(12) United States Patent
Kurata et al.

(10) Patent No.: US 11,004,727 B2
(45) Date of Patent: May 11, 2021

(54) METHOD FOR FABRICATING ELECTRODE AND SEMICONDUCTOR DEVICE

(71) Applicant: SEMICONDUCTOR ENERGY LABORATORY CO., LTD., Atsugi (JP)

(72) Inventors: Motomu Kurata, Kanagawa (JP); Shinya Sasagawa, Kanagawa (JP); Ryota Hodo, Kanagawa (JP); Yuta Iida, Kanagawa (JP); Satoru Okamoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/556,330

(22) Filed: Aug. 30, 2019

(65) Prior Publication Data

US 2019/0393079 A1 Dec. 26, 2019

Related U.S. Application Data

(62) Division of application No. 15/092,973, filed on Apr. 7, 2016, now Pat. No. 10,460,984.

(30) Foreign Application Priority Data

Apr. 15, 2015 (JP) .................... 2015-083537

(51) Int. Cl.
  *H01L 21/76* (2006.01)
  *H01L 21/768* (2006.01)
  *H01L 29/786* (2006.01)

(52) U.S. Cl.
  CPC .. *H01L 21/76802* (2013.01); *H01L 21/76814* (2013.01); *H01L 21/76843* (2013.01); *H01L 21/76855* (2013.01); *H01L 29/78666* (2013.01)

(58) Field of Classification Search
  CPC ......... H01L 21/76802; H01L 21/76855; H01L 21/76843; H01L 21/76814;
  (Continued)

(56) References Cited

U.S. PATENT DOCUMENTS 5,488,964 A   2/1996 Murakami et al.
5,671,764 A   9/1997 Murakami et al.
  (Continued)

FOREIGN PATENT DOCUMENTS

EP   1737044 A   12/2006
EP   2226847 A   9/2010
  (Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
  (Continued)

*Primary Examiner* — Charles D Garber
*Assistant Examiner* — S M Sohel Imtiaz
(74) *Attorney, Agent, or Firm* — Fish & Richardson P.C.

(57) ABSTRACT

A minute transistor is provided. A transistor having low parasitic capacitance is provided. A transistor having high frequency characteristics is provided. An electrode including the transistor is provided. A novel electrode is provided. The electrode includes a first conductive layer containing a metal, an insulating layer, and a second conductive layer. The insulating layer is formed over the first conductive layer. A mask layer is formed over the insulating layer. The insulating layer is etched using plasma with the mask layer used as a mask, whereby an opening is formed in the insulating layer so as to reach the first conductive layer. Plasma treatment is performed on at least the opening in an oxygen atmosphere. By the plasma treatment, a metal-
  (Continued)

containing oxide is formed on the first conductive layer in the opening. The oxide is removed, and then the second conductive layer is formed in the opening.

10 Claims, 80 Drawing Sheets

(58) Field of Classification Search
CPC ......... H01L 29/78666; H01L 29/66969; H01L 21/02063; H01L 29/42384; H01L 29/78603; H01L 29/7869; H01L 29/78648
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,782,990 A | 7/1998 | Murakami et al. |
| 5,887,604 A | 3/1999 | Murakami et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,187 B2 | 5/2006 | Yamamoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,144,766 B2 | 12/2006 | Yamamoto et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,300,833 B2 | 11/2007 | Yamamoto et al. |
| 7,323,356 B2 | 1/2008 | Hosono et al. |
| 7,385,224 B2 | 6/2008 | Ishii et al. |
| 7,397,124 B2 | 7/2008 | Hu et al. |
| 7,402,506 B2 | 7/2008 | Levy et al. |
| 7,405,160 B2 | 7/2008 | Kozuka et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,915,075 B2 | 3/2011 | Suzawa et al. |
| 8,030,216 B2 | 10/2011 | Kozuka et al. |
| 8,547,771 B2 | 10/2013 | Koyama |
| 8,673,426 B2 | 3/2014 | Yamazaki et al. |
| 8,748,241 B2 | 6/2014 | Isobe et al. |
| 8,916,424 B2 | 12/2014 | Isobe et al. |
| 8,932,903 B2 | 1/2015 | Sato et al. |
| 8,956,929 B2 | 2/2015 | Egi et al. |
| 8,995,174 B2 | 3/2015 | Koyama |
| 9,117,662 B2 | 8/2015 | Isobe et al. |
| 9,209,795 B2 | 12/2015 | Okamoto et al. |
| 9,252,286 B2 | 2/2016 | Isobe et al. |
| 9,871,059 B2 | 1/2018 | Isobe et al. |
| 2001/0008227 A1* | 7/2001 | Sadamoto ........... H01L 31/1884 216/23 |
| 2001/0046027 A1 | 11/2001 | Tai et al. |
| 2002/0040999 A1 | 4/2002 | Moriwaki et al. |
| 2002/0056838 A1 | 5/2002 | Ogawa |
| 2002/0132454 A1 | 9/2002 | Ohtsu et al. |
| 2002/0145834 A1* | 10/2002 | Inoue ................... G11B 5/3903 360/320 |
| 2003/0160331 A1 | 8/2003 | Fujisawa |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0098892 A1 | 5/2005 | Hu et al. |
| 2005/0186801 A1* | 8/2005 | Uno ................... H01L 21/76808 438/706 |
| 2005/0199959 A1 | 9/2005 | Chiang et al. |
| 2005/0227432 A1 | 10/2005 | Choi et al. |
| 2006/0035452 A1 | 2/2006 | Carcia et al. |
| 2006/0043377 A1 | 3/2006 | Hoffman et al. |
| 2006/0051969 A1 | 3/2006 | Nakajima et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0246640 A1* | 11/2006 | Kuwashima ........ H01L 27/1266 438/151 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054482 A1 | 3/2007 | Nakajima et al. |
| 2007/0054507 A1 | 3/2007 | Kaji et al. |
| 2007/0069401 A1* | 3/2007 | Kakehata .................. C23C 8/36 438/785 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299761 A1 | 12/2008 | Luoh et al. |
| 2009/0061623 A1 | 3/2009 | Chang et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0286391 A1 | 11/2009 | Nakajima et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0084267 A1* | 4/2011 | Yamazaki ............. H01L 21/324 257/43 |

(56) References Cited

U.S. PATENT DOCUMENTS

| | | | |
|---|---|---|---|
| 2012/0001182 A1* | 1/2012 | Choi | H01L 29/4908 257/59 |
| 2012/0025191 A1 | 2/2012 | Yamazaki | |
| 2013/0069132 A1 | 3/2013 | Atsumi et al. | |
| 2013/0244369 A1* | 9/2013 | Nishimoto | H01L 21/30604 438/71 |
| 2014/0008647 A1* | 1/2014 | Yamazaki | H01L 29/24 257/43 |
| 2014/0299830 A1* | 10/2014 | Kim | H01L 27/2481 257/4 |
| 2014/0339540 A1 | 11/2014 | Takemura | |
| 2015/0218013 A1* | 8/2015 | Ahmad | B01J 20/205 210/670 |
| 2015/0328668 A1* | 11/2015 | Koyama | H01L 21/67017 134/22.12 |
| 2016/0076146 A1* | 3/2016 | Ellinger | H01L 21/02579 427/569 |

FOREIGN PATENT DOCUMENTS

| | | |
|---|---|---|
| JP | 60-039848 A | 3/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-336430 A | 11/1992 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-156999 A | 6/2005 |
| JP | 2005-252284 A | 9/2005 |
| JP | 2007-165514 A | 6/2007 |
| JP | 2007-165827 A | 6/2007 |
| JP | 2008-251741 A | 10/2008 |
| JP | 2010-226051 A | 10/2010 |
| JP | 2012-049514 A | 3/2012 |
| JP | 2012-109512 A | 6/2012 |
| JP | 2012-257187 A | 12/2012 |
| JP | 2013-149955 A | 8/2013 |
| JP | 2014-240833 A | 12/2014 |
| JP | 2014-241407 A | 12/2014 |
| KR | 0161449 B1 * | 2/1999 ........... H01L 21/304 |
| TW | 417241 | 1/2001 |
| TW | 441002 | 6/2001 |
| TW | 575940 | 2/2004 |
| TW | 200516709 | 5/2005 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "SPINEL.YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a charge-generation layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

FIG. 7A
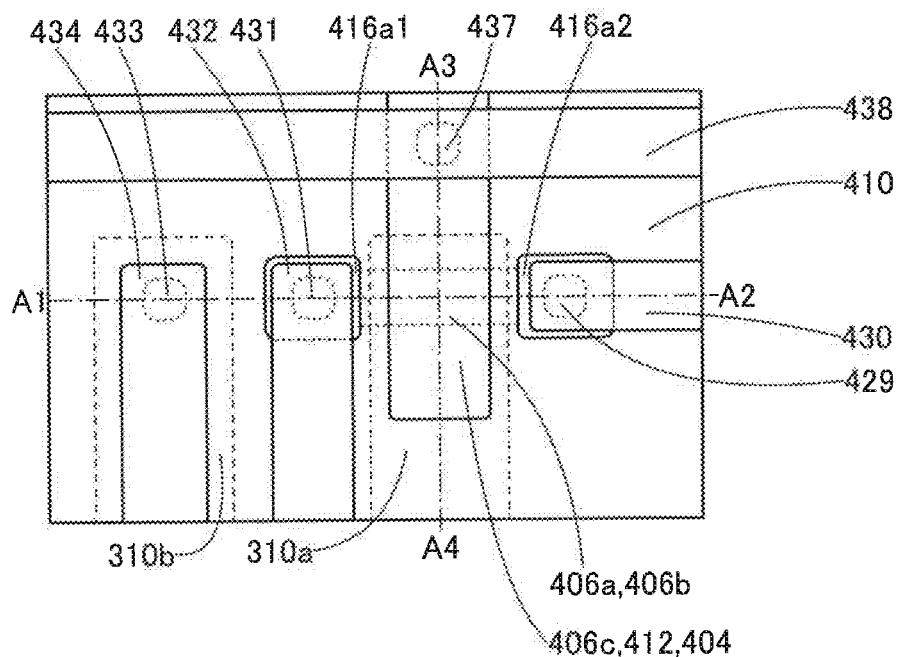
FIG. 7B
FIG. 7C
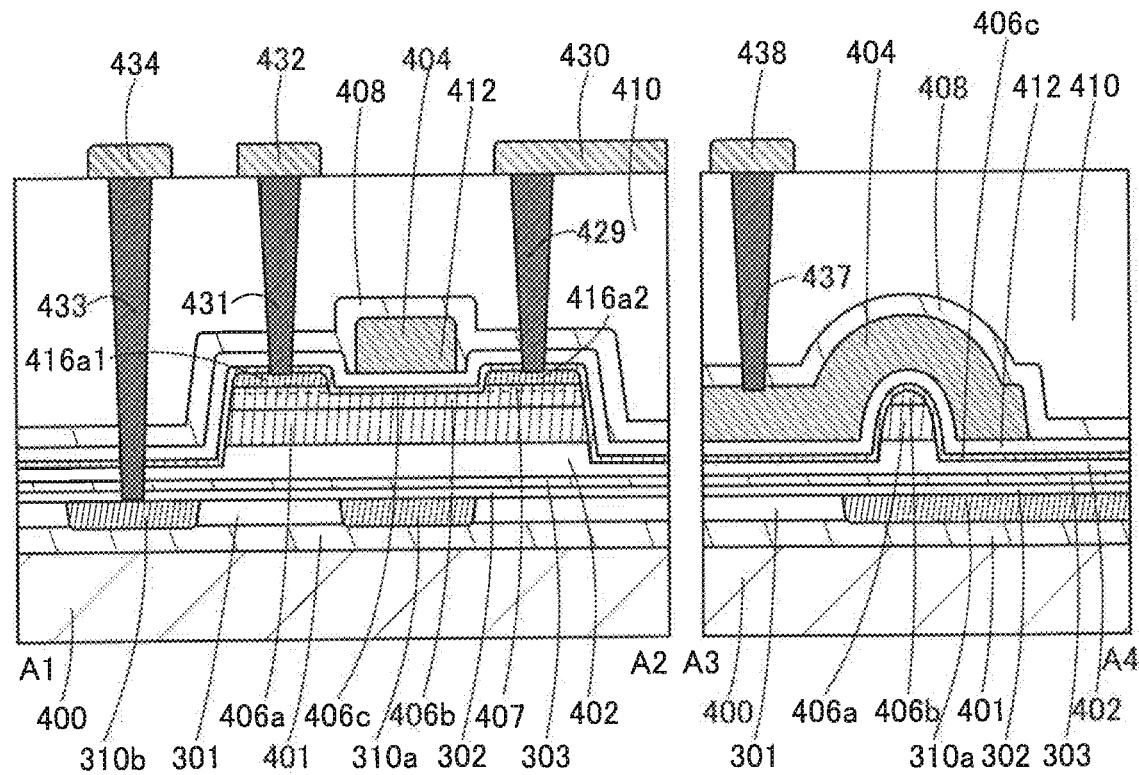

FIG. 15A
FIG. 15B
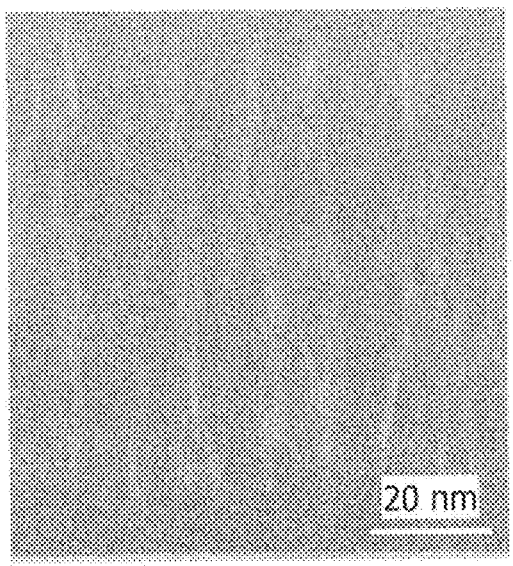
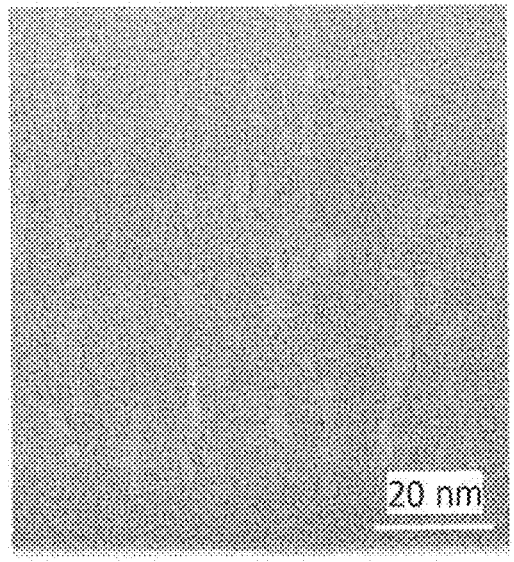

FIG. 18A
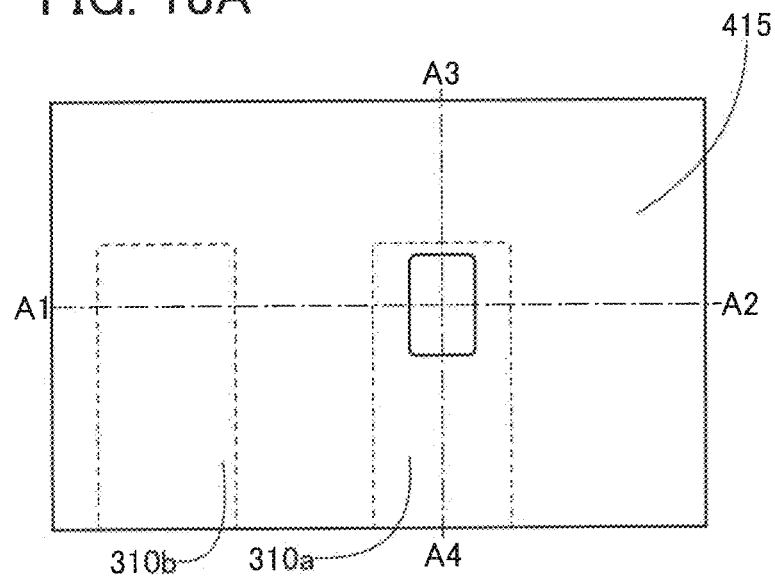
FIG. 18B
FIG. 18C
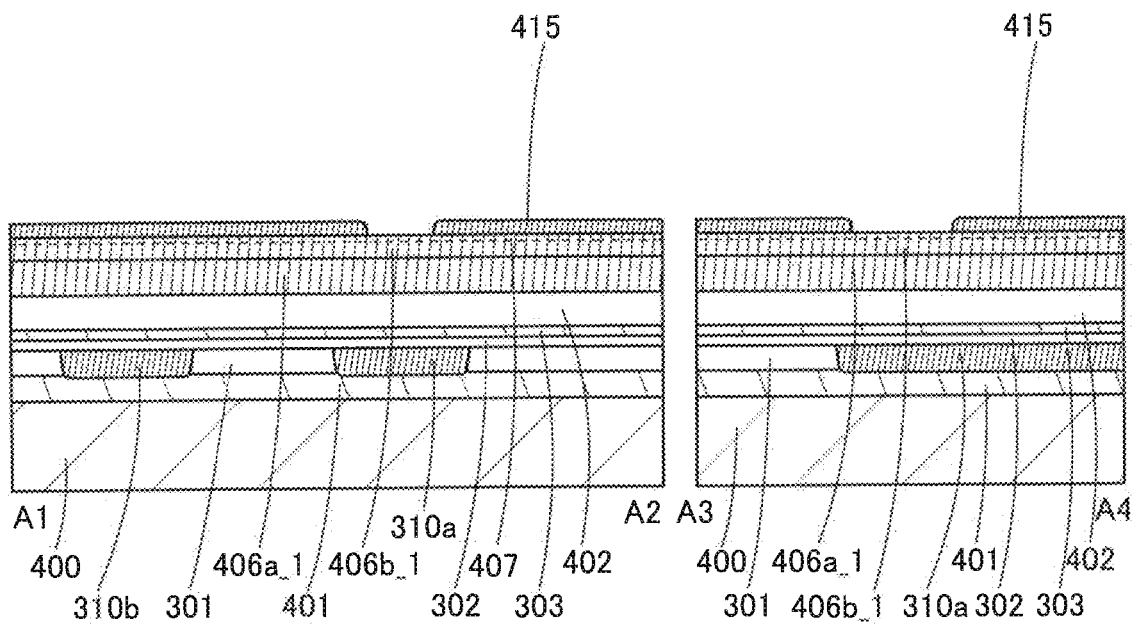

FIG. 19A
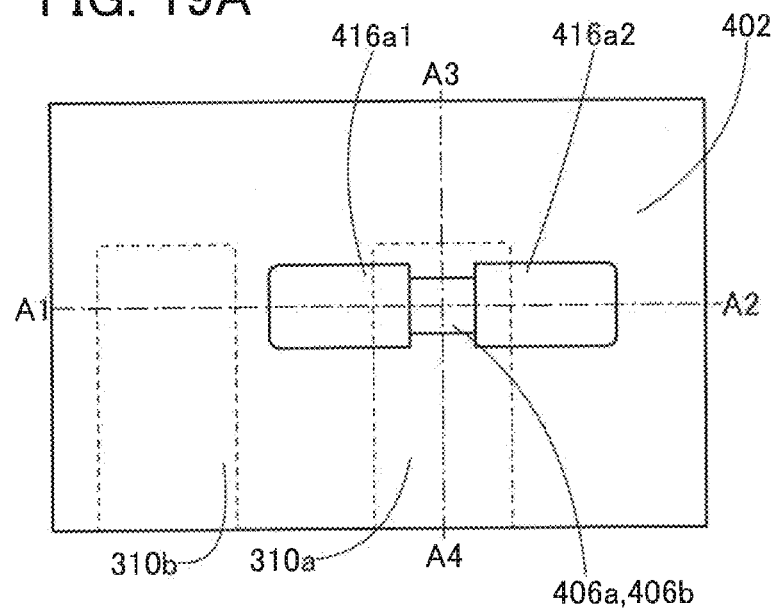
FIG. 19B
FIG. 19C
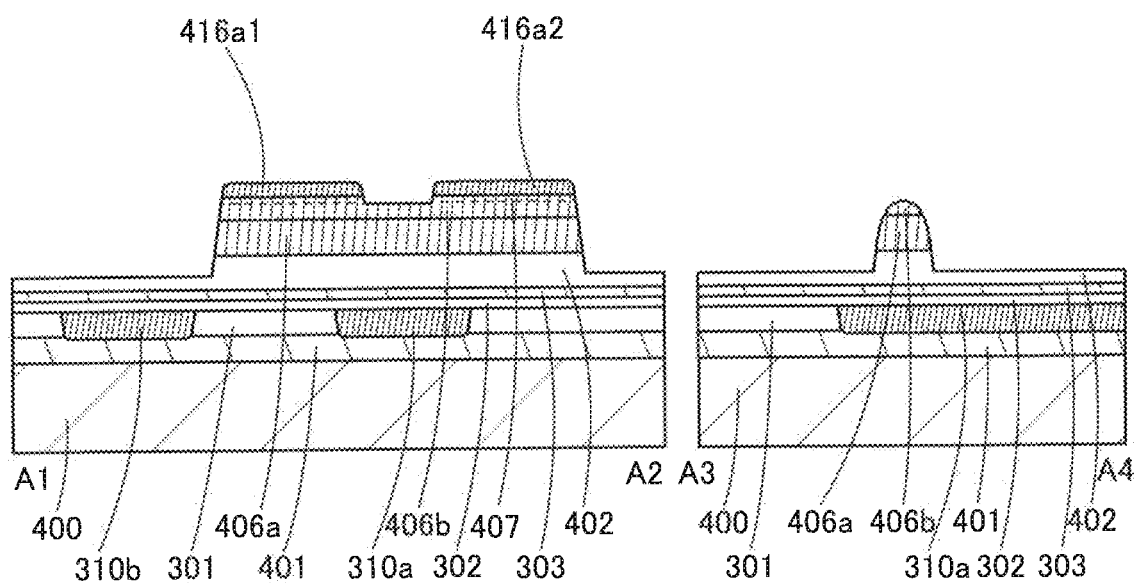

FIG. 20A
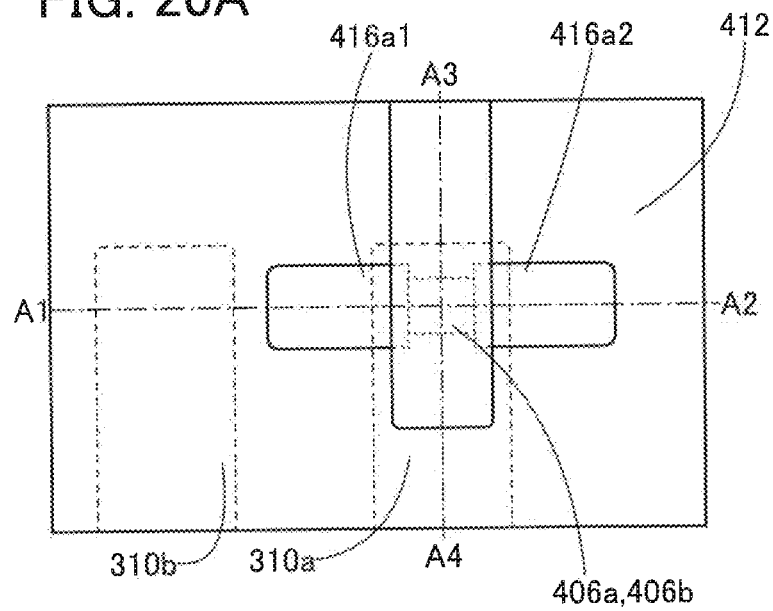
FIG. 20B
FIG. 20C
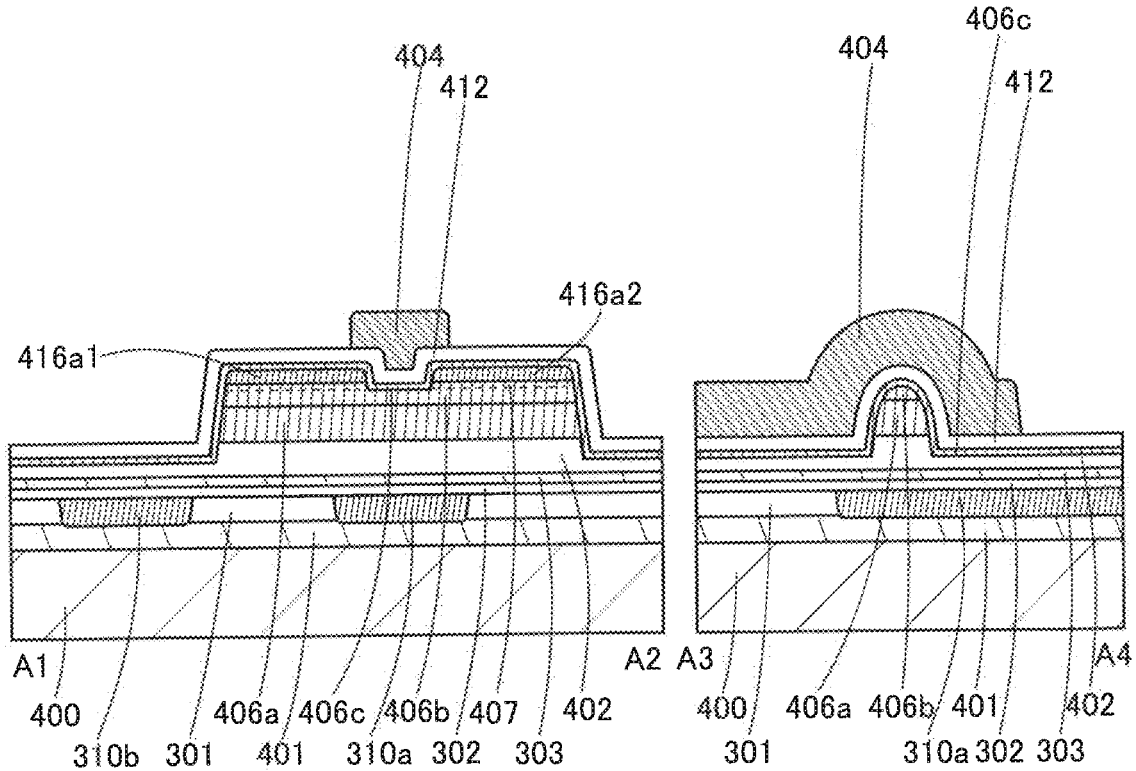

FIG. 25A
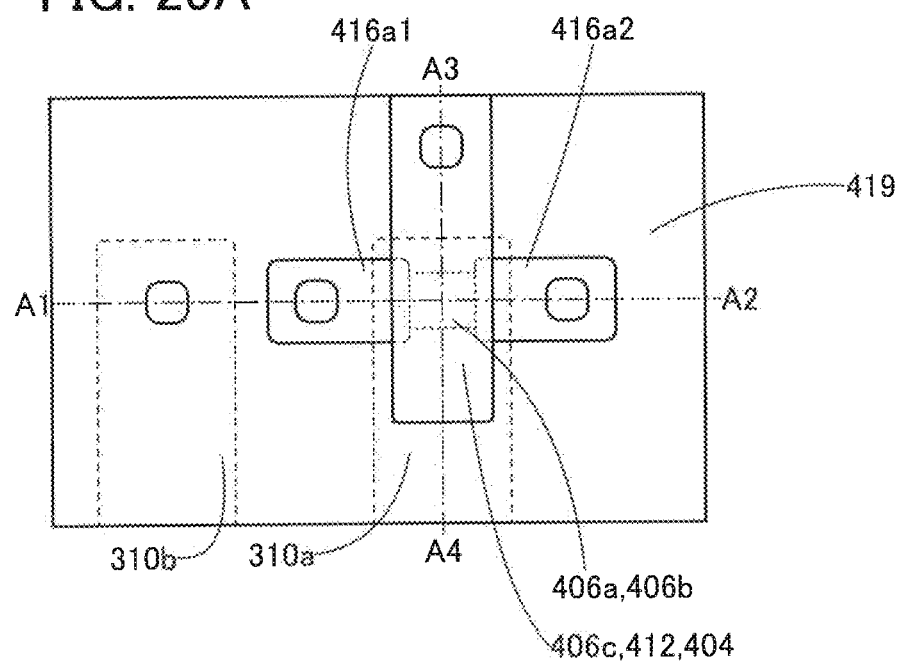
FIG. 25B
FIG. 25C
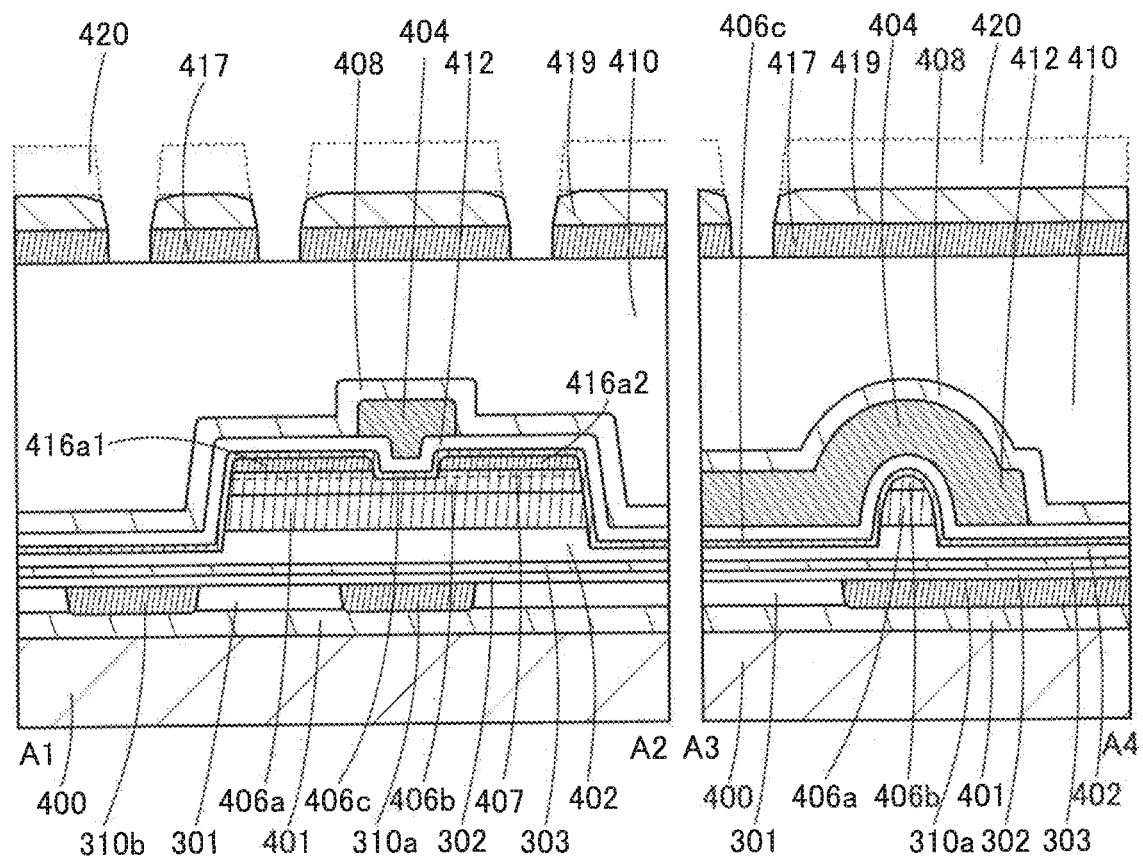

FIG. 27A
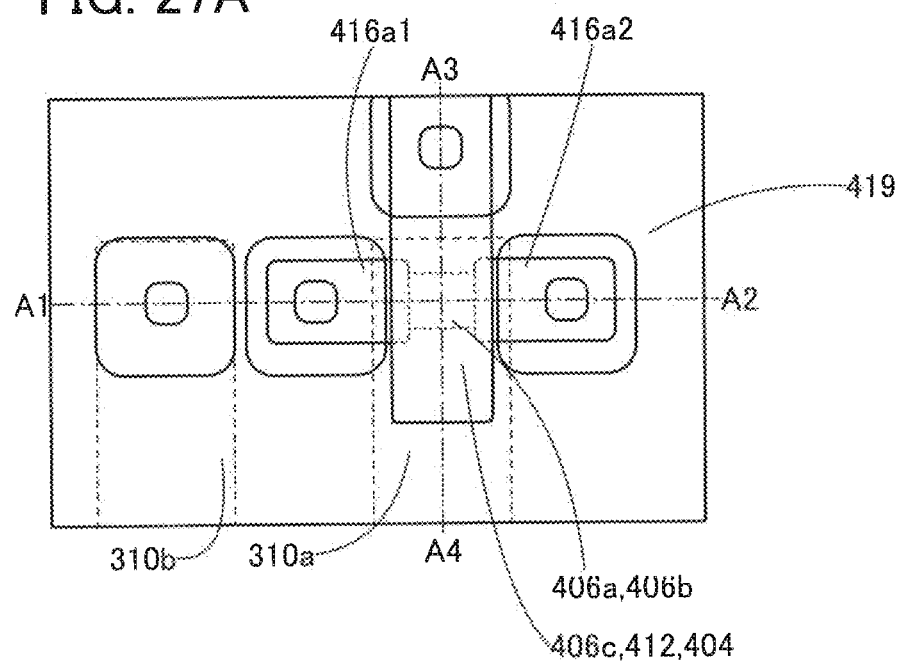
FIG. 27B
FIG. 27C
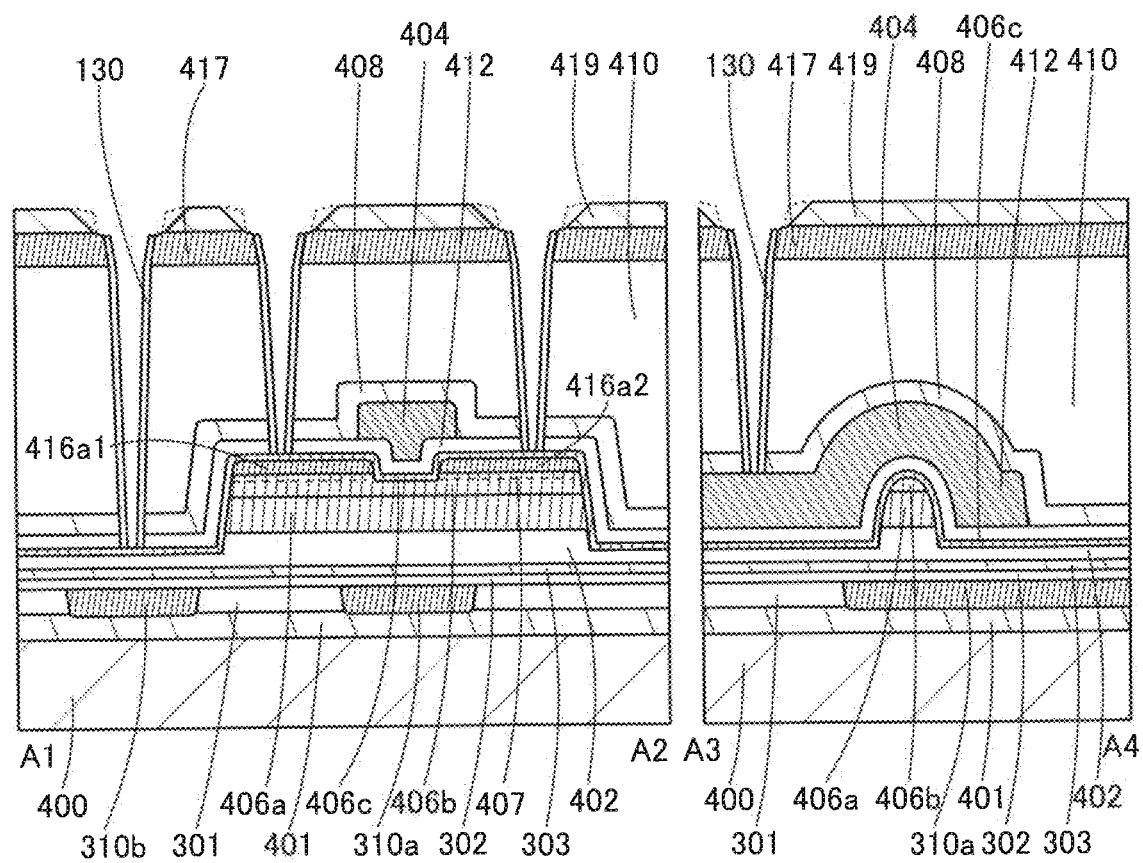

FIG. 28A
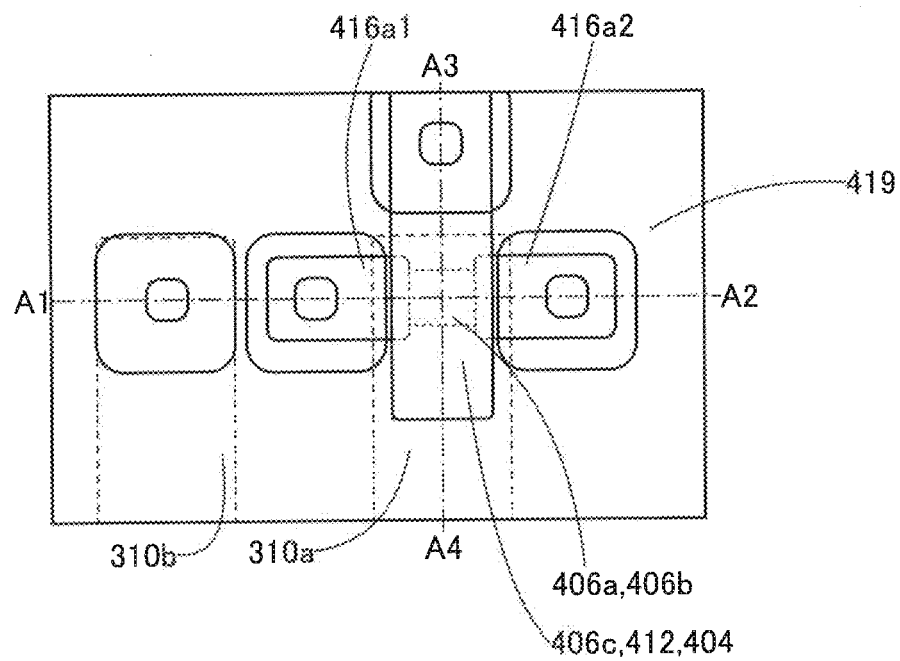
FIG. 28B
FIG. 28C
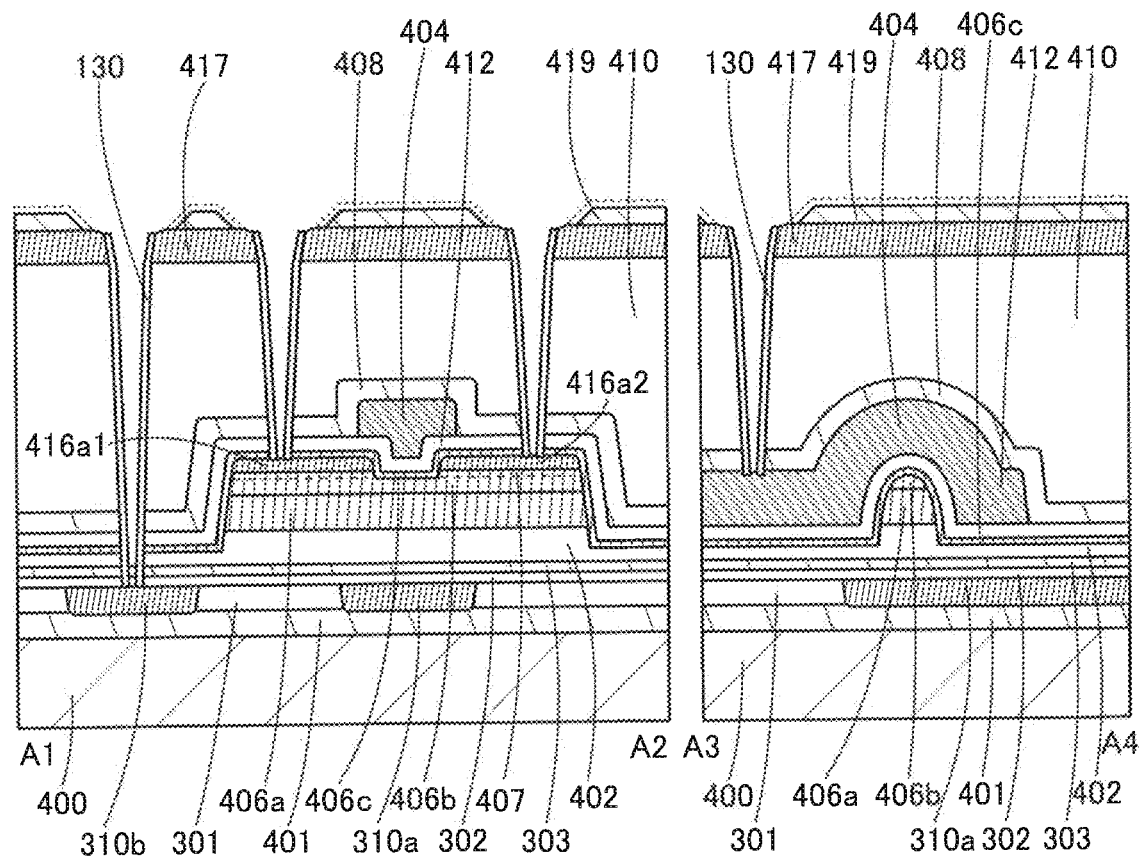

FIG. 29A
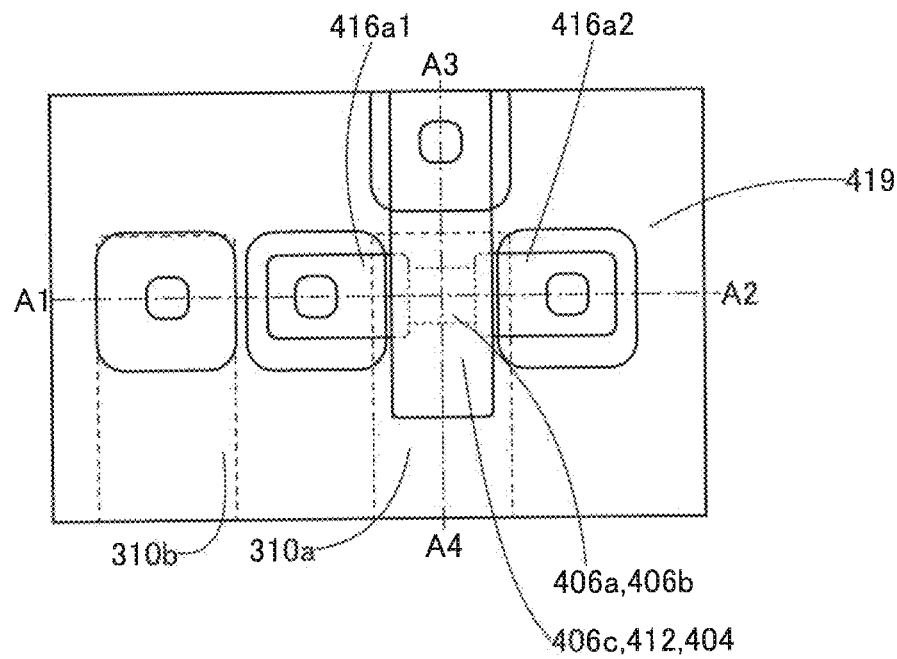
FIG. 29B
FIG. 29C
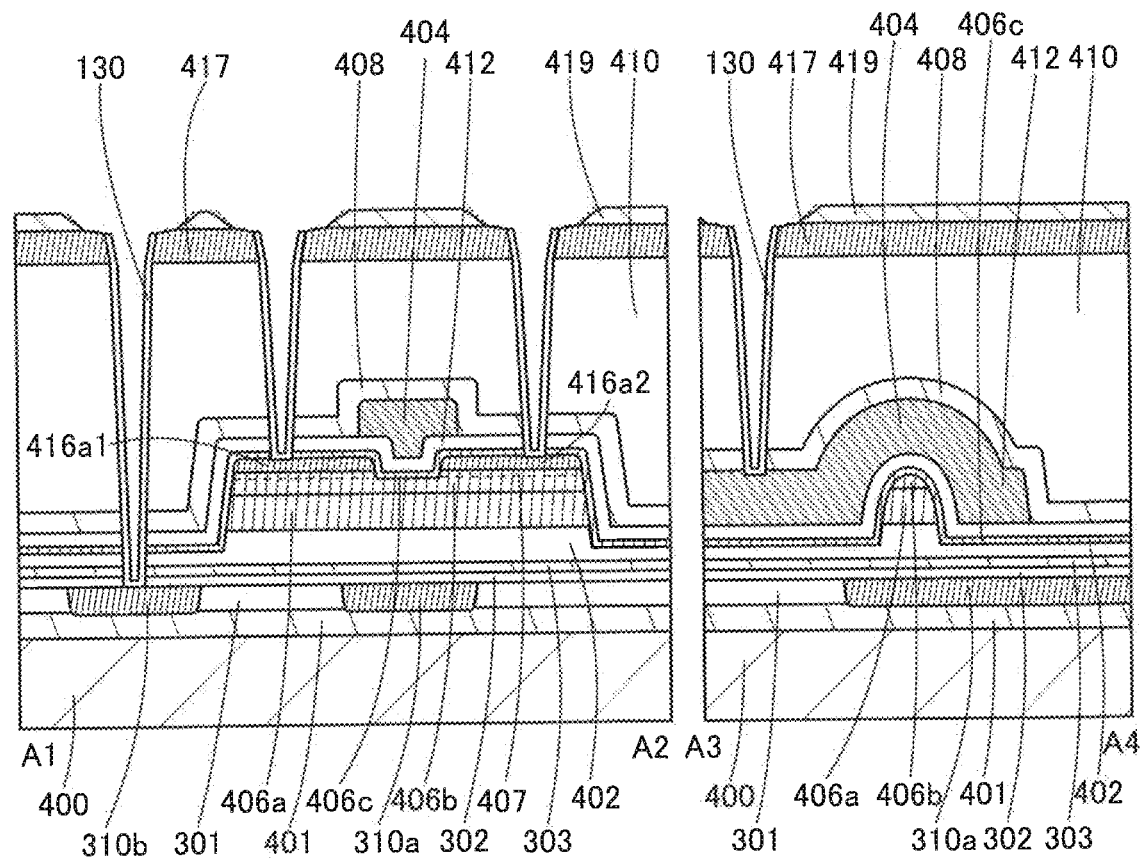

FIG. 32A
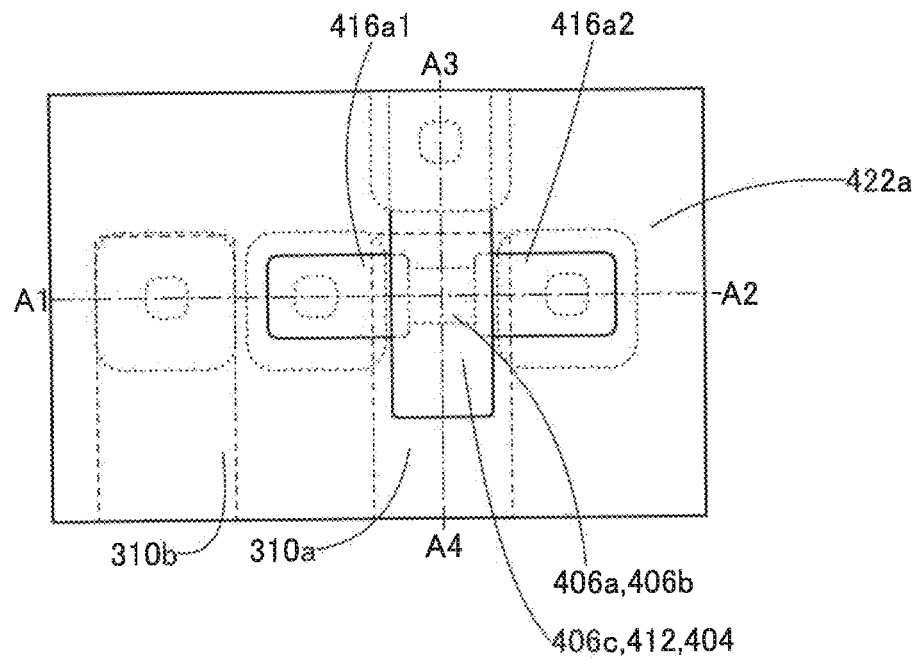
FIG. 32B
FIG. 32C
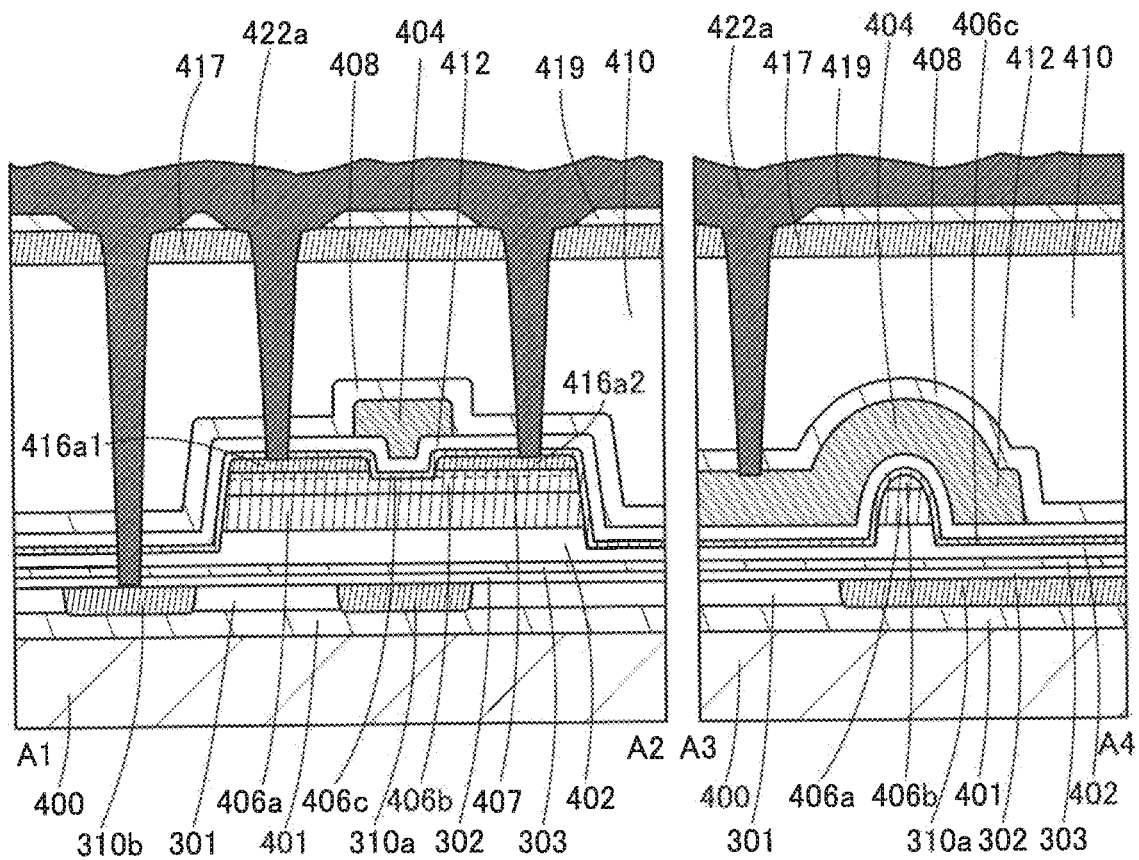

FIG. 37A
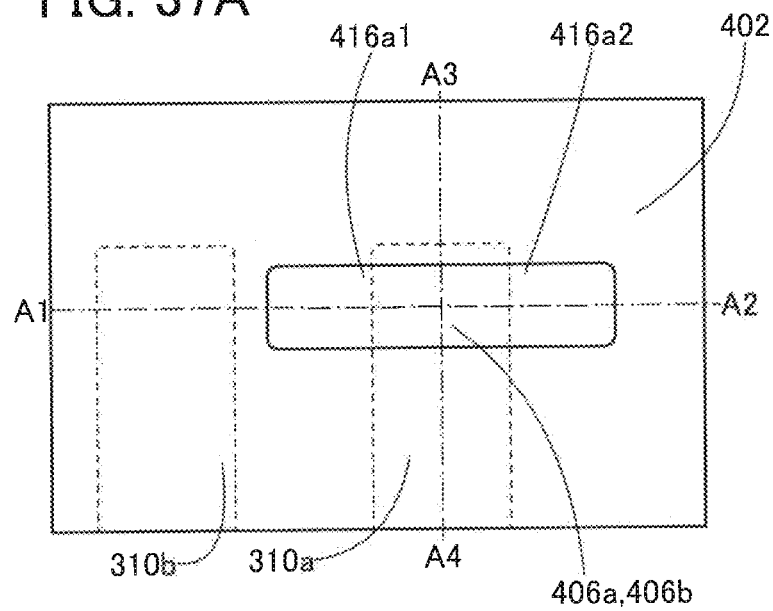
FIG. 37B
FIG. 37C
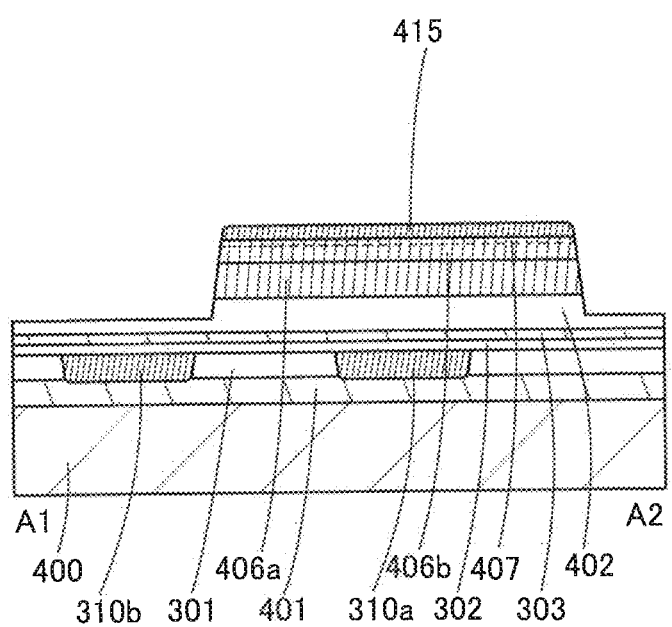
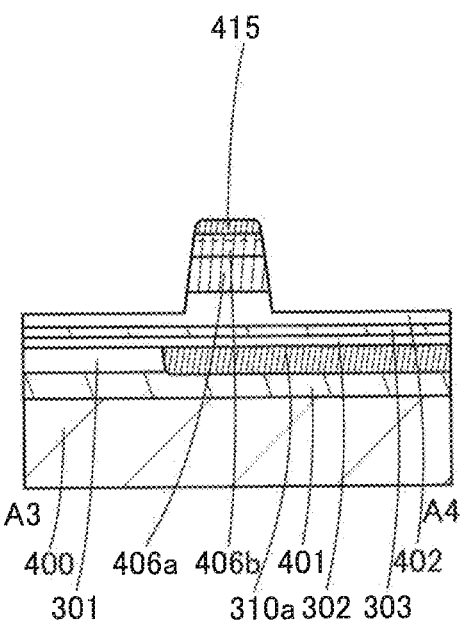

FIG. 39A
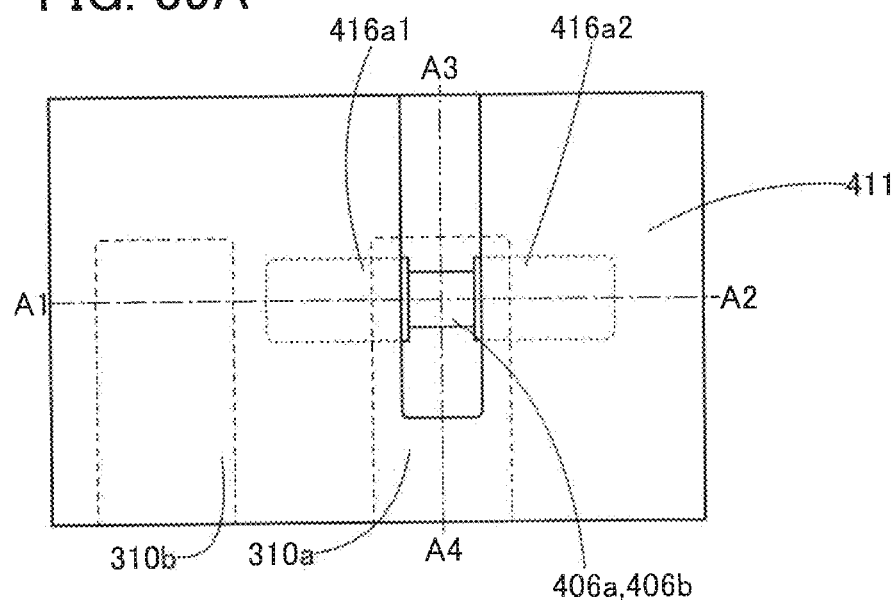
FIG. 39B
FIG. 39C
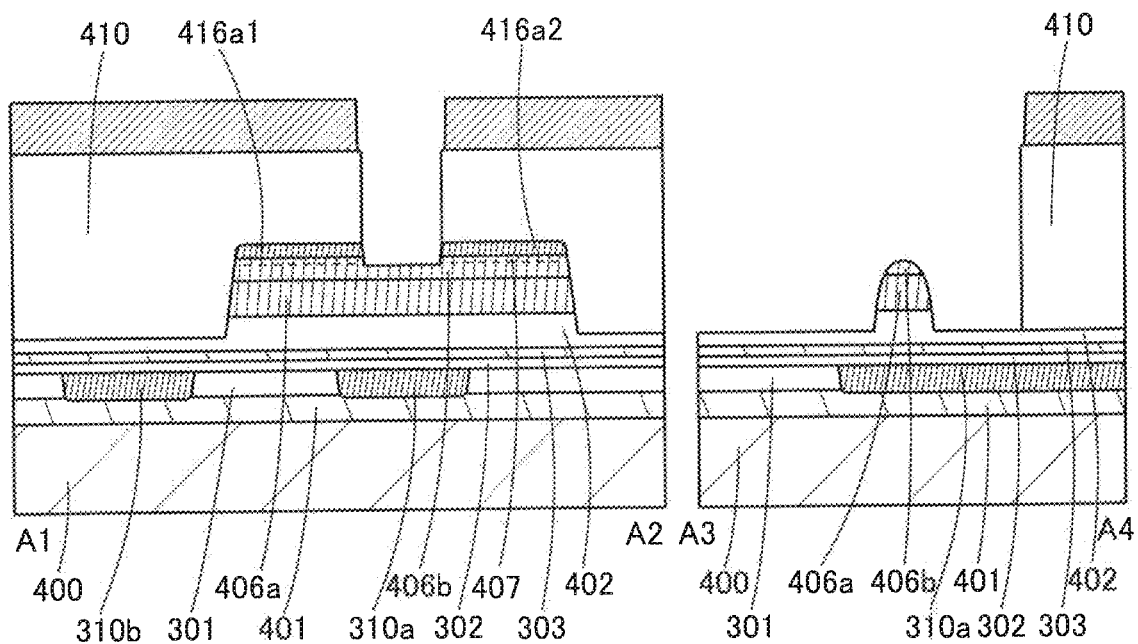

FIG. 40A
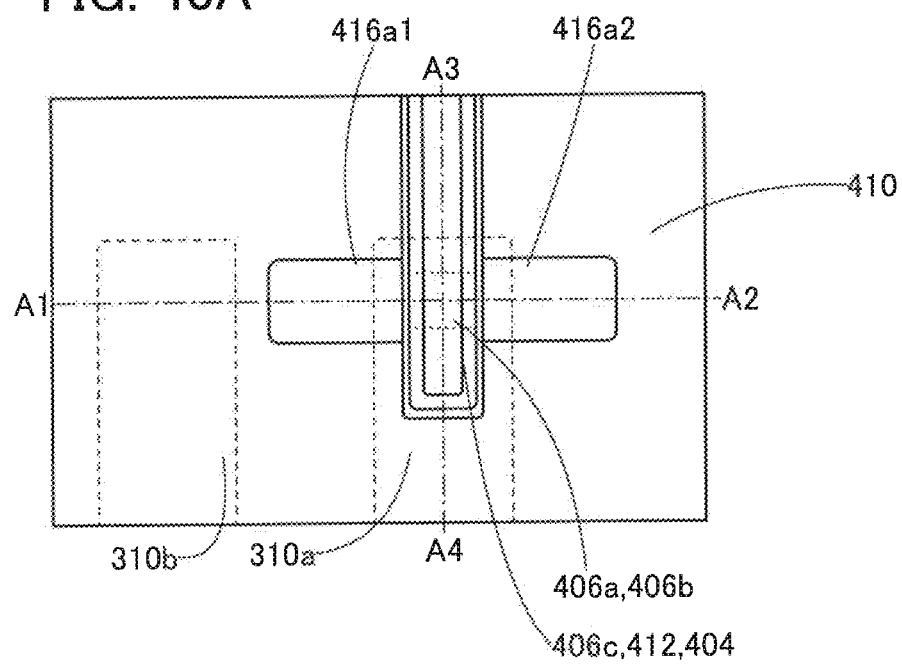
FIG. 40B
FIG. 40C
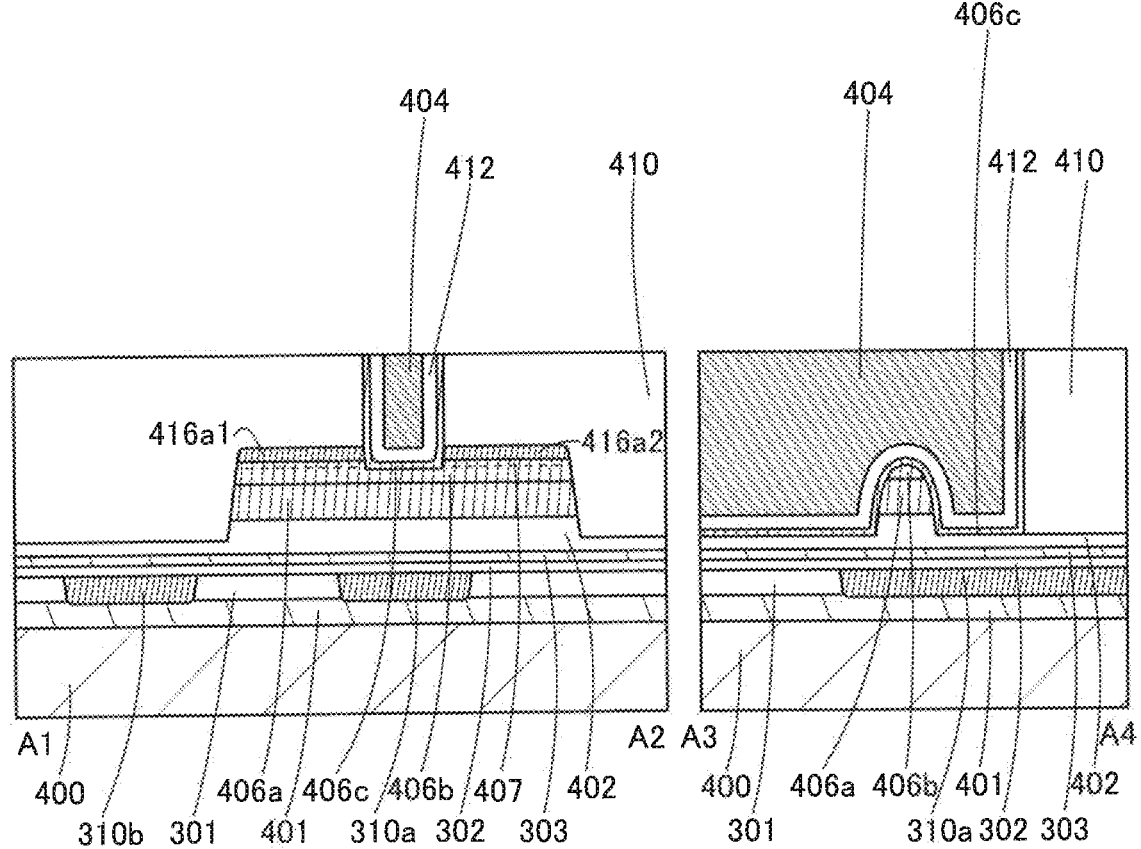

FIG. 41A
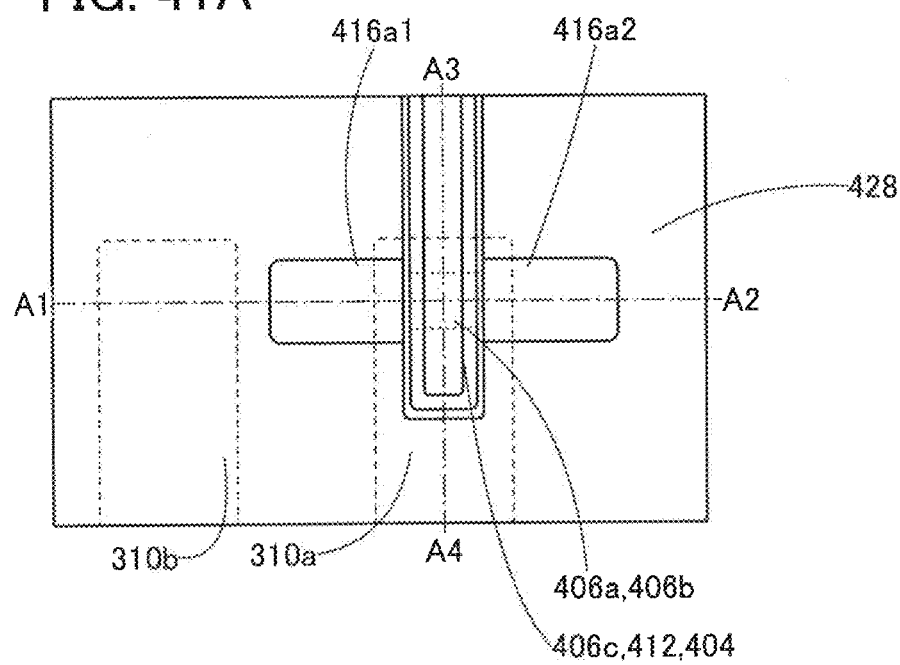
FIG. 41B
FIG. 41C
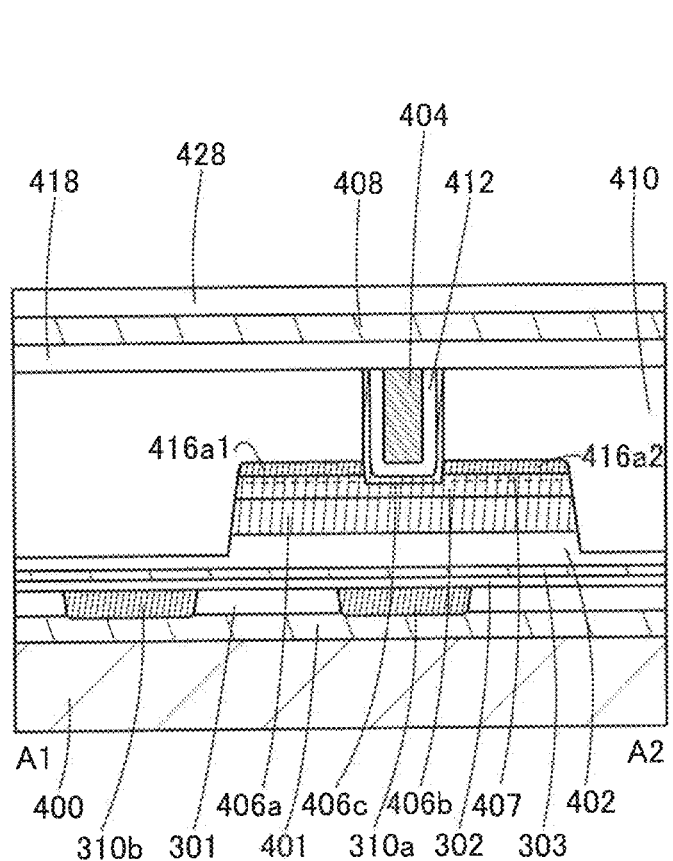
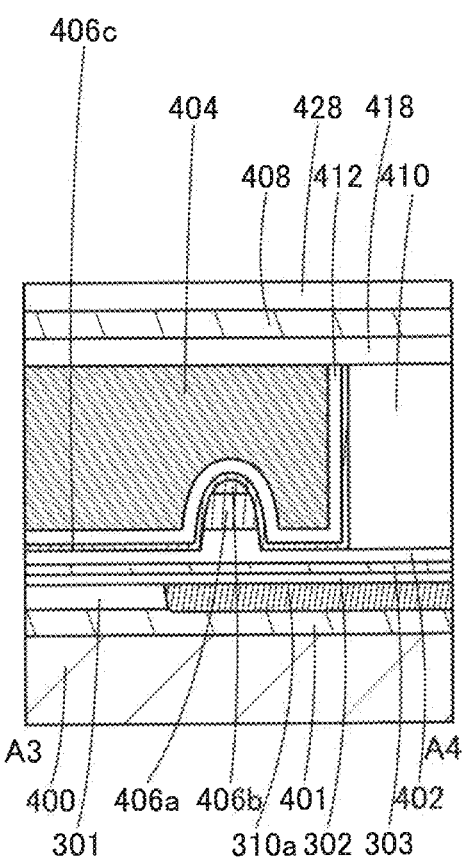

FIG. 44A
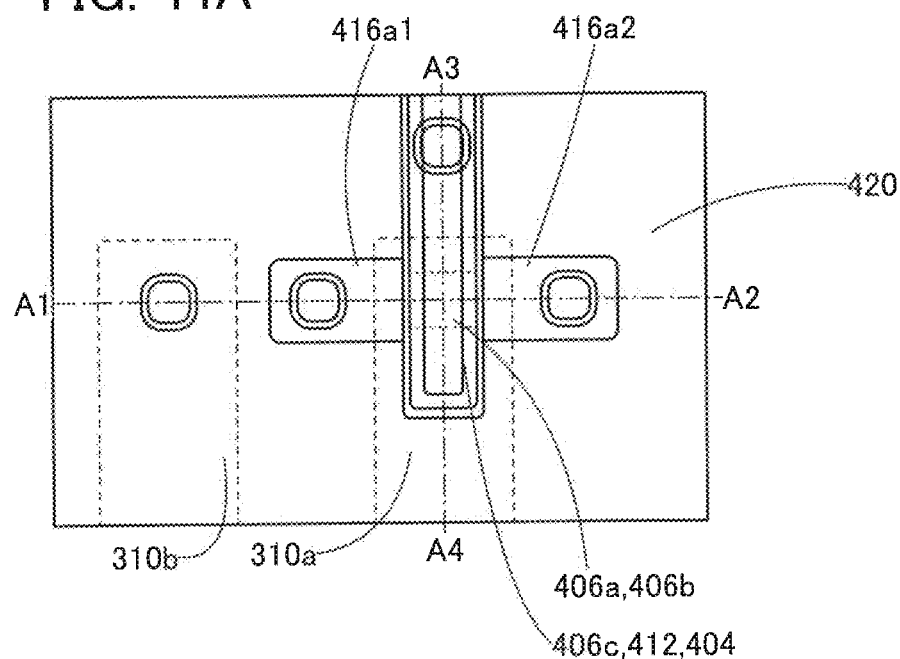
FIG. 44B
FIG. 44C
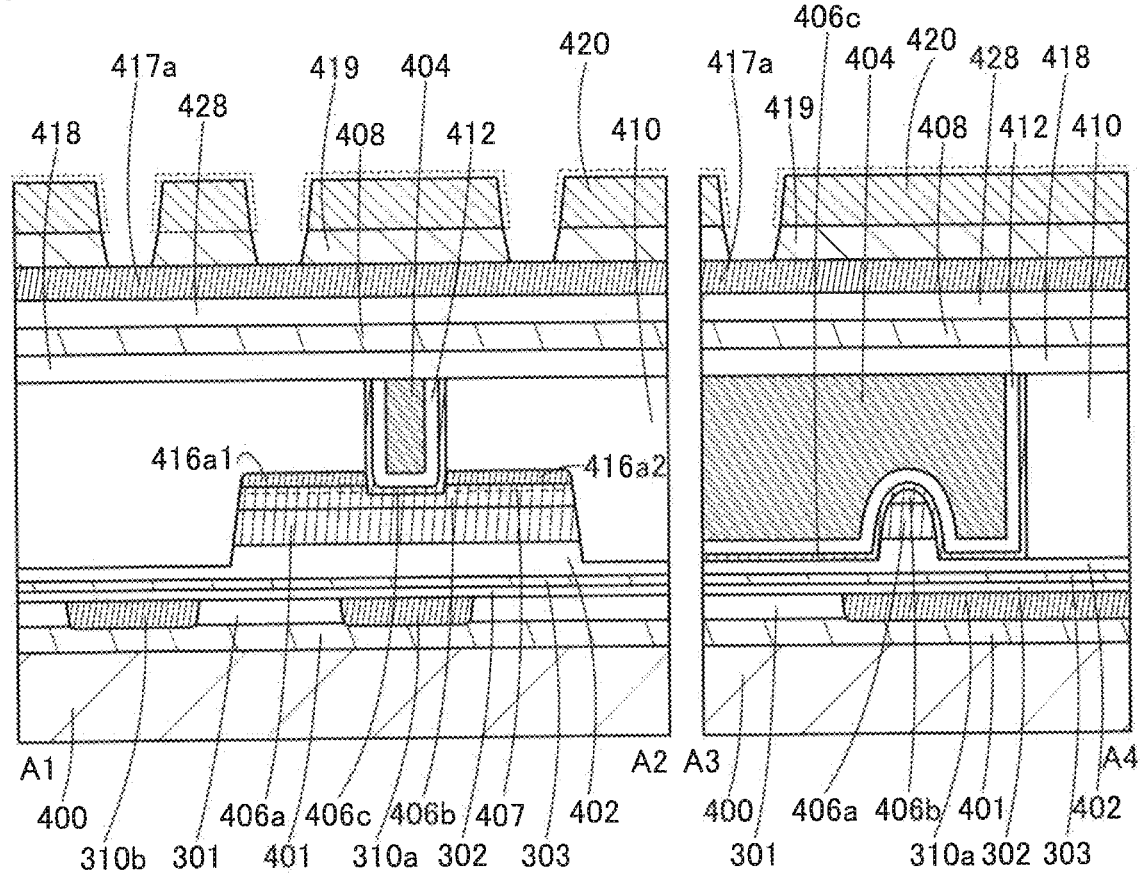

FIG. 52A
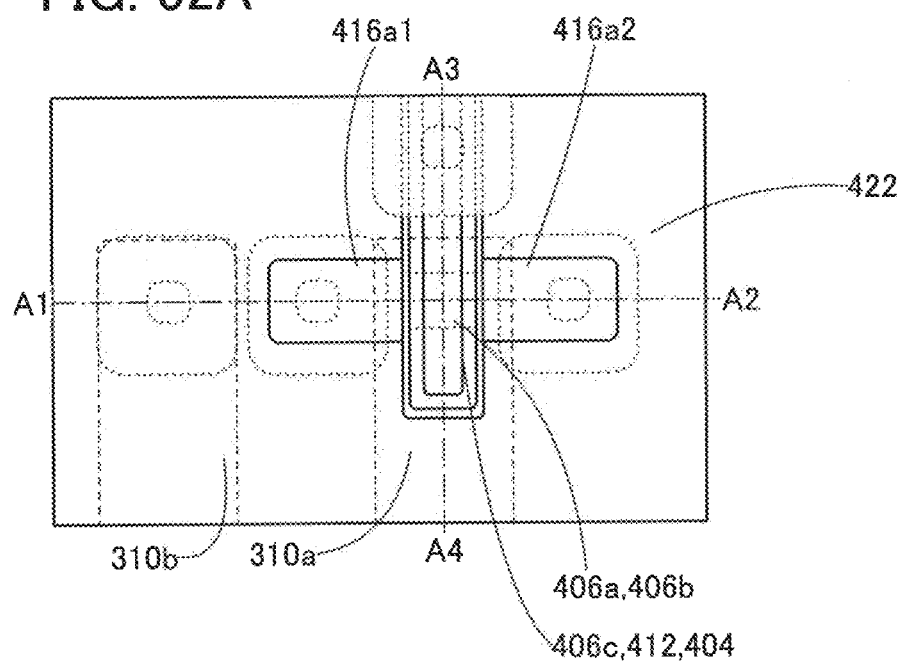
FIG. 52B
FIG. 52C
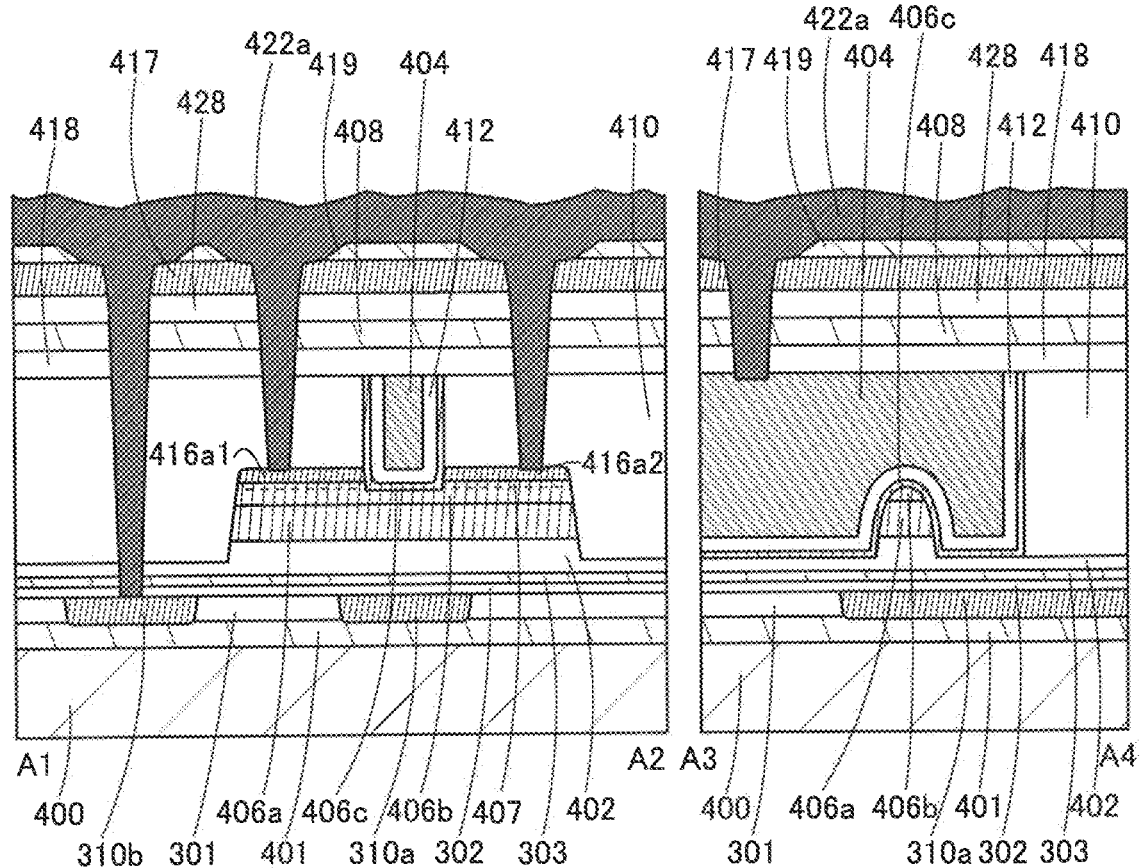

FIG. 80A

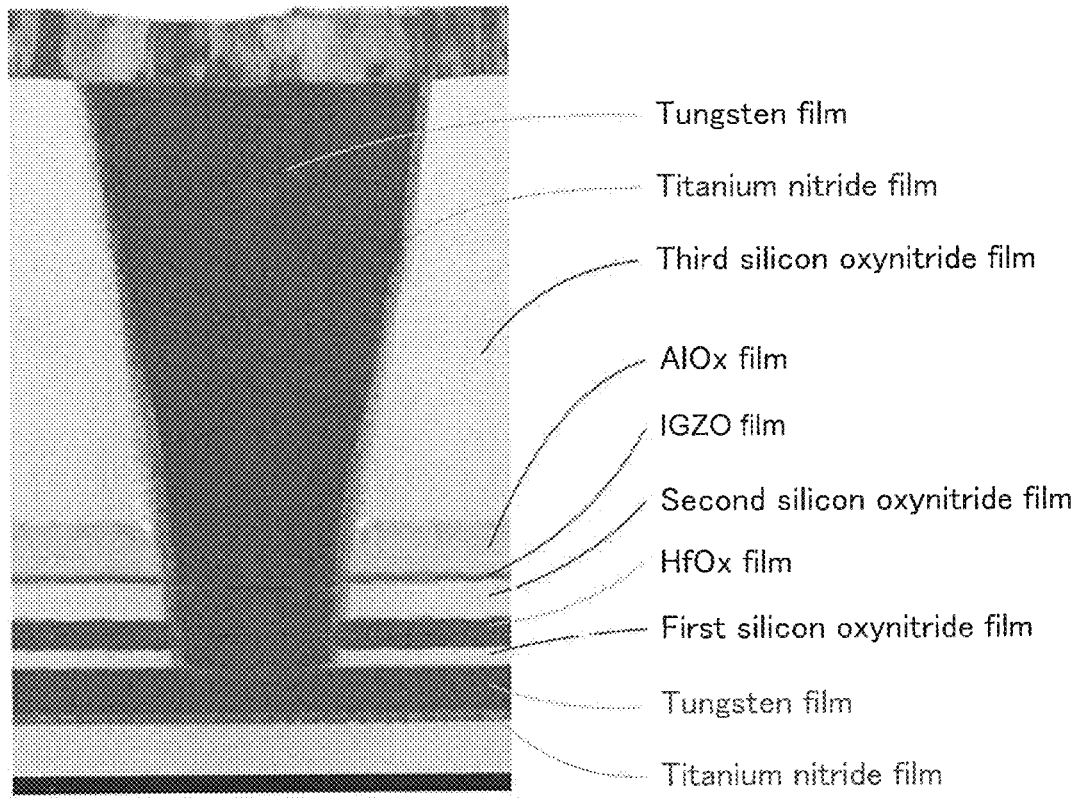

- Tungsten film
- Titanium nitride film
- Third silicon oxynitride film
- AlOx film
- IGZO film
- Second silicon oxynitride film
- HfOx film
- First silicon oxynitride film
- Tungsten film
- Titanium nitride film

FIG. 80B

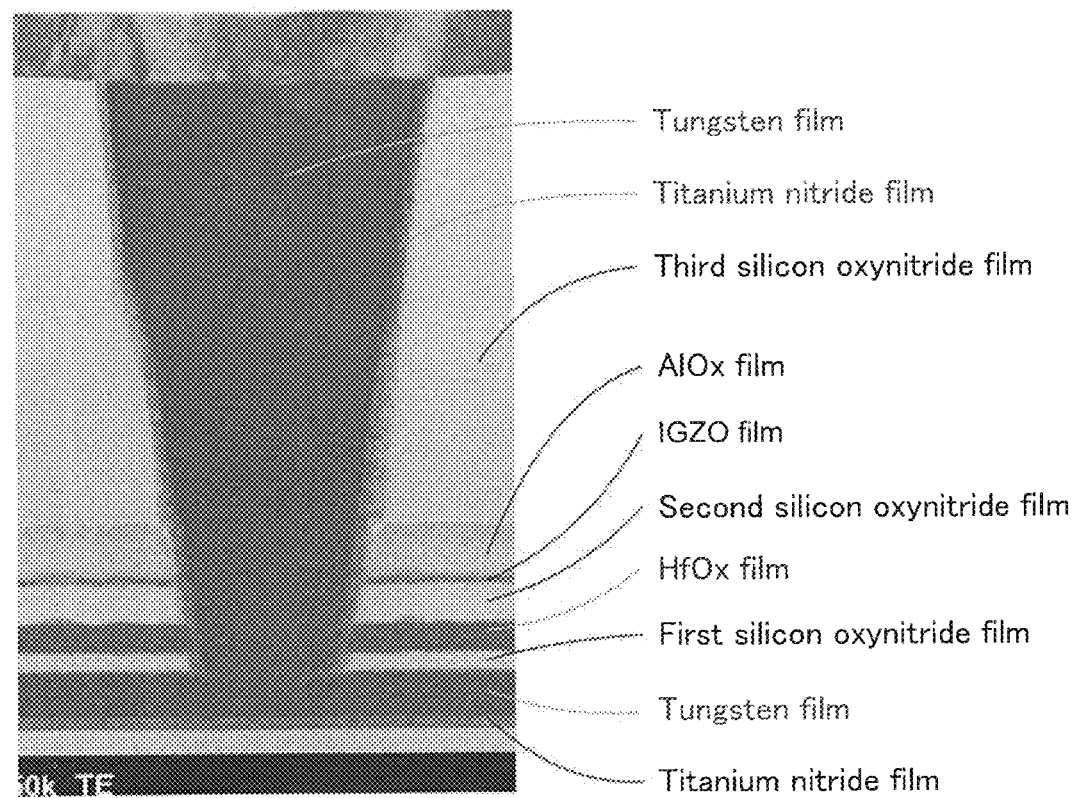

- Tungsten film
- Titanium nitride film
- Third silicon oxynitride film
- AlOx film
- IGZO film
- Second silicon oxynitride film
- HfOx film
- First silicon oxynitride film
- Tungsten film
- Titanium nitride film

METHOD FOR FABRICATING ELECTRODE AND SEMICONDUCTOR DEVICE

CROSS-REFERENCE TO RELATED APPLICATIONS

This application is a divisional of U.S. application Ser. No. 15/092,973, filed Apr. 7, 2016, now allowed, which claims the benefit of a foreign priority application filed in Japan as Serial No. 2015-083537 on Apr. 15, 2015, both of which are incorporated by reference.

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power memory device, a memory device, a processor, and an electronic device. The present invention relates to methods for manufacturing a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, a transistor including an oxide semiconductor has been attracting attention. An oxide semiconductor can be formed by a sputtering method or the like, and thus can be used for a semiconductor of a transistor in a large display device. In addition, the transistor including an oxide semiconductor is advantageous in reducing capital investment because part of production equipment for a transistor including amorphous silicon can be retrofitted and utilized.

It is known that a transistor including an oxide semiconductor has an extremely low leakage current in an off state. For example, a low-power-consumption CPU utilizing the characteristic of a low leakage current of the transistor including an oxide semiconductor is disclosed (see Patent Document 1).

Furthermore, a method for manufacturing a transistor including an oxide semiconductor in which a gate electrode is embedded in an opening is disclosed (see Patent Documents 2 and 3).

REFERENCE

Patent Document

[Patent Document 1] Japanese Published Patent Application No. 2012-257187

[Patent Document 2] Japanese Published Patent Application No. 2014-241407

[Patent Document 3] Japanese Published Patent Application No. 2014-240833

SUMMARY OF THE INVENTION

An object is to provide a minute transistor. Another object is to provide a transistor with low parasitic capacitance. Another object is to provide a transistor having a large amount of on-state current. Another object is to provide a transistor having high frequency characteristics. Another object is to provide a transistor with favorable electrical characteristics. Another object is to provide a transistor having stable electrical characteristics. Another object is to provide a transistor having a small amount of off-state current. Another object is to provide a novel transistor. Another object is to provide a semiconductor device including the transistor. Another object is to provide a semiconductor device that operates at high speed. Another object is to provide a novel semiconductor device. Another object is to provide a method for manufacturing a novel semiconductor device. Another object is to provide a module including any of the above semiconductor devices. Another object is to provide an electronic device including any of the above semiconductor devices or the module.

Note that the description of these objects does not disturb the existence of other objects. In one embodiment of the present invention, there is no need to achieve all the objects. Other objects will be apparent from and can be derived from the description of the specification, the drawings, the claims, and the like.

(1) One embodiment of the present invention is a method for fabricating an electrode. The method includes the first to sixth steps. The first step is a step of forming an insulating layer over a first conductive layer. The first conductive layer contains a metal element. The second step is a step of forming a mask layer over the insulating layer. The third step is a step of forming an opening in the insulating layer. The opening is formed by etching the insulating layer using plasma and the mask layer as a mask in the third step. The bottom part of the opening reaches the top surface of the first conductive layer in the third step. The fourth step is a step of performing plasma treatment on at least the opening. An oxide is formed over the first conductive layer in the opening by the plasma treatment in the fourth step. The plasma treatment is performed in an atmosphere containing oxygen in the fourth step. The oxide contains the metal element. The fifth step is a step of removing the oxide. The sixth step is a step of forming a second conductive layer in the opening.

(2) Another embodiment of the present invention is the method for fabricating an electrode that is described in (1) and in which the oxide is removed by washing treatment using a liquid in the fifth step.

(3) Another embodiment of the present invention is the method for fabricating an electrode that is described in (2) and in which the washing treatment includes three or more cycles of the following first to fourth steps. The first step is to supply water such that the washing bath overflows while bubbling the water in the washing bath with the use of a nitrogen gas. The second step is to drain the water from the washing bath while supplying water from a shower to the washing bath. The third step is to rapidly supply water in the washing bath. The fourth step is to supply water such that the washing bath overflows while bubbling the water in the washing bath with the use of a nitrogen gas.

(4) Another embodiment of the present invention is the method for fabricating an electrode described in any one of (1) to (3) in which the first conductive layer is a conductive layer containing tungsten.

(5) Another embodiment of the present invention is the method for fabricating an electrode that is described in any one of (1) to (4) and in which the insulating layer is formed in such a manner that a first metal oxide is formed over a first insulator, a second insulator is former over the first metal oxide, a third insulator is formed over the second insulator, a second metal oxide is formed over the third insulator, and a fourth insulator is formed over the second metal oxide.

(6) Another embodiment of the present invention is the method for fabricating an electrode that is described in (5) and in which the first metal oxide is a metal oxide containing hafnium oxide.

(7) Another embodiment of the present invention is the method for fabricating an electrode that is described in (5) or (6) and in which the second metal oxide is a metal oxide containing aluminum oxide.

(8) Another embodiment of the present invention is the method for fabricating an electrode that is described in any one of (1) to (4) and in which the insulating layer is formed in such a manner that a first insulator is formed, a first metal oxide is formed over the first insulator, and a third insulator is formed over the first metal oxide.

(9) Another embodiment of the present invention is the method for fabricating an electrode that is described in (8) and in which the first metal oxide is a metal oxide containing hafnium oxide.

(10) Another embodiment of the present invention is the method for fabricating an electrode that is described in (8) or (9) and in which the insulating layer is formed in such a manner that a first metal oxide is formed, and a first insulator is formed over the first metal oxide.

(11) Another embodiment of the present invention is the method for fabricating an electrode that is described in (8) and in which the first metal oxide is a metal oxide containing aluminum oxide.

(12) Another embodiment of the present invention is the method for fabricating an electrode that is described in any one of (6), (7), (9), and (10) and in which the metal oxide containing hafnium oxide is etched with a dry etching apparatus using a $C_4F_8$ gas, a hydrogen gas, and an argon gas.

Note that in the method for manufacturing an electrode of one embodiment of the present invention, the oxide semiconductor may be replaced with another semiconductor.

A minute transistor can be provided. Alternatively, a transistor with low parasitic capacitance can be provided. Alternatively, a transistor having a large amount of on-state current can be provided. Alternatively, a transistor having high frequency characteristics can be provided. Alternatively, a transistor with favorable electrical characteristics can be provided. Alternatively, a transistor with stable electrical characteristics can be provided. Alternatively, a transistor with small amount of off-state current can be provided. Alternatively, a novel transistor can be provided. Alternatively, a semiconductor device including the transistor can be provided. Alternatively, a semiconductor device which can operate at high speed can be provided. Alternatively, a novel semiconductor device can be provided. A method for manufacturing a novel semiconductor device can be provided. A module including any of the above semiconductor devices can be provided. An electronic device including any of the above semiconductor devices or the module can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 7A to 7C are a top view and cross-sectional views illustrating the transistor of one embodiment of the present invention.

FIGS. 15A and 15B show cross-sectional TEM images of an a-like OS.

FIGS. 18A to 18C are a top view and cross-sectional views illustrating the manufacturing method of a transistor of one embodiment of the present invention.

FIGS. 19A to 19C are a top view and cross-sectional views illustrating the manufacturing method of a transistor of one embodiment of the present invention.

FIGS. 20A to 20C are a top view and cross-sectional views illustrating the manufacturing method of a transistor of one embodiment of the present invention.

FIGS. 25A to 25C are a top view and cross-sectional views illustrating the manufacturing method of a transistor of one embodiment of the present invention.

FIGS. 27A to 27C are a top view and cross-sectional views illustrating the manufacturing method of a transistor of one embodiment of the present invention.

FIGS. 28A to 28C are a top view and cross-sectional views illustrating the manufacturing method of a transistor of one embodiment of the present invention.

FIGS. 29A to 29C are a top view and cross-sectional views illustrating the manufacturing method of a transistor of one embodiment of the present invention.

FIGS. 32A to 32C are a top view and cross-sectional views illustrating the manufacturing method of a transistor of one embodiment of the present invention.

FIGS. 37A to 37C are a top view and cross-sectional views illustrating the manufacturing method of a transistor of one embodiment of the present invention.

FIGS. 39A to 39C are a top view and cross-sectional views illustrating the manufacturing method of a transistor of one embodiment of the present invention.

FIGS. 40A to 40C are a top view and cross-sectional views illustrating the manufacturing method of a transistor of one embodiment of the present invention.

FIGS. 41A to 41C are a top view and cross-sectional views illustrating the manufacturing method of a transistor of one embodiment of the present invention.

FIGS. 44A to 44C are a top view and cross-sectional views illustrating the manufacturing method of a transistor of one embodiment of the present invention.

FIGS. 52A to 52C are a top view and cross-sectional views illustrating the manufacturing method of a transistor of one embodiment of the present invention.

FIGS. 80A and 80B are cross-sectional STEM images in Example 3.

DETAILED DESCRIPTION OF THE INVENTION

Figure 1:
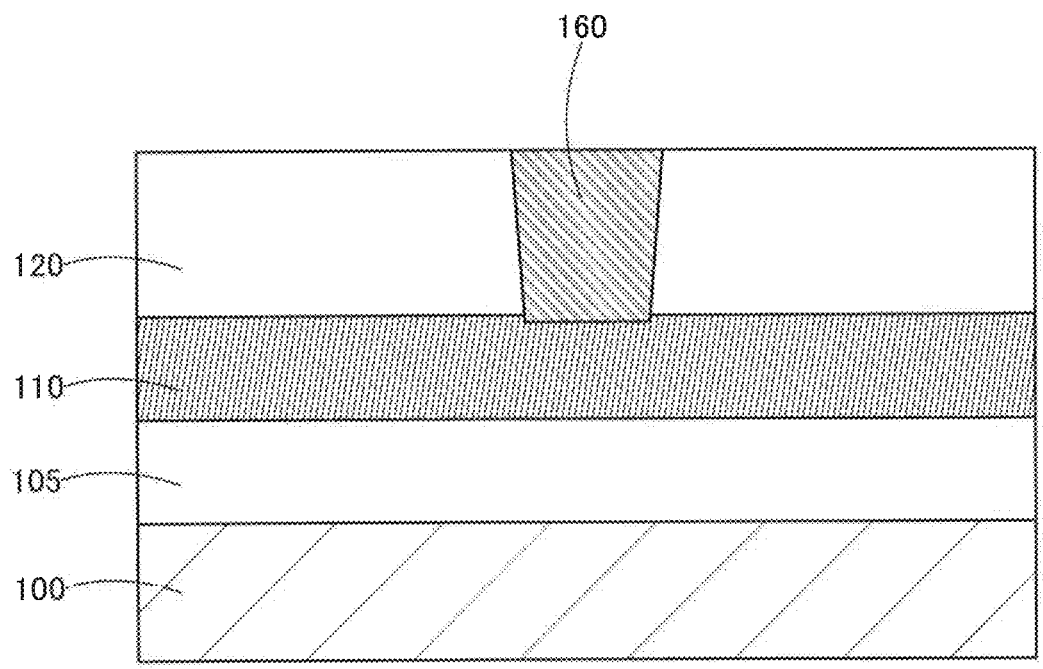
FIG. 1 is a cross-sectional view illustrating an electrode of one embodiment of the present invention.
Figure 2A:
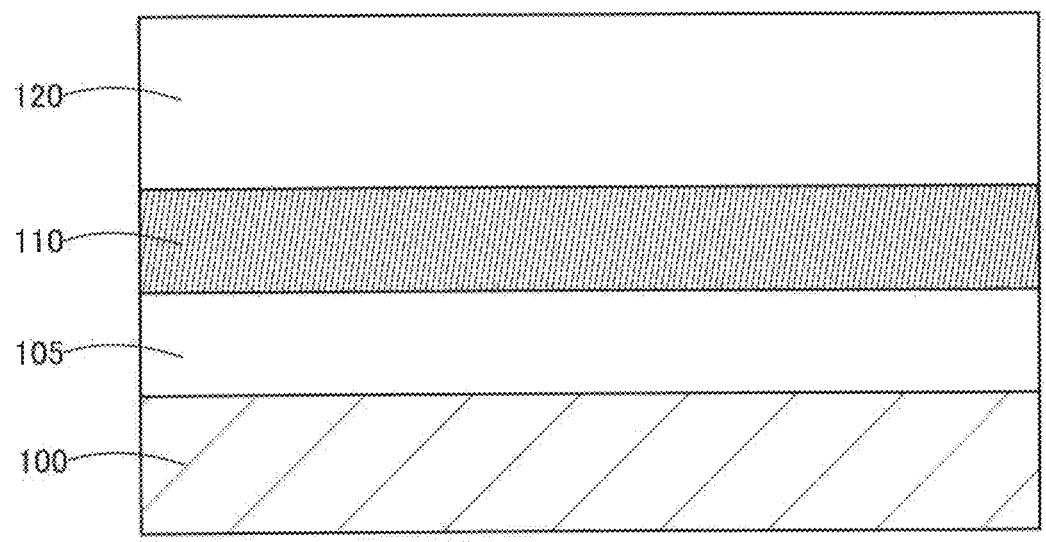
FIGS. 2A and 2B are cross-sectional views illustrating a manufacturing method of an electrode of one embodiment of the present invention.
Figure 2B:
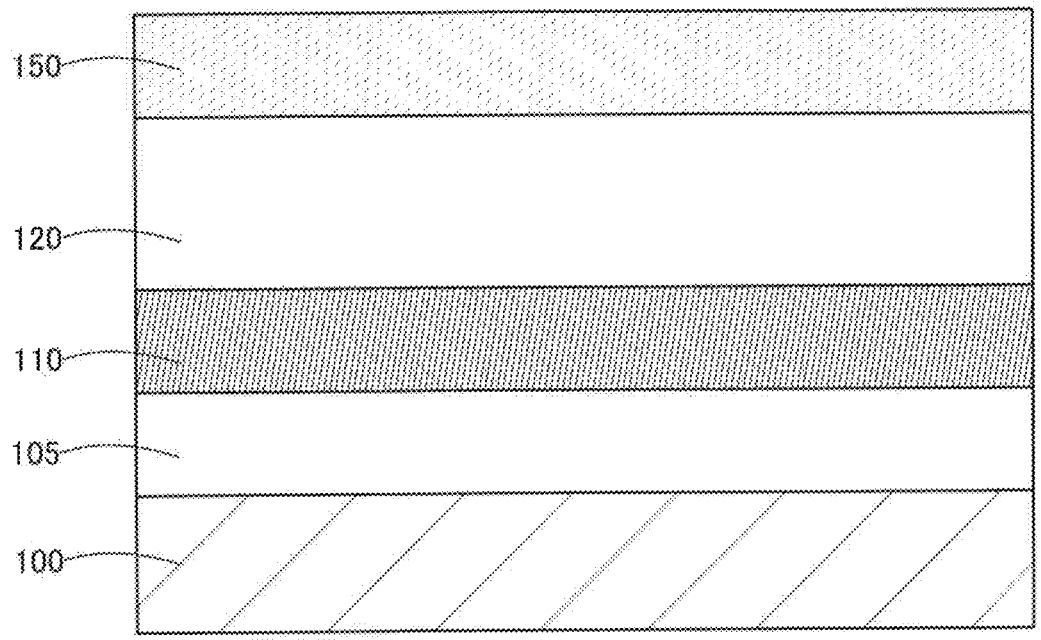

Embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to the description of the embodiments and examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, for example, when the shape of an object is described with use of a term such as "diameter", "grain size", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a voltage refers to a potential difference between a certain potential and a reference potential (e.g., a ground potential (GND) or a source potential) in many cases. A voltage can be referred to as a potential and vice versa.

Note that the ordinal numbers such as "first" and "second" are used for the sake of convenience and do not denote the order of steps or the stacking order of layers. Therefore, for example, description can be given even when "first" is replaced with "second" or "third", as appropriate. In addition, the ordinal numbers in this specification and the like are not necessarily the same as those which specify one embodiment of the present invention.

Note that an impurity in a semiconductor refers to, for example, elements other than the main components of a semiconductor. For example, an element with a concentration of lower than 0.1 atomic % is an impurity. When an impurity is contained, the density of states (DOS) might be formed in a semiconductor, the carrier mobility might be decreased, or the crystallinity might be decreased, for example In the case where the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (contained in water), lithium, sodium, silicon, boron, phosphorus, carbon, and nitrogen, for example In the case where the semiconductor is an oxide semiconductor, oxygen vacancies might be formed by entry of an impurity. When the semiconductor is a silicon, examples of an impurity which changes the characteristics of the semiconductor include oxygen, Group 1 elements except hydrogen, Group 2 elements, Group 13 elements, and Group 15 elements.

The channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed in a side surface of a semiconductor is increased in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Thus, in this specification, in a top view of a transistor, an apparent channel width that is the length of a portion where a source and a drain face each other in a region where a semiconductor region and a gate electrode overlap with each other is referred to as a surrounded channel width (SCW) in some cases. Furthermore, in this specification, the term "channel width" may denote a surrounded channel width, an apparent channel width, or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate the field-effect mobility, the current value per channel width, and the like of a transistor. In this case, the obtained value is sometimes different from the value obtained by using an effective channel width for the calculation.

Note that in this specification, the description "A has a shape such that an end portion extends beyond an end portion of B" may indicate, for example, the case where at least one of end portions of A is positioned so as to extend beyond at least one of end portions of B in a top view or a cross-sectional view. Thus, the description "A has a shape such that an end portion extends beyond an end portion of B" can be read as the description "one end portion of A is positioned so as to extend beyond one end portion of B in a top view," for example In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a structure and a fabricating method of an electrode of one embodiment of the present invention will be described.

FIG. 1 is a cross-sectional view of an electrode of one embodiment of the present invention. The electrode includes an insulating layer 105 over a substrate 100, a conductive layer 110 over the insulating layer 105, an insulating layer 120 over the conductive layer 110, and a conductive layer 160 provided in an opening formed in the insulating layer 120.

The method for fabricating the electrode in FIG. 1 of one embodiment of the present invention will be described with reference to FIGS. 2A and 2B to FIGS. 5A and 5B.

First, the insulating layer 105 is formed over the substrate 100.

The insulating layer 105 may be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods be classified into a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., a transistor or a capacitor), or the like included in a semiconductor device might be charged up by receiving electric charge from plasma. In that case, accumulated electric charge might break the wiring, electrode, element, or the like included in the semiconductor device. Such plasma damage is not caused in the case of using a TCVD method not using plasma, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles released from a target or the like are deposited, in a CVD method and an ALD method, a film is formed by a reaction at a surface of an object. Thus, a CVD method and an ALD method enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate; thus, it is sometimes preferable to combine an ALD method with another deposition method with a high deposition rate, such as a CVD method.

When a CVD method or an ALD method is used, the composition of a film to be formed can be controlled with a flow rate ratio of the source gases. For example, with a CVD method or an ALD method, a film with a desired composition can be formed by adjusting the flow rate ratio of the source gases. Moreover, with a CVD method or an ALD method, by changing the flow rate ratio of the source gases while forming a film, the film whose composition is continuously changed can be formed. In the case where a film is formed while changing the flow rate ratio of the source gases, as compared to the case where a film is formed using a plurality of deposition chambers, time taken for the deposition can be reduced because time taken for transfer and pressure adjustment is omitted. Thus, semiconductor devices can be manufactured with improved productivity.

The insulating layer 105 may be formed using, for example, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon oxide; silicon nitride oxide; or silicon nitride. Furthermore, the insulating layer 105 may be a multi-layer film in which two or more of the above insulators are formed as appropriate.

Then, the conductive layer 110 is formed over the insulating layer 105. The conductive layer can be formed using tantalum nitride, tungsten nitride, or titanium nitride, for example. Alternatively, a layered film formed using the conductive layer and tantalum, tungsten, titanium, molybdenum, aluminum, copper, or a molybdenum-tungsten alloy can be used. The conductive layer can be formed by a sputtering method, a CVD method, an MBE method, a PLD method, an ALD method, or the like. Note that the conductive layer 110 may be processed by a lithography method to form a wiring layer.

Then, the insulating layer 120 is formed over the conductive layer 110. The insulating layer 120 can be formed in a manner similar to that of the insulating layer 105. Alternatively, the insulating layer 120 may be formed using, for example, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon oxide; silicon oxynitride; silicon nitride oxide; or silicon nitride. Furthermore, the insulating layer 120 may be a multi-layer film in which two or more of the above insulators are formed as appropriate (see FIG. 2A).

Then, a mask layer 150 is provided over the insulating layer 120. A resist can be used as the mask layer 150. Alternatively, a conductor may be formed over the insulating layer 120, and a resist may be provided over the conductor. Alternatively, an insulator may be formed over the insulating layer 120, and a resist may be provided over the insulator. Alternatively, a conductor may be formed over the insulating layer 120, an insulator may be formed over the conductor, and a resist may be provided over the insulator. Alternatively, an insulator may be formed over the insulating layer 120, a conductor may be formed over the insulator, and a resist may be provided over the conductor. In the above manner, the mask layer 150 may be formed by providing a resist over a multi-layer film including any of the conductors and the insulators selected as appropriate. Note that an organic coating film may be positioned under the resist. The organic coating film positioned under the resist may improve adhesion between the resist and a layer under the resist (see FIG. 2B).

Figure 3A:
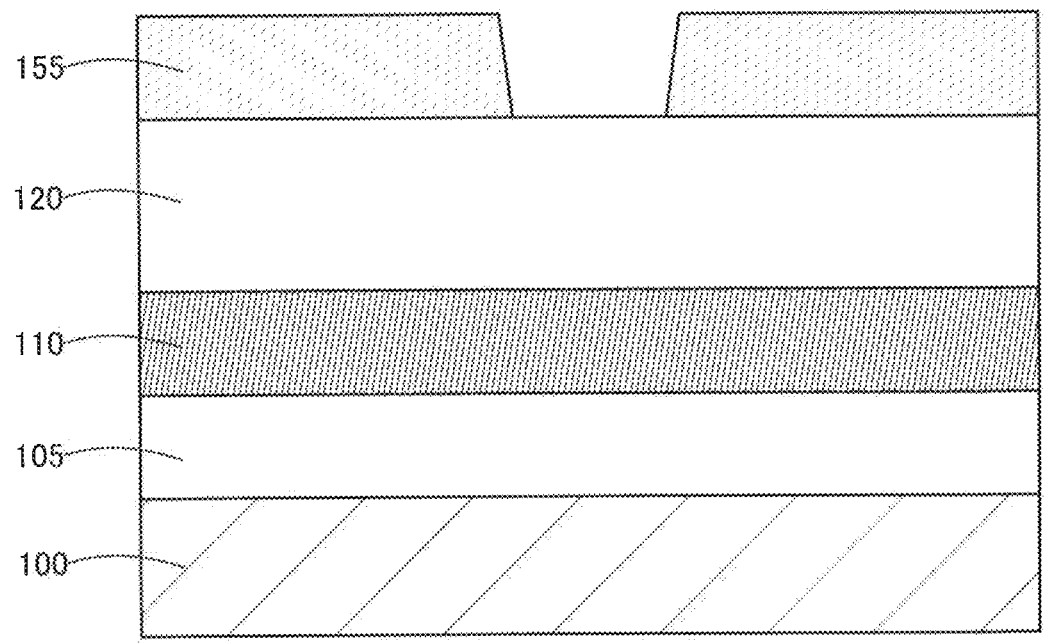
FIGS. 3A and 3B are cross-sectional views illustrating the manufacturing method of an electrode of one embodiment of the present invention.
Figure 3B:
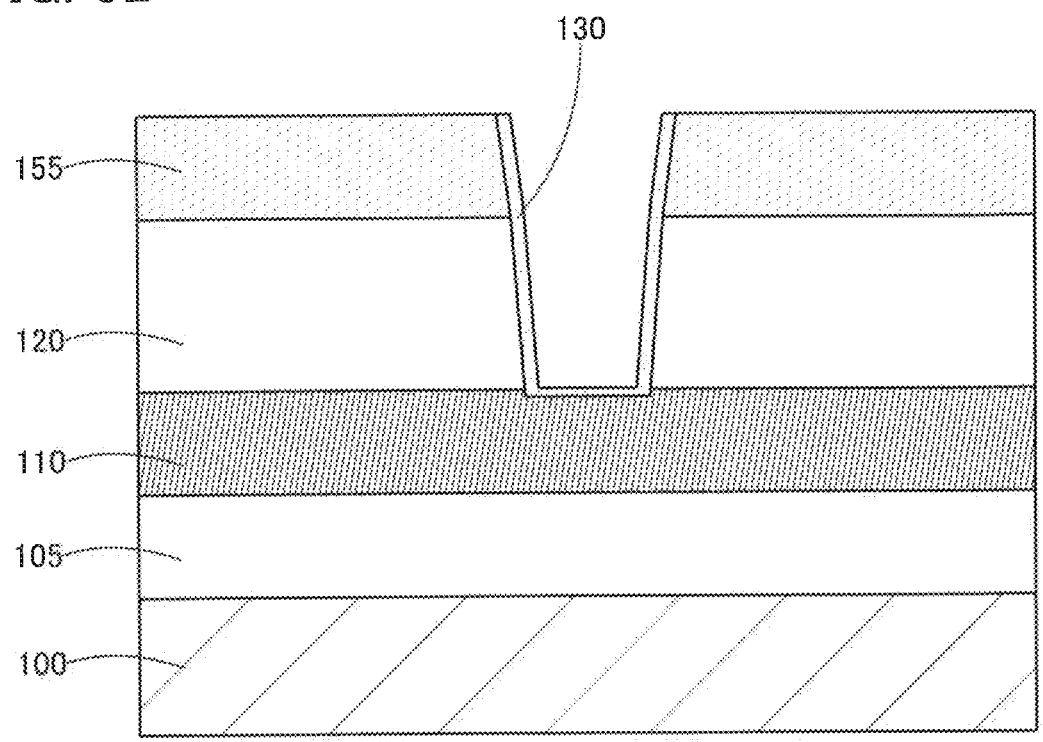

After that, the mask layer 150 is processed by a lithography method to form an etching mask layer 155 (see FIG. 3A).

In a lithography method, first, a resist is exposed to light through a photomask. Next, a region exposed to light is removed or left using a developing solution, so that a resist mask is formed. Then, etching through the resist mask is conducted. As a result, the conductor, the semiconductor, the insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing or wet etching treatment can be used for removal of the resist mask. Alternatively, wet etching treatment is performed after dry etching treatment. Still alternatively, dry etching treatment is performed after wet etching treatment.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Subsequently, an opening is formed in the insulating layer 120 so as to reach the conductive layer 110 by a dry etching method using the etching mask layer 155 as a mask. As a gas for dry etching, for example, a $C_4F_6$ gas, a $C_4F_8$ gas, a $CF_4$ gas, a $SF_6$ gas, a $CHF_3$ gas, or the like can be used alone or in combination. Alternatively, an oxygen gas, one or more of a helium gas, an argon gas, a hydrogen gas, and the like can be added to any of the above gases as appropriate. For example, as a dry etching apparatus, any of the above dry etching apparatuses can be used; however, a dry etching apparatus in which high-frequency power sources with different frequencies are connected to the parallel-plate electrodes is preferably used.

In the case where the insulating layer 120 is a multi-layer film including two or more insulators, the gas most suitable for each insulator is selected as appropriate. In the case where the insulating layer 120 contains hafnium oxide, a mixed gas of a $C_4F_8$ gas, an argon gas, and a hydrogen gas is preferably used as a gas for dry etching of the hafnium oxide.

In forming an opening by a dry etching method, a product 130 is deposited on the side surface and the bottom surface of the opening. The gas used for the dry etching, the etching mask layer 155, and the insulating layer 120 to be etched react in plasma, whereby the product 130 is deposited on the side surface of the opening. Meanwhile, on the bottom surface of the opening, the rate of an etching reaction between etching species in plasma and the insulating layer 120 in plasma is higher than the rate at which the product 130 is deposited. Thus, the product 130 is unlikely to be deposited on the bottom surface of the opening while the insulating layer 120 is etched. However, when the bottom part of the opening reaches the conductive layer 110, the rate of an etching reaction between the etching species and the conductive layer 110 becomes lower than the rate at which the product is deposited; consequently, the product 130 may be deposited on the conductive layer 110 at the bottom part of the opening (see FIG. 3B).

Then, plasma treatment using an oxygen gas is performed to remove the product 130. The aforementioned dry etching apparatus can be used for the plasma treatment using an oxygen gas. As soon as the opening is formed in the insulating layer 120, the plasma treatment using an oxygen gas is performed. Performing the successive processings can improve productivity or can prevent attachment of dust and contamination by atmospheric components.

The oxygen plasma treatment oxidizes the top surface of the conductive layer 110 at the bottom part of the opening in the insulating layer 120. In the case where the conductive layer 110 contains a metal, a metal oxide 115 might be formed. The metal oxide 115 might serve as an insulator or a resistor; thus, the metal oxide 115 is preferably removed for favorable electrical connection between the conductive layer 160 to be formed later and the conductive layer 110 (see FIG. 4A).

In order to remove the metal oxide 115, a removing method using a liquid can be employed. Washing treatment using a liquid is preferably performed to remove the metal oxide, in which case plasma damage and the like are not caused.

Here, a washing treatment method of one embodiment of the present invention to remove the metal oxide with the use of a liquid will be described.

For the washing, pure water, diluted hydrofluoric acid, a liquid (carbonated water) whose electric resistance is reduced by mixing $CO_2$ into pure water, or the like can be used. Here, washing using pure water or carbonated water is performed.

As a washing apparatus, a batch-type washing apparatus is used. In the batch-type washing apparatus, a substrate cassette that can hold one or more substrates is put in a washing bath so that washing can be performed.

Washing steps are as follows: a first step of supplying pure water or carbonated water such that the washing bath overflows while bubbling the pure water or carbonated water in the washing bath with the use of a nitrogen gas; a second step of eliminating the pure water or carbonated water in the washing bath while supplying pure water or carbonated water from a shower to the washing bath; a third step of rapidly supplying pure water or carbonated water in the washing bath; and a fourth step of supplying pure water or carbonated water such that the washing bath overflows while bubbling the pure water or carbonated water in the washing bath with the use of a nitrogen gas.

The washing method includes the first step, the second step, the third step, and the fourth step in each cycle, and may be called quick dump rinsing (QDR) washing.

Figure 4A:
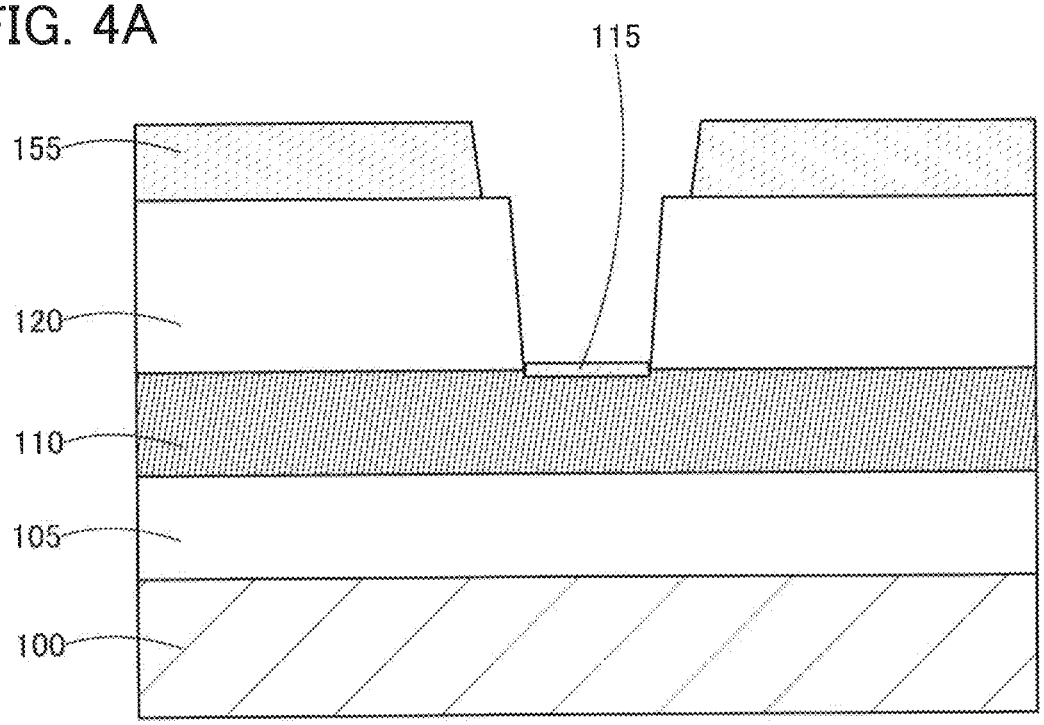
FIGS. 4A and 4B are cross-sectional views illustrating the manufacturing method of an electrode of one embodiment of the present invention.
Figure 4B:
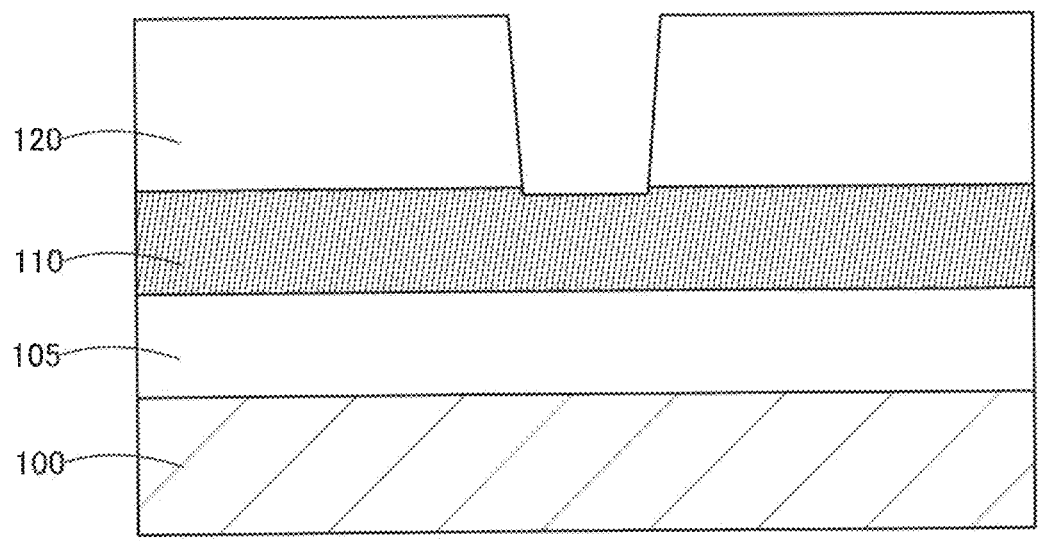
Figure 5A:
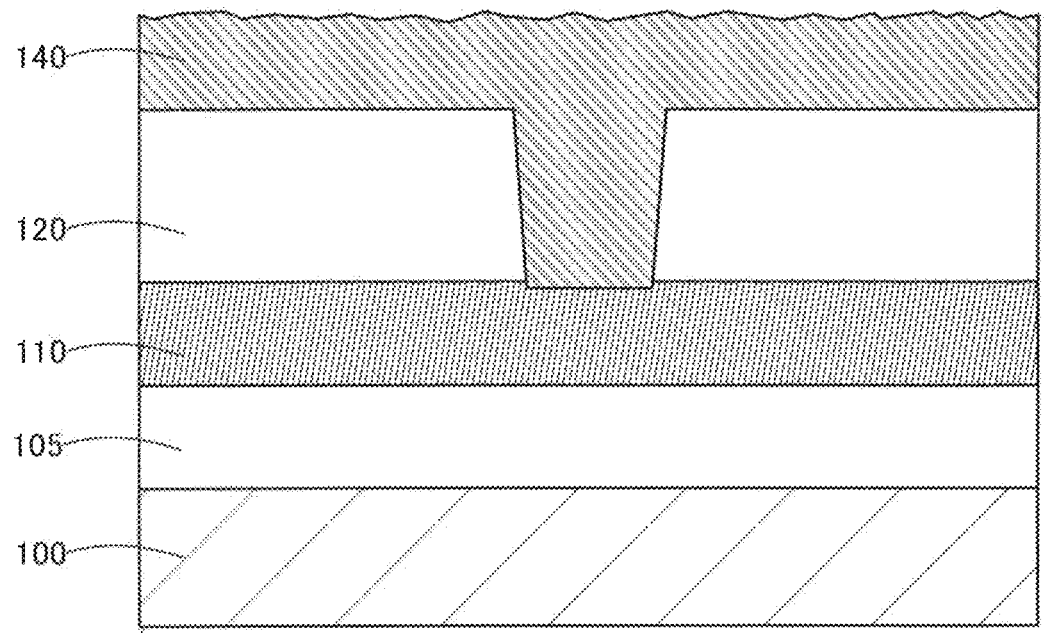
FIGS. 5A and 5B are cross-sectional views illustrating the manufacturing method of an electrode of one embodiment of the present invention.
Figure 5B:
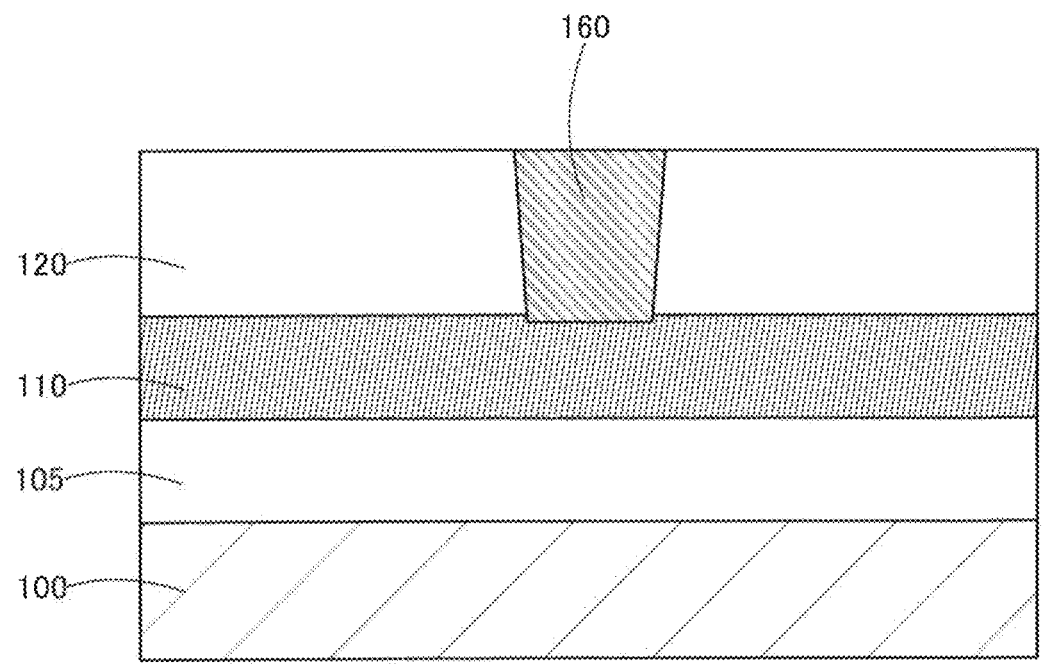

The QDR washing is performed to remove the metal oxide 115 (see FIG. 4B). The QDR washing is preferably performed three or more cycles, more preferably five or more cycles.

Next, a conductive layer 140 is formed. The conductive layer 140 can be formed by a sputtering method, a CVD method, an MBE method, a PLD method, an ALD method, or the like. The conductive layer 140 is formed so as to fill the opening formed by the insulating layer 120 and the like. Therefore, a CVD method (a MCVD method, in particular) is preferred. A multilayer film of a conductor deposited by an ALD method or the like and a conductor formed by a CVD method is preferred in some cases to increase adhesion between the insulating layer 120 and the conductor formed by an MCVD method. For example, a multilayer film in which titanium nitride and tungsten are deposited in this order or the like can be used (see FIG. 5A).

Then, the conductive layer 140 is subjected to chemical mechanical polishing (CMP) treatment until the top surface of the insulating layer 120 is reached. Consequently, the conductive layer 160 is embedded in the opening in the insulating layer 120. Through the above steps, the electrode illustrated in FIG. 1 can be fabricated (see FIG. 5B).

Embodiment 2

<Transistor Structure 1>

A structure of a transistor included in a semiconductor device of one embodiment of the present invention will be described below.

Figure 6A:
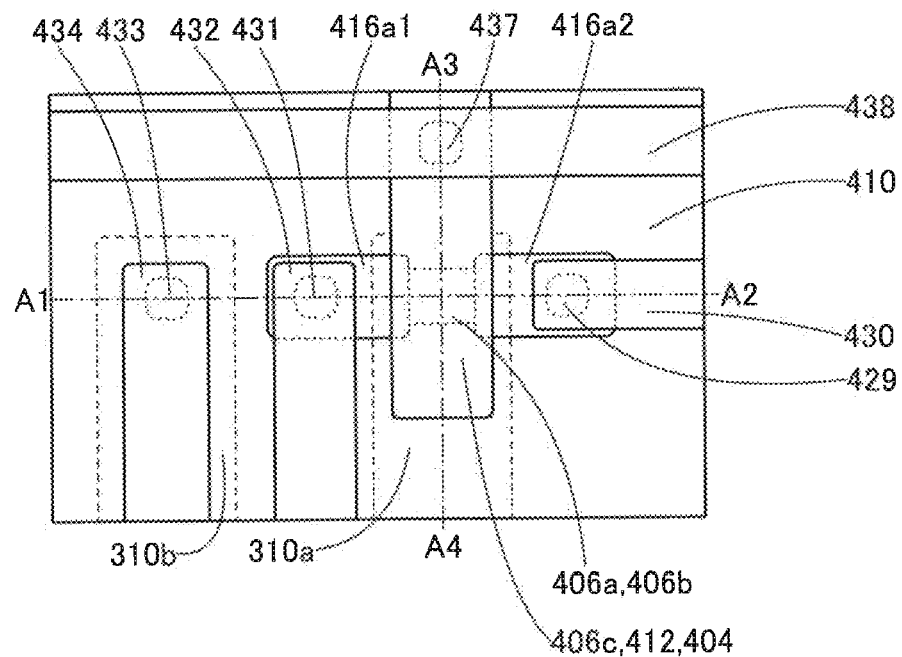
FIGS. 6A to 6C are a top view and cross-sectional views illustrating the transistor of one embodiment of the present invention.
Figures 6B, 6C:
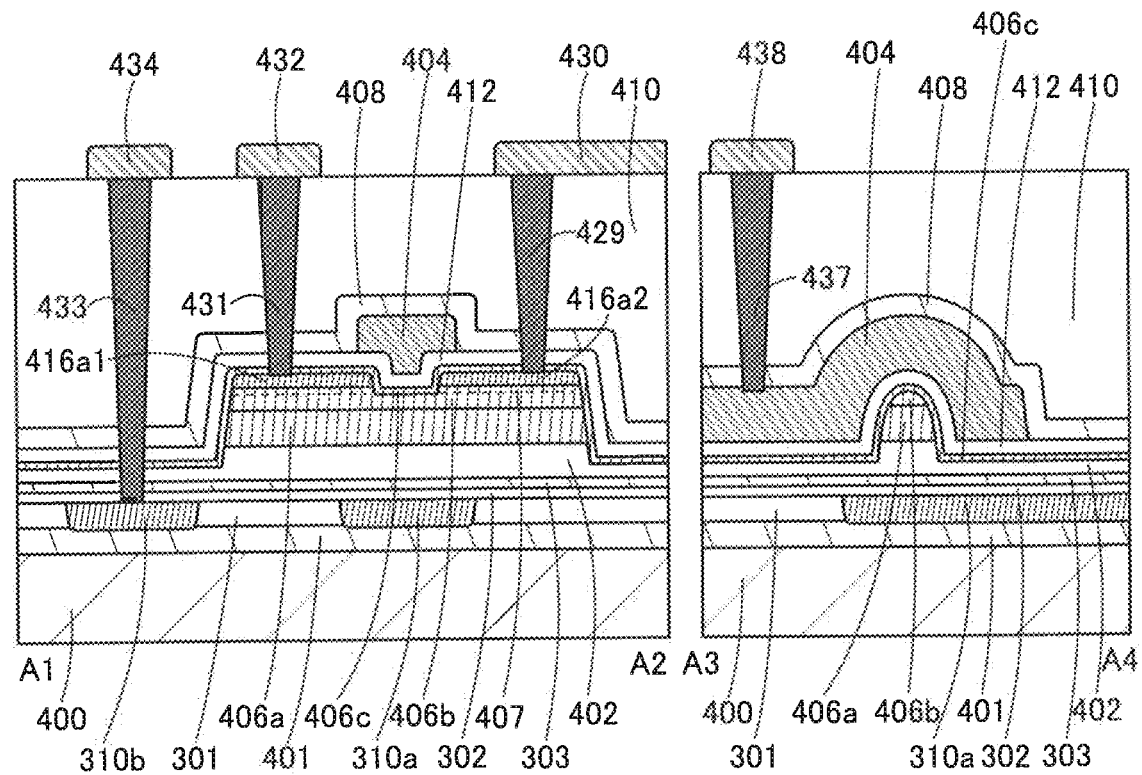

FIGS. 6A to 6C are a top view and cross-sectional views of a semiconductor device of one embodiment of the present invention. FIG. 6A is the top view, and FIGS. 6B and 6C are the cross-sectional views taken along dashed-dotted lines A1-A2 and A3-A4 in FIG. 6A, respectively. Note that for simplification of the drawing, some components are not illustrated in the top view in FIG. 6A.

In FIGS. 6B and 6C, the transistor includes an insulator 401 over a substrate 400; an insulator 301 over the insulator 401; conductors 310a and 310b in openings of the insulator 301; an insulator 302 over the insulator 301 and conductors 310a and 310b; an electron trap layer 303 over the insulator 302; an insulator 402 over the electron trap layer 303; an insulator 406a over the insulator 402; a semiconductor 406b over the insulator 406a; conductors 416a1 and 416a2 each having a region in contact with a top surface of the semiconductor 406b; an insulator 406c having regions in contact with the top of the insulator 402, side surfaces of the insulator 406a, the top surface and side surfaces of the semiconductor 406b, a top surface and side surfaces of the conductor 416a1, and a top surface and side surfaces of the conductor 416a2; an insulator 412 over the insulator 406c; a conductor 404 overlapping with the semiconductor 406b with the insulator 412 positioned therebetween; an insulator 408 over the insulator 412 and the conductor 404; an insulator 410 over the insulator 408; a first opening reaching the conductor 310b through the insulators 410, 408, 412, 406c, and 402, the electron trap layer 303, and the insulator 302; a second opening reaching the conductor 416a1 through the insulators 410, 408, 412, and 406c; a third opening reaching the conductor 416a2 through the insulators 410, 408, 412, and 406c; a fourth opening reaching the conductor 404 through the insulators 410 and 408; a conductor 433, a conductor 431, a conductor 429, and a conductor 437 that are embedded in the first opening, the second opening, the third opening, and the fourth opening, respectively; a conductor 434 that is over the insulator 410 and includes a region in contact with the conductor 433; a conductor 432 over the insulator 410, which includes a region in contact with the conductor 431; a conductor 430 over the insulator 410, which includes a region in contact with the conductor 429; and a conductor 438 that is over the insulator 410 and includes a region in contact with the conductor 437.

Figure 10A:
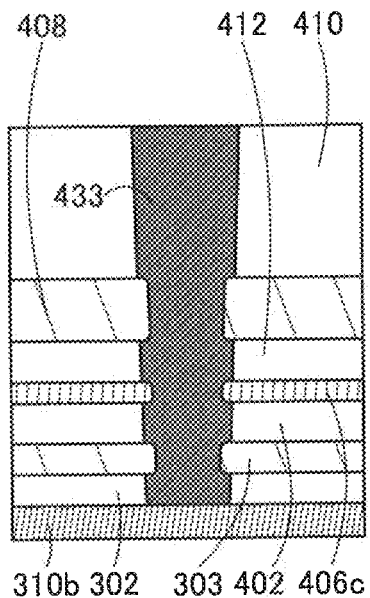
FIGS. 10A to 10F are cross-sectional views each illustrating part of a transistor of one embodiment of the present invention.
Figure 10B:
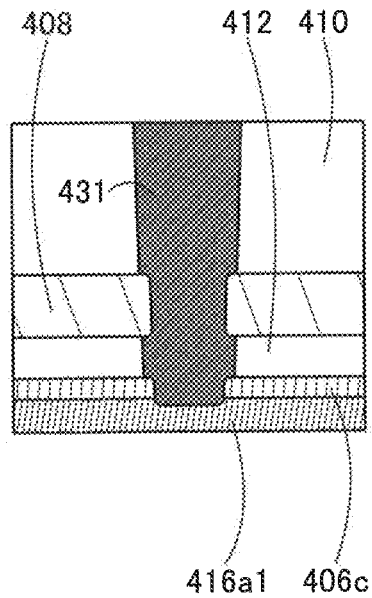
Figure 10C:
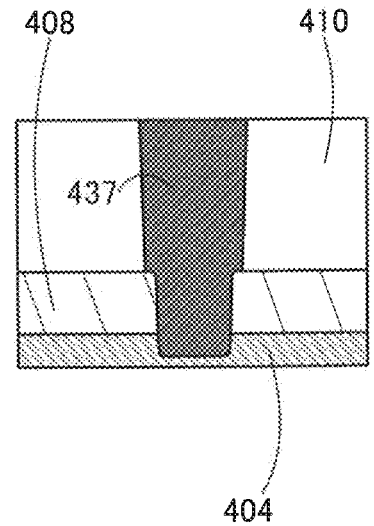

The shapes of cross sections of the openings of one embodiment of the present invention will be described with reference to FIGS. 10A to 10C. FIGS. 10A to 10C are enlarged cross-sectional views of the openings of the transistor shown in FIGS. 6A to 6C. FIG. 10A is an enlarged view of the first opening. FIG. 10B is an enlarged view of the second opening. FIG. 10C is an enlarged view of the fourth opening. Note that in FIGS. 10A to 10C, the insulator 410 is thin in its thickness direction for convenience of explanation.

Although the openings in FIGS. 6B and 6C have straight cross sections, the openings each may have a shape in which the opening diameter of a layer is larger or smaller than those of layers positioned thereover and thereunder or larger or smaller than that of a layer positioned thereover or thereunder as illustrated in FIGS. 10A to 10C. In the first opening in FIG. 10A, the opening diameter of each of the insulators 410, 412, 402, and 302 is larger than those of layers positioned thereover and thereunder or a layer positioned thereover or thereunder. In other words, the opening diameter of each of the insulators 408 and 406c and the electron trap layer 303 is smaller than those of layers positioned thereover and thereunder. In other words, the opening of each of the insulator 408, the insulator 406c, and the electron trap layer 303 is constricted. In the second opening in FIG. 10B, the opening diameter of each of the insulators 410 and 412 is larger than those of layers positioned thereover and thereunder or that of a layer positioned thereunder. In other words, the opening diameter of each of the insulators 408 and 406c is smaller than those of layers positioned thereover and thereunder or that of a layer positioned thereover. In other words, the opening of each of the insulators 408 and 406c is constricted. In the fourth opening in FIG. 10C, the opening diameter of the insulator 410 is larger than that of a layer positioned thereunder. In other words, the opening diameter of the insulator 408 is smaller than that of a layer positioned thereover. In other words, the opening of the insulator 408 is constricted. Such shapes are obtained in some cases when etching rates of the insulators 410, 412, 402, and 302 are higher than those of the insulator 408, the insulator 406a, and the electron trap layer 303.

In a bottom part of the opening in FIG. 10B, part of the top surface of the conductor 416a1 is dented. This is because the time needed to form the first opening and the time needed to form the second opening are different from each other, and the conductor 416a1 is over-etched to be partly etched during a period after the second opening is formed and before the first opening is formed. Similarly, in a bottom part of the opening in FIG. 10C, part of the top surface of the conductor 404 is dented. This is because the time needed to form the first opening and the time needed to form the fourth opening are different from each other, and the conductor 404 is over-etched to be partly etched during a period after the fourth opening is formed and before the first opening is formed. Note that in FIGS. 10A to 10C, examples are illustrated in which the opening diameter of a layer is larger than those of layers positioned thereover and thereunder or the conductor has a dented portion; however, the sizes of the wider portion of the opening and the dented portion of the conductive film are not limited to those examples.

Note that the semiconductor 406b includes regions 407 in each of which the top surface of the semiconductor 406b is in contact with the conductor 416a1 or 416a2.

In the transistor, the conductor 404 functions as a first gate electrode. Furthermore, the conductor 404 can have a layered structure including a conductor that hardly allows oxygen to pass therethrough. For example, when the conductor that hardly allows oxygen to pass therethrough is formed as a lower layer, an increase in the electric resistance value due to oxidization of the conductor 404 can be prevented. The insulator 412 functions as a gate insulator.

The conductors 416a1 and 416a2 function as a source electrode and a drain electrode. The conductors 416a1 and 416a2 can each have a layered structure including a conductor that hardly allows oxygen to pass therethrough. For example, when the conductor that hardly allows oxygen to pass therethrough is formed as an upper layer, an increase in the electric resistance value due to oxidization of the conductors 416a1 and 416a2 can be prevented. Note that the electric resistance values of the conductors can be measured by a two-terminal method or the like.

The resistance of the semiconductor 406b can be controlled by a potential applied to the conductor 404. That is, conduction or non-conduction between the conductors 416a1 and 416a2 can be controlled by the potential applied to the conductor 404.

As illustrated in FIGS. 6B and 6C, the top surface of the semiconductor 406b is in contact with the conductors 416a1 and 416a2. In addition, the insulator 406a and the semiconductor 406b can be electrically surrounded by an electric field of the conductor 404 functioning as the first gate electrode. A structure in which a semiconductor is electrically surrounded by an electric field of a gate electrode is referred to as a surrounded channel (s-channel) structure. Therefore, a channel is formed in the entire semiconductor 406b (bulk) in some cases. In the s-channel structure, a large amount of current can flow between a source and a drain of the transistor, so that an on-state current can be increased. In addition, since the insulator 406a and the semiconductor 406b are surrounded by the electric field of the conductor 404, an off-state current can be decreased.

The conductor 310a functions as a second gate electrode. The conductor 310a can be a multilayer film containing a conductive film that hardly allows oxygen to pass therethrough. When the conductor 310a is a multilayer film including a conductive film that hardly allows oxygen to pass therethrough, a reduction in conductivity caused by oxidization of the conductor 310a can be prevented. The insulator 302, the electron trap layer 303, and the insulator 402 function as a second gate insulating film. The threshold voltage of the transistor can be controlled by a potential applied to the conductor 310a. In addition, by the potential applied to the conductor 310a, electrons are injected to the electron trap layer 303 and thus the threshold voltage of the transistor can be controlled. The first gate electrode and the second gate electrode electrically connected to each other can increase the on-state current. Note that the function of the first gate electrode and that of the second gate electrode may be interchanged.

Figure 11A:
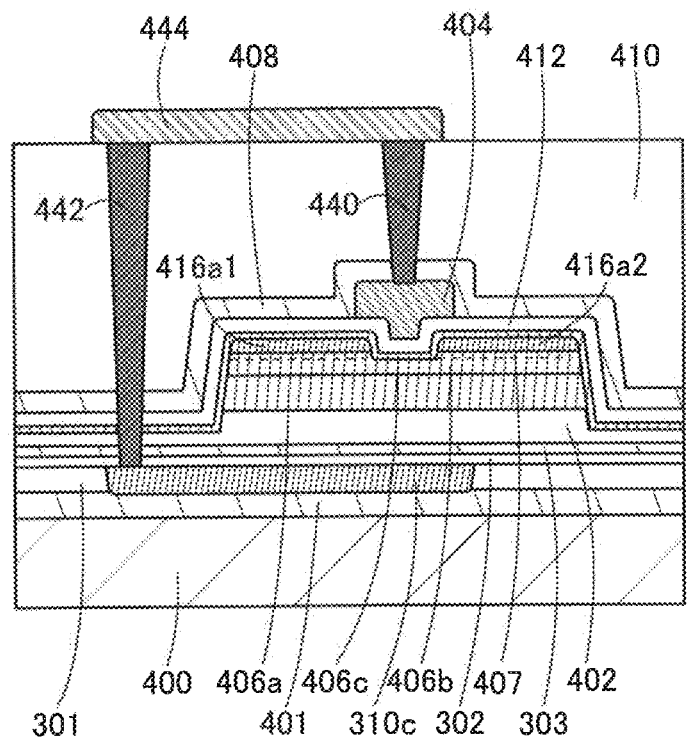
FIGS. 11A and 11B are cross-sectional views illustrating transistors of embodiments of the present invention.

FIG. 11A illustrates an example in which the first gate electrode and the second gate electrode are electrically connected. In an opening reaching the conductor 404 through the insulator 410, a conductor 440 is embedded, and a top surface of the conductor 440 is electrically connected to a conductor 444 formed over the insulator 410. In an opening reaching a conductor 310c through the insulator 410, the insulator 408, the insulator 412, the insulator 406c, the insulator 402, the electron trap layer 303, and the insulator 302, the conductor 442 is embedded, and a top surface of the conductor 442 and the conductor 444 are electrically connected. That is, the conductor 404 functioning as the first gate electrode is electrically connected to the conductor 310c functioning as the second gate electrode through the conductors 440, 444, and 442.

Note that the transistor is surrounded by an insulator which has a function of blocking oxygen and impurities such as hydrogen, whereby stable electric characteristics can be obtained. For example, as the insulator 408, an insulator which has a function of blocking oxygen and impurities such as hydrogen may be used.

An insulator which has a function of blocking oxygen and impurities such as hydrogen may be formed to have a single-layer structure or a layered structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 408 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 408 preferably contains aluminum oxide. For example, when the insulator 408 is formed using plasma including oxygen, oxygen can be added to the insulator 412 serving as a base layer of the insulator 408. The oxygen added to the insulator 412 is excess oxygen. When the insulator 408 contains aluminum oxide, entry of impurities such as hydrogen into the semiconductor 406b can be inhibited. Furthermore, when the insulator 408 contains aluminum oxide, for example, outward diffusion of excess oxygen added to the insulator 412 described above can be reduced.

The insulator 401 may be formed using, for example, aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 401 preferably includes aluminum oxide or silicon nitride. For example, when the insulator 401 includes aluminum oxide or silicon nitride, entry of impurities such as hydrogen into the semiconductor 406b can be inhibited. Furthermore, when the insulator 401 includes aluminum oxide or silicon nitride, for example, outward diffusion of oxygen can be reduced.

The insulator 301 may be formed to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 301 preferably includes silicon oxide or silicon oxynitride.

The electron trap layer 303 may be formed to have, for example, a single-layer structure or a layered structure including an insulator or a metal oxide film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the electron trap layer 303 preferably contains silicon nitride, hafnium oxide, or aluminum oxide.

The insulators 302 and 402 may each be formed to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

Note that the insulator 410 preferably includes an insulator with a low dielectric constant. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a layered structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the layered structure can have thermal stability and a low dielectric constant. Examples of the resin include polyester, polyolefin, polyamide (e.g., nylon or aramid), polyimide, polycarbonate, and acrylic.

The insulator 412 may be formed to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 412 preferably includes silicon oxide or silicon oxynitride.

Note that the insulator 412 preferably contains an insulator with a high dielectric constant. For example, the insulator 412 preferably includes gallium oxide, hafnium oxide, an oxide including aluminum and hafnium, an oxynitride including aluminum and hafnium, an oxide including silicon and hafnium, an oxynitride including silicon and hafnium, or the like. The insulator 412 preferably has a layered structure including silicon oxide or silicon oxynitride and an insulator with a high dielectric constant. Since silicon oxide and silicon oxynitride have thermal stability, combination of silicon oxide or silicon oxynitride with an insulator with a high dielectric constant allows the layered structure to be thermally stable and have a high dielectric constant. For example, when aluminum oxide, gallium oxide, or hafnium oxide of the insulator 412 is on the insulator 406c side, entry of silicon included in the silicon oxide or the silicon oxynitride into the semiconductor 406b can be suppressed. When silicon oxide or silicon oxynitride is on the insulator 406c side, for example, trap centers might be formed at the interface between aluminum oxide, gallium oxide, or hafnium oxide and silicon oxide or silicon oxynitride. In some cases, the trap centers can shift the threshold voltage of the transistor in the positive direction by trapping electrons.

Each of the conductors 416a1 and 416a2 may be formed to have a single-layer structure or a layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. Alternatively, a film of an alloy or compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

Each of the conductors 310a, 310b, 310c, 404, 429, 430, 431, 432, 433, 434, 437, 438, 440, 442, and 444 may be formed to have, for example, a single-layer structure or a layered structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. Alternatively, a film of an alloy or compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

As the semiconductor 406b, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The insulator 406a and the insulator 406c are desirably oxides including one or more, or two or more elements other than oxygen included in the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

<Transistor Structure 2>

A transistor having a structure different from that in FIGS. 6A to 6C will be described with reference to FIGS. 7A to 7C. FIGS. 7A to 7C are a top view and cross-sectional views of a semiconductor device of one embodiment of the present invention. FIG. 7A is the top view, and FIGS. 7B and 7C are the cross-sectional views taken along dashed-dotted lines A1-A2 and A3-A4 in FIG. 7A, respectively. Note that for simplification of the drawing, some components are not illustrated in the top view in FIG. 7A.

As illustrated in FIGS. 7A to 7C, the transistor has a structure different from that in FIGS. 6A to 6C in that the conductor 404 functioning as the first gate electrode overlaps with neither the conductor 416a1 functioning as the source electrode nor the conductor 416a2 functioning as the drain electrode.

Since the conductor 404 functioning as the first gate electrode overlaps with neither the conductor 416a1 functioning as the source electrode nor the conductor 416a2 functioning as the drain electrode, parasitic capacitance is not generated between the conductor 404 functioning as the gate electrode and the conductor 416a1 or the 416a1 functioning as the source electrode or the drain electrode, which is favorable for high-speed operation of the transistor. In addition, this structure can prevent a leakage current between the conductor 404 functioning as the first gate electrode and the conductor 416a1 or 416a2 functioning as the source electrode or the drain electrode. For the other components, refer to the above description.

<Transistor Structure 3>

Figure 8A:
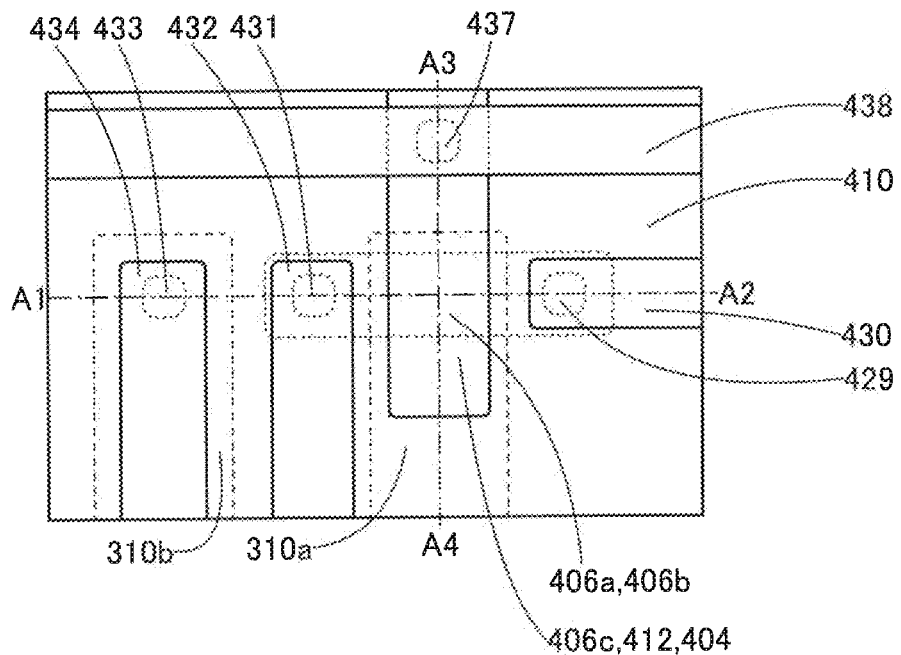
FIGS. 8A to 8C are a top view and cross-sectional views illustrating the transistor of one embodiment of the present invention.
Figures 8B, 8C:
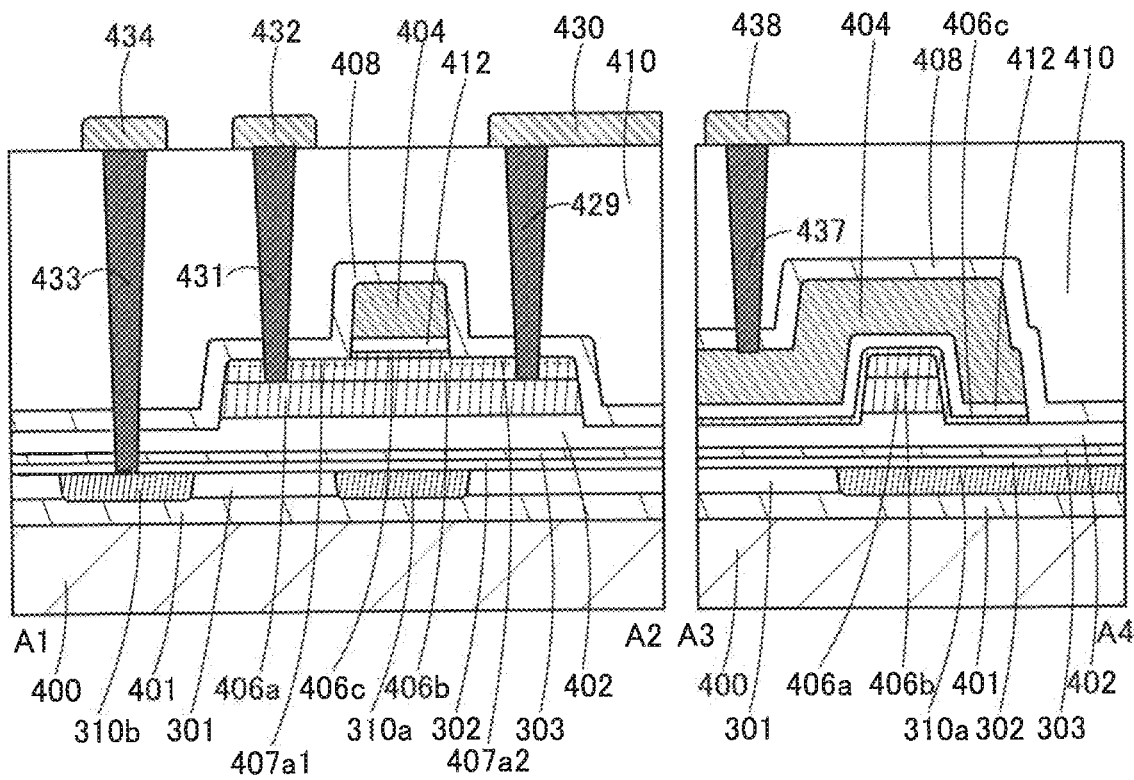

A transistor having a structure different from that in FIGS. 7A to 7C will be described with reference to FIGS. 8A to 8C. FIGS. 8A to 8C are a top view and cross-sectional views of a semiconductor device of one embodiment of the present invention. FIG. 8A is the top view, and FIGS. 8B and 8C are the cross-sectional views taken along dashed-dotted lines A1-A2 and A3-A4 in FIG. 8A, respectively. Note that for simplification of the drawing, some components are not illustrated in the top view in FIG. 8A.

As illustrated in FIGS. 8A to 8C, the transistor has a structure different from that in FIGS. 7A to 7C in that it does not include the conductors 416a1 and the 416a2 functioning as the source electrode and the drain electrode, and includes: regions 407a1 and 407a2 functioning as a source region and a drain region; an opening reaching the insulator 406a through the insulator 410, the insulator 408, the insulator 412, the region 407a1, and the semiconductor 406b; and an opening reaching the insulator 406a through the insulator 410, the insulator 408, the insulator 412, the region 407a2, and the semiconductor 406b. For the other components, refer to the above description.

<Transistor Structure 4>

Figure 9A:
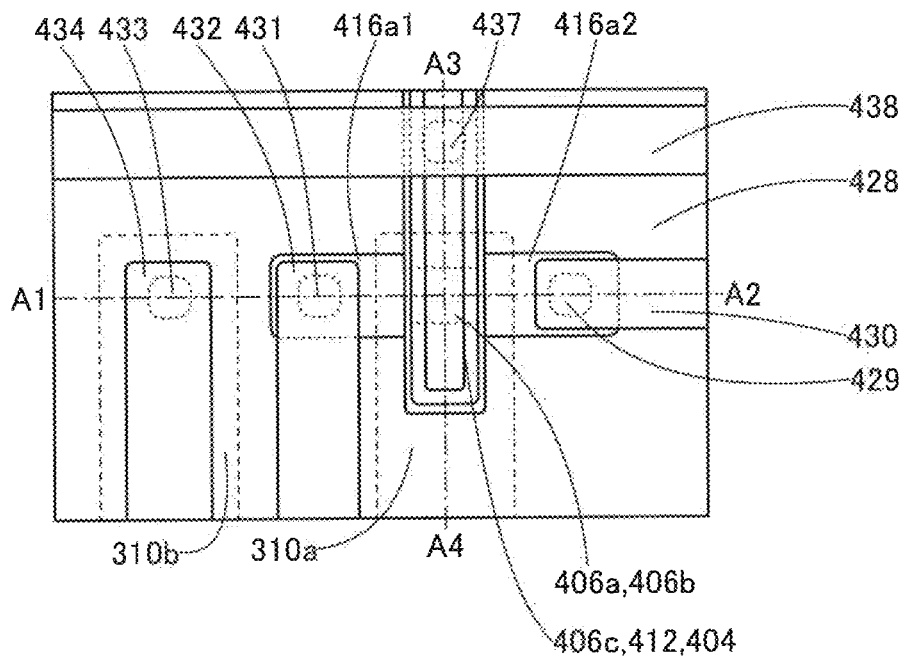
FIGS. 9A to 9C are a top view and cross-sectional views illustrating the transistor of one embodiment of the present invention.
Figure 9B:
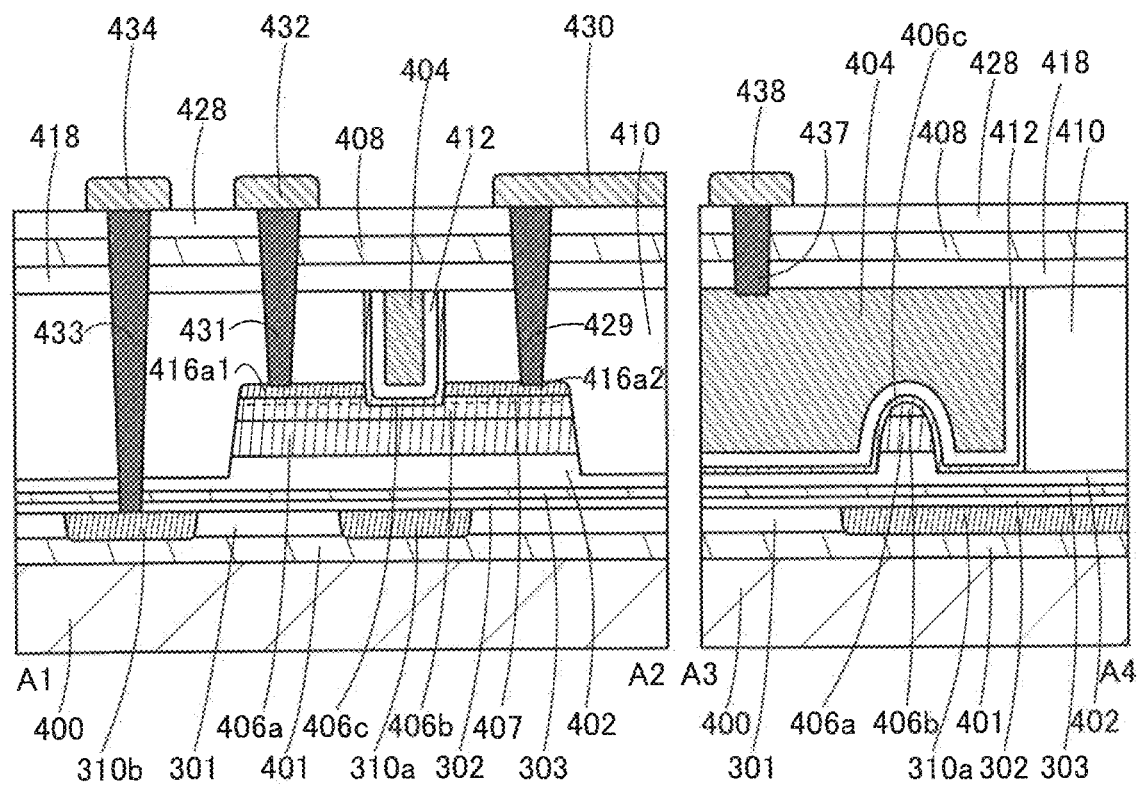
Figure 9C:
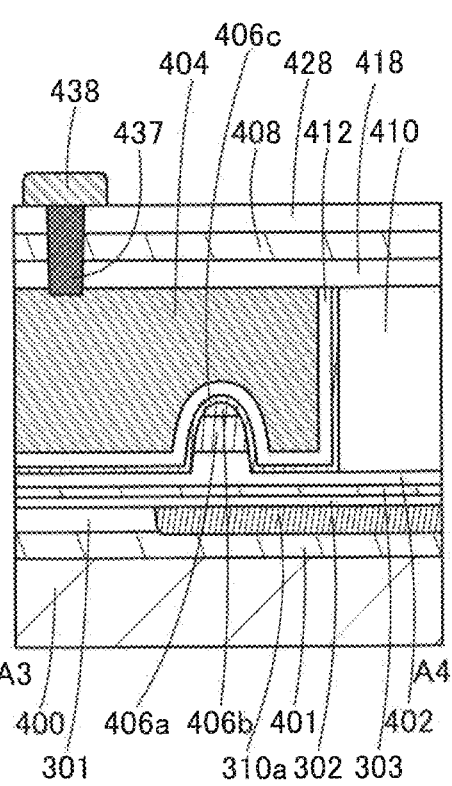

A transistor having a structure different from that in FIGS. 6A to 6C will be described with reference to FIGS. 9A to 9C. FIGS. 9A to 9C are a top view and cross-sectional views of a semiconductor device of one embodiment of the present invention. FIG. 9A is the top view, and FIGS. 9B and 9C are the cross-sectional views taken along dashed-dotted lines A1-A2 and A3-A4 in FIG. 9A, respectively. Note that for simplification of the drawing, some components are not illustrated in the top view in FIG. 9A.

In FIGS. 9B and 9C, the transistor includes the insulator 401 over the substrate 400; an insulator 301 over the insulator 401; conductors 310a and 310b in openings of the insulator 301; an insulator 302 over the insulator 301 and conductors 310a and 310b; an electron trap layer 303 over the insulator 302; the insulator 402 over the electron trap layer 303; the insulator 406a over the insulator 402; the semiconductor 406b over the insulator 406a; the conductors 416a1 and 416a2 each having the region in contact with the top surface of the semiconductor 406b; the insulator 410 in contact with the top surfaces of the conductors 416a1 and 416a2; the insulator 406c in contact with the top surface of the semiconductor 406b; the insulator 412 over the insulator 406c; the conductor 404 over the semiconductor 406b with the insulators 412 and 406c positioned therebetween; an insulator 418 over the insulator 410, the insulator 406c, the insulator 412, and the conductor 404; the insulator 408 over the insulator 418; an insulator 428 over the insulator 408; the first opening reaching the conductor 310b through the insulators 428, 408, 418, 410, and 402, the electron trap layer 303, and the insulator 302; the second opening reaching the conductor 416a1 through the insulators 428, 408, 418, and 410; the third opening reaching the conductor 416a2 through the insulators 428, 408, 418, and 410; the fourth opening reaching the conductor 404 through the insulators 428, 408, and 418; the conductor 433, the conductor 431, the conductor 429, and the conductor 437 that are embedded in the first opening, the second opening, the third opening, and the fourth opening, respectively; the conductor 434 that is over the insulator 428 and includes a region in contact with the conductor 433; the conductor 432 over the insulator 428, which includes a region in contact with the conductor 431; the conductor 430 that is over the insulator 428 and includes a region in contact with the conductor 429; and the conductor 438 that is over the insulator 428 and includes a region in contact with the conductor 437.

Figure 10D:
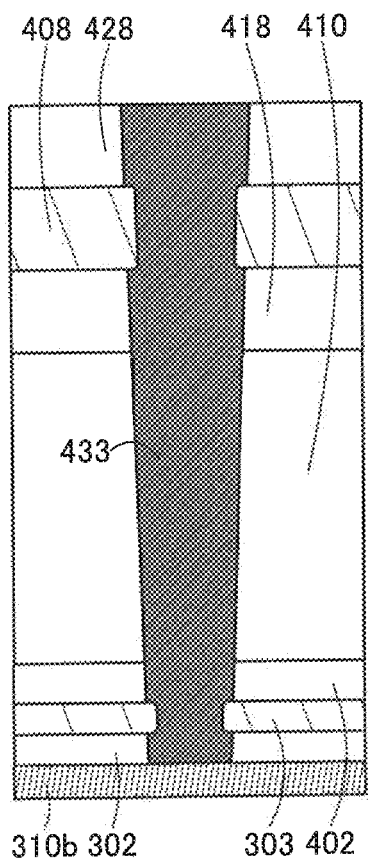
Figure 10E:
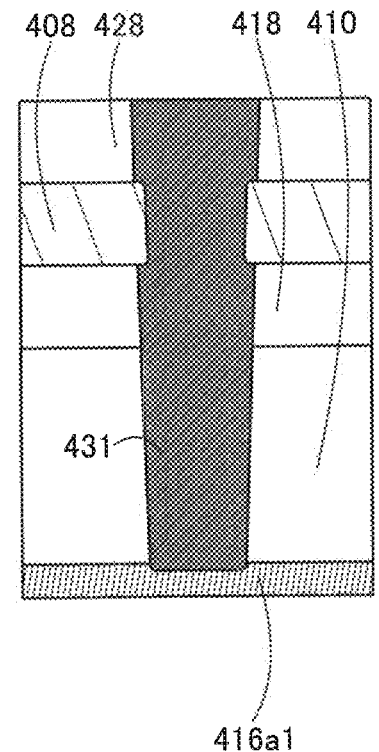
Figure 10F:
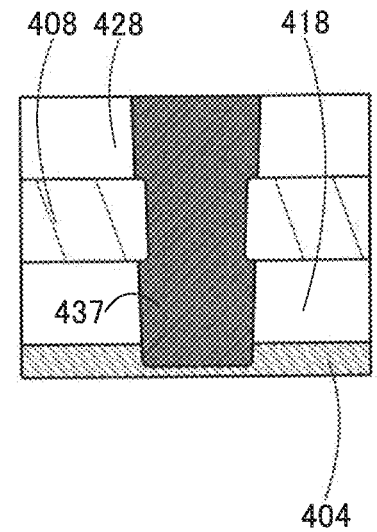

The shapes of cross sections of the openings will be described with reference to FIGS. 10D to 10F. FIGS. 10D to 10F are enlarged cross-sectional views of the openings of the transistor shown in FIGS. 9A to 9C. FIG. 10D is an enlarged view of the first opening. FIG. 10E is an enlarged view of the second opening. FIG. 10F is an enlarged view of the fourth opening. Note that in FIGS. 10D to 10F, the insulator 410 is thin in its thickness direction for convenience of explanation.

Although the openings in FIGS. 9B and 9C have straight cross sections, the openings each may have a shape in which the opening diameter of a layer is larger or smaller than those of layers positioned thereover and thereunder or larger than that of a layer positioned thereover or thereunder as illustrated in FIGS. 10D to 10F. In the first opening in FIG. 10D, the opening diameter of each of the insulators 428, 418, 410, 402, and 302 is larger than those of layers positioned thereover and thereunder or that of a layer positioned thereover or thereunder. In other words, the opening diameter of each of the insulator 408 and the electron trap layer 303 is smaller than those of layers positioned thereover and thereunder. In other words, the opening of each of the insulator 408 and the electron trap layer 303 is constricted. In the second opening in FIG. 10E, the opening diameter of each of the insulators 428, 418, and 410 is larger than those of layers positioned thereover and thereunder or that of a layer positioned thereover or thereunder. In other words, the opening diameter of the insulator 408 is smaller than those of layers positioned thereover and thereunder. In other words, the opening of the insulator 408 is constricted. In the fourth opening in FIG. 10F, the opening diameter of each of the insulator 428 and the insulator 418 is larger than that of a layer positioned thereover or thereunder. In other words, the opening diameter of the insulator 408 is smaller than those of layers positioned thereover and thereunder. In other words, the opening of the insulator 408 is constricted. Such shapes are obtained in some cases when etching rates of the insulators 428, 418, 410, 402, and 302 are higher than those of the insulator 408 and the electron trap layer 303.

In a bottom part of the opening in FIG. 10E, part of the top surface of the conductor 416a1 is dented. This is because the time needed to form the first opening and the time needed to form the second opening are different from each other, and the conductor 416a1 is over-etched to be partly etched during a period after the second opening is formed and before the first opening is formed. Similarly, in a bottom part of the opening in FIG. 10F, part of the top surface of the conductor 404 is dented. This is because the time needed to form the first opening and the time needed to form the fourth opening are different from each other, and the conductor 404 is over-etched to be partly etched during a period after the fourth opening is formed and before the first opening is formed. Note that in FIGS. 10D to 10F, examples are illustrated in which the opening diameter of a layer is larger than those of layers positioned thereover and thereunder or the conductor has a dented portion; however, the sizes of the wider portion of the opening and the dented portion of the conductive film are not limited to those examples.

Note that the semiconductor 406b includes regions 407 in each of which the top surface of the semiconductor 406b is in contact with the conductor 416a1 or 416a2.

In the transistor, the conductor 404 functions as the first gate electrode. Furthermore, the conductor 404 can have the layered structure including a conductor that hardly allows oxygen to pass therethrough. For example, when the conductor that hardly allows oxygen to pass therethrough is formed as a lower layer, an increase in the electric resistance value due to oxidation of the conductor 404 can be prevented. The insulator 412 functions as the gate insulator.

The conductors 416a1 and 416a2 function as the source electrode and the drain electrode. The conductors 416a1 and 416a2 can each have the layered structure including a conductor that hardly allows oxygen to pass therethrough. For example, when the conductor that hardly allows oxygen to pass therethrough is formed as an upper layer, an increase in the electric resistance value due to oxidation of the conductors 416a1 and 416a2 can be prevented.

The resistance of the semiconductor 406b can be controlled by a potential applied to the conductor 404. That is, conduction or non-conduction between the conductors 416a1 and 416a2 can be controlled by the potential applied to the conductor 404.

In the transistor, the region functioning as a gate electrode is formed in a self-aligned manner so as to fill the opening in the insulator 410 and others. Such a transistor can be also referred to as a trench-gate self-align (TGSA) s-channel FET.

In FIG. 9B, the length of the region of the bottom surface of the conductor 404 functioning as a gate electrode facing the top surface of the semiconductor 406b with the insulator 412 and the insulator 406c positioned therebetween is defined as a gate line width. The gate line width can be smaller than the width of the opening reaching the semiconductor 406b in the insulator 410. That is, the gate line width can be smaller than the minimum feature size. Specifically, the gate line width can be greater than or equal to 5 nm and less than or equal to 60 nm, preferably greater than or equal to 5 nm and less than or equal to 30 nm.

When an electric field from the gate electrode is blocked by other conductors, the switching characteristics of the transistor may be degraded. In the transistor, the positional relationship between the conductor 404 and the conductors 416a1 and 416a2 is changed by the thicknesses of the insulator 406c and the insulator 412. That is, the relationship between the thicknesses of the conductors 416a1 and 416a2 functioning as the source electrode and the drain electrode and the thickness of the insulator 412 functioning as the gate insulating film affects the electric characteristics of the transistor.

When the thickness of the insulator 412 in a region between the conductors 416a1 and 416a2 is smaller than that of the conductor 416a1 or 416a2 in FIG. 9B, an electric field from the gate electrode is applied to the entire channel formation region, making the operation of the transistor favorable. The thickness of the insulator 412 in the region between the conductors 416a1 and 416a2 is smaller than or equal to 30 nm, preferably smaller than or equal to 10 nm.

The transistor can have a structure in which the conductor 416a1 or 416a2 has a small thickness. An end portion of the conductor 416a1 has a region facing the conductor 404 with the insulator 406c and the insulator 412 positioned therebetween; furthermore, an end portion of the conductor 416a2 has a region facing the conductor 404 with the insulator 406c and the insulator 412 positioned therebetween; however, the area of these regions can be small. Thus, the parasitic capacitance of these regions in the transistor is reduced.

The conductor 310a functions as the second gate electrode. The conductor 310a can be the multilayer film including a conductive film that hardly allows oxygen to pass therethrough. The use of the multilayer film including a conductive film that hardly allows oxygen to pass therethrough can prevent a decrease in conductivity due to oxidation of the conductor 310a. The insulator 302, the electron trap layer 303, and the insulator 402 function as the second gate insulating film. The threshold voltage of the transistor can be controlled by a potential applied to the conductor 310a. Furthermore, by the potential applied to the conductor 310a, electrons are injected to the electron trap layer 303 and thus the threshold voltage of the transistor can be controlled. The first gate electrode and the second gate electrode are electrically connected to each other, whereby a high on-state current can be obtained. Note that the functions of the first gate electrode and the second gate electrode may be replaced with each other.

Figure 11B:
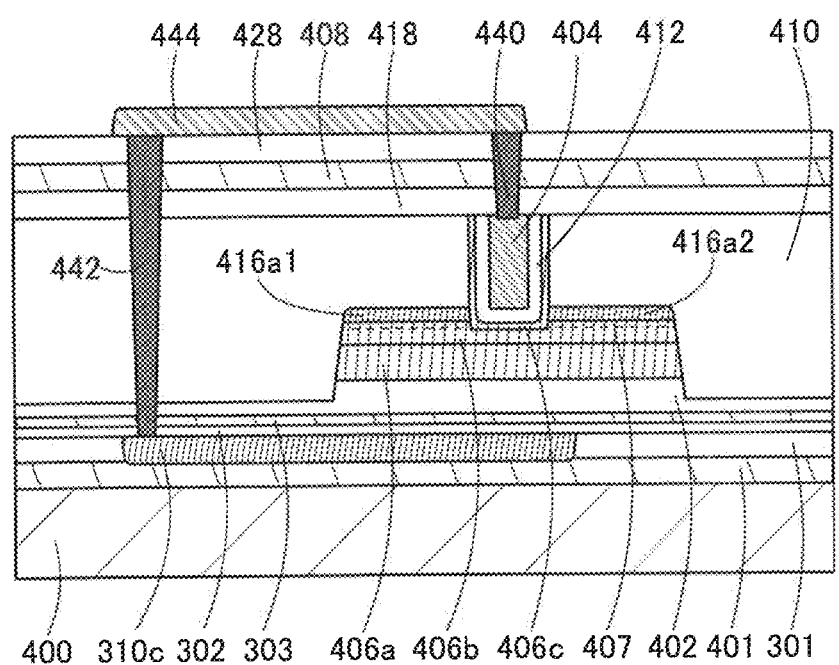

FIG. 11B illustrates an example in which the first gate electrode and the second gate electrode are electrically connected. In the opening reaching the conductor 404 through the insulators 428, 408, and 418, the conductor 440 is embedded, and a top surface of the conductor 440 is electrically connected to the conductor 444 formed over the insulator 428. In the opening reaching the conductor 310c through the insulators 428, 408, 418, 410, and 402, the electron trap layer 303, and the insulator 302, the conductor 442 is embedded, and the top surface of the conductor 442 and the conductor 444 are electrically connected. That is, the conductor 404 functioning as the first gate electrode is electrically connected to the conductor 310c functioning as the second gate electrode through the conductors 440, 444, and 442.

The insulators 418 and 428 may each be formed to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 301 preferably contains silicon oxide or silicon oxynitride. For the other components, refer to the above description.

In this embodiment, one embodiment of the present invention has been described. Other embodiments of the present invention are described in other embodiments. Note that one embodiment of the present invention is not limited to the above examples. That is, since various embodiments of the present invention are disclosed in this embodiment and other embodiments, one embodiment of the present invention is not limited to a specific embodiment. For example, an example in which a channel formation region of a transistor includes an oxide semiconductor, an example in which a transistor includes an oxide semiconductor, and the like are described as one embodiment of the present invention; however, one embodiment of the present invention is not limited to these examples. Depending on circumstances or conditions, various transistors of embodiments of the present invention may include various semiconductors. Depending on circumstances or conditions, transistors of embodiments of the present invention may include, for example, at least one of silicon, germanium, silicon germanium, silicon carbide, gallium arsenide, aluminum gallium arsenide, indium phosphide, gallium nitride, and an organic semiconductor. Alternatively, depending on circumstances or conditions, various transistors of embodiments of the present invention do not necessarily include an oxide semiconductor, for example.

At least part of this embodiment can be implemented in combination with any of the embodiments described in this specification as appropriate.

Embodiment 3

<Structure of Oxide Semiconductor>

The structure of an oxide semiconductor will be described below.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis aligned crystal parts (also referred to as pellets).

Figure 12A:
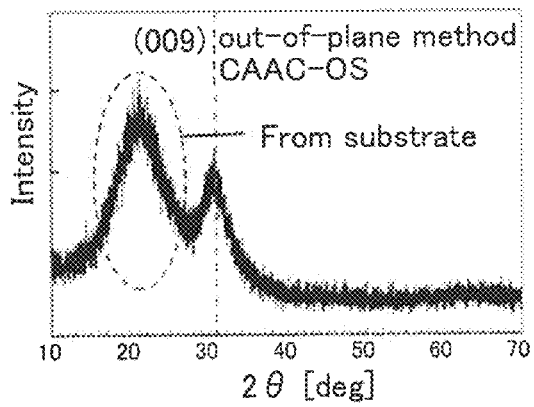
FIGS. 12A to 12E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an InGaZnO$_4$ crystal that is classified as the space group R-3m is analyzed by an out-of-plane method, a peak appears at a diffraction angle (2θ) of around 31° as shown in FIG. 12A. This peak is derived from the (009) plane of the InGaZnO$_4$ crystal, which indicates that crystals in the CAAC-OS have c-axis alignment, and that the c-axes are aligned in the direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 12B:
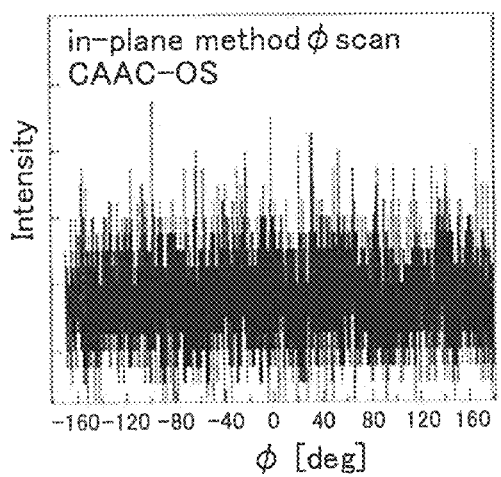
Figure 12C:
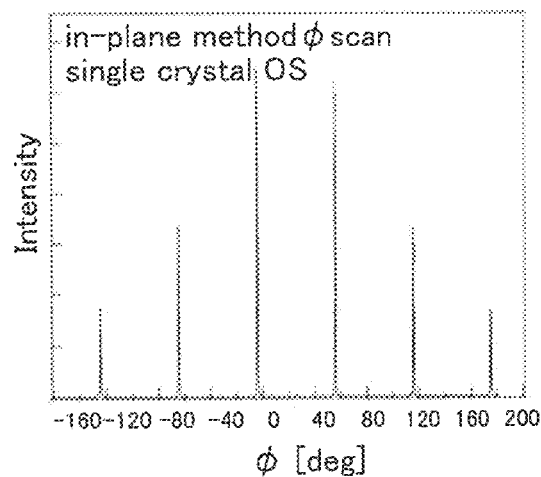

On the other hand, in structural analysis of the CAAC-OS by an in-plane method in which an X-ray is incident on the CAAC-OS in the direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), a peak is not clearly observed as shown in FIG. 12B. In contrast, in the case where single crystal InGaZnO$_4$ is subjected to φ scan with 2θ fixed at around 56°, six peaks which are derived from crystal planes equivalent to the (110) plane are observed as shown in FIG. 12C. Accordingly, the structural analysis using XRD shows that the directions of a-axes and b-axes are irregularly oriented in the CAAC-OS.

Figure 12D:
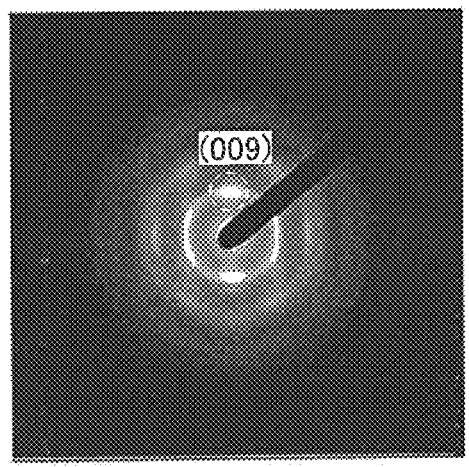
Figure 12E:
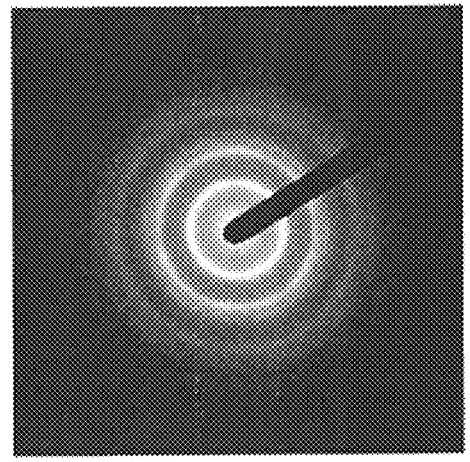

Next, a CAAC-OS analyzed by electron diffraction will be described. For example, when an electron beam with a probe diameter of 300 nm is incident on a CAAC-OS including an InGaZnO$_4$ crystal in the direction parallel to the formation surface of the CAAC-OS, such a diffraction pattern (also referred to as a selected-area transmission electron diffraction pattern) as is shown in FIG. 12D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 12E shows a diffraction pattern obtained in such a manner that an electron beam with a probe diameter of 300 nm is incident on the same sample in the direction perpendicular to the sample surface. As shown in FIG. 12E, a ring-like diffraction pattern is observed. Thus, the electron diffraction using an electron beam with a probe diameter of 300 nm also indicates that the a-axes and b-axes of the pellets included in the CAAC-OS do not have regular alignment. The first ring in FIG. 12E is considered to be derived from the (010) plane, the (100) plane, and the like of the InGaZnO$_4$ crystal. The second ring in FIG. 12E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 13A:
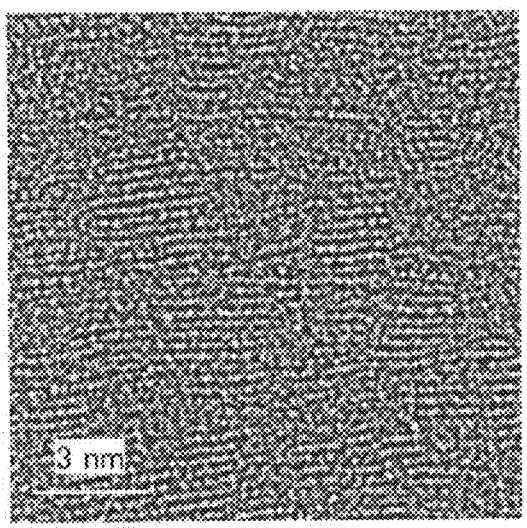
FIGS. 13A to 13E show a cross-sectional TEM image and plan-view TEM images of a CAAC-OS and images obtained through analysis thereof.

FIG. 13A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 13A shows pellets in which metal atoms are arranged in a layered manner. FIG. 13A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 13B:
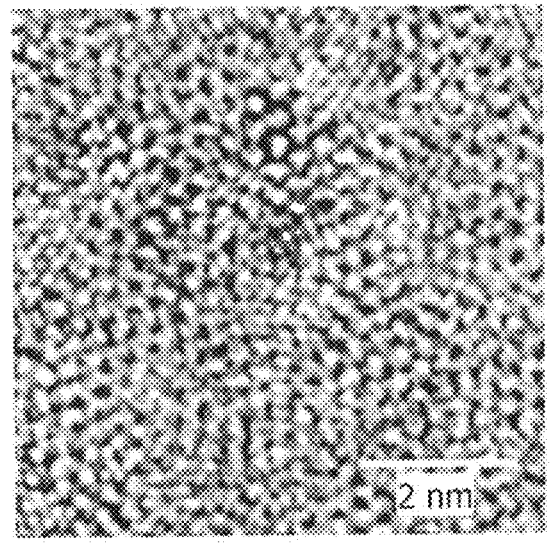
Figure 13C:
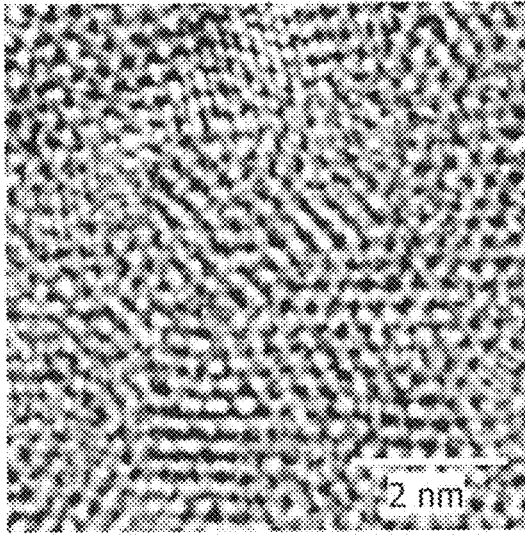
Figure 13D:
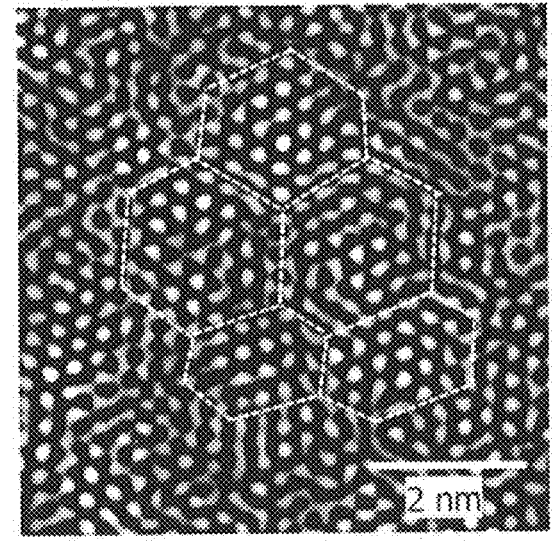
Figure 13E:
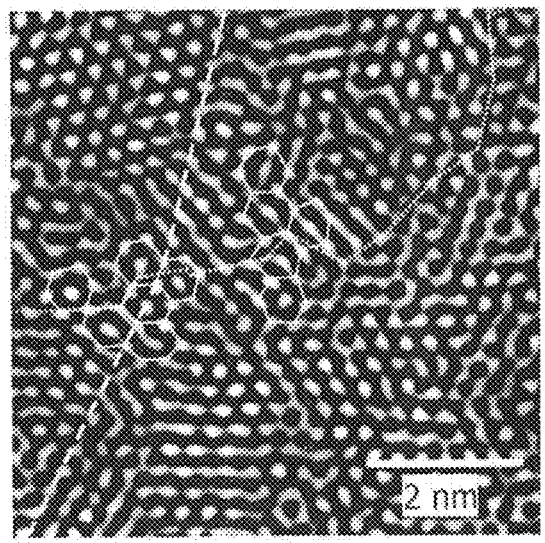

FIGS. 13B and 13C show Cs-corrected high-resolution TEM images of a plane of the CAAC-OS observed from the direction substantially perpendicular to the sample surface. FIGS. 13D and 13E are images obtained through image processing of FIGS. 13B and 13C. The method of image processing is as follows. The image in FIG. 13B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 13D, a portion where a lattice arrangement is broken is shown by dashed lines. A region surrounded by dashed lines is one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 13E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example That is, a lattice arrangement is distorted so that formation of a crystal grain boundary is inhibited. This is probably because the CAAC-OS can tolerate distortion owing to a low density of interatomic bond arrangement in the a-b plane direction, an interatomic bond distance changed by substitution of a metal element, and the like.

As described above, the CAAC-OS has c-axis alignment, its pellets (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, the impurity contained in the oxide semiconductor might serve as a carrier trap or serve as a carrier generation source. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}$/cm$^3$, preferably lower than $1\times10^{11}$/cm$^3$, more preferably lower than $1\times10^{10}$/cm$^3$, and is higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 14A:
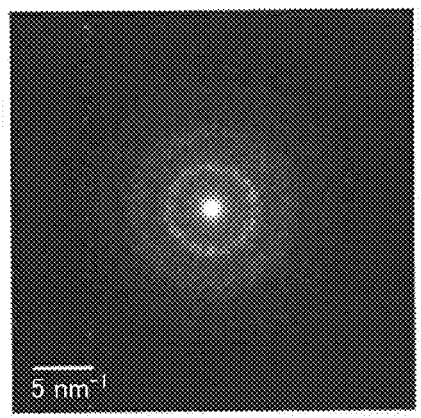
FIGS. 14A to 14D show electron diffraction patterns and a cross-sectional TEM image of an nc-OS.
Figure 14B:
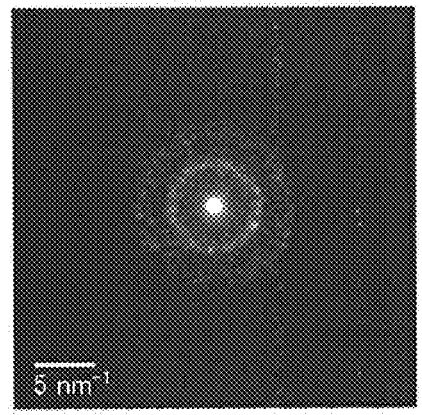

For example, when an electron beam with a probe diameter of 50 nm is incident on a 34-nm-thick region of thinned nc-OS including an InGaZnO$_4$ crystal in the direction parallel to the formation surface, a ring-shaped diffraction pattern (a nanobeam electron diffraction pattern) shown in FIG. 14A is observed. FIG. 14B shows a diffraction pattern obtained when an electron beam with a probe diameter of 1 nm is incident on the same sample. As shown in FIG. 14B, a plurality of spots are observed in a ring-like region. In other words, ordering in an nc-OS is not observed with an electron beam with a probe diameter of 50 nm but is observed with an electron beam with a probe diameter of 1 nm.

Figure 14C:
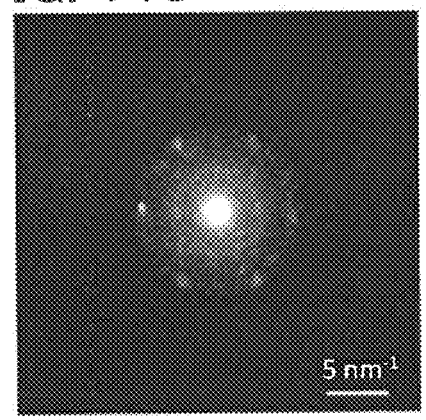

Furthermore, an electron diffraction pattern in which spots are arranged in an approximately hexagonal shape is observed in some cases as shown in FIG. 14C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 14D:
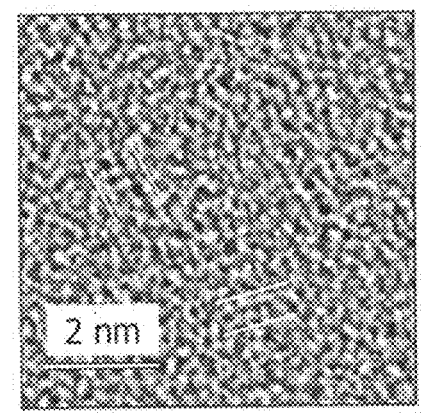

FIG. 14D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 14D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

FIGS. 15A and 15B are high-resolution cross-sectional TEM images of an a-like OS. FIG. 15A is the high-resolution cross-sectional TEM image of the a-like OS at the start of the electron irradiation. FIG. 15B is the high-resolution cross-sectional TEM image of the a-like OS after the electron ($e^-$) irradiation at $4.3 \times 10^8$ $e^-/nm^2$. FIGS. 15A and 15B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 16:
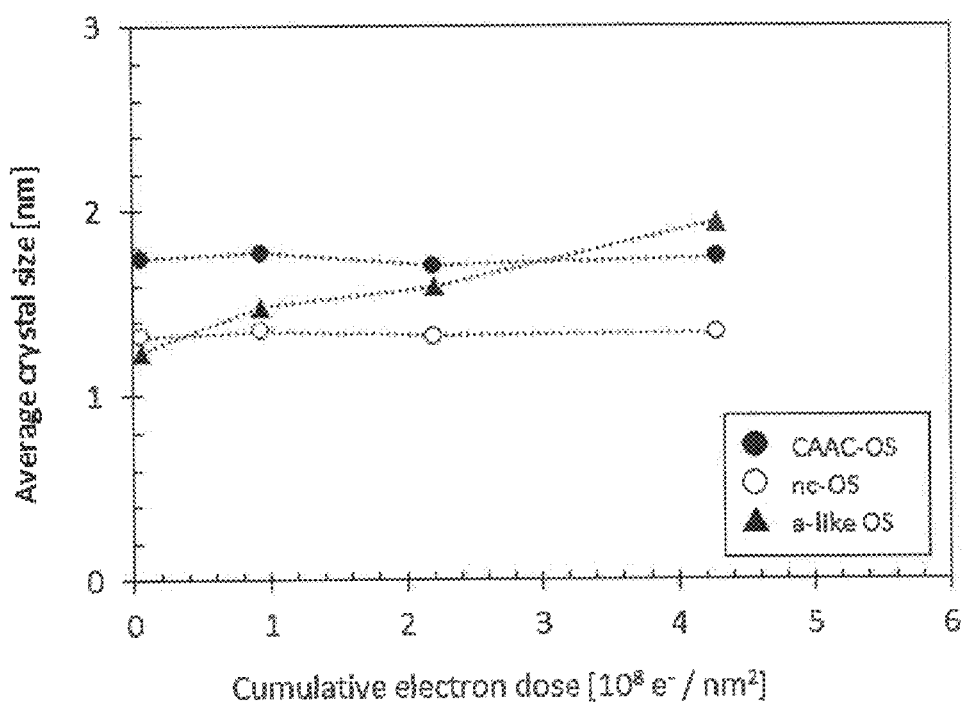
FIG. 16 shows changes in crystal parts of In—Ga—Zn oxides induced by electron irradiation.
Figure 17A:
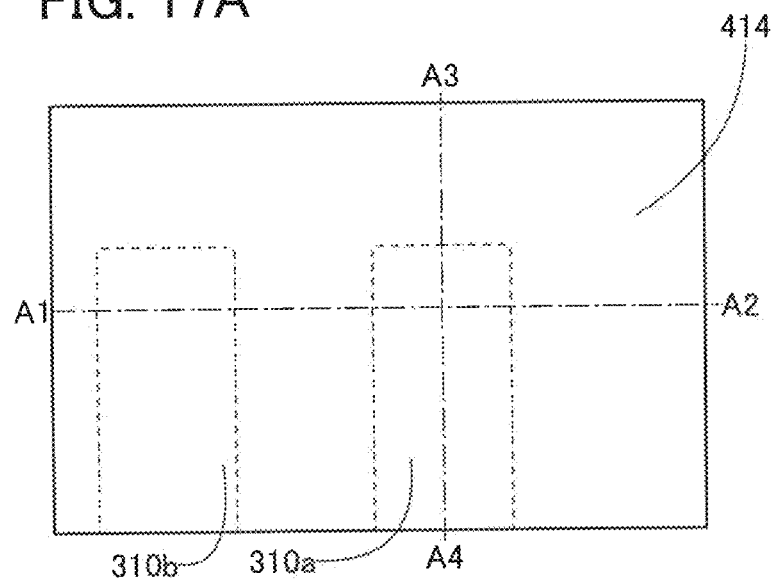
FIGS. 17A to 17C are a top view and cross-sectional views illustrating a manufacturing method of a transistor of one embodiment of the present invention.
Figure 17B:
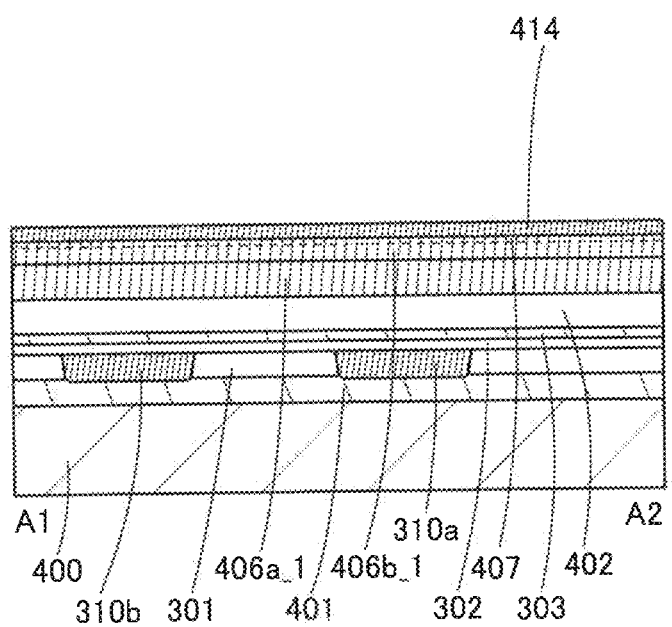
Figure 17C:
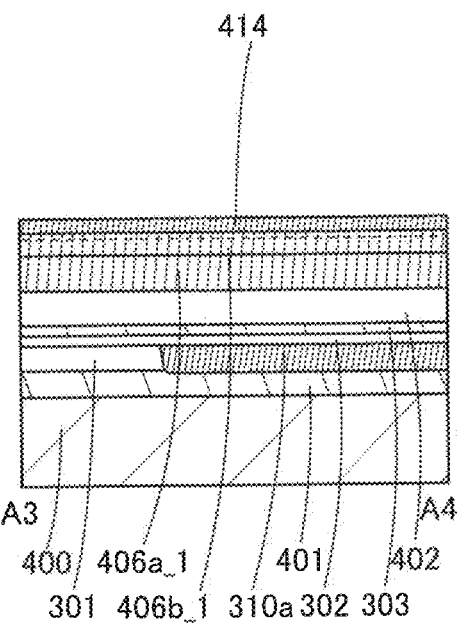

FIG. 16 shows change in the average size of crystal parts (at 22 points to 30 points) in each sample. Note that the crystal part size corresponds to the length of a lattice fringe. FIG. 16 indicates that the crystal part size in the a-like OS increases with an increase in the cumulative electron dose in obtaining TEM images, for example. As shown in FIG. 16, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 16, the average size of crystal parts in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations are as follows: the accelerating voltage is 300 kV; the current density is $6.7 \times 10^5$ $e^-/(nm^2 \cdot s)$; and the diameter of irradiation region is 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example An oxide which can be used as the insulator 406a, the semiconductor 406b, the insulator 406c, or the like will be described.

The semiconductor 406b is an oxide semiconductor containing indium, for example. The oxide semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 406b preferably contains zinc. When the oxide semiconductor contains zinc, the oxide semiconductor is easily crystallized, in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., zinc tin oxide, gallium tin oxide, or gallium oxide.

For the semiconductor 406b, an oxide with a wide energy gap may be used, for example. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, the insulator 406a and the insulator 406c are oxides including one or more elements, or two or more elements other than oxygen included in the semiconductor 406b. Since the insulator 406a and the insulator 406c each include one or more elements, or two or more elements other than oxygen included in the semiconductor 406b, an interface state is less likely to be formed at the interface between the insulator 406a and the semiconductor 406b and the interface between the semiconductor 406b and the insulator 406c.

The case where the insulator 406a, the semiconductor 406b, and the insulator 406c include indium will be described. In the case of using an In-M-Zn oxide as the insulator 406a, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the insulator 406c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the insulator 406c may be an oxide that is of the same type as the insulator 406a.

As the semiconductor 406b, an oxide having an electron affinity higher than those of the insulators 406a and 406c is used. For example, as the semiconductor 406b, an oxide having an electron affinity higher than those of the insulators 406a and 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and an excellent oxygen-blocking property. Therefore, the insulator 406c preferably includes an indium gallium oxide. The gallium atomic ratio [Ga/(In+Ga)] is, for example, higher than or equal to 70%, preferably higher than or equal to 80%, more preferably higher than or equal to 90%.

Note that the insulator 406a and/or the insulator 406c may be gallium oxide. For example, when gallium oxide is used as the insulator 406c, a leakage current between the conductor 404 and the conductor 416a1 or the conductor 416a2 can be reduced. In other words, the off-state current of the transistor can be reduced.

In that case, when a gate voltage is applied, a channel is formed in the semiconductor 406b having the highest electron affinity among the insulator 406a, the semiconductor 406b, and the insulator 406c.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. The mixed region has a low density of interface states. For that reason, the stack including the insulator 406a, the semiconductor 406b, and the insulator 406c has a band structure where energy is changed continuously at each interface and in the vicinity of the interface (continuous junction).

At this time, electrons move mainly in the semiconductor 406b, not in the insulator 406a and the insulator 406c. Thus, when the density of interface states at the interface between the insulator 406a and the semiconductor 406b and the density of interface states at the interface between the semiconductor 406b and the insulator 406c are decreased, electron movement in the semiconductor 406b is less likely to be inhibited and the on-state current of the transistor can be increased.

In the case where the transistor has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor is. For example, the semiconductor 406b has a region with a thickness greater than or equal to 10 nm, preferably greater than or equal to 20 nm, more preferably greater than or equal to 40 nm, more preferably greater than or equal to 60 nm, still more preferably greater than or equal to 100 nm. Note that the semiconductor 406b has a region with a thickness of, for example, less than or equal to 300 nm, preferably less than or equal to 200 nm, more preferably less than or equal to 150 nm because the productivity of the semiconductor device including the transistor might be decreased. In some cases, when the channel formation region is reduced in size, the electrical characteristics of the transistor with a smaller thickness of the semiconductor 406b may be improved. Therefore, the semiconductor 406 may have a thickness less than 10 nm.

Moreover, the thickness of the insulator 406c is preferably as small as possible to increase the on-state current of the transistor. For example, the insulator 406c is formed to include a region having a thickness of less than 10 nm, preferably less than or equal to 5 nm, more preferably less than or equal to 3 nm. Meanwhile, the insulator 406c has a function of blocking entry of elements other than oxygen (such as hydrogen and silicon) included in the adjacent insulator into the semiconductor 406b where a channel is formed. For this reason, it is preferable that the insulator 406c have a certain thickness. For example, the insulator 406c is formed to include a region having a thickness of greater than or equal to 0.3 nm, preferably greater than or equal to 1 nm, more preferably greater than or equal to 2 nm. The insulator 406c preferably has an oxygen blocking property to suppress outward diffusion of oxygen released from the insulator 402 and the like.

To improve reliability, preferably, the thickness of the insulator 406a is large and the thickness of the insulator 406c is small. For example, the insulator 406a includes a region with a thickness of, for example, greater than or equal to 10 nm, preferably greater than or equal to 20 nm, more preferably greater than or equal to 40 nm, still more preferably greater than or equal to 60 nm. When the thickness of the insulator 406a is made large, a distance from an interface between the adjacent insulator and the insulator 406a to the semiconductor 406b in which a channel is formed can be large. Since the productivity of the semiconductor device including the transistor might be decreased, the insulator 406a has a region with a thickness of, for example, less than or equal to 200 nm, preferably less than or equal to 120 nm, more preferably less than or equal to 80 nm.

For example, silicon in the oxide semiconductor might serve as a carrier trap or a carrier generation source. Therefore, the silicon concentration of the semiconductor 406b is preferably as low as possible. For example, a region in which the concentration of silicon which is measured by secondary ion mass spectrometry (SIMS) is lower than $1 \times 10^{19}$ atoms/cm$^3$, preferably lower than $5 \times 10^{18}$ atoms/cm$^3$, or more preferably lower than $2 \times 10^{18}$ atoms/cm$^3$ is provided between the semiconductor 406b and the insulator 406a. A region with a silicon concentration lower than $1 \times 10^{19}$ atoms/cm$^3$, preferably lower than $5 \times 10^{18}$ atoms/cm$^3$, more preferably lower than $2 \times 10^{18}$ atoms/cm$^3$ which is measured by SIMS is provided between the semiconductor 406b and the insulator 406c.

It is preferable to reduce the concentration of hydrogen in the insulator 406a and the insulator 406c in order to reduce the concentration of hydrogen in the semiconductor 406b. The insulator 406a and the insulator 406c each have a region in which the concentration of hydrogen measured by SIMS is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. It is preferable to reduce the concentration of nitrogen in the insulator 406a and the insulator 406c in order to reduce the concentration of nitrogen in the semiconductor 406b. The insulator 406a and the insulator 406c each have a region in which the concentration of nitrogen measured by SIMS is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor 406b is preferably as low as possible. For example, the semiconductor 406b preferably has a region in which the copper concentration is lower than or equal to $1 \times 10^{19}$ atoms/cm$^3$, lower than or equal to $5 \times 10^{18}$ atoms/cm$^3$, or lower than or equal to $1 \times 10^{18}$ atoms/cm$^3$.

The above three-layer structure is an example. For example, a two-layer structure without the insulator 406a or the insulator 406c may be employed. Alternatively, a four-layer structure in which any one of the insulators or the semiconductors described as examples of the insulator 406a, the semiconductor 406b, and the insulator 406c is provided below or over the insulator 406a or below or over the insulator 406c may be employed. Alternatively, an n-layer structure (n is an integer of 5 or more) may be employed in which any one of the insulators or the semiconductors described as examples of the insulator 406a, the semiconductor 406b, and the insulator 406c is provided at two or more of the following positions: over the insulator 406a, below the insulator 406a, over the insulator 406c, and below the insulator 406c.

As the substrate 400, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate made of silicon, germanium, or the like, a compound semiconductor substrate made of silicon carbide, silicon germanium, gallium arsenide, indium phosphide, zinc oxide, or gallium oxide, or the like is used. The above semiconductor substrate in which an insulator region is provided, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 includes a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, for example, metal, an alloy, resin, glass, or fiber thereof can be used. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

At least part of this embodiment can be implemented in combination with any of the embodiments described in this specification as appropriate.

Embodiment 4

<Method 1 for Manufacturing Transistor>

A method for manufacturing the transistor of one embodiment of the present invention in FIGS. 6A to 6C will be described below with reference to FIGS. 17A to 17C to FIGS. 35A to 35C.

First, the substrate 400 is prepared.

Then, the insulator 401 is formed. The insulator 401 may be formed by a sputtering method, a CVD method, a MBE method, a PLD method, an ALD method, or the like.

Next, the insulator 301 is formed over the insulator 401. The insulator 301 can be formed by a sputtering method, a CVD method, an MBE method, a PLD method, an ALD method, or the like.

Then, a groove is formed in the insulator 401 so as to reach the insulator 301. Examples of the groove include a hole and an opening. In forming the groove, wet etching may be employed; however, dry etching is preferably employed in terms of microfabrication. The insulator 401 is preferably an insulator that functions as an etching stopper film used in forming the groove by etching the insulator 301. For example, in the case where a silicon oxide film is used as the insulator 301 in which the groove is to be formed, the insulator 401 is preferably formed using a silicon nitride film, an aluminum oxide film, or a hafnium oxide film.

After the formation of the groove, a conductor to be the conductors 310a and 310b is formed. The conductor to be the conductors 310a and 310b desirably includes a conductor that hardly allows oxygen to pass therethrough. For example, tantalum nitride, tungsten nitride, or titanium nitride can be used. Alternatively, a layered film formed using the conductor and tantalum, tungsten, titanium, molybdenum, aluminum, copper, or a molybdenum-tungsten alloy can be used. The conductor to be the conductors 310a and 310b can be formed by a sputtering method, a CVD method, an MBE method, a PLD method, an ALD method, or the like.

Next, CMP is performed to remove the conductor to be the conductors 310a and 310b that are located over the insulator 301. Consequently, the conductors 310a and 310b remain only in the groove, whereby a wiring layer with a flat top surface can be formed.

Next, the insulator 302 is formed over the insulator 301 and the conductors 310a and 310b. The insulator 302 can be formed by a sputtering method, a CVD method, an MBE method, a PLD method, an ALD method, or the like. The electron trap layer 303 is formed over the insulator 302. It is preferable that the electron trap layer 303 hardly allow impurities such as hydrogen and oxygen to pass therethrough. It is preferable to use, for example, a silicon nitride film, an aluminum oxide film, or a hafnium oxide film. The electron trap layer 303 can be formed by a sputtering method, a CVD method, an MBE method, a PLD method, an ALD method, or the like.

Next, the insulator 402 is formed over the electron trap layer 303. The insulator 402 can be formed by a sputtering method, a CVD method, an MBE method, an PLD method, an ALD method, or the like. Next, treatment to add oxygen to the insulator 402 may be performed. Examples of the treatment for adding oxygen to the insulator 402 include an ion implantation method and a plasma treatment method. Note that oxygen added to the insulator 402 is excess oxygen.

Next, an insulator 406a_1 is formed over the insulator 402. The insulator 406a_1 can be formed by a sputtering method, a CVD method, an MBE method, a PLD method, an ALD method, or the like.

Next, treatment to add oxygen to the insulator 406a_1 may be performed. Examples of the treatment for adding oxygen to the insulator 406a_1 include an ion implantation method and a plasma treatment method. Note that oxygen added to the insulator 406a_1 is excess oxygen. Oxygen is preferably added to a layer corresponding to the insulator 406a_1. Next, a semiconductor 406b_1 is formed over the insulator 406a_1.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor 406b_1 can be increased and impurities such as hydrogen and water can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the semiconductor 406b_1. Alternatively, after plasma treatment using an inert gas with the apparatus, plasma treatment using oxygen in order to compensate released oxygen may be performed.

Next, a conductor 414 is formed over the semiconductor 406b_1. The conductor 414 can be formed by a sputtering method, a CVD method, an MBE method, a PLD method, an ALD method, or the like (see FIGS. 17A to 17C).

Next, the conductor 414 is processed by a photolithography method or the like to form a conductor 415 (see FIGS. 18A to 18C).

Then, the insulator 406a_1, the semiconductor 406b_1, and the conductor 415 are processed by a lithography method or the like to form a multilayer film including the insulator 406a, the semiconductor 406b, and the conductors 416a1 and 416a2. Here, a top surface of the semiconductor to be the semiconductor 406b is damaged when the conductor is formed, whereby the region 407 is formed. The region 407 includes a region in which the resistance of the semiconductor 406b is reduced; thus, contact resistance between the conductor 415 and the semiconductor 406b is reduced. Note that when the multilayer film is formed, the insulator 402 is also subjected etching to have a thinned region in some cases. That is, the insulator 402 may have a protruding portion in a region in contact with the multilayer film (see FIGS. 19A to 19C).

Next, the insulator 406c is formed. The insulator 406c can be formed by a sputtering method, a CVD method, an MBE method, a PLD method, an ALD method, or the like. Then, the insulator 412 is formed over the insulator 406c. The insulator 412 can be formed by a sputtering method, a CVD method, an MBE method, a PLD method, an ALD method, or the like.

Next, a conductor to be the conductor 404 is formed. The conductor 404 can be formed by a sputtering method, a CVD method, an MBE method, a PLD method, an ALD method, or the like. Then, the conductor to be the conductor 404 is processed by a lithography method or the like to form the conductor 404 (see FIGS. 20A to 20C).

Next, the insulator 408 is formed. The insulator 408 can be formed by a sputtering method, a CVD method, an MBE method, a PLD method, an ALD method, or the like. An aluminum oxide is preferably deposited as the insulator 408 using plasma containing oxygen, so that oxygen in the plasma can be added to the top surface of the insulator 412 as excess oxygen.

Then, the insulator 410 is formed over the insulator 408. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink jet method), a printing method (such as screen printing or offset printing), a doctor knife method, a roll coater method, a curtain coater method, or the like.

Figure 21A:
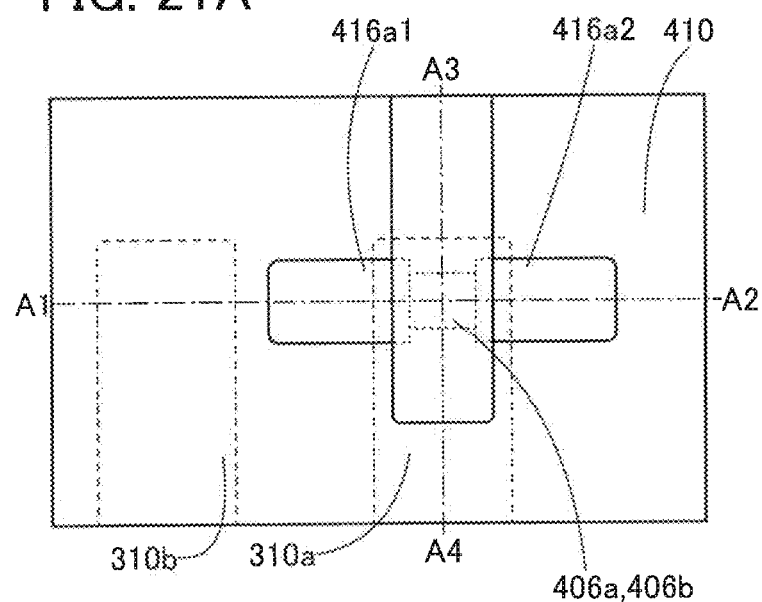
FIGS. 21A to 21C are a top view and cross-sectional views illustrating the manufacturing method of a transistor of one embodiment of the present invention.
Figure 21B:
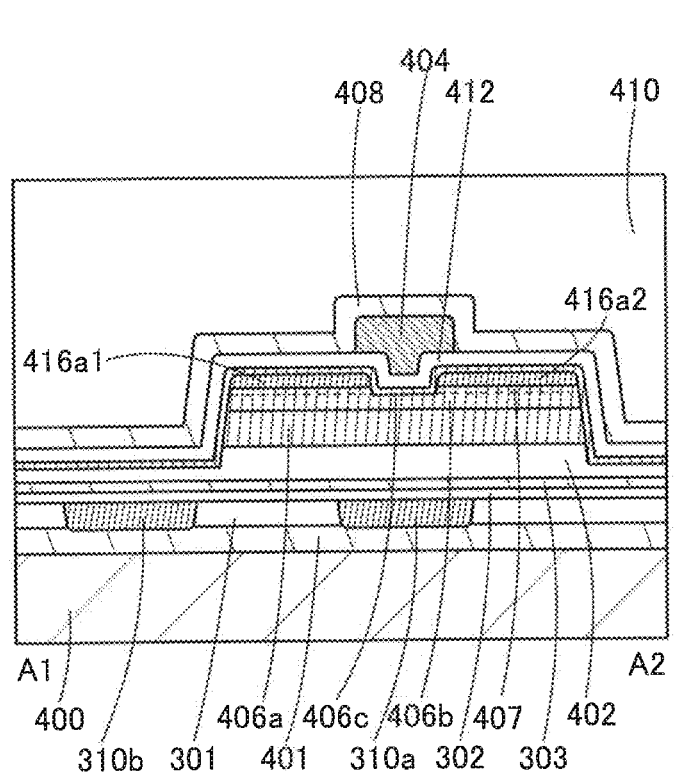
Figure 21C:
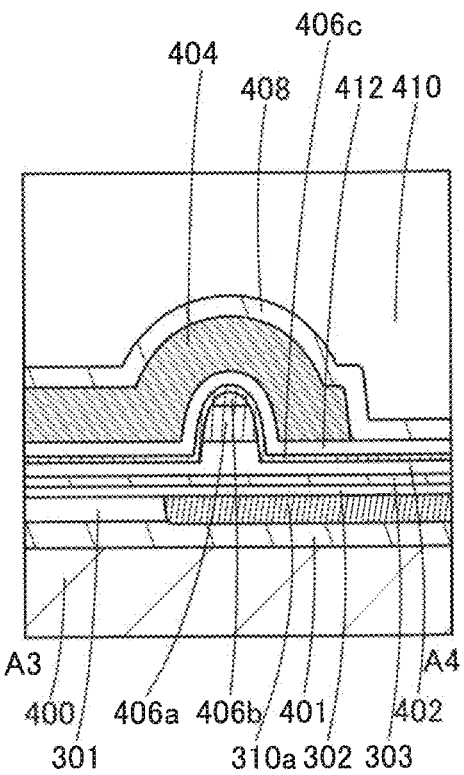

The insulator 410 may be formed to have a flat top surface. For example, the top surface of the insulator 410 may have planarity immediately after the deposition. Alternatively, the insulator 410 may be planarized by removing the insulator or the like from the top surface after the deposition so that the top surface becomes parallel to a reference surface such as a rear surface of the substrate. Such treatment is referred to as planarization treatment. As the planarization treatment, for example, CMP treatment, dry etching treatment, or the like can be performed. Note that the top surface of the insulator 410 is not necessarily flat (see FIGS. 21A to 21C).

A method for forming the first to fourth openings will be described below in detail.

Figure 22A:
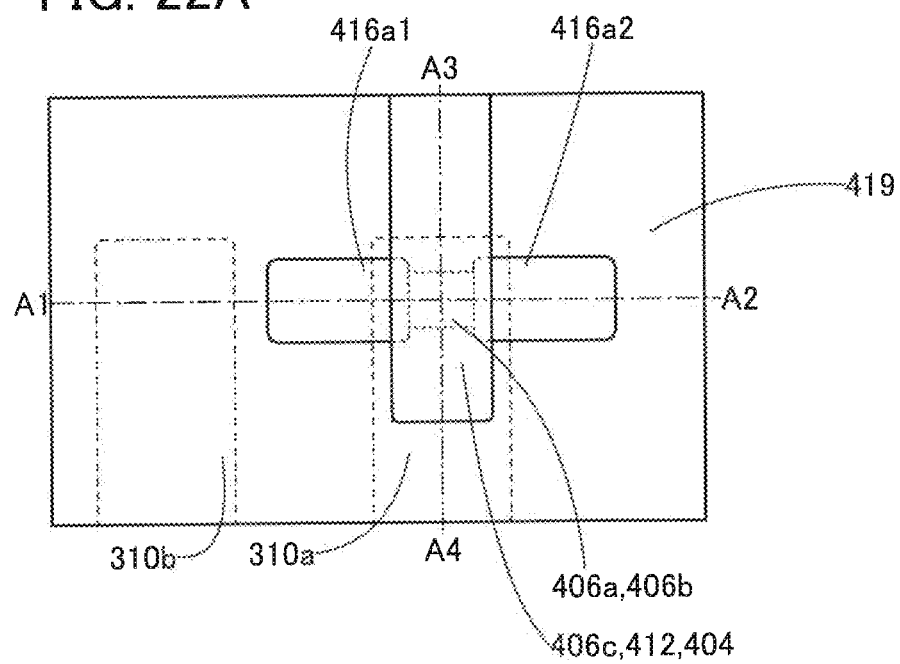
FIGS. 22A to 22C are a top view and cross-sectional views illustrating the manufacturing method of a transistor of one embodiment of the present invention.
Figure 22B:
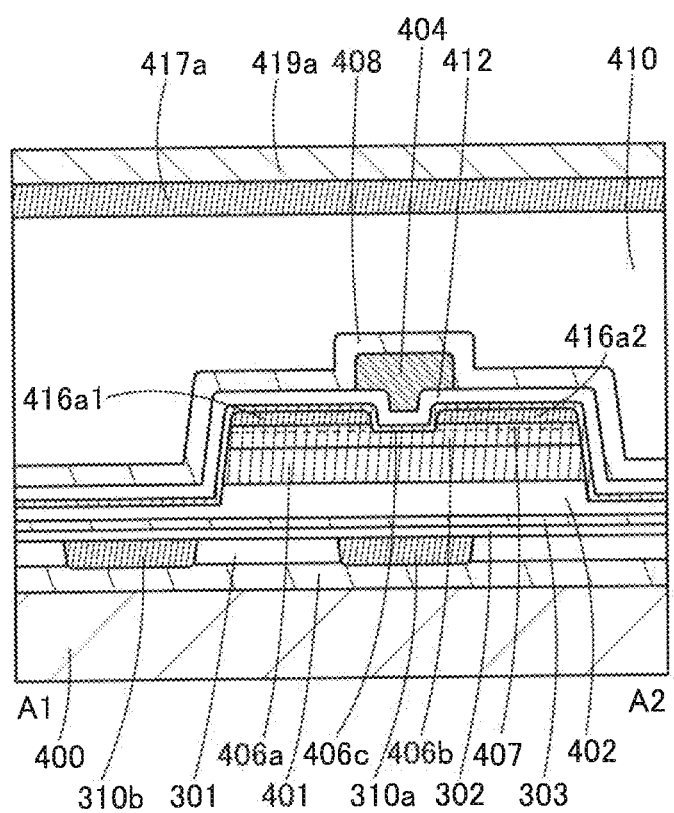
Figure 22C:
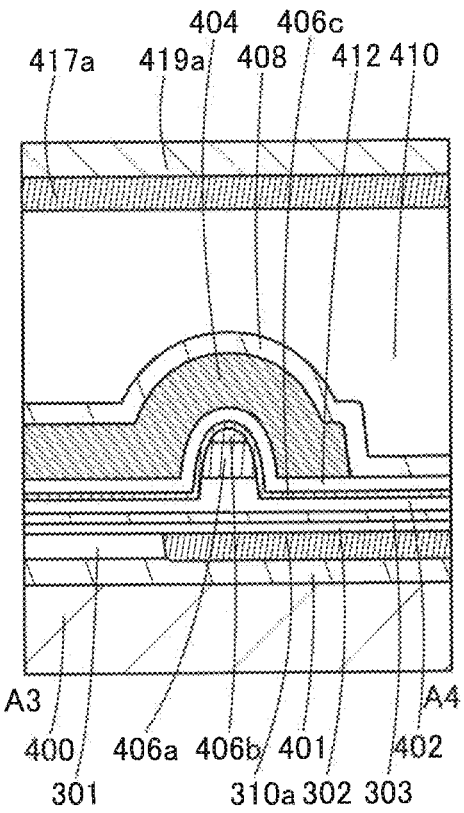

First, a conductor 417a is formed over the insulator 410. The conductor 417a can be formed by a sputtering method, a CVD method, an MBE method, a PLD method, an ALD method, or the like. Next, an insulator 419a is formed over the conductor 417a. The insulator 419a can be formed by a sputtering method, a CVD method, an MBE method, a PLD method, an ALD method, or the like (see FIGS. 22A to 22C).

Figure 23A:
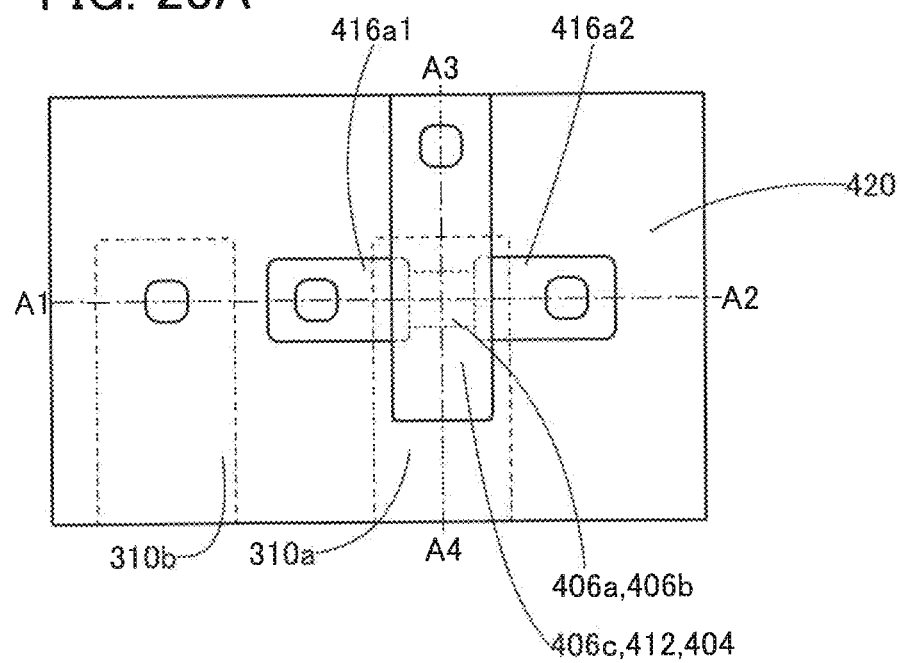
FIGS. 23A to 23C are a top view and cross-sectional views illustrating the manufacturing method of a transistor of one embodiment of the present invention.
Figures 23B, 23C:
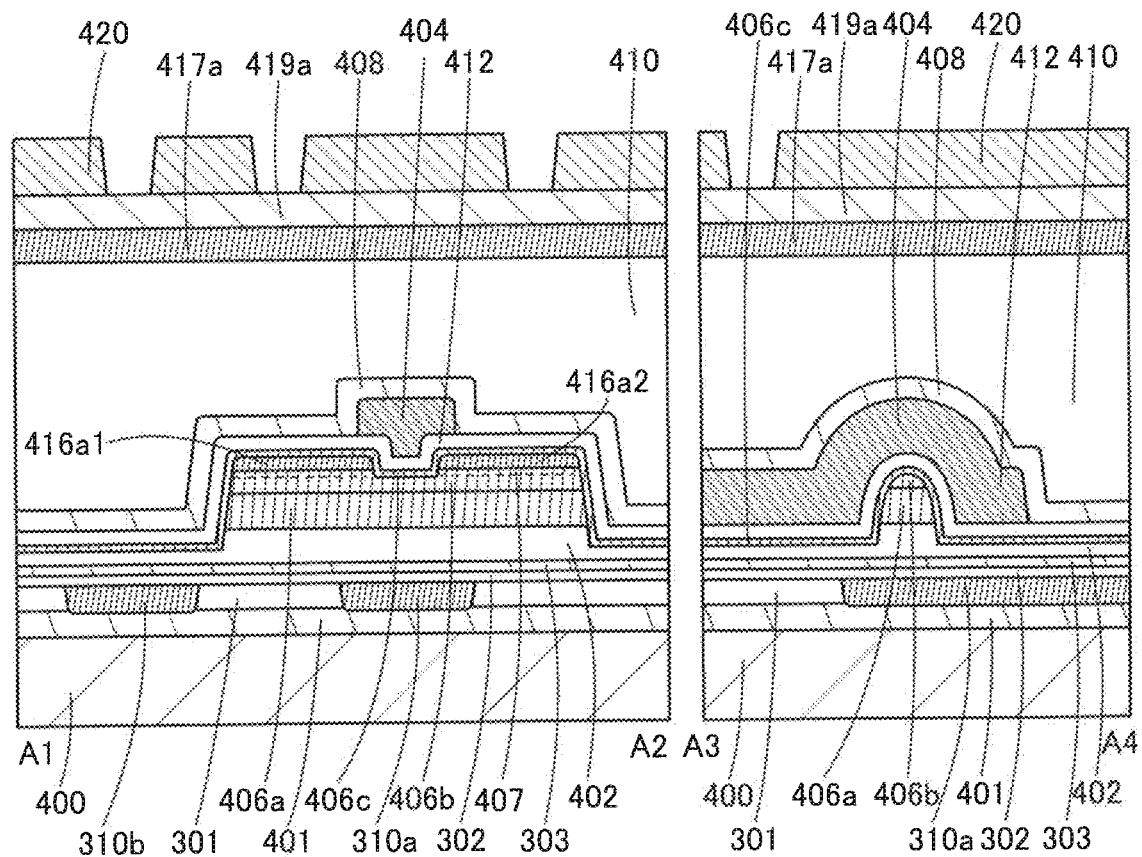

Next, a resist mask 420 is formed over the insulator 419a by a lithography method or the like. Although not shown, the resist mask 420 may be formed in such a manner that an organic coating film is formed over the insulator 419a and then a lithography method or the like is performed on the organic coating film Formation of the organic coating film between the insulator 419a and the resist mask 420 may improve adhesion between the insulator 419a and the resist mask 420 with the organic coating film interposed therebetween (see FIGS. 23A to 23C).

Next, first processing is performed on the insulator 419a by a dry etching method or the like using the resist mask as a mask until a top surface of the conductor 417a is reached, whereby the insulator 419 is formed. In the case where the organic coating film is formed over the insulator 419a, the organic coating film is processed by a dry etching method or the like before the first processing. Examples of a gas to be used for the processing of the organic coating film include a $C_4F_6$ gas, a $C_4F_8$ gas, a $CF_4$ gas, a $SF_6$ gas, and a $CHF_3$ gas.

Figure 24A:
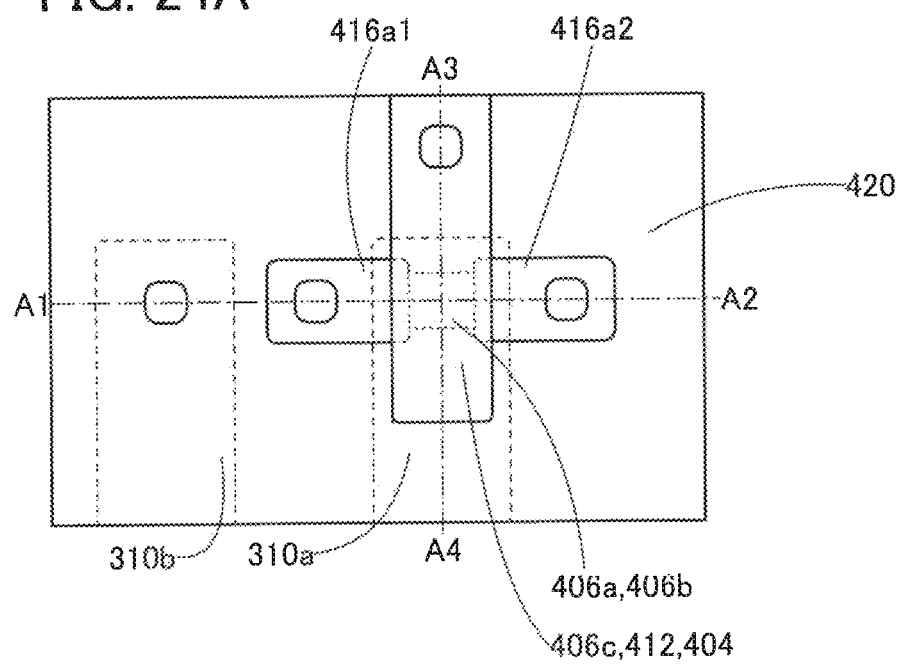
FIGS. 24A to 24C are a top view and cross-sectional views illustrating the manufacturing method of a transistor of one embodiment of the present invention.
Figure 24B:
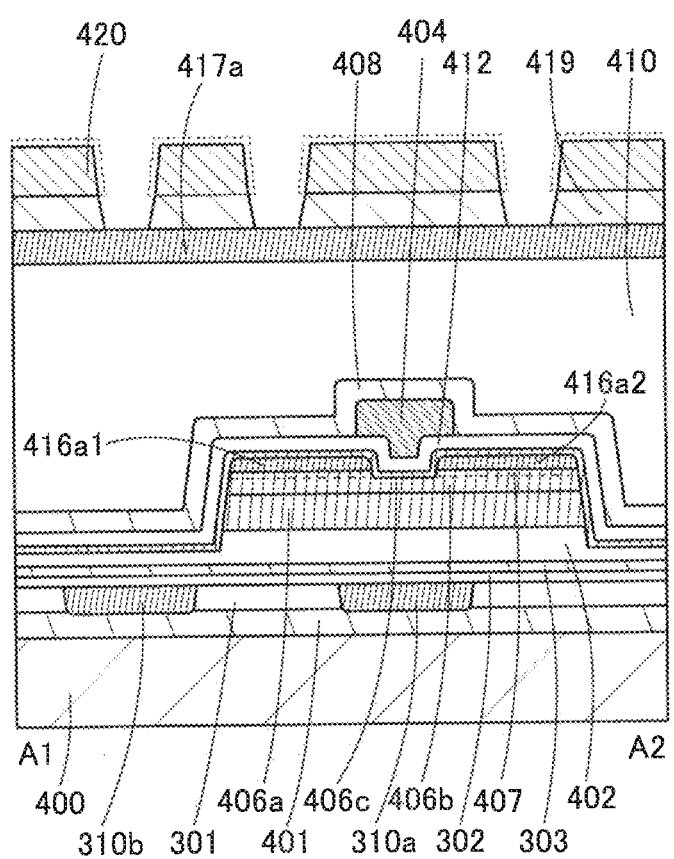
Figure 24C:
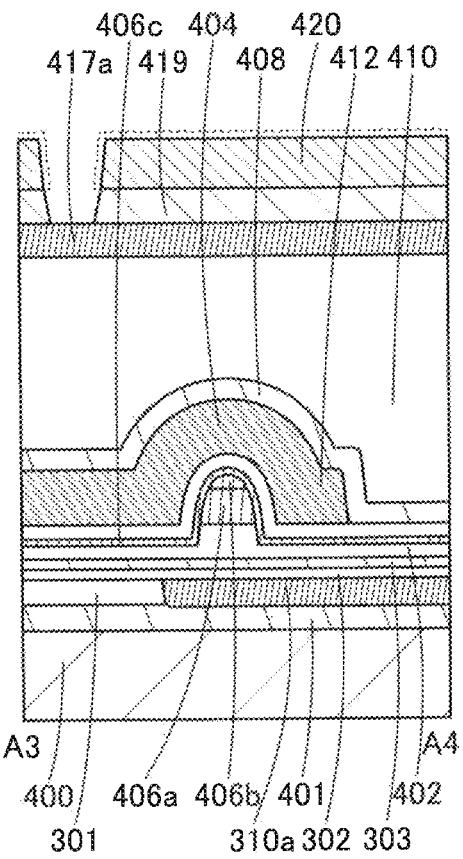

As a gas for the first processing, for example, a $C_4F_6$ gas, a $C_4F_8$ gas, a $CF_4$ gas, a $SF_6$ gas, a $CHF_3$ gas, or the like can be used alone or in combination. Alternatively, an oxygen gas, a helium gas, an argon gas, a hydrogen gas, or the like can be added to any of the above gases as appropriate. As a dry etching apparatus used for the processing of the organic coating film and the processing of the insulator 419, any of the above-described dry etching apparatuses can be used; however, a dry etching apparatus in which high-frequency power sources with different frequencies are connected to the parallel-plate electrodes is preferably used (see FIGS. 24A to 24C).

Next, second processing is performed on the conductor 417a by a dry etching method until the top surface of the insulator 410 is reached, whereby the conductor 417 is formed. As a gas for the dry etching, for example, a $C_4F_6$ gas, a $C_4F_8$ gas, a $CF_4$ gas, a $SF_6$ gas, a $CHF_3$ gas, a $Cl_2$ gas, a $BCl_3$ gas, a $SiCl_4$ gas, or the like can be used alone or in combination. Alternatively, an oxygen gas, a helium gas, an argon gas, a hydrogen gas, or the like can be added to any of the above gases as appropriate. At this time, the resist mask 420 is eliminated by the etching in some cases. As a dry etching apparatus, the dry etching apparatuses used in the first processing may be used. Through the above steps, a hard mask including the conductor 417 and the insulator 419 is formed (see FIGS. 25A to 25C).

Note that the hard mask may be one layer formed only using the conductor 417. In that case, the second processing is performed after the formation of the resist mask 420 over the conductor 417 by a lithography method or the like. By the second processing, the resist mask 420 is eliminated by the etching in some cases. Alternatively, without the hard mask, only the resist mask 420 or a two-layer mask including the organic coating film and the resist mask 420 may be used.

Next, third processing is performed on the insulator 410 until the first opening, the second opening, the third opening, and the fourth opening reach the top surface of the insulator 408 using the hard mask including the conductor 417 and the insulator 419 as a mask. As a gas for the dry etching, a gas similar to that used in the first processing can be used. As a dry etching apparatus, an apparatus similar to that used in the first processing can be used.

When the top surface of the insulator 410 is flat, the thicknesses of the insulator 410 at different openings vary. The order of thickness of the insulator 410 from the largest to the smallest is the thickness at the first opening, that at the fourth opening, and those at the second and third openings.

That is, in the third processing, the insulator 410 at the second and third openings is etched first so that the insulator 408 is reached; then, the insulator 410 at the fourth opening is etched so that the insulator 408 is reached; lastly, the insulator 410 at the first opening is etched so that the insulator 408 is reached. In other words, the insulator 408 at the second opening, the third opening, and the fourth opening is over-etched in the period after the second opening, the third opening, and the fourth opening reach the insulator 408 and before the first opening reaches the insulator 408.

Figure 26A:
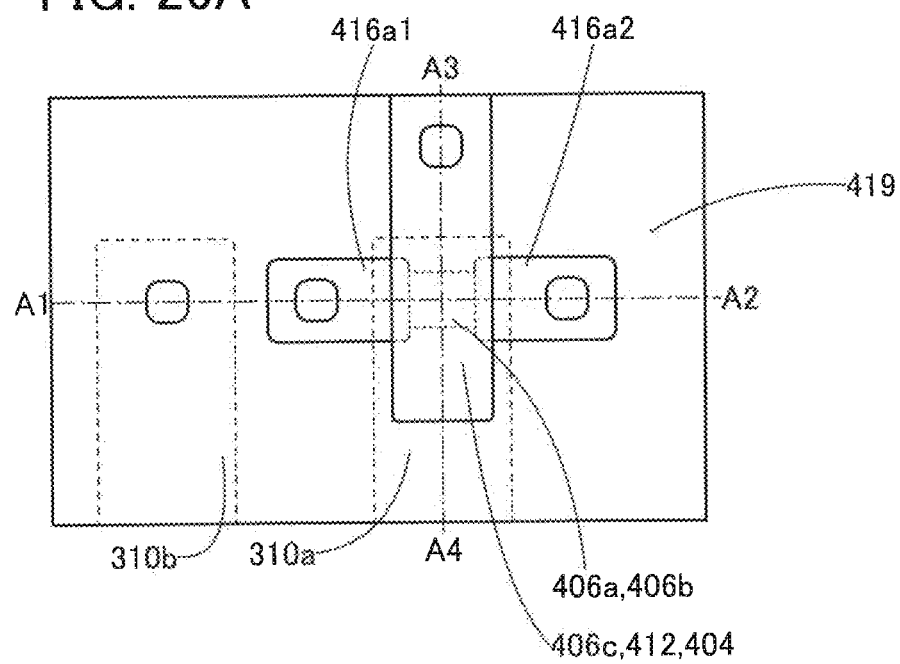
FIGS. 26A to 26C are a top view and cross-sectional views illustrating the manufacturing method of a transistor of one embodiment of the present invention.
Figures 26B, 26C:
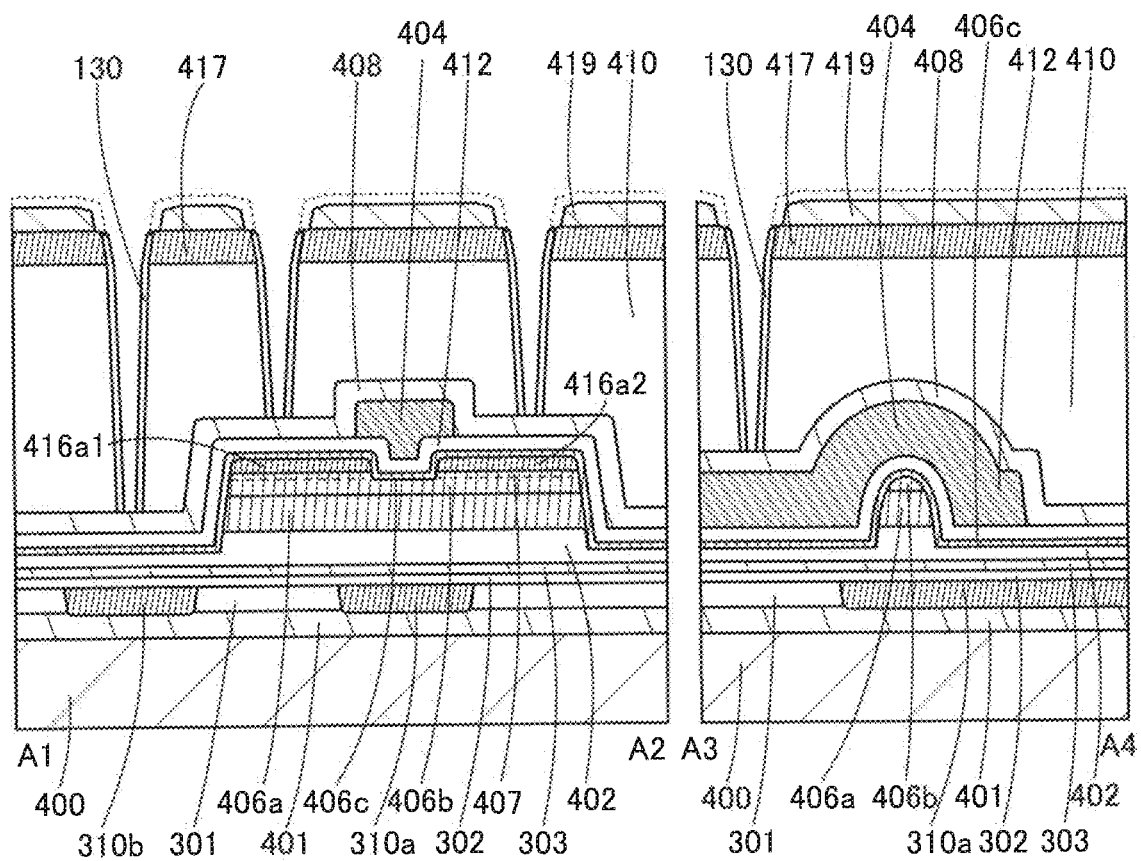

In the conditions for the third processing, the etching rate of the insulator 408 is set lower than that of the insulator 410. In other words, by setting the ratio of the etching rate of the insulator 410 to the etching rate of the insulator 408 high, the progress of the etching of the insulator 408 in the second and third openings can be minimized. The ratio of the etching rate of the insulator 410 to the etching rate of the insulator 408 is set to 5:1 or more, preferably, 10:1 or more. By the third processing, the product 130 might be deposited on the side surface of the first opening, the side surface of the second opening, the side surface of the third opening, and the side surface of the fourth opening (see FIGS. 26A to 26C).

Next, fourth processing is performed on the insulator 408 by a dry etching method until the first opening, the second opening, and the third opening reach the insulator 412 and the fourth opening reaches the conductor 404.

Then, fifth processing is performed on the insulator 412 by a dry etching method until the first opening, the second opening, and the third opening reach the insulator 406c. The fourth opening has reached the conductor 404 by the fourth processing, and the conductor 404 at the fourth opening is over-etched by the fifth processing (see FIGS. 27A to 27C).

Next, sixth processing is performed on the insulator 406c by a dry etching method until the first opening reaches the insulator 402 and the second and third openings reach the conductors 416a1 and 416a2. The fourth opening has reached the conductor 404 by the fourth processing, and the conductor 404 at the fourth opening is further over-etched by the sixth processing.

Next, seventh processing is performed on the insulator 402 by a dry etching method until the electron trap layer 303 is reached. The second opening and the third opening have reached the conductors 416a1 and 416a2 by the sixth processing, and the conductors 416a1 and 416a2 at the second and third openings are over-etched by the seventh processing. The fourth opening has reached the conductor 404 by the fourth processing and the conductor 404 at the fourth opening is further over-etched by the seventh processing (FIGS. 28A to 28C).

Next, eighth processing is performed on the electron trap layer 303 by a dry etching method until the first opening reaches the insulator 302. The second and third openings have reached the conductors 416a1 and 416a2 by the sixth processing, and the conductors 416a1 and 416a2 at the second and third openings are over-etched by the eighth processing. The fourth opening has reached the conductor 404 by the fourth processing, and the conductor 404 at the fourth opening is further over-etched by the eighth processing.

Next, ninth processing is performed on the insulator 302 by a dry etching method until the first opening reaches the conductor 310b. The second and third openings have reached the conductors 416a1 and 416a2 by the sixth processing, and the conductors 416a1 and 416a2 at the second and third openings are further over-etched by the ninth processing. The fourth opening has reached the conductor 404 by the fourth processing, and the conductor 404 at the fourth opening is further over-etched by the ninth processing. The product 130 might be deposited on the conductor 310b at the bottom part of the first opening, the conductor 416a1 at the bottom part of the second opening, the conductor 416a2 at the bottom part of the third opening, and the conductor 404 at the bottom part of the fourth opening (see FIGS. 29A to 29C).

The fourth to ninth processings can be performed under the same conditions. As the gas used for the dry etching, a gas similar to that used in the first processing can be used. As a dry etching apparatus, an apparatus similar to that used in the first processing can be used.

In the conditions of the fourth to ninth processings, by making the ratio of the etching rates of the insulator 408 and the electron trap layer 303 to the etching rates of the conductors 404, 416a1, 416a2, and 310b high, the progress of the etching of the conductors 404, 416a1, and 416a2 due to the over-etching can be suppressed. The etching rates of the conductors 404, 416a1, 416a2, and 310b are set to 1, and the etching rates of the insulator 408 and the electron trap layer 303 are set to 5 or more, preferably 10 or more.

Furthermore, in the conditions of the third to ninth processings, by making the ratio of the etching rates of the insulator 410, the insulator 408, the insulator 412, the insulator 406c, the insulator 402, the electron trap layer 303, and the insulator 302 to the etching rates of the insulator 419 and the conductor 417 as a hard mask high, the change in the shapes of the insulator 419 and the conductor 417 as the hard mask can be prevented, and defects in the shapes of the openings can be prevented. Specifically, upper portions of the openings can be prevented from extending. The etching rates of the insulator 419 and the conductor 417 are set to 1, and etching rates of the insulator 410, the insulator 408, the insulator 412, the insulator 406c, the insulator 402, the electron trap layer 303, and the insulator 302 are set to 5 or more, preferably 10 or more.

Note that the first to ninth processings can be successively performed using the same dry etching apparatus. Alternatively, when the dry etching apparatus includes a plurality of etching chambers, the first to ninth processings can be performed without exposure to air in each processing. Thus, corrosion or contamination of the substrate, attachment of dust to the substrate, or the like can be prevented; alternatively, productivity can be improved.

For example, when the dry etching apparatus has two etching chambers, after the first processing and the second processing are successively performed in a first chamber, the substrate is moved to a second chamber, and the third to ninth processings may be successively performed. It is preferable that different chambers be used for different kinds of gases to be used in the etching (e.g, when a gas containing chlorine is used or when a gas containing fluorine is used), because stable etching rates, and the like are obtained. Alternatively, the first to ninth processings can be performed in the first chamber and the second chamber in parallel. The parallel processings are preferable because productivity can be improved.

As soon as the completion of the ninth processing, plasma treatment using an oxygen gas may be performed. Although the product 130 might be deposited on the inside of the first opening, the inside of the second opening, the inside of the third opening, and the inside of the fourth opening by the first processing, the second processing, the third processing, the fourth processing, the fifth processing, the sixth processing, the seventh processing, the eighth processing, and the ninth processing, the product 130 can be removed by the plasma treatment using an oxygen gas.

Figure 30A:
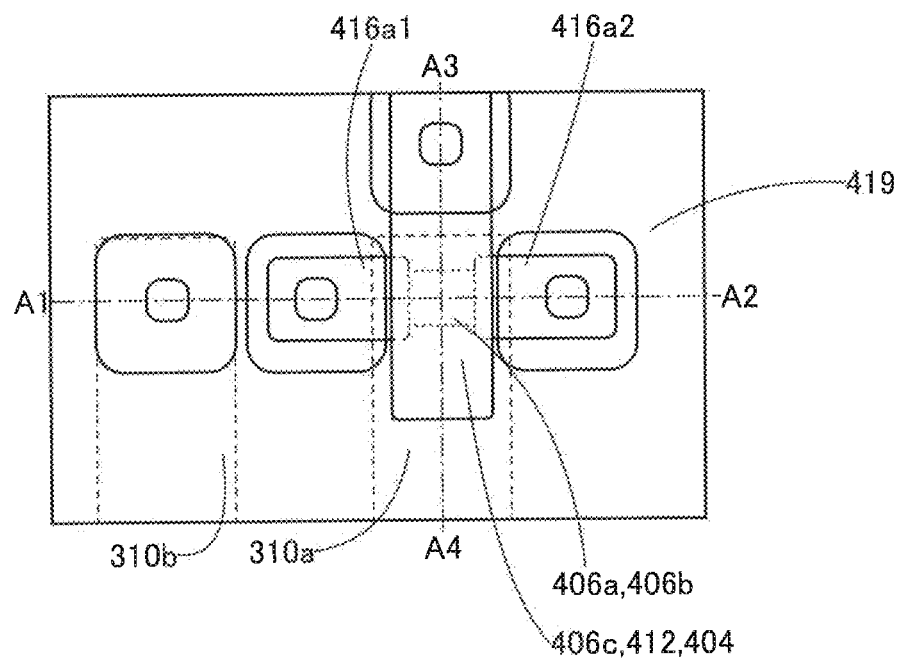
FIGS. 30A to 30C are a top view and cross-sectional views illustrating the manufacturing method of a transistor of one embodiment of the present invention.
Figures 30B, 30C:
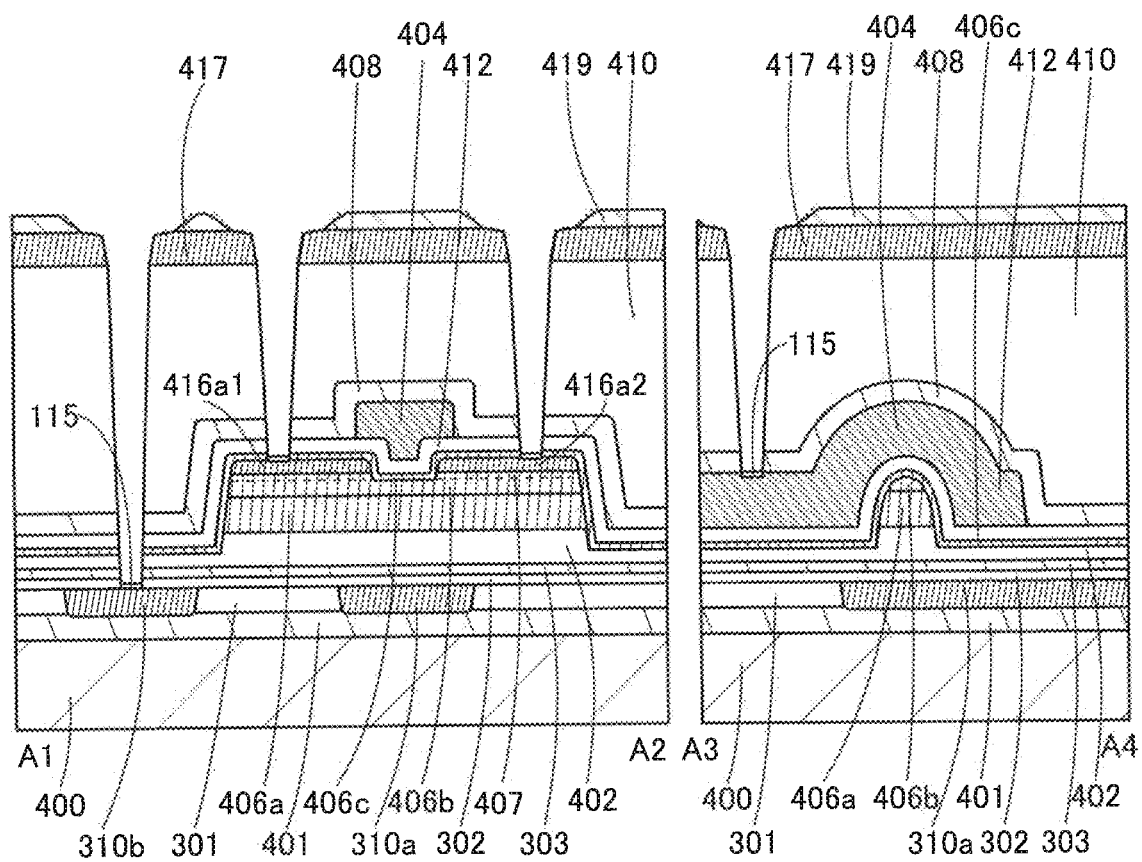

The oxygen plasma treatment oxidizes the top surface of the conductor 310b at the bottom part of the first opening, the top surface of the conductor 416a1 at the bottom part of the second opening, the top surface of the conductor 416a2 at the bottom part of the third opening, and the top surface of the conductor 404 at the bottom part of the fourth opening. In the case where the conductor contains a metal, the metal oxide 115 might be formed. The metal oxide 115 might serve as an insulator or a resistor; thus, the metal oxide 115 is preferably removed (see FIGS. 30A to 30C).

Washing treatment may be performed to remove the metal oxide 115. For washing treatment, washing using a chemical solution or water can be performed. As a washing apparatus, a spin washing apparatus or a batch-type washing apparatus can be used.

Here, as an example of washing treatment, QDR washing treatment is performed using a batch-type washing apparatus as in Embodiment 1. The QDR washing is preferably performed three or more cycles, more preferably five or more cycles.

Figure 31A:
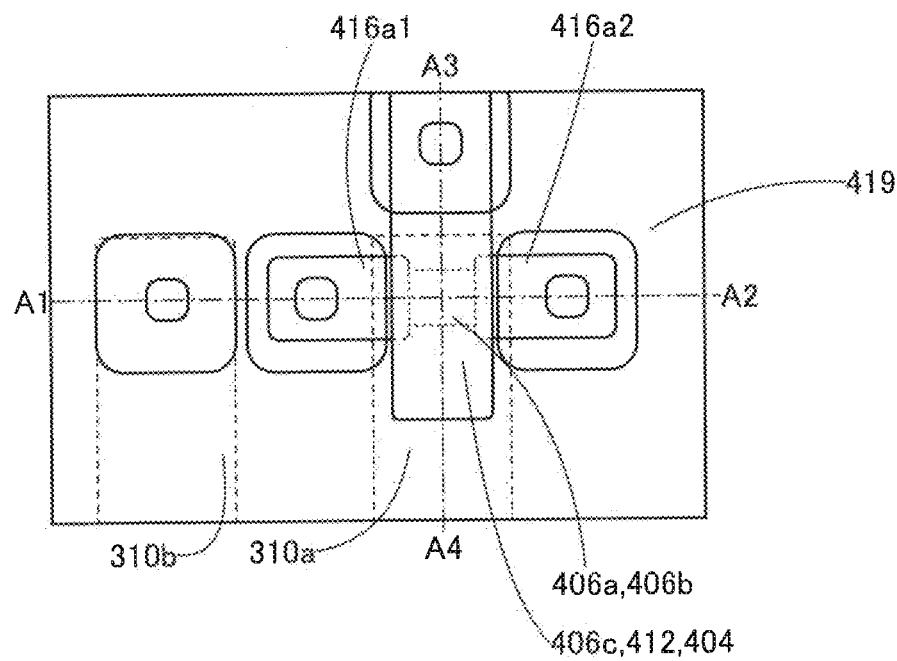
FIGS. 31A to 31C are a top view and cross-sectional views illustrating the manufacturing method of a transistor of one embodiment of the present invention.
Figures 31B, 31C:
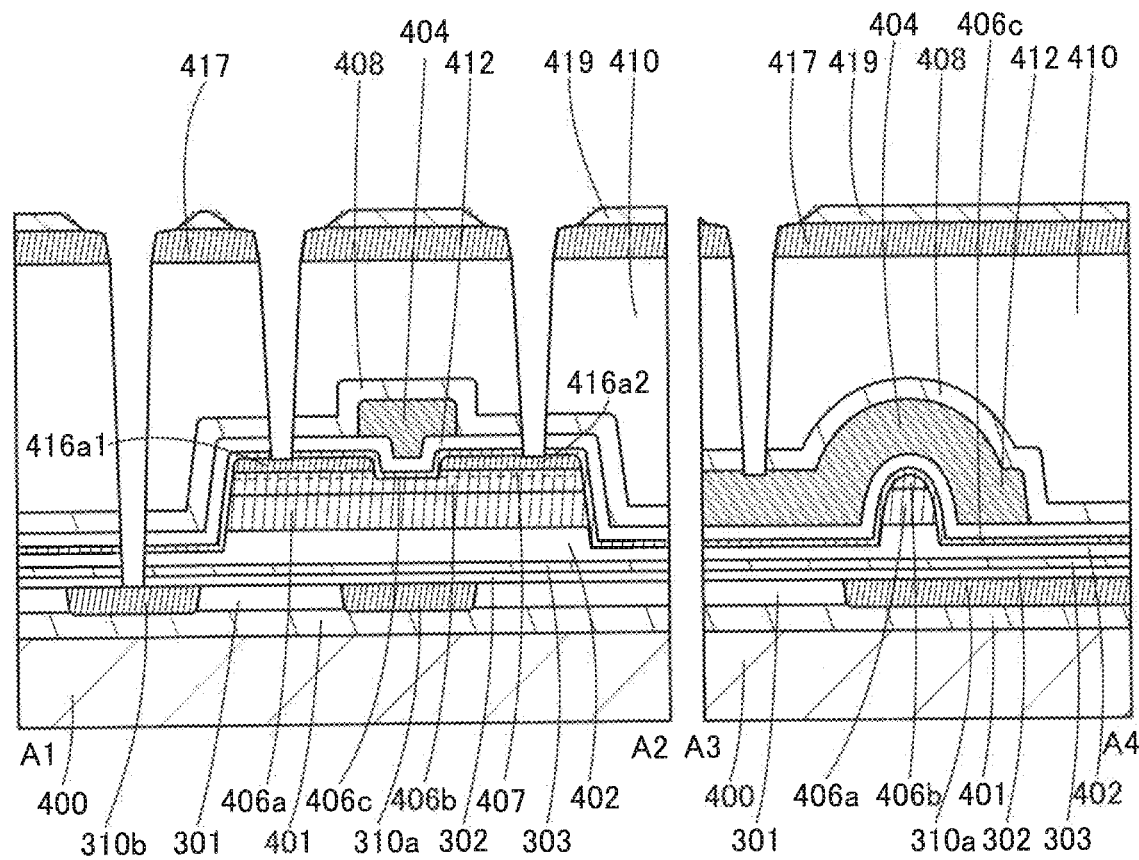

Through the above steps, the first opening, the second opening, the third opening, and the fourth opening can be formed (see FIGS. 31A to 31C).

Although a method for forming the first opening, the second opening, the third opening, and the fourth opening by performing lithography once, lithography may be performed to form each opening. Alternatively, lithography may be performed to form two or more openings.

Then, a conductor 422a is formed. The conductor 422a can be formed by a sputtering method, a CVD method, an MBE method, a PLD method, an ALD method, or the like. The conductor 422a is formed so as to fill the opening formed in the insulator 410 and others. Therefore, a CVD method (a MCVD method, in particular) is preferred. A multi-layer film of a conductor formed by an ALD method or the like and a conductor formed by a MCVD method is preferred in some cases to increase adhesion between the insulator 410 and the conductor formed by a MCVD method. For example, a multi-layer film in which titanium nitride and tungsten are stacked in this order is used (see FIGS. 32A to 32C).

Figure 33A:
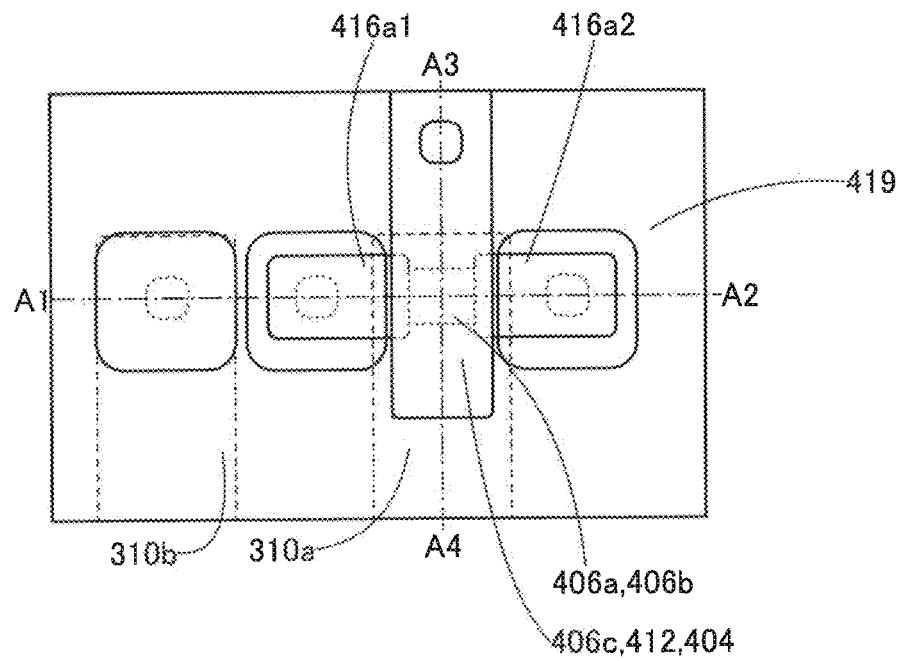
FIGS. 33A to 33C are a top view and cross-sectional views illustrating the manufacturing method of a transistor of one embodiment of the present invention.
Figure 33B:
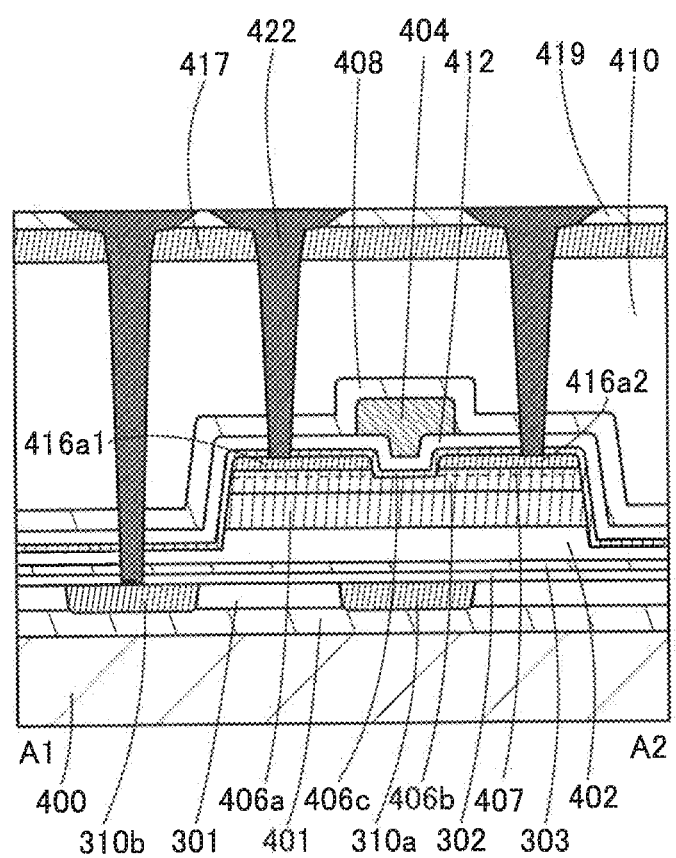
Figure 33C:
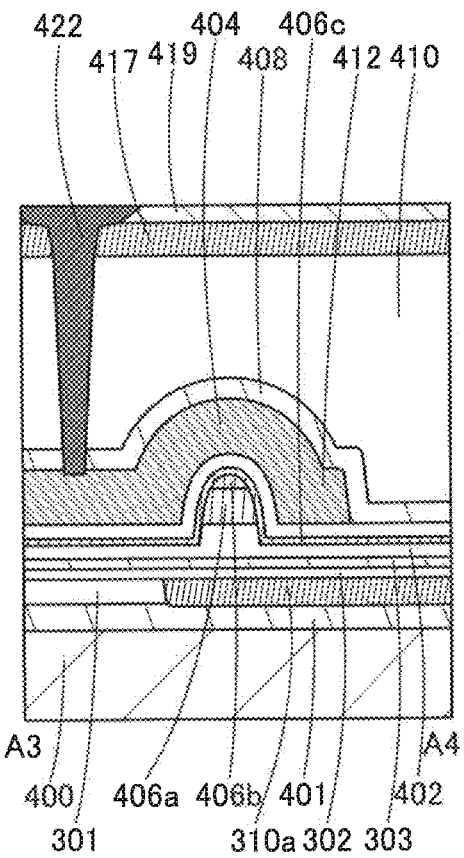

Next, first CMP treatment is performed on the conductor 422a until a top surface of the insulator 419 is reached, whereby the conductor 422 is formed (see FIGS. 33A to 33C).

Figure 34A:
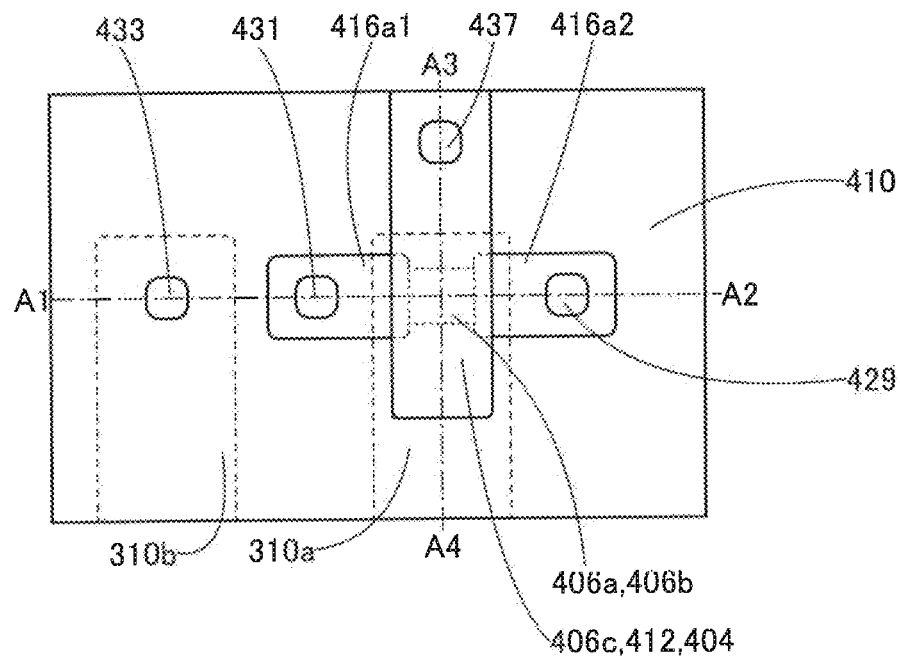
FIGS. 34A to 34C are a top view and cross-sectional views illustrating the manufacturing method of a transistor of one embodiment of the present invention.
Figures 34B, 34C:
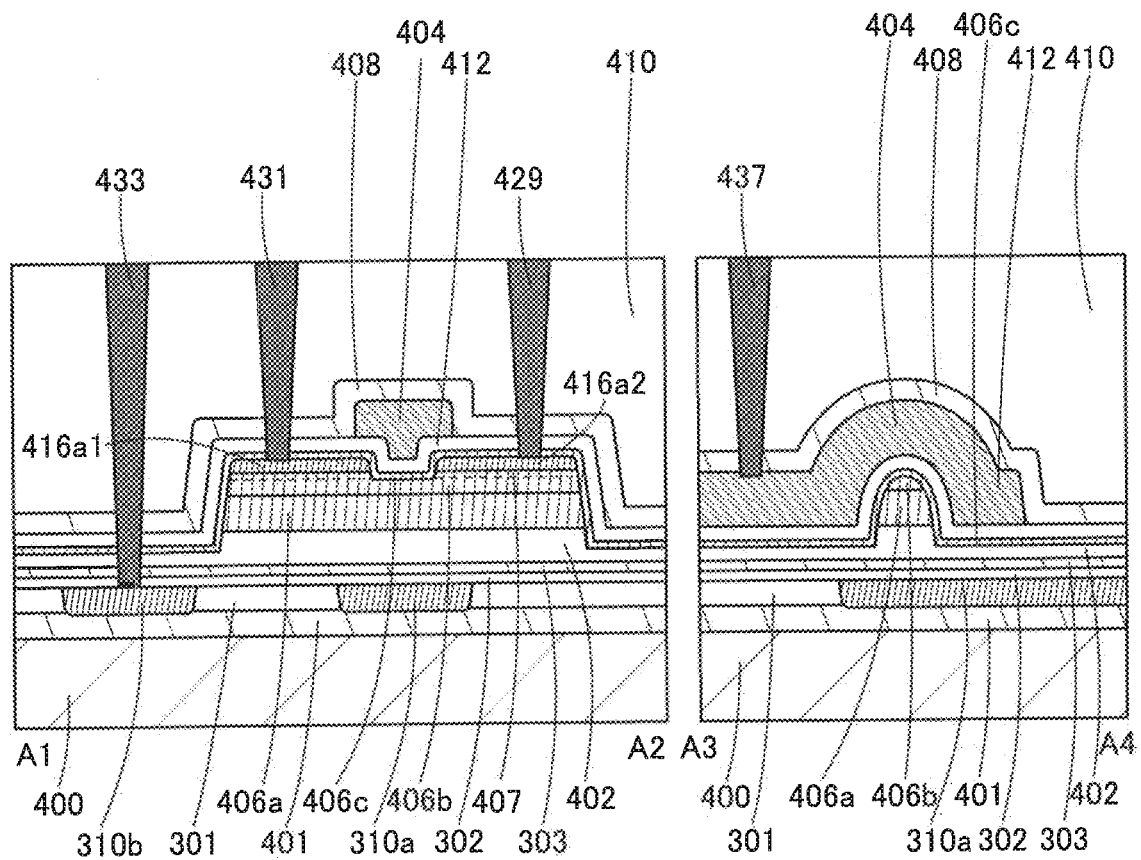
Figure 35A:
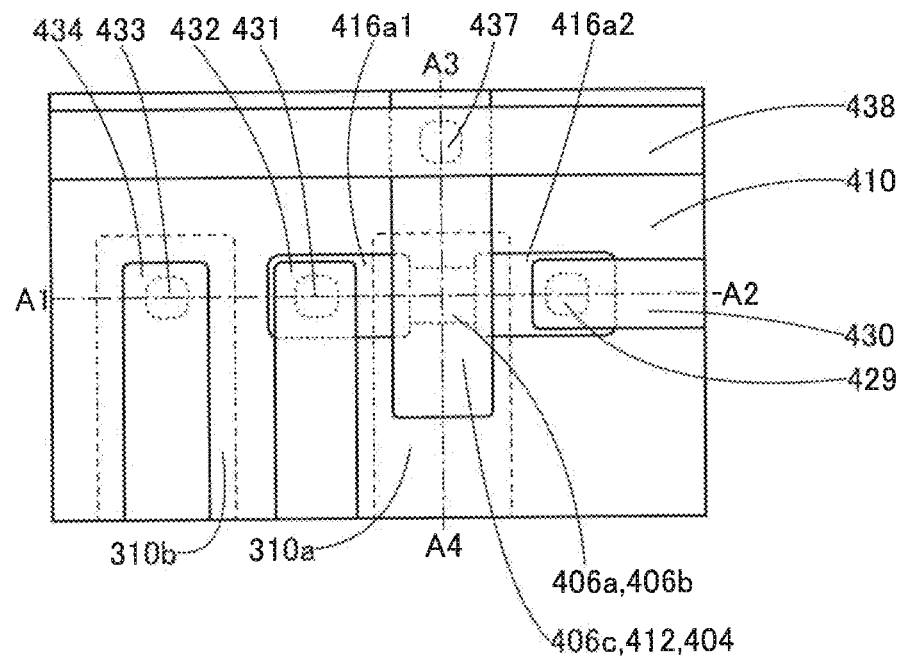
FIGS. 35A to 35C are a top view and cross-sectional views illustrating the manufacturing method of a transistor of one embodiment of the present invention.
Figures 35B, 35C:
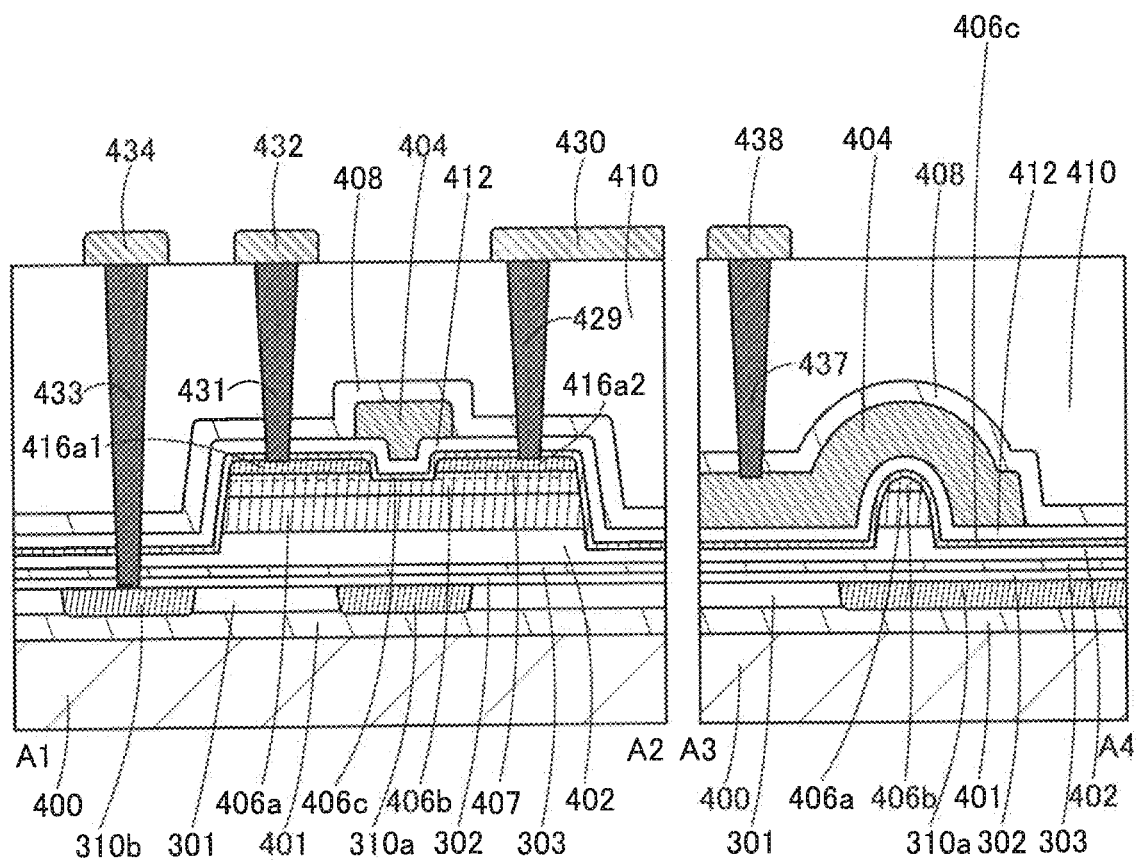
Figure 36A:
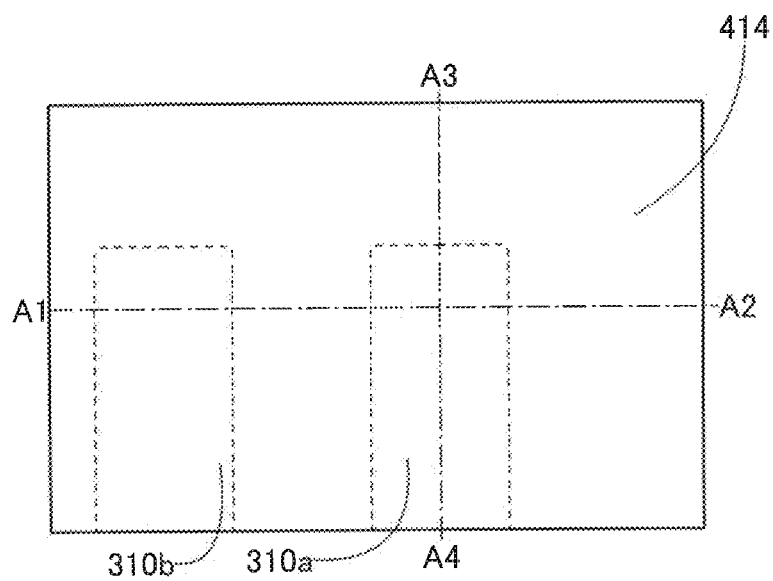
FIGS. 36A to 36C are a top view and cross-sectional views illustrating a manufacturing method of a transistor of one embodiment of the present invention.
Figures 36B, 36C:
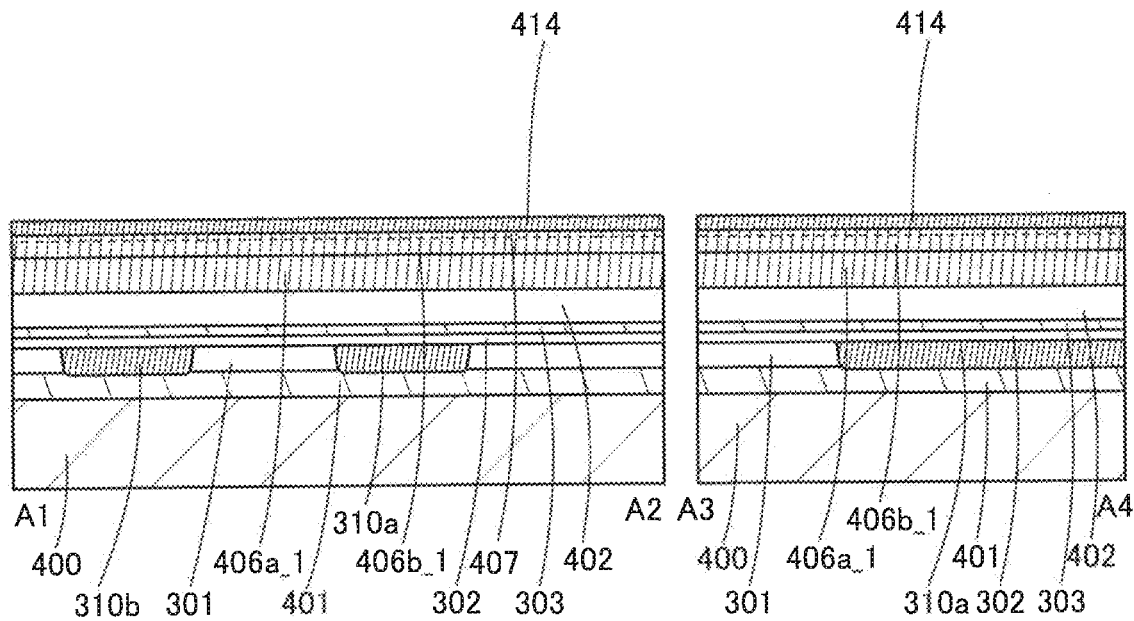

Next, second CMP processing is performed on the conductor 422, the insulator 419, and the conductor 417 until the top surface of the insulator 410 is reached. Accordingly, the conductor 433, the conductor 431, the conductor 429, and the conductor 437 are embedded in the first opening, the second opening, the third opening, and the fourth opening, respectively (see FIGS. 34A to 34C).

Next, a conductor is formed over the insulator 410, the conductor 433, the conductor 431, the conductor 429, and the conductor 437, and partly etched by a lithography method, whereby the conductor 434, the conductor 432, the conductor 430, and the conductor 438 are formed. Through the above steps, the transistor in FIGS. 6A to 6C can be formed (see FIGS. 35A to 35C).

<Method 2 for Manufacturing Transistor>

A method for manufacturing a transistor in FIGS. 9A to 9C of one embodiment of the present invention will be described below with reference to FIGS. 36A to 36C to FIGS. 56A to 56C. Note that the process up to the formation of the conductor 414 is similar to that in Method 1 for manufacturing a transistor (see FIGS. 36A to 36C).

Next, the insulator 406a_1, the semiconductor 406b_1, and the conductor 414 are processed by a lithography method, whereby the multi-layer film including the insulator 406a, the semiconductor 406b, and the conductor 415 is formed. Here, a top surface of a semiconductor to be the semiconductor 406b_1 is damaged when the conductor 414 is formed, whereby the region 407 is formed. Since the region 407 includes a region where the resistance of the semiconductor 406b is reduced, the contact resistance between the conductor 415 and the semiconductor 406b is reduced. Note that when the multilayer film is formed, the insulator 402 is also subjected etching to have a thinned region in some cases. That is, the insulator 402 may have a protruding portion in a region in contact with the multilayer film (see FIGS. 37A to 37C).

Next, an insulator 410a is formed. The insulator 410a can be formed by a sputtering method, a CVD method, an MBE method, a PLD method, an ALD method, or the like. Alternatively, the insulator 410a can be formed by a spin coating method, a dipping method, a droplet discharging method (such as an ink-jet method), a printing method (such as screen printing or offset printing), a doctor knife method, a roll coater method, a curtain coater method, or the like.

The insulator 410a may be formed to have a flat top surface. For example, the top surface of the insulator 410a may have flatness immediately after the deposition. Alternatively, for example, the insulator 410a may have flatness by removing the insulator and the like from the top surface after the film formation so that the top surface of the insulator 410a becomes parallel to a reference surface such as a rear surface of the substrate. Such treatment is referred to as planarization treatment. As the planarization treatment, for example, CMP treatment, dry etching treatment, or the like can be performed. However, the top surface of the insulator 410a is not necessarily flat.

Figure 38A:
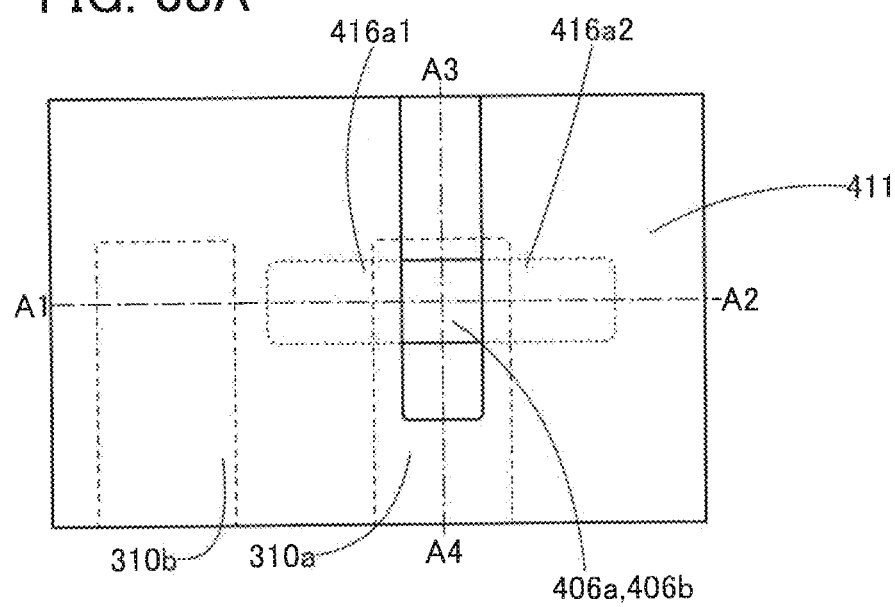
FIGS. 38A to 38C are a top view and cross-sectional views illustrating the manufacturing method of a transistor of one embodiment of the present invention.
Figure 38B:
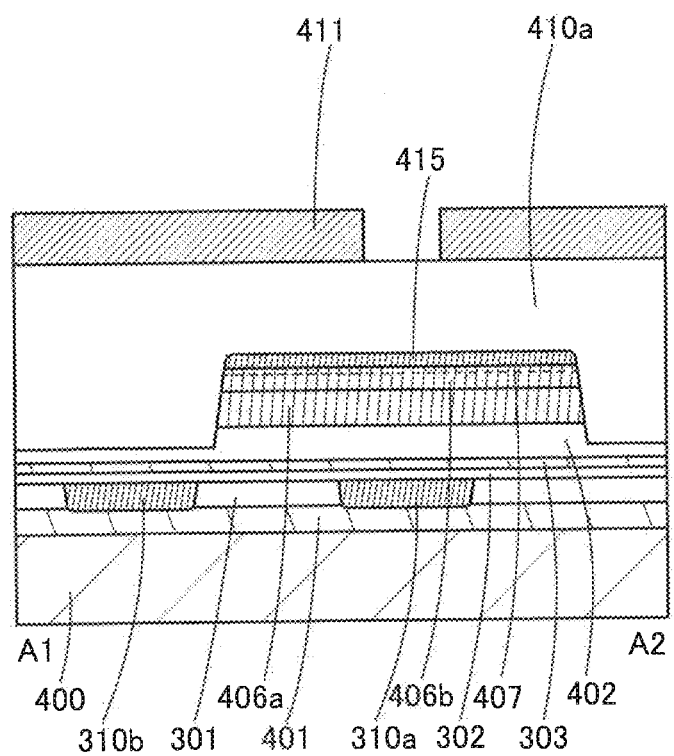
Figure 38C:
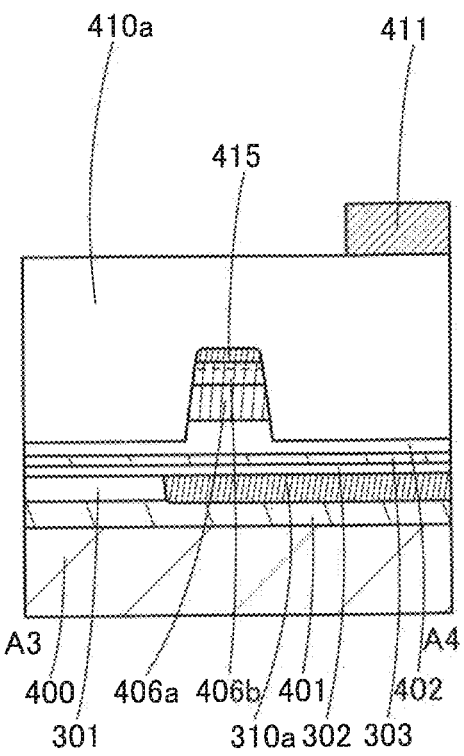

Next, the resist mask 411 is formed over the insulator 410a by a lithography method or the like. Here, in order to improve the adhesion between the top surface of the insulator 410a and the resist mask 411, for example, an organic coating film may be provided between the insulator 410a and the resist mask 411. Alternatively, a single layer of a conductor or a stack of a conductor and an insulator is formed over the insulator 410a to form a hard mask by a lithography method (see FIGS. 38A to 38C).

Next, the first processing is performed on the insulator 410a by a dry etching method or the like until the insulator 402 is reached, whereby the insulator 410 is formed. At that time, the insulator 402 might be etched until the electron trap layer 303 is reached. As a gas for the dry etching in the first processing, for example, a $C_4F_6$ gas, a $CF_4$ gas, a $SF_6$ gas, a $CHF_3$ gas, or the like can be used. Alternatively, an oxygen gas, a helium gas, an argon gas, a hydrogen gas, or the like can be added to any of the above gases as appropriate. Here, a $C_4F_6$ gas to which an oxygen gas is added is preferably used. As a dry etching apparatus, any of the above-described dry etching apparatuses can be used; however, a dry etching apparatus in which high-frequency power sources with different frequencies are connected to parallel-plate electrodes is preferably used.

Next, the conductor 415 is subjected to the second processing using a dry etching method or the like so as to be separated into the conductor 416a1 and the conductor 416a2. As a gas for the dry etching in the second processing, for example, any of a $C_4F_6$ gas, a $CF_4$ gas, a $SF_6$ gas, a $Cl_2$ gas, a $BCl_3$ gas, a $SiCl_4$ gas, and the like can be used alone or in combination. Alternatively, an oxygen gas, a helium gas, an argon gas, or a hydrogen gas can be added to any of the above gases as appropriate. Here, a combination of a $CF_4$ gas, a $Cl_2$ gas, and an oxygen gas is preferably used. As a dry etching apparatus, the above-described dry etching apparatuses for the first processing may be used.

At this time, the semiconductor 406b has an exposed region. Here, the exposed region of the semiconductor 406b, which is the region 407, is removed by the second processing in some cases (see FIGS. 39A to 39C).

When the first processing and the second processing are each performed by a dry etching method, an impurity such as the residual components of the etching gas is attached to the exposed region of the semiconductor 406b in some cases. For example, when a chlorine-based gas is used as an etching gas, chlorine and the like are attached in some cases. Furthermore, when a hydrocarbon-based gas is used as an etching gas, carbon, hydrogen, and the like are attached in some cases. When the substrate is exposed to air after the second processing, the exposed region of the semiconductor 406b, and the like corrode in some cases. Thus, plasma treatment using an oxygen gas is preferably performed successively after the second processing because the impurity can be removed and corrosion of the exposed region of the semiconductor 406b, and the like can be prevented.

Alternatively, the impurity may be reduced by washing treatment using diluted hydrofluoric acid or the like or washing treatment using ozone or the like, for example Note that different types of washing treatment may be combined. In such a manner, the exposed region of the semiconductor 406b, i.e., a channel formation region has high resistance.

Meanwhile, in the region 407 where the conductors 416a1 and 416a2 and the top surface of the semiconductor 406b overlap with each other, the value of contact resistance between the conductors 416a1 and 416a2 and the semiconductor 406b is decreased; thus, favorable transistor characteristics can be obtained.

Next, an insulator to be the insulator 406c is formed, and an insulator to be the insulator 412 is formed over the insulator to be the insulator 406c. The insulator to be the insulator 406c and the insulator to be the insulator 412 can be formed by a sputtering method, a CVD method, an MBE method, a PLD method, an ALD method, or the like. The insulator to be the insulator 406c and the insulator to be the insulator 412 are formed to have a uniform thickness along bottom and side surfaces of an opening formed in the insulator 410, the conductor 416a1, and the conductor 416a2. Therefore, an ALD method is preferably used.

Next, the conductor to be the conductor 404 is formed. The conductor to be the conductor 404 can be formed by a sputtering method, a CVD method, an MBE method, a PLD method, an ALD method, or the like. The conductor to be the conductor 404 is formed so as to fill the opening formed in the insulator 410 and the like. Therefore, a CVD method (an MCVD method, in particular) is preferred. A multi-layer film of a conductor formed by an ALD method or the like and a conductor formed by a CVD method is preferred in some cases to increase adhesion between adhesion between the insulator 410 and the conductor formed by a MCVD method. For example, the multi-layer film where titanium nitride and tungsten are formed in this order may be used.

Next, the conductor to be the conductor 404, the insulator to be the insulator 412, and the insulator to be the insulator 406c are polished and flattened by CMP or the like from the top surface of the conductor to be the conductor 404 until the top surface of the insulator 410 is reached. Accordingly, the conductor 404 functioning as the gate electrode can be formed in a self-aligned manner without using a lithography method. Furthermore, the insulator 412 and the insulator 406c are formed.

The conductor 404 functioning as the gate electrode can be formed without considering alignment accuracy of the conductor 404 functioning as the gate electrode and the conductors 416a1 and 416a2 functioning as the source electrode and the drain electrode; as a result, the area of the semiconductor device can be reduced. Furthermore, because the lithography process is not necessary, productivity due to simplification of the process can be improved (see FIGS. 40A to 40C).

Next, the insulator 418 is formed over the insulator 410, the insulator 412, and the insulator 406c. The insulator 418 can be formed by a sputtering method, a CVD method, an MBE method, a PLD method, an ALD method, or the like. Then, the insulator 408 is formed over the insulator 418. The insulator 408 can be formed by a sputtering method, a CVD method, an MBE method, a PLD method, an ALD method, or the like. An aluminum oxide film is preferably formed as the insulator 408 using plasma containing oxygen, so that oxygen in the plasma can be added as excess oxygen to the top surface of the insulator 418.

Second heat treatment may be performed at any time after the formation of the insulator to be the insulator 408. By the second heat treatment, the excess oxygen contained in the insulator 418 is moved to the semiconductor 406b through the insulator 410, the insulator 402, and the insulator 406a. Furthermore, the excess oxygen contained in the insulator 418 is moved to the semiconductor 406b through the insulator 412 and/or the insulator 406c. Since excess oxygen is moved to the semiconductor 406b by passing two paths as described above, defects (oxygen vacancies) in the semiconductor 406b can be reduced.

Note that the second heat treatment may be performed at a temperature such that excess oxygen (oxygen) in the insulator 418 is diffused to the semiconductor 406b. For example, the description of the first heat treatment may be referred to for the second heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited. Note that in the case where heating at the time of formation of the layers doubles as the second heat treatment, the second heat treatment is not necessarily performed.

Next, the insulator 428 is formed over the insulator 408. The insulator 428 can be formed by a sputtering method, a CVD method, an MBE method, a PLD method, an ALD method, or the like (see FIGS. 41A to 41C).

A method for forming the first to fourth openings of one embodiment of the present invention will be described below in detail.

Figure 42A:
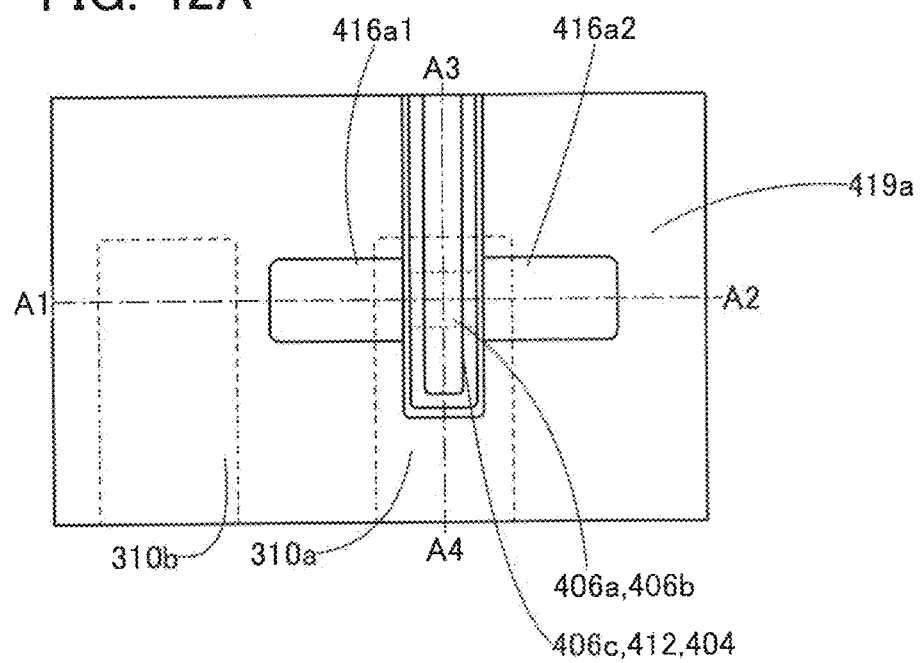
FIGS. 42A to 42C are a top view and cross-sectional views illustrating the manufacturing method of a transistor of one embodiment of the present invention.
Figure 42B:
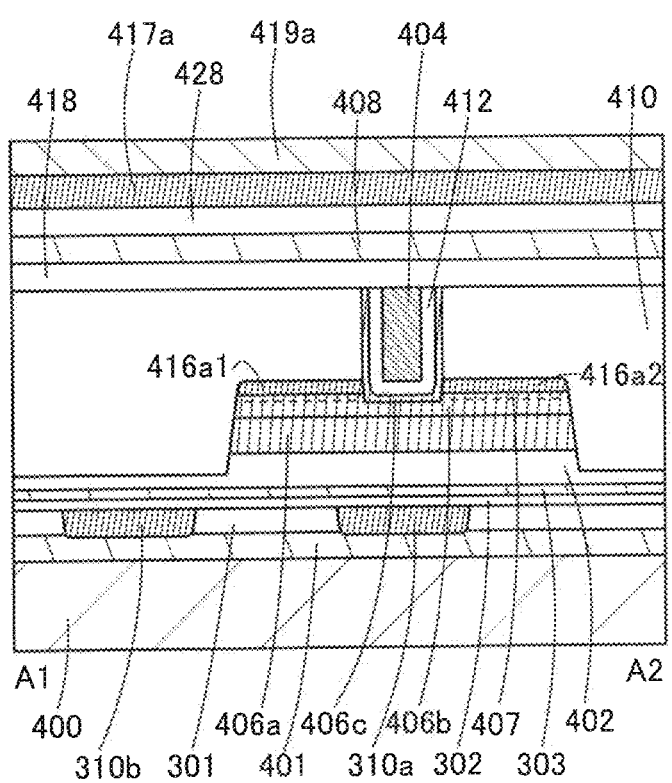
Figure 42C:
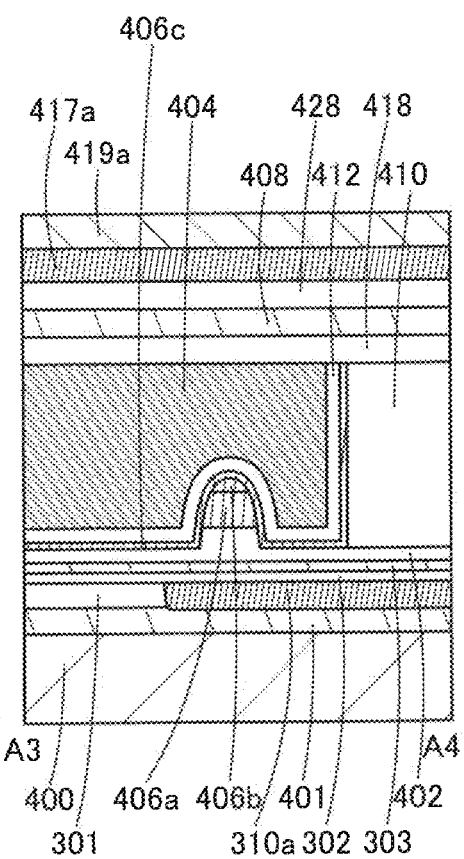

First, the conductor 417a is formed over the insulator 428. The conductor 417a can be formed by a sputtering method, a CVD method, an MBE method, a PLD method, an ALD method, or the like. The insulator 419a is formed over the conductor 417a. The insulator 419a can be formed by a sputtering method, a CVD method, an MBE method, a PLD method, an ALD method, or the like (see FIGS. 42A to 42C).

Figure 43A:
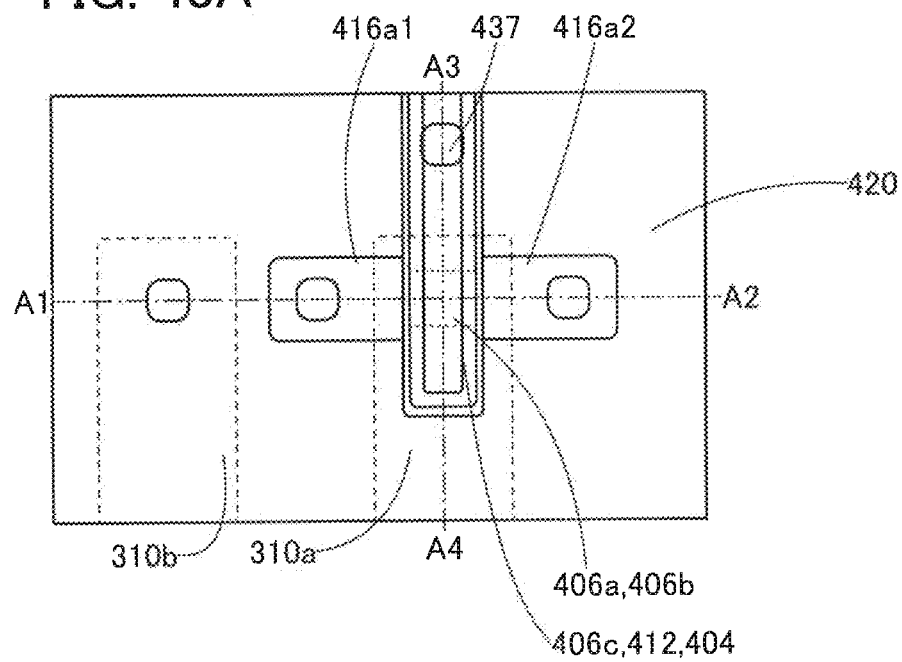
FIGS. 43A to 43C are a top view and cross-sectional views illustrating the manufacturing method of a transistor of one embodiment of the present invention.
Figure 43B:
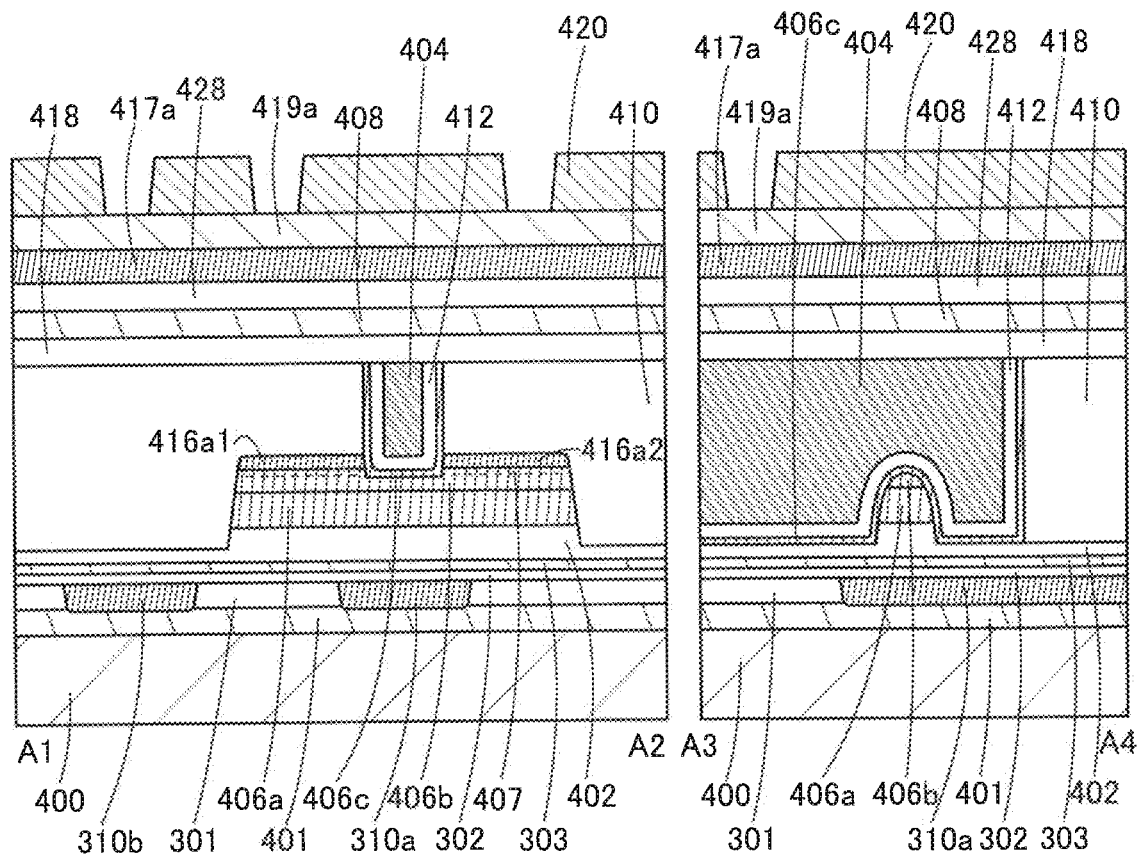
Figure 43C:
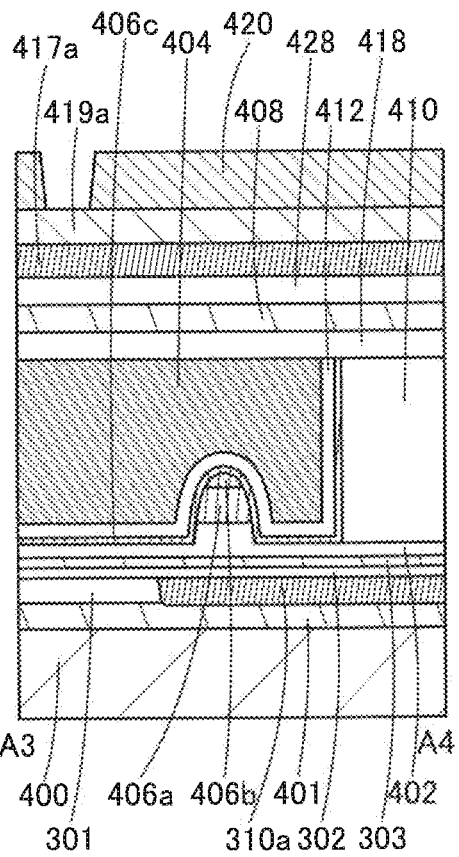

Next, the resist mask 420 is formed over the insulator 419a by a lithography method or the like. Although not shown, the resist mask 420 may be formed in such a manner that an organic coating film is formed over the insulator 419a and then a lithography method or the like is performed on the organic coating film Formation of the organic coating film between the insulator 419a and the resist mask 420 may improve adhesion between the insulator 419a and the resist mask 420 with the organic coating film interposed therebetween (see FIGS. 43A to 43C).

Next, the first processing is performed on the insulator 419a by a dry etching method or the like until a top surface of the conductor 417a is reached, whereby the insulator 419 is formed. In the case where the organic coating film is formed over the insulator 419a, the organic coating film is processed by a dry etching method or the like before the first processing. Examples of gases to be used for the processing of the organic coating film include a $C_4F_6$ gas, a $C_4F_8$ gas, a $CF_4$ gas, a $SF_6$ gas, and a $CHF_3$ gas.

As a gas for the first processing, for example, any of a $C_4F_6$ gas, a $C_4F_8$ gas, a $CF_4$ gas, a $SF_6$ gas, a $CHF_3$ gas, and the like can be used alone or in combination. Alternatively, an oxygen gas, a helium gas, an argon gas, a hydrogen gas, or the like can be added to any of the above gases as appropriate. As a dry etching apparatus used for the processing of the organic coating film and the processing of the insulator 419, any of the above-described dry etching apparatuses can be used; however, a dry etching apparatus in which high-frequency power sources with different frequencies are connected to the parallel-plate electrodes is preferably used (see FIGS. 44A to 44C).

Figure 45A:
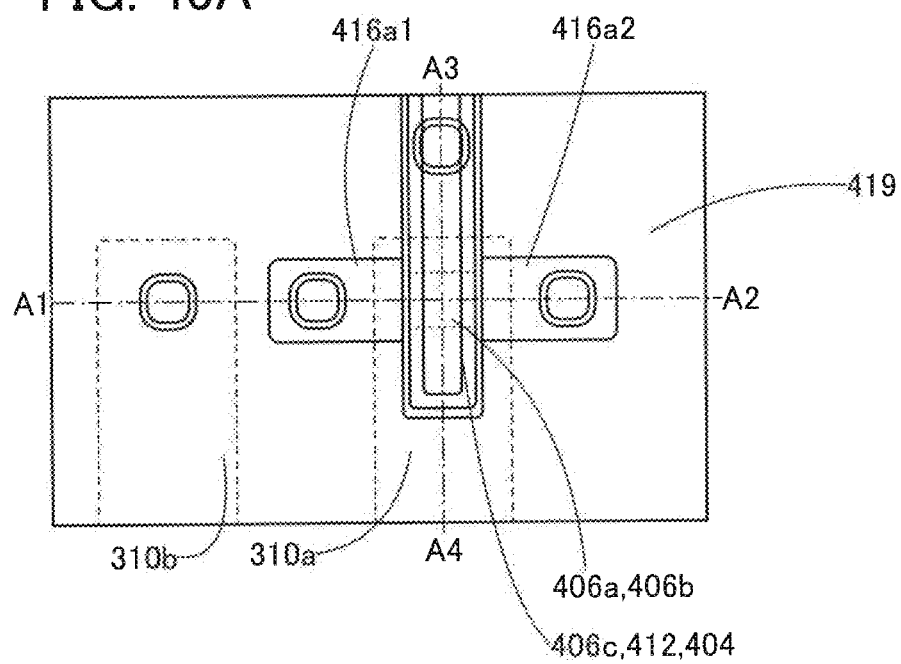
FIGS. 45A to 45C are a top view and cross-sectional views illustrating the manufacturing method of a transistor of one embodiment of the present invention.
Figure 45B:
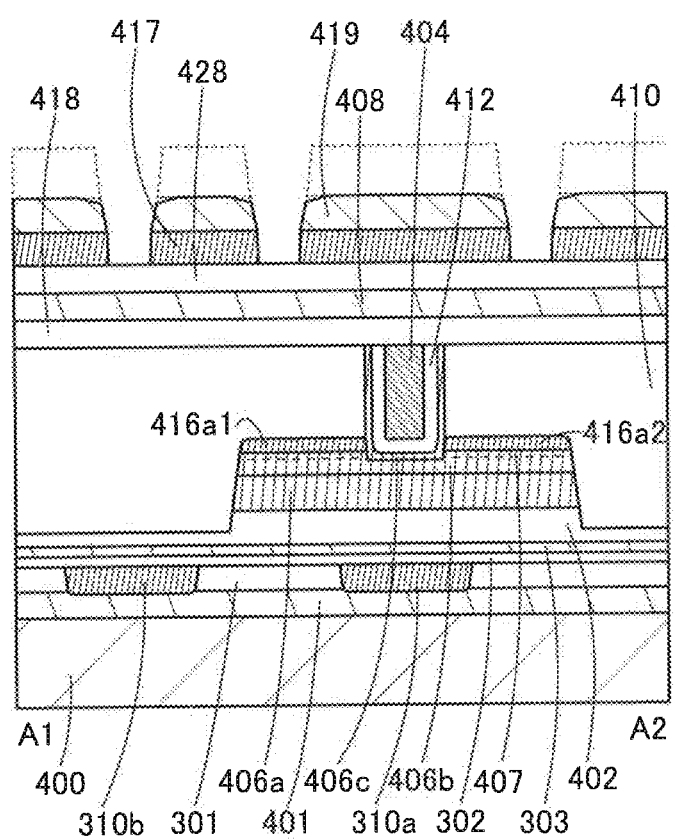
Figure 45C:
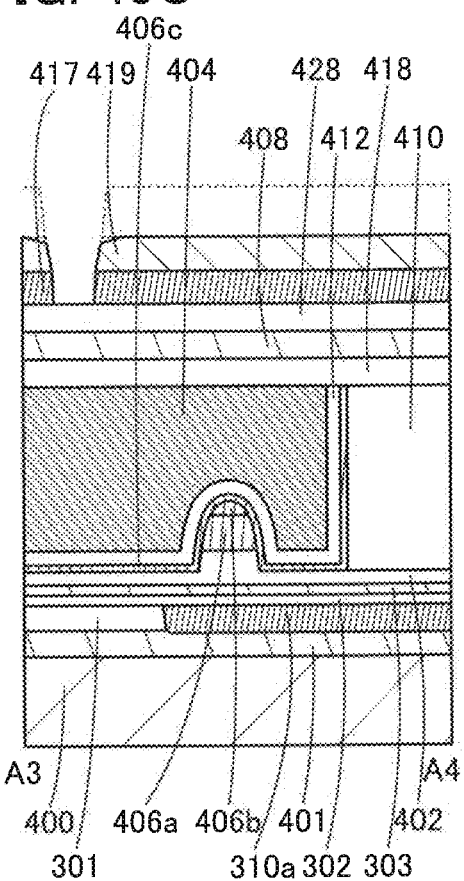

Next, the second processing is performed on the conductor 417a by a dry etching method until the top surface of the insulator 428 is reached, whereby the conductor 417 is formed. As a gas for the dry etching, for example, any of a $C_4F_6$ gas, a $C_4F_8$ gas, a $CF_4$ gas, a $SF_6$ gas, a $CHF_3$ gas, a $Cl_2$ gas, a $BCl_3$ gas, a $SiCl_4$ gas, and the like can be used alone or in combination. Alternatively, an oxygen gas, a helium gas, an argon gas, a hydrogen gas, or the like can be added to any of the above gases as appropriate. At this time, the resist mask 420 is eliminated by the etching in some cases. As a dry etching apparatus, the dry etching apparatuses used in the first processing may be used. Through the above steps, a hard mask including the conductor 417 and the insulator 419 is formed (see FIGS. 45A to 45C).

Note that the hard mask may be one layer formed only using the conductor 417. In that case, the second processing is performed after the formation of the resist mask 420 over the conductor 417a by a lithography method or the like. By the second processing, the resist mask 420 is eliminated by the etching in some cases. Alternatively, without the hard mask, only the resist mask 420 or a two-layer mask including the organic coating film and the resist mask 420 may be used.

Figure 46A:
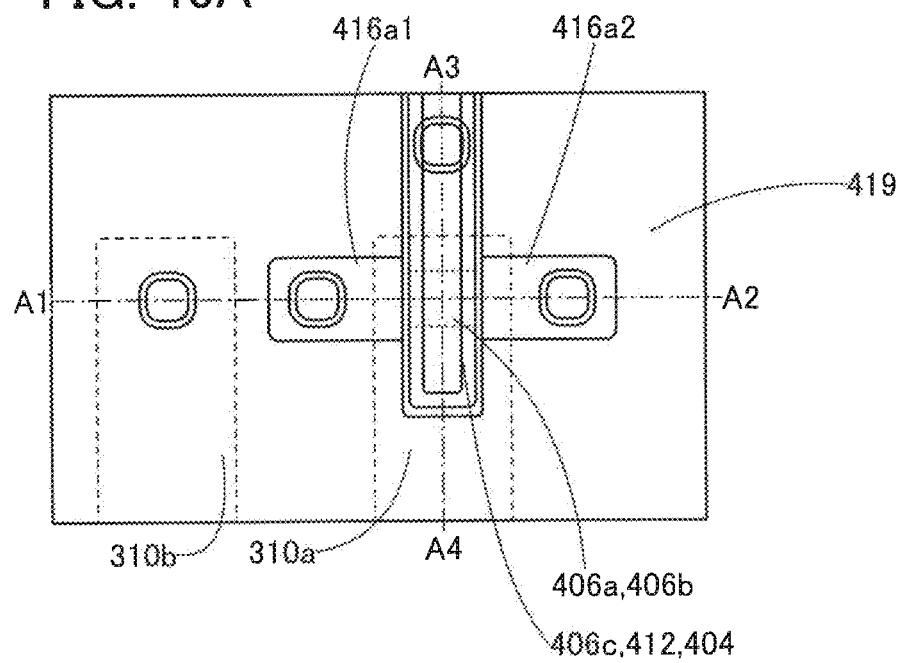
FIGS. 46A to 46C are a top view and cross-sectional views illustrating the manufacturing method of a transistor of one embodiment of the present invention.
Figure 46B:
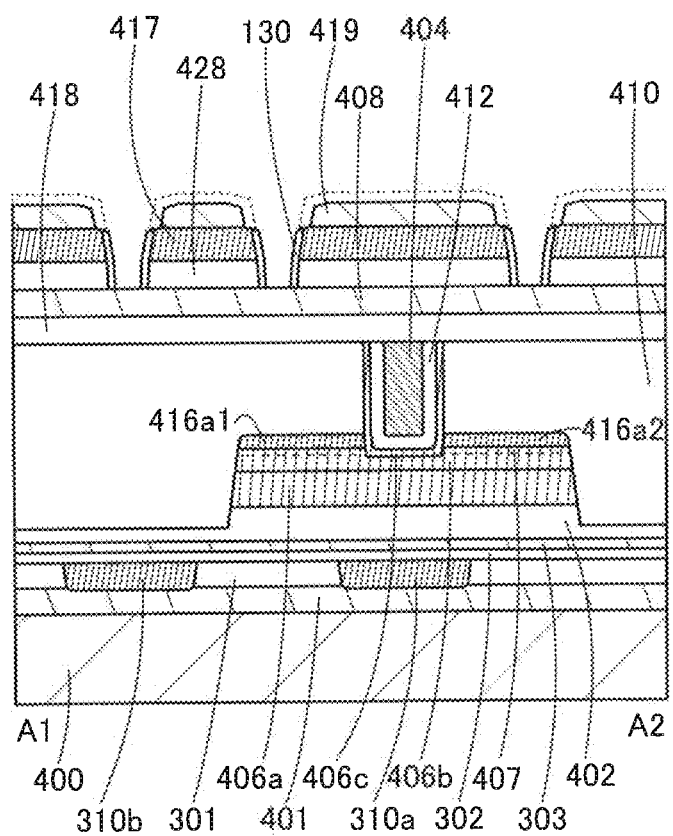
Figure 46C:
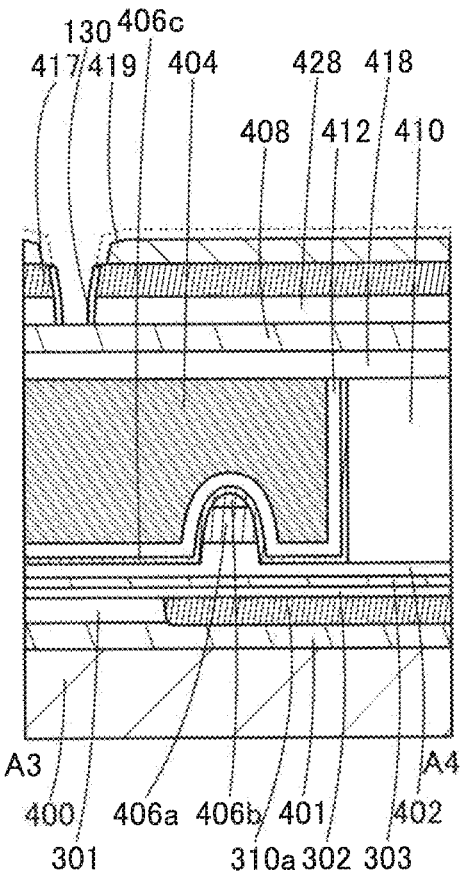

Next, the third processing is performed on the insulator 428 by a dry etching method until the first opening, the second opening, the third opening, and the fourth opening reach the top surface of the insulator 408 using the hard mask including the conductor 417 and the insulator 419 as a mask. As a gas for the dry etching, a gas similar to that used in the first processing can be used. As a dry etching apparatus, an apparatus similar to that used in the first processing can be used. By the third processing, the product 130 might be deposited on the side surface of the first opening, the side surface of the second opening, the side surface of the third opening, and the side surface of the fourth opening (see FIGS. 46A to 46C).

Next, the fourth processing is performed on the insulator 408 by a dry etching method until the first opening, the second opening, the third opening, and the fourth opening reach the top surface of the insulator 418.

Next, the fifth processing is performed on the insulator 418 by a dry etching method until the first to third openings reach the insulator 410 and the fourth opening reaches the conductor 404.

Figure 47A:
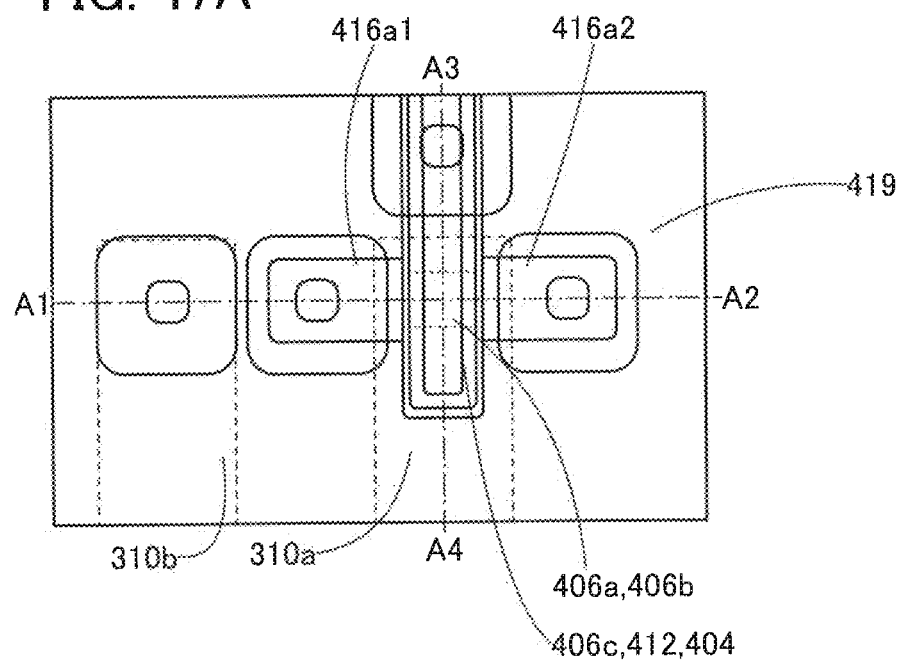
FIGS. 47A to 47C are a top view and cross-sectional views illustrating the manufacturing method of a transistor of one embodiment of the present invention.
Figure 47B:
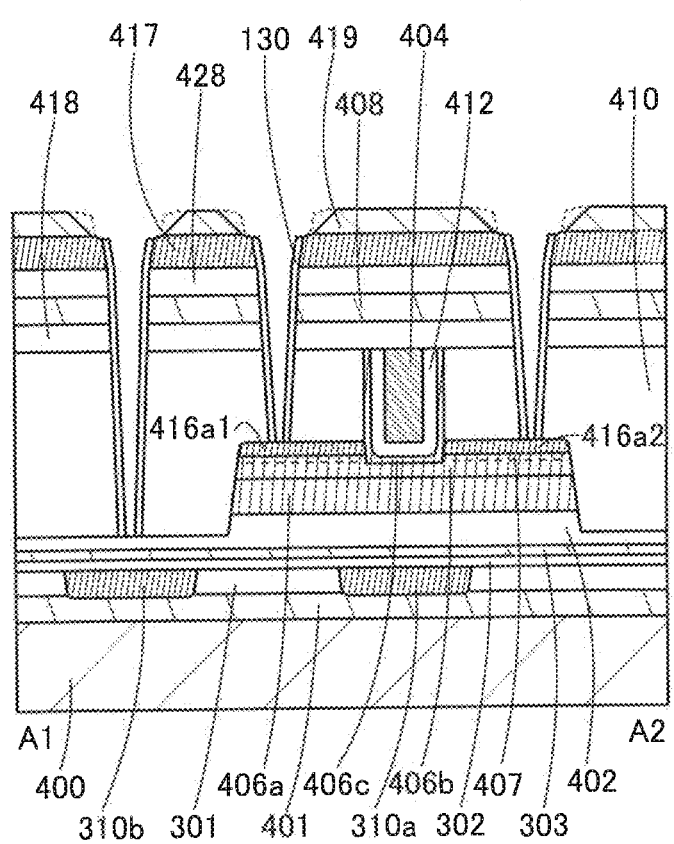
Figure 47C:
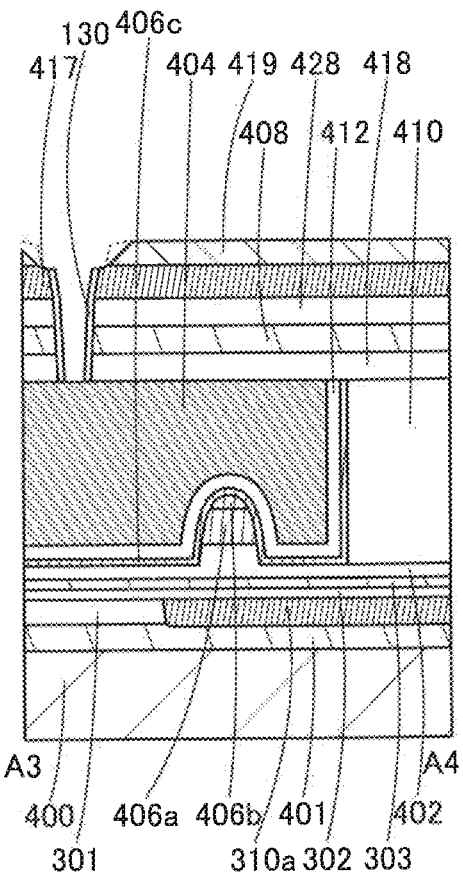

Next, the sixth processing is performed on the insulator 410 by a dry etching method until the first opening, the second opening, and the third opening reach the insulator 402, the conductor 416a1, and the conductor 416a2, respectively. The fourth opening is not provided in the insulator 410 and the fourth opening has already reached the conductor 404 by the fifth processing; thus, the conductor 404 is over-etched by the sixth processing (see FIGS. 47A to 47C).

Since the insulator 410 has a flat top surface by CMP treatment or the like, the thicknesses of the insulator 410 at the first to third openings vary. The order of thickness of the insulator 410 from the largest to the smallest is the thickness at the first opening and those at the second and third openings. Note that the fourth opening is not provided in the insulator 410.

That is, in the sixth processing, the insulator 410 at the second and third openings is etched first so that the conductors 416a1 and 416a2 are reached; then, the insulator 410 at the first opening is etched so that the insulator 402 is reached. In other words, the conductors 416a1 and 416a2 in the second and third openings are over-etched during the period after the second opening and the third opening reach the conductors 416a1 and 416a2 and before the first opening reaches the insulator 402. Alternatively, the conductor 404 at the fourth opening is over-etched during the sixth processing.

Figure 48A:
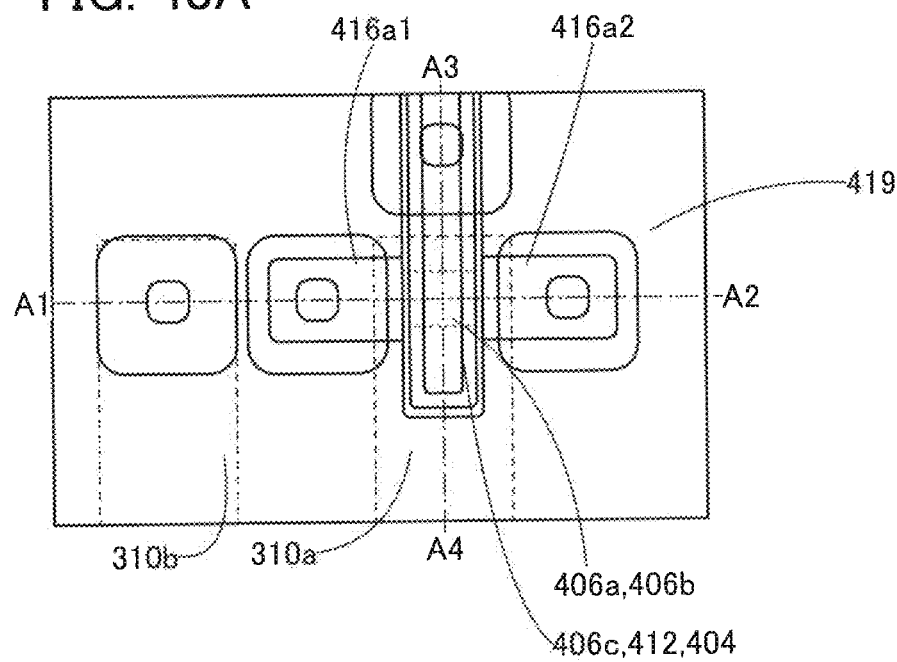
FIGS. 48A to 48C are a top view and cross-sectional views illustrating the manufacturing method of a transistor of one embodiment of the present invention.
Figure 48B:
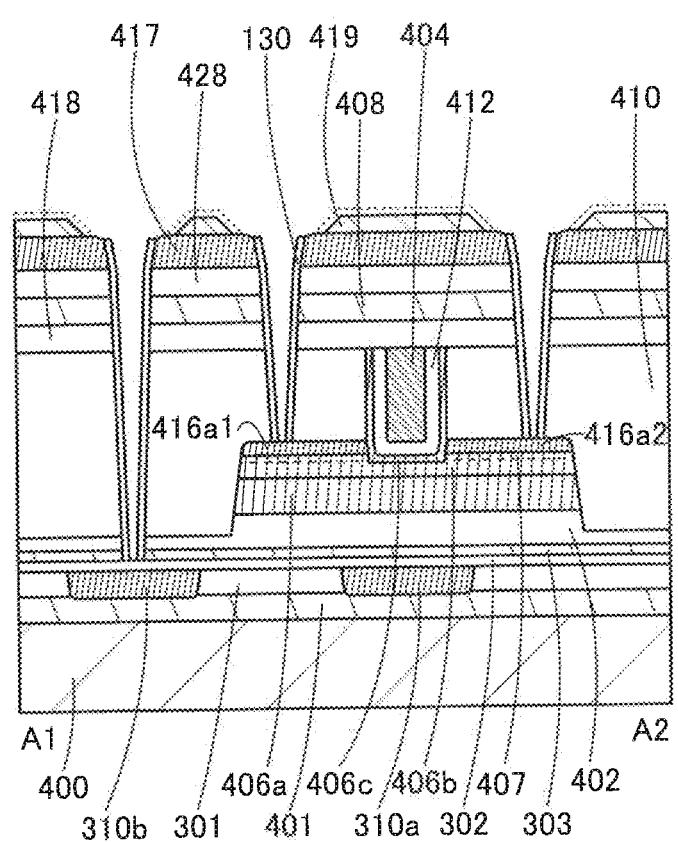
Figure 48C:
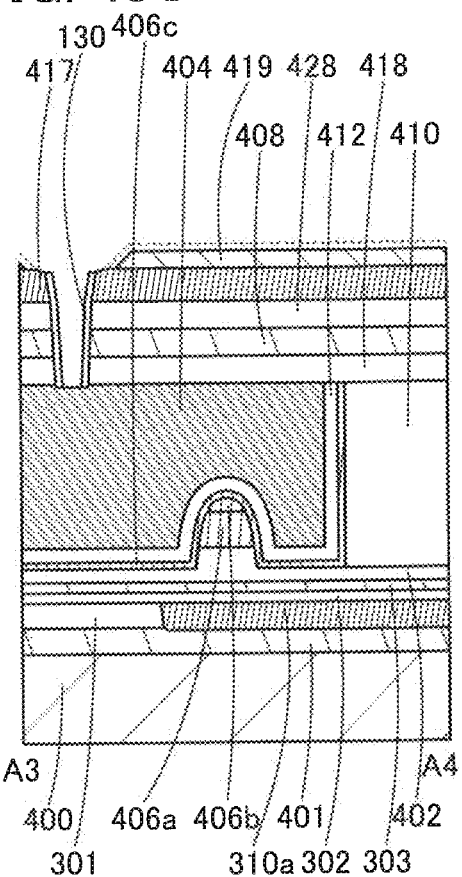

Next, the seventh processing is performed on the insulator 402 and the electron trap layer 303 by a dry etching method until the first opening reaches the insulator 302. Since the second and third openings have reached the conductors 416a1 and 416a2 by the sixth processing, the conductors 416a1 and 416a2 are further over-etched by the seventh processing. Since the fourth opening has reached the conductor 404 by the fifth processing, the conductor 404 is further over-etched by the seventh processing (see FIGS. 48A to 48C).

Figure 49A:
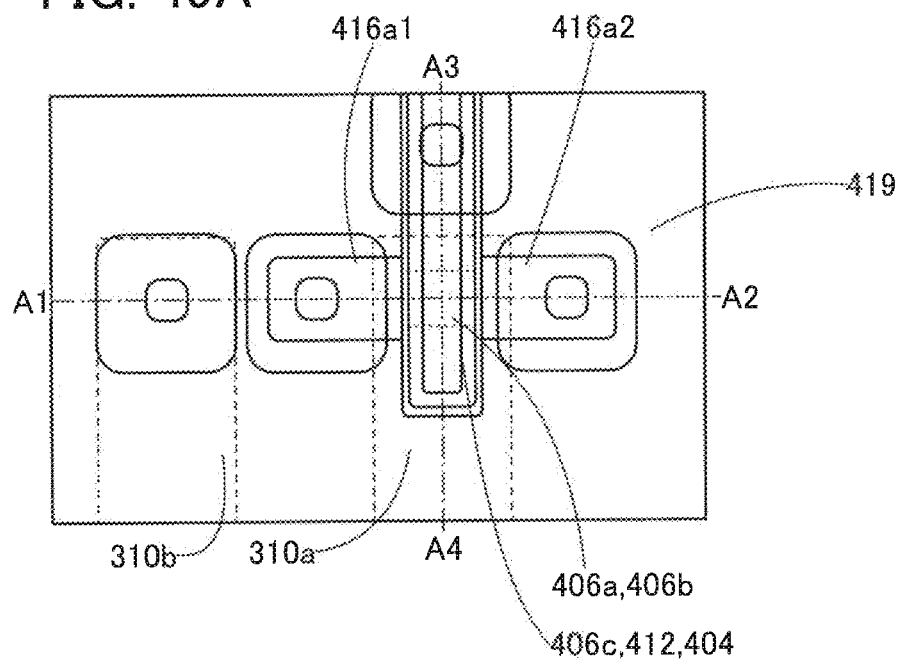
FIGS. 49A to 49C are a top view and cross-sectional views illustrating the manufacturing method of a transistor of one embodiment of the present invention.
Figures 49B, 49C:
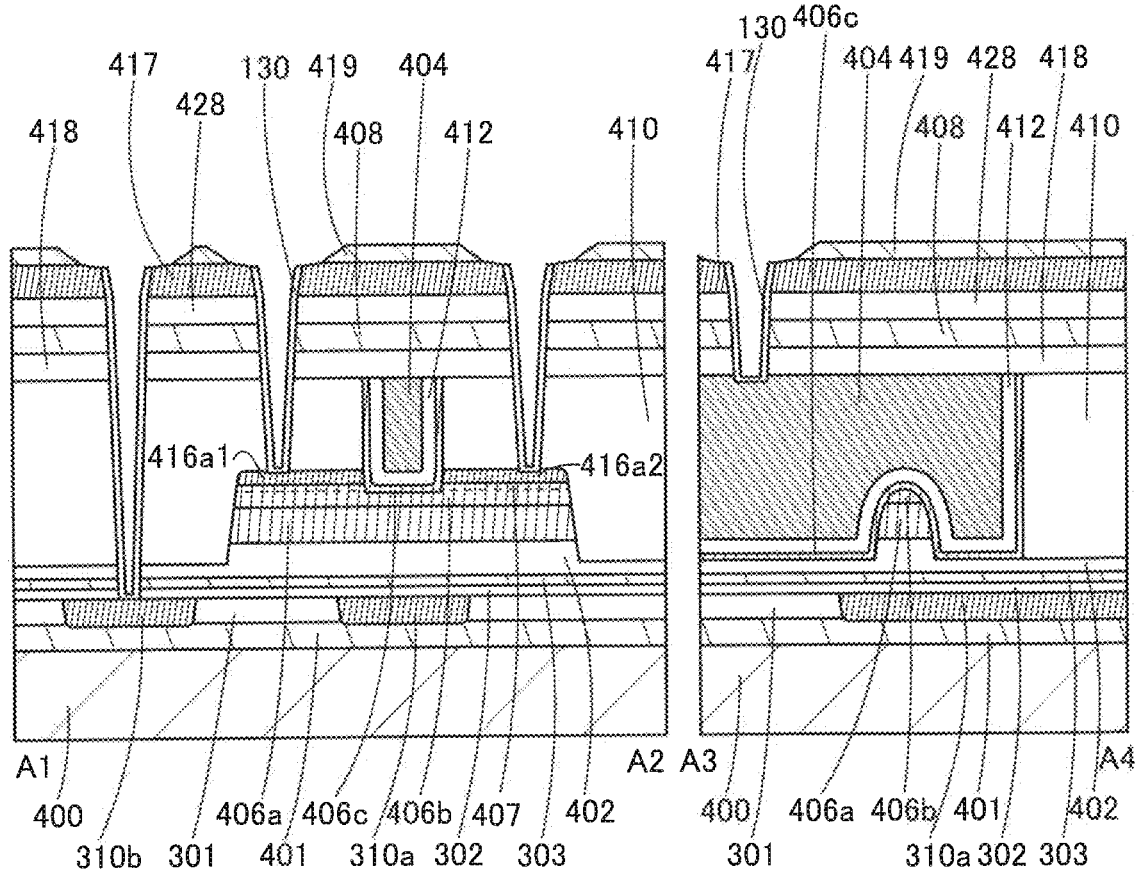

Next, the eighth processing is performed on the insulator 302 by a dry etching method until the first opening reaches the conductor 310b. Since the second opening and the third opening have reached the conductors 416a1 and 416a2 by the sixth processing, the conductors 416a1 and 416a2 are further over-etched by the eighth processing. Since the fourth opening has reached the conductor 404 by the fifth processing, the conductor 404 is further over-etched by the eighth processing. The product 130 might be deposited on the conductor 310b at the bottom part of the first opening, the conductor 416a1 at the bottom part of the second opening, the conductor 416a2 at the bottom part of the third opening, and the conductor 404 at the bottom part of the fourth opening (see FIGS. 49A to 49C).

The fourth to eighth processing can performed under the same conditions. As a gas used for the dry etching, a gas similar to that used in the first processing can be used. As a dry etching apparatus, an apparatus similar to that used in the first processing can be used.

In the conditions of the fourth to eighth processing, by making the ratio of the etching rates of the insulator 408 and the electron trap layer 303 to the etching rates of the conductors 404, 416a1, 416a2, and 310b high, the progress of the etching of the conductors 404, 416a1, and 416a2 due to the over-etching can be suppressed. The etching rates of the conductors 404, 416a1, 416a2, and 310b are set to 1, and the etching rates of the insulator 408 and the electron trap layer 303 are set to 5 or more, preferably 10 or more.

Furthermore, in the conditions of the third to eighth processing, by making the ratio of the etching rates of the insulator 428, the insulator 418, the insulator 408, the insulator 410, the insulator 402, the electron trap layer 303, and the insulator 302 to the etching rates of the insulator 419 and the conductor 417 as a hard mask high, the change in the shapes of the insulator 419 and the conductor 417 as the hard mask can be prevented, and defects in the shapes of the openings can be prevented. Specifically, upper portions of the openings can be prevented from extending. The etching rates of the insulator 419 and the conductor 417 are set to 1, and etching rates of the insulator 428, the insulator 418, the insulator 408, the insulator 410, the insulator 402, the electron trap layer 303, and the insulator 302 are set to 5 or more, preferably 10 or more.

As soon as the completion of the eighth processing, plasma treatment using an oxygen gas may be performed. Although the product might be deposited on the inside of the first opening, the inside of the second opening, the inside of the third opening, and the inside of the fourth opening by the first processing, the second processing, the third processing, the fourth processing, the fifth processing, the sixth processing, the seventh processing, and the eighth processing, the product can be removed by the plasma treatment using an oxygen gas.

Figure 50A:
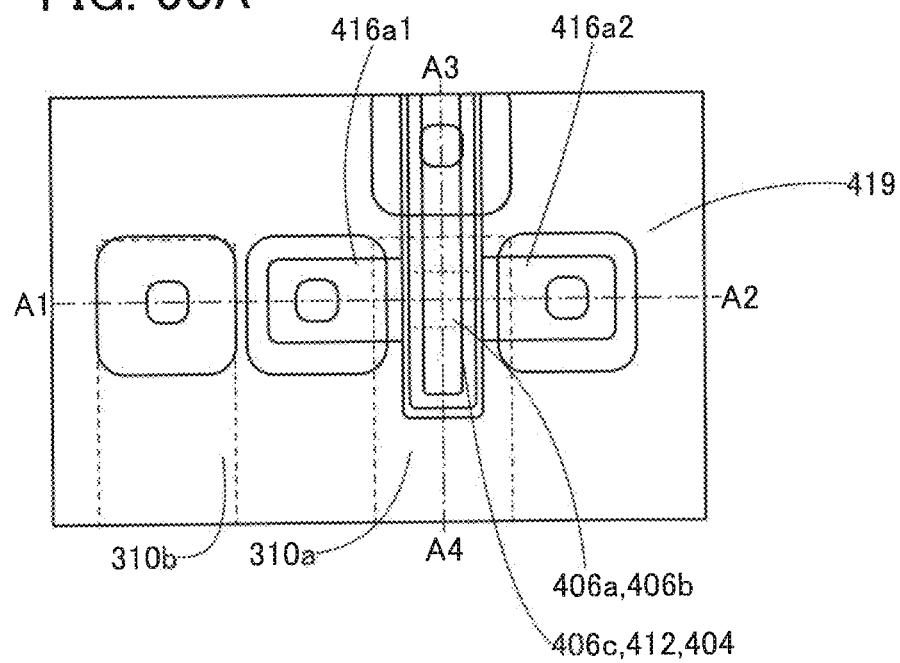
FIGS. 50A to 50C are a top view and cross-sectional views illustrating the manufacturing method of a transistor of one embodiment of the present invention.
Figure 50B:
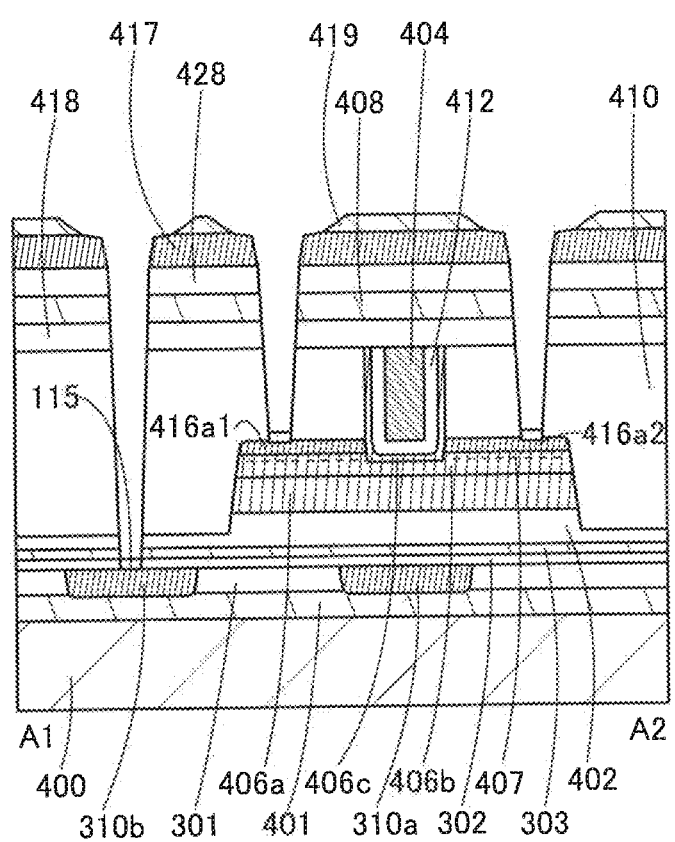
Figure 50C:
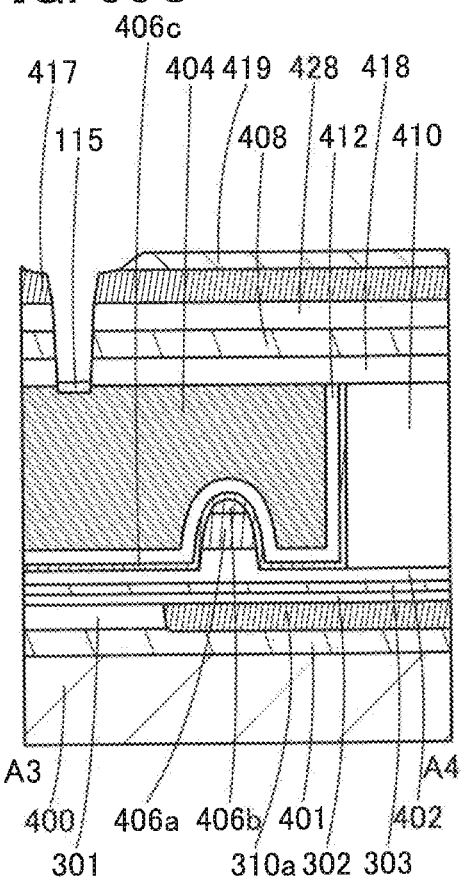

The oxygen plasma treatment oxidizes the top surface of the conductor 310b at the bottom part of the first opening, the top surface of the conductor 416a1 at the bottom part of the second opening, the top surface of the conductor 416a2 at the bottom part of the third opening, and the top surface of the conductor 404 at the bottom part of the fourth opening. In the case where the conductor contains a metal, the metal oxide 115 might be formed. The metal oxide 115 might serve as an insulator or a resistor; thus, the metal oxide 115 is preferably removed (see FIGS. 50A to 50C).

Washing treatment may be performed to remove the metal oxide 115. For washing treatment, washing using a chemical solution or water can be performed. As a washing apparatus, a spin washing apparatus or a batch-type washing apparatus can be used.

Here, as an example of washing treatment, QDR washing treatment is performed using a batch-type washing apparatus as in Embodiment 1. The QDR washing is preferably performed three or more cycles, more preferably five or more cycles.

Figure 51A:
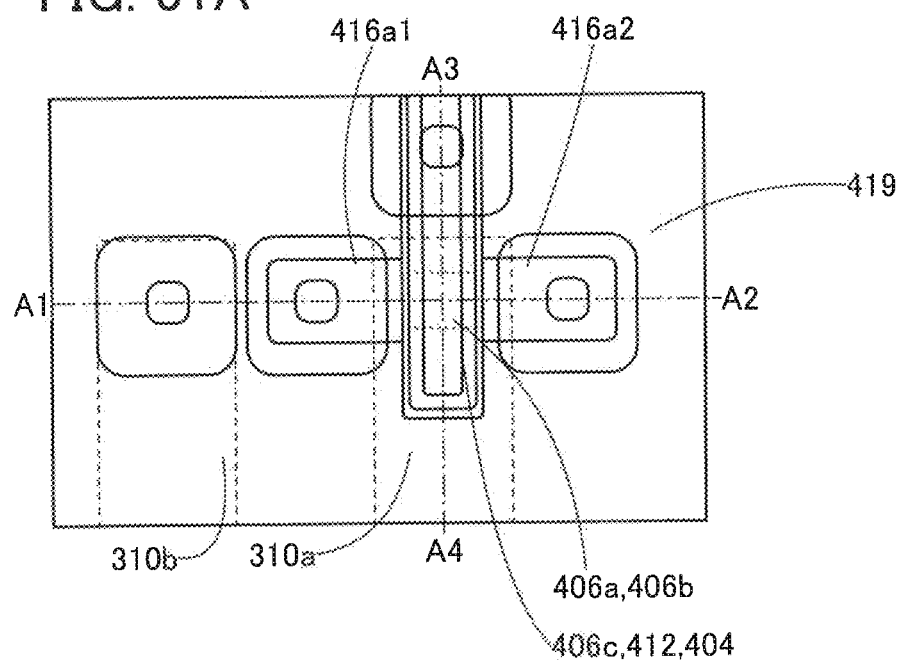
FIGS. 51A to 51C are a top view and cross-sectional views illustrating the manufacturing method of a transistor of one embodiment of the present invention.
Figure 51B:
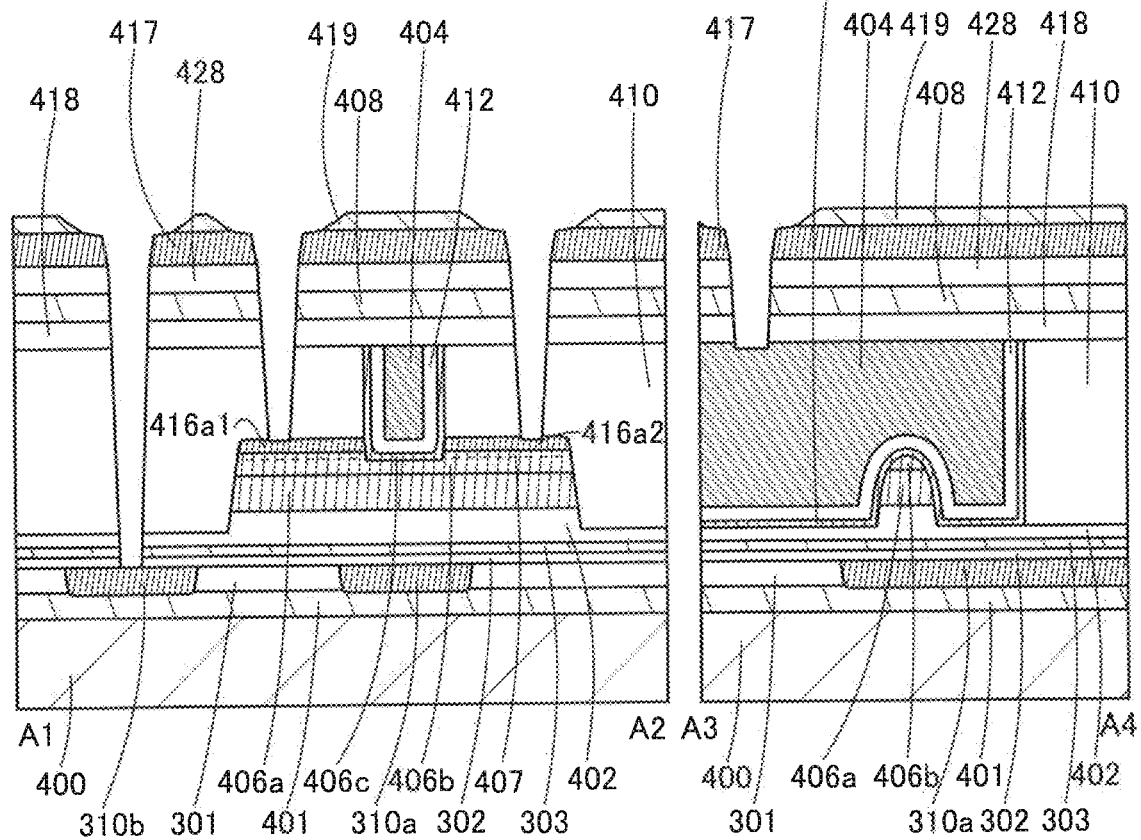
Figure 51C:
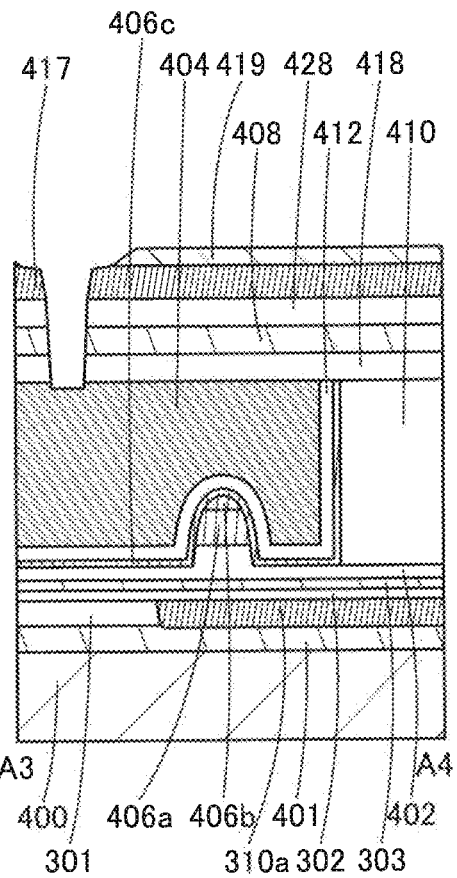

Through the above steps, the first opening, the second opening, the third opening, and the fourth opening can be formed (see FIGS. 51A to 51C).

Although a method for forming the first opening, the second opening, the third opening, and the fourth opening by performing lithography once, lithography may be performed to form each opening. Alternatively, lithography may be performed to form two or more openings.

Next, the conductor 422a is formed. The conductor 422a can be formed by a sputtering method, a CVD method, an MBE method, a PLD method, an ALD method, or the like. The conductor 422a is formed so as to fill the opening formed in the insulator 410 and others. Therefore, a CVD method (a MCVD method, in particular) is preferred. A multi-layer film of a conductor formed by an ALD method or the like and a conductor formed by a CVD method is preferred in some cases to increase adhesion between the insulator 410 and the like and the conductor formed by a MCVD method. For example, a multi-layer film including titanium nitride and tungsten in this order is used (see FIGS. 52A to 52C).

Figure 53A:
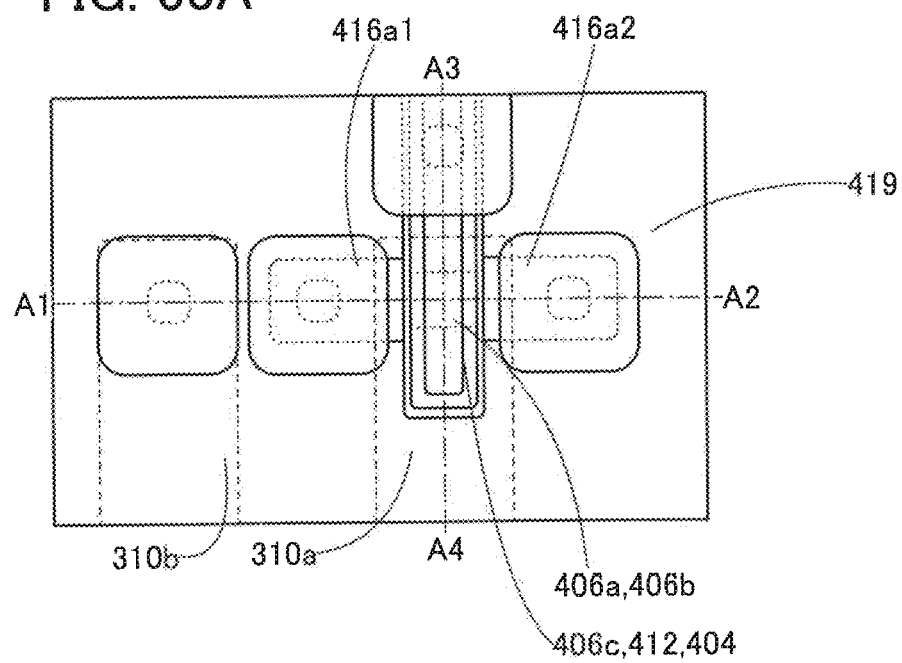
FIGS. 53A to 53C are a top view and cross-sectional views illustrating the manufacturing method of a transistor of one embodiment of the present invention.
Figure 53B:
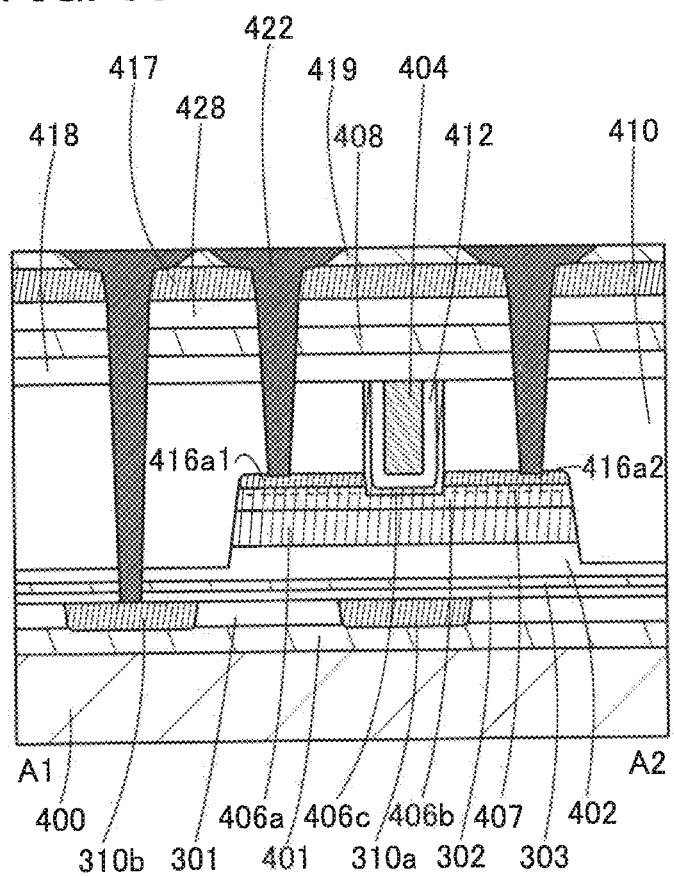
Figure 53C:
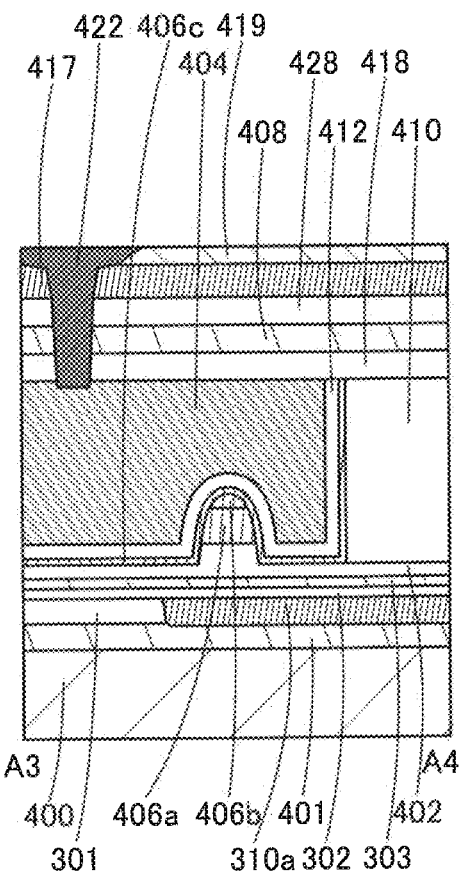

Next, the first CMP treatment is performed until the conductor 422a reaches the top surface of the insulator 419, whereby the conductor 422 is formed (see FIGS. 53A to 53C).

Figure 54A:
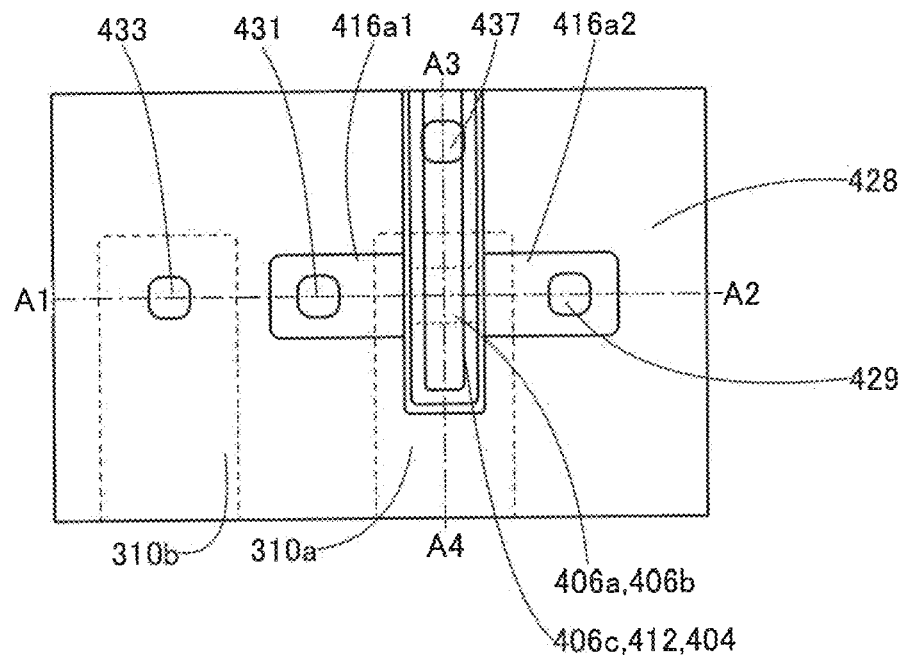
FIGS. 54A to 54C are a top view and cross-sectional views illustrating the manufacturing method of a transistor of one embodiment of the present invention.
Figures 54B, 54C:
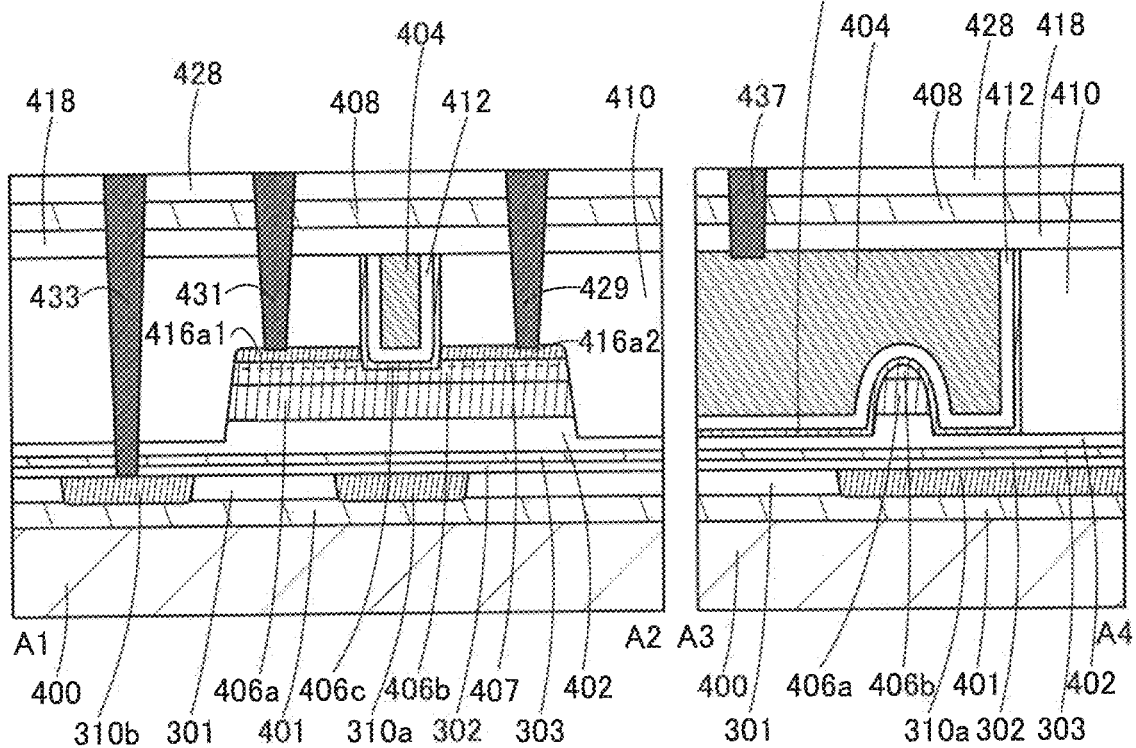

Next, the second CMP processing is performed on the conductor 422, the insulator 419, and the conductor 417 until the top surface of the insulator 428 is reached. Accordingly, the conductor 433, the conductor 431, the conductor 429, and the conductor 437 are embedded in the first opening, the second opening, the third opening, and the fourth opening, respectively (see FIGS. 54A to 54C).

Figure 55A:
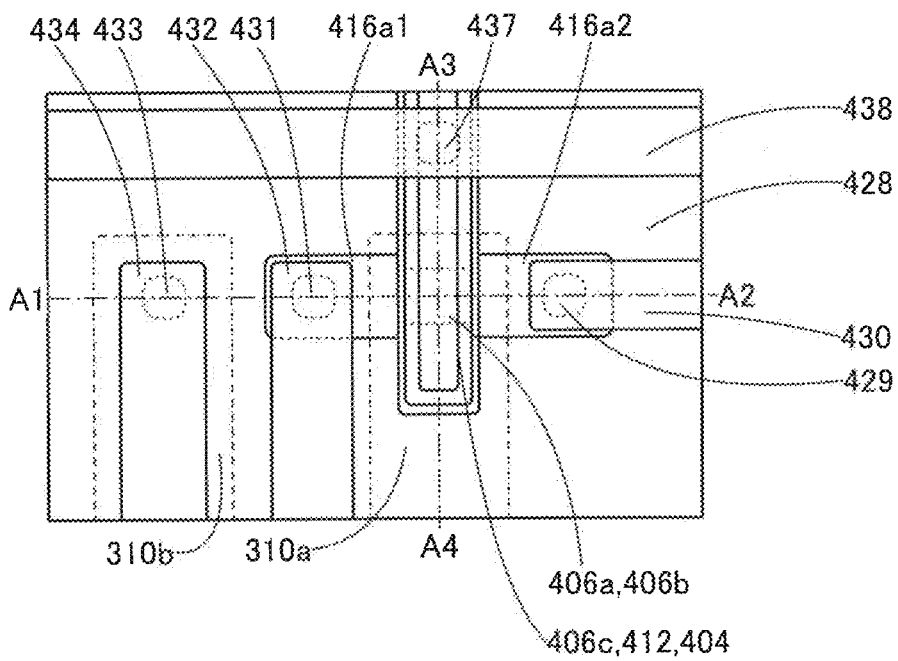
FIGS. 55A to 55C are a top view and cross-sectional views illustrating the manufacturing method of a transistor of one embodiment of the present invention.
Figure 55B:
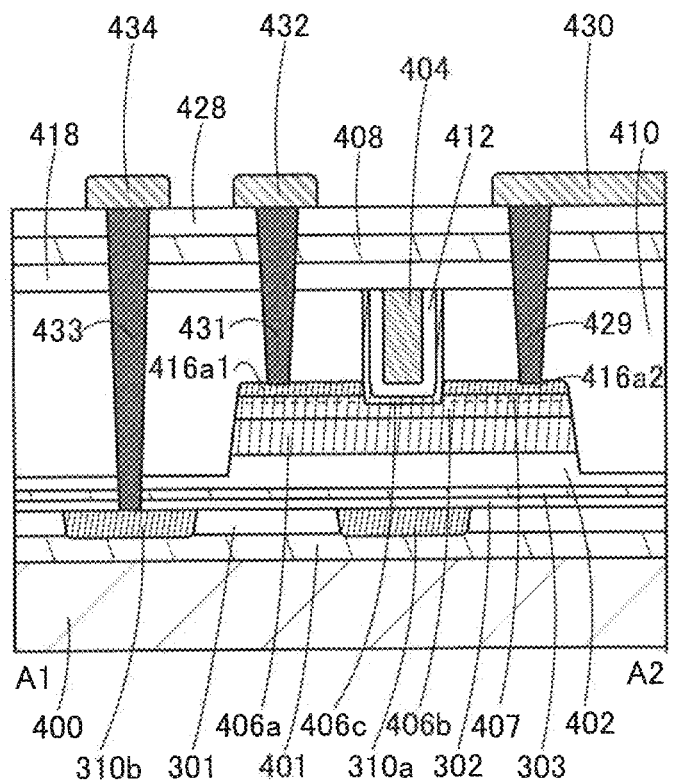
Figure 55C:
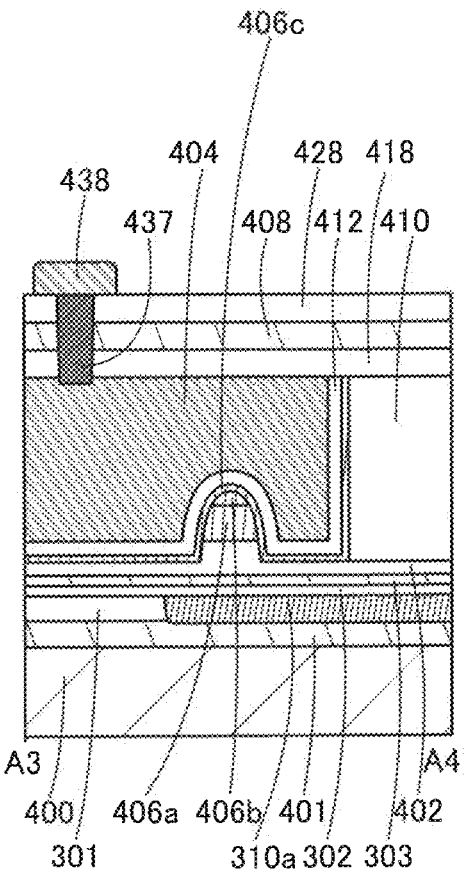
Figure 56A:
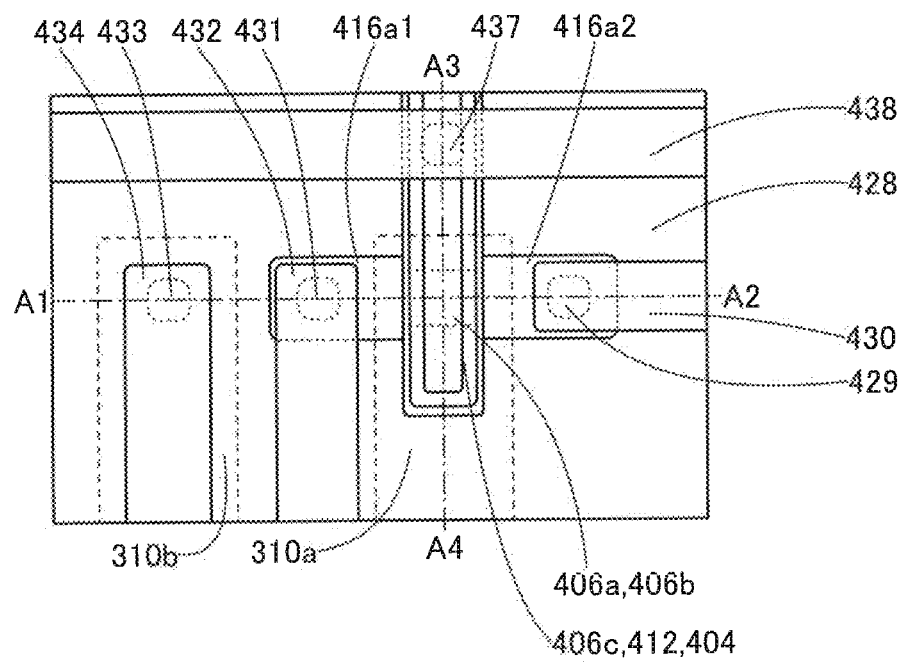
FIGS. 56A to 56C are a top view and cross-sectional views illustrating the manufacturing method of a transistor of one embodiment of the present invention.
Figure 56B:
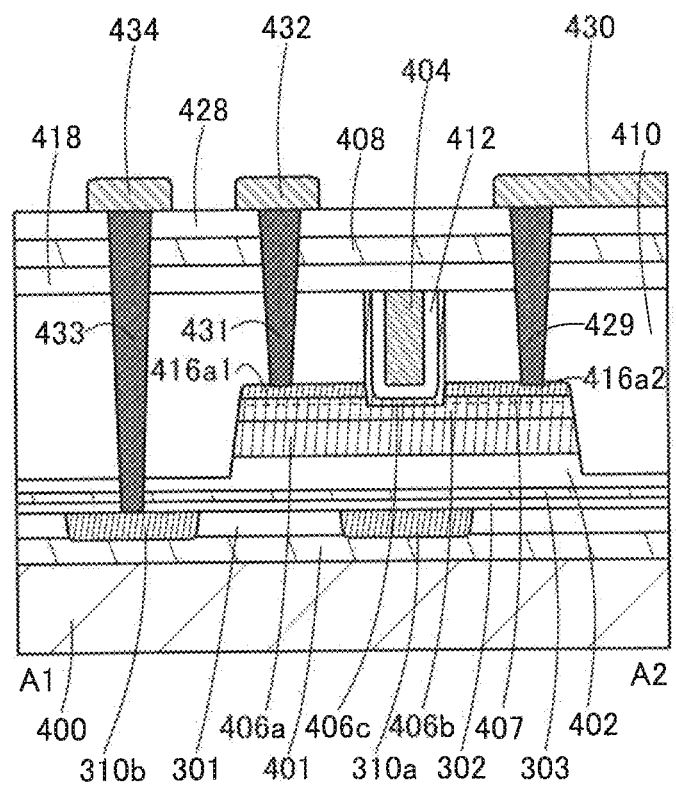
Figure 56C:
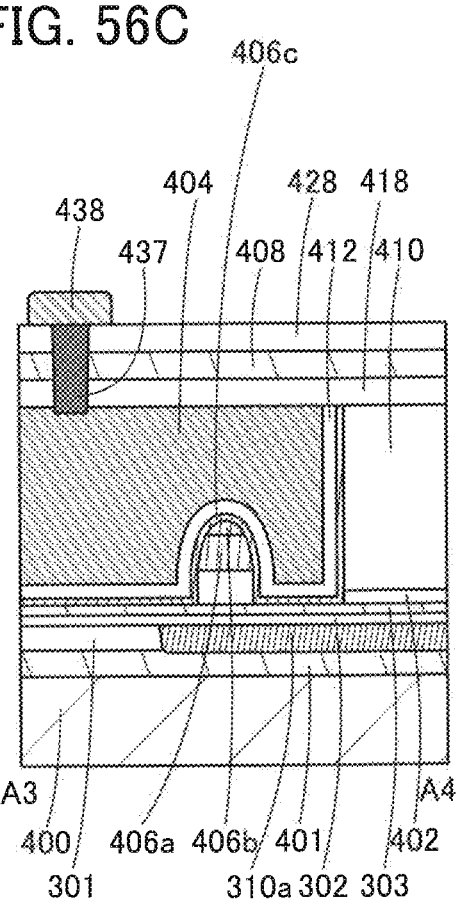

Next, the conductor is formed over the insulator 428, the conductor 433, the conductor 431, the conductor 429, and the conductor 437, and partly etched by a lithography method, whereby the conductor 434, the conductor 432, the conductor 430, and the conductor 438 are formed. Through the above steps, the transistor in FIGS. 9A to 9C can be formed (see FIGS. 55A to 55C).

As described above, when the insulator 410 is formed, the first processing is performed on the insulator 410a by a dry etching method until the insulator 402 is reached, whereby the insulator 410 is formed. At that time, the insulator 402 is etched in some cases until the electron trap layer 303 is reached. The transistor in that case has a structure shown in FIGS. 56A to 56C. At least part of this embodiment can be implemented in combination with any of the embodiments described in this specification as appropriate.

Embodiment 5

<Memory Device 1>

Figure 57A:
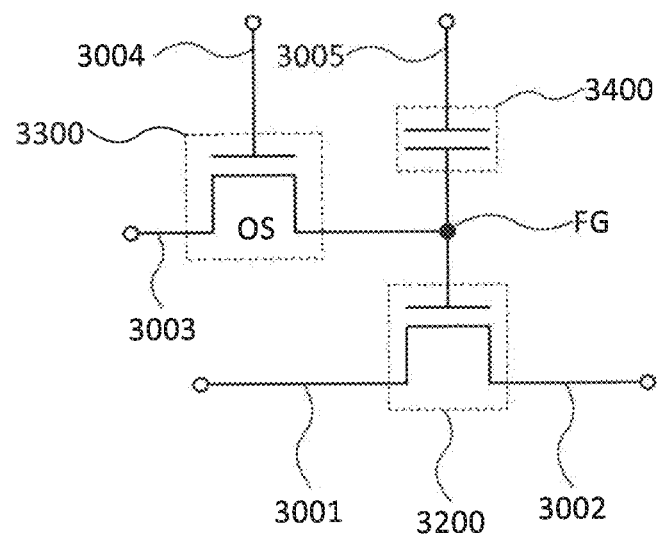
FIGS. 57A and 57B are each a circuit diagram of a memory device of one embodiment of the present invention.
Figure 57B:
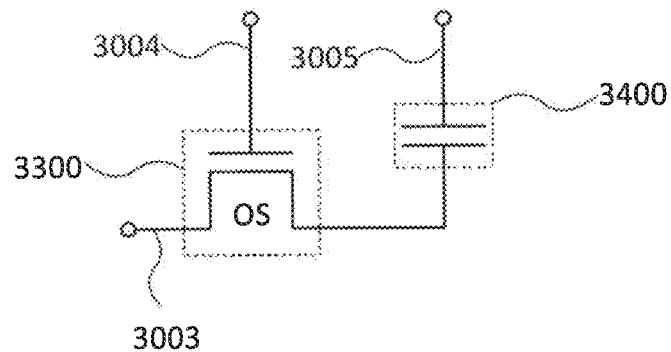

An example of a semiconductor device (memory device) which includes the transistor of one embodiment of the present invention, which can retain stored data even when not powered, and which has an unlimited number of times of writing is shown in FIGS. 57A and 57B.

The semiconductor device illustrated in FIG. 57A includes a transistor 3200 using a first semiconductor, a transistor 3300 using a second semiconductor, and a capacitor 3400. Note that any of the above-described transistors can be used as the transistor 3300.

The transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 57A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 57A has a feature that the potential of the gate of the transistor 3200 can be retained, and thus enables writing, retaining, and reading of data as follows.

Writing and retaining of data will be described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charge providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 depends on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to turn "on" the transistor 3200. Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is turned "on." In the case where the low-level electric charge is supplied to the node FG in writing, even when the potential of the fifth wiring 3005 is $V_0$ ($<V_{th\_L}$), the transistor 3200 still remains "off." Thus, the data retained in the node FG can be read by determining the potential of the second wiring 3002.

Note that in the case where memory cells are arrayed, it is necessary that data of a desired memory cell be read in read operation. The fifth wiring 3005 of memory cells from which data is not read may be supplied with a potential at which the transistor 3200 is turned "off" regardless of the electric charge supplied to the node FG, that is, a potential lower than $V_{th\_H}$, whereby only data of a desired memory cell can be read. Alternatively, the fifth wiring 3005 of the memory cells from which data is not read may be supplied with a potential at which the transistor 3200 is turned "on" regardless of the electric charge supplied to the node FG, that is, a potential higher than $V_{th\_L}$, whereby only data of a desired memory cell can be read.

<Structure 1 of Semiconductor Device>

Figure 58:
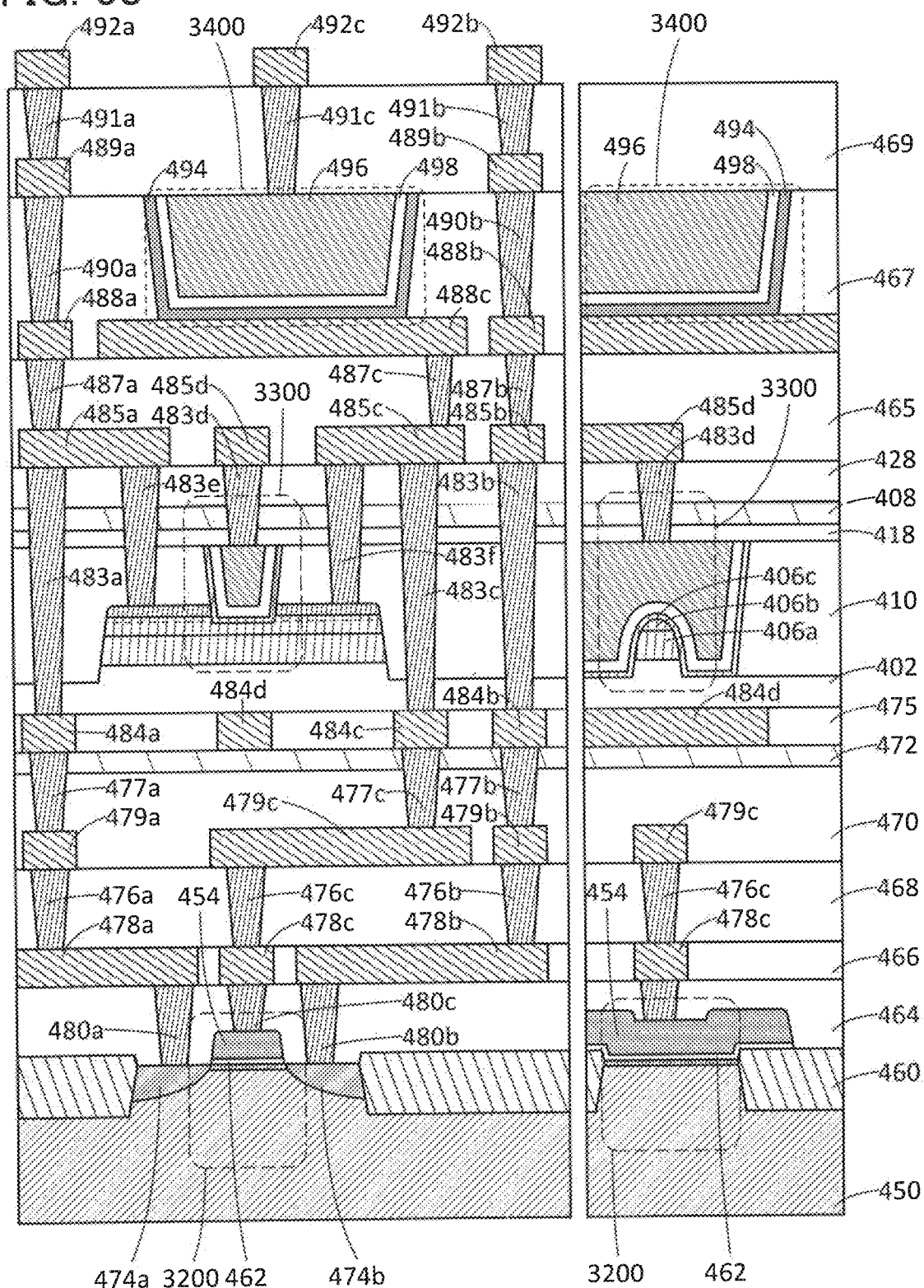
FIG. 58 is a cross-sectional view illustrating a semiconductor device of one embodiment of the present invention.

FIG. 58 is a cross-sectional view of the semiconductor device in FIG. 57A. The semiconductor device shown in FIG. 58 includes the transistor 3200, the transistor 3300, and the capacitor 3400. The transistor 3300 and the capacitor 3400 are provided over the transistor 3200. Although an example where the transistor illustrated in FIGS. 9A to 9C is used as the transistor 3300 is shown, the semiconductor device of one embodiment of the present invention is not limited thereto. The description of the above transistor is referred to.

The transistor 3200 illustrated in FIG. 58 is a transistor using a semiconductor substrate 450. The transistor 3200 includes a region 474a in the semiconductor substrate 450, a region 474b in the semiconductor substrate 450, an insulator 462, and a conductor 454.

In the transistor 3200, the regions 474a and 474b have a function as a source region and a drain region. The insulator 462 has a function as a gate insulator. The conductor 454 has a function as a gate electrode. Therefore, the resistance of a channel formation region can be controlled by a potential supplied to the conductor 454. In other words, conduction or non-conduction between the region 474a and the region 474b can be controlled by the potential supplied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 3200 is formed. Alternatively, the semiconductor substrate 450 may be an i-type semiconductor substrate.

The top surface of the semiconductor substrate 450 preferably has a (110) plane. Thus, the on-state characteristics of the transistor 3200 can be improved.

The regions 474a and 474b are regions including impurities imparting the p-type conductivity. Accordingly, the transistor 3200 has a structure of a p-channel transistor.

Note that although the transistor 3200 is illustrated as a p-channel transistor, the transistor 3200 may be an n-channel transistor.

Note that the transistor 3200 is separated from an adjacent transistor by the region 460 and the like. The region 460 is an insulating region.

The semiconductor illustrated in FIG. 58 includes an insulator 464, an insulator 466, an insulator 468, an insulator 470, an insulator 472, an insulator 475, the insulator 402, the insulator 410, the insulator 418, the insulator 408, the insulator 428, an insulator 465, an insulator 467, an insulator 469, an insulator 498, a conductor 480a, a conductor 480b, a conductor 480c, a conductor 478a, a conductor 478b, a conductor 478c, a conductor 476a, a conductor 476b, a conductor 476c, a conductor 479a, a conductor 479b, a conductor 479c, a conductor 477a, a conductor 477b, a conductor 477c, a conductor 484a, a conductor 484b, a conductor 484c, a conductor 484d, a conductor 483a, a conductor 483b, a conductor 483c, a conductor 483d, a conductor 483e, a conductor 483f, a conductor 485a, a conductor 485b, a conductor 485c, a conductor 485d, a conductor 487a, a conductor 487b, a conductor 487c, a conductor 488a, a conductor 488b, a conductor 488c, a conductor 490a, a conductor 490b, a conductor 489a, a conductor 489b, a conductor 491a, a conductor 491b, a conductor 491c, a conductor 492a, a conductor 492b, a conductor 492c, the conductor 494, a conductor 496, the insulator 406a, the semiconductor 406b, and an insulator 406c.

The insulator 464 is provided over the transistor 3200. The insulator 466 is over the insulator 464. The insulator 468 is over the insulator 466. The insulator 470 is placed over the insulator 468. The insulator 472 is placed over the insulator 470. The insulator 475 is placed over the insulator 472. The transistor 3300 is provided over the insulator 475. The insulator 418 is provided over the transistor 3300. The insulator 408 is provided over the insulator 418. The insulator 428 is provided over the insulator 408. The insulator 465 is over the insulator 428. The capacitor 3400 is provided over the insulator 465. The insulator 469 is provided over the capacitor 3400.

The insulator 464 includes an opening reaching the region 474a, an opening reaching the region 474b, and an opening reaching the conductor 454, in which the conductor 480a, the conductor 480b, and the conductor 480c are embedded, respectively.

In addition, the insulator 466 includes an opening reaching the conductor 480a, an opening reaching the conductor 480b, and an opening reaching the conductor 480c, in which the conductor 478a, the conductor 478b, and the conductor 478c are embedded, respectively.

In addition, the insulator 468 includes an opening reaching the conductor 478a, an opening reaching the conductor 478b, and an opening reaching the conductor 478c, in which the conductor 476a, the conductor 476b, and the conductor 476c are embedded, respectively.

The conductor 479a in contact with the conductor 476a, the conductor 479b in contact with the conductor 476b, and the conductor 479c in contact with the conductor 476c are over the insulator 468. The insulator 472 includes an opening reaching the conductor 479a through the insulator 470 and an opening reaching the conductor 479b through the insulator 470. In the respective openings, the conductor 477a and the conductor 477b are embedded.

The insulator 475 includes an opening overlapping with the channel formation region of the transistor 3300, an opening reaching the conductor 477a, an opening reaching the conductor 477b, and an opening reaching the insulator 472. In the respective openings, the conductor 484a, the conductor 484b, the conductor 484c, and the conductor 484d are embedded.

The conductor 484d may have a function as a bottom gate electrode of the transistor 3300. Alternatively, for example, electric characteristics such as the threshold voltage of the transistor 3300 may be controlled by application of a constant potential to the conductor 484d. Still alternatively, for example, the conductor 484d and the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

In addition, the insulator 402 includes an opening reaching the conductor 484a, an opening reaching the conductor 484b, and an opening reaching the conductor 484c.

The insulator 428 includes an opening reaching the conductor 484a through the insulator 408, the insulator 418, the insulator 410, and the insulator 402, an opening reaching the conductor 484c through the insulator 408, the insulator 418, the insulator 410, and the insulator 402, two openings reaching a conductor of one of the source electrode and the drain electrode of the transistor 3300 through the insulator 408, the insulator 418, and the insulator 410, and an opening reaching a conductor of the gate electrode of the transistor 3300 through the insulator 408 and the insulator 418. In the openings, the conductor 483a, the conductor 483c, the conductor 483e, the conductor 483f, and the conductor 483d are embedded.

The conductor 485a in contact with the conductors 483a and 483e, the conductor 485b in contact with the conductor 483b, the conductor 485c in contact with the conductor 483c and the conductor 483f, and the conductor 485d in contact with the conductor 483d are over the insulator 428. The insulator 465 has an opening reaching the conductor 485a, an opening reaching the conductor 485b, and an opening reaching the conductor 485c. In the respective openings, the conductor 487a, the conductor 487b, and the conductor 487c are embedded.

The conductor 488a in contact with the conductor 487a, the conductor 488b in contact with the conductor 487b, and the conductor 488c in contact with the conductor 487c are over the insulator 465. In addition, the insulator 467 includes an opening reaching the conductor 488a and an opening reaching the conductor 488b. In the respective openings, the conductor 490a and the conductor 490b are embedded. The conductor 488c is in contact with the conductor 494 which is the one electrode of the capacitor 3400.

The conductor 489a in contact with the conductor 490a and the conductor 489b in contact with the conductor 490b are over the insulator 467. The insulator 469 includes an opening reaching the conductor 489a, an opening reaching the conductor 489b, an opening reaching the conductor 496 which is the other electrode of the capacitor 3400. In the respective openings, the conductor 491a, the conductor 491b, and the conductor 491c are embedded.

The conductor 492a in contact with the conductor 491a, the conductor 492b in contact with the conductor 491b, and the conductor 492c in contact with the conductor 491c are over the insulator 469.

The insulators 464, 466, 468, 470, 472, 475, 402, 410, 408, 428, 465, 467, 469, and 498 may each be formed to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed of, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 470, 472, 475, 402, 410, 408, 428, 465, 467, 469, and 498. When an insulator that has a function of blocking oxygen and impurities such as hydrogen is placed near the transistor 3300, the electric characteristics of the transistor 3300 can be stable.

An insulator with a function of blocking oxygen and impurities such as hydrogen may have a single-layer structure or a layered structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductors 480a, 480b, 480c, 478a, 478b, 478c, 476a, 476b, 476c, 479a, 479b, 479c, 477a, 477b, 477c, 484a, 484b, 484c, 484d, 483a, 483b, 483c, 483d, 483e, 483f, 485a, 485b, 485c, 485d, 487a, 487b, 487c, 488a, 488b, 488c, 490a, 490b, 489a, 489b, 491a, 491b, 491c, 492a, 492b, 492c, 494, and 496 may have a single-layer structure or a layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406a and the insulator 406c, oxides containing one or more, or two or more elements other than oxygen included in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The source or drain of the transistor 3200 is electrically connected to the conductor that is one of the source electrode and the drain electrode of the transistor 3300 through the conductor 480a, the conductor 478a, the conductor 476a, the conductor 479a, the conductor 477a, the conductor 484a, the conductor 483a, the conductor 485a, and the conductor 483e. The conductor 454 that is the gate electrode of the transistor 3200 is electrically connected to the conductor that is the other of the source electrode and the drain electrode of the transistor 3300 through the conductor 480c, the conductor 478c, the conductor 476c, the conductor 479c, the conductor 477c, the conductor 484c, the conductor 483c, the conductor 485c, and the conductor 483f.

The capacitor 3400 includes one of the source electrode and the drain electrode of the transistor 3300, the conductor 494 electrically connected to the one electrode of the capacitor 3400 through the conductor 483c, the conductor 485c, the conductor 487c, and the conductor 488c, the insulator 498, the conductor 496 that is the other electrode of the capacitor 3400. The capacitor 3400 is preferably formed above or below the transistor 3300 because the semiconductor can be reduced in size.

For the structures of other components, the description of FIGS. 9A to 9C and the like can be referred to as appropriate.

Figure 59:
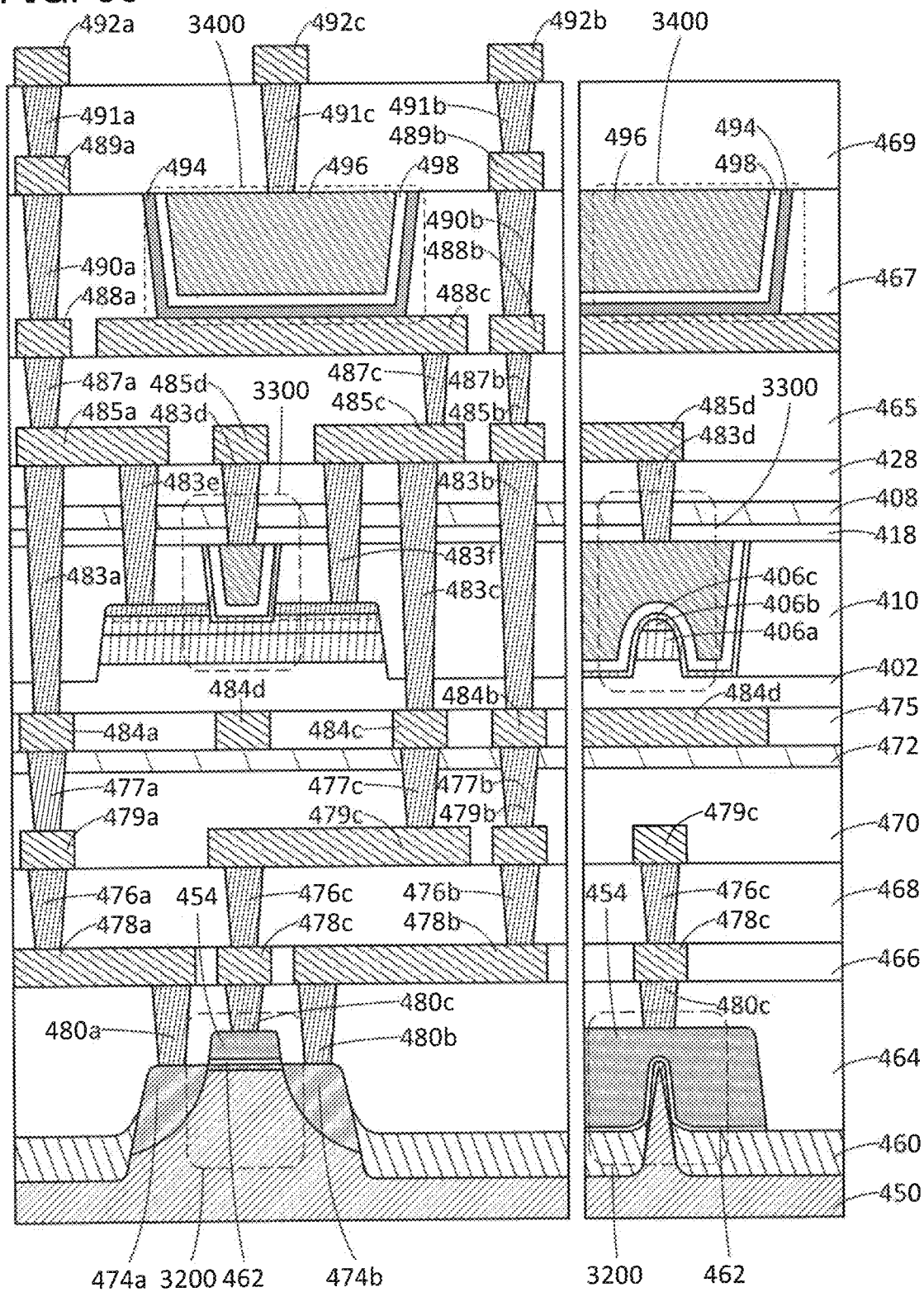
FIG. 59 is a cross-sectional view illustrating a semiconductor device of one embodiment of the present invention.

A semiconductor device in FIG. 59 is the same as the semiconductor device in FIG. 58 except for the structure of the transistor 3200. Therefore, the description of the semiconductor device in FIG. 58 is referred to for the semiconductor device in FIG. 59. Specifically, in the semiconductor device in FIG. 59, the transistor 3200 is a FIN-type transistor. The effective channel width is increased in the FIN-type transistor 3200, whereby the on-state characteristics of the transistor 3200 can be improved. In addition, since contribution of the electric field of the gate electrode can be increased, the off-state characteristics of the transistor 3200 can be improved. Note that the transistor 3200 can be either a p-channel transistor or an n-channel transistor.

Although an example in which the transistor 3300 is over the transistor 3200 and the capacitor 3400 is over the transistor 3300 is illustrated in this embodiment, one or more transistors including a semiconductor similar to the transistor 3300 may be provided over the transistor 3200. With such a structure, the degree of integration of the semiconductor device can be further increased.

<Memory Device 2>

The semiconductor device in FIG. 57B is different from the semiconductor device in FIG. 57A in that the transistor 3200 is not provided. Also in this case, data can be written and retained in a manner similar to that of the semiconductor device in FIG. 57A.

Reading of data in the semiconductor device in FIG. 57B will be described. When the transistor 3300 is turned on, the third wiring 3003 which is in a floating state and the capacitor 3400 are electrically connected to each other, and the electric charge is redistributed between the third wiring 3003 and the capacitor 3400. As a result, the potential of the third wiring 3003 is changed. The amount of change in potential of the third wiring 3003 depends on the potential of the one electrode of the capacitor 3400 (or the electric charge accumulated in the capacitor 3400).

For example, the potential of the third wiring 3003 after the electric charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the electric charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, a high voltage is not needed for data writing and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved. At least part of this embodiment can be implemented in combination with any of the embodiments described in this specification as appropriate.

Embodiment 6

<Structure 2 of Semiconductor Device>

In this embodiment, an example of a circuit including the transistor of one embodiment of the present invention will be described with reference to drawings.

<Cross-Sectional Structure>

Figure 60A:
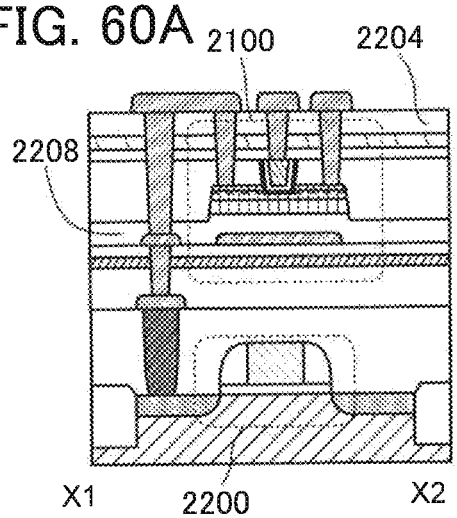
FIGS. 60A to 60F are circuit diagrams and cross-sectional views illustrating semiconductor devices of embodiments of the present invention.
Figure 60B:
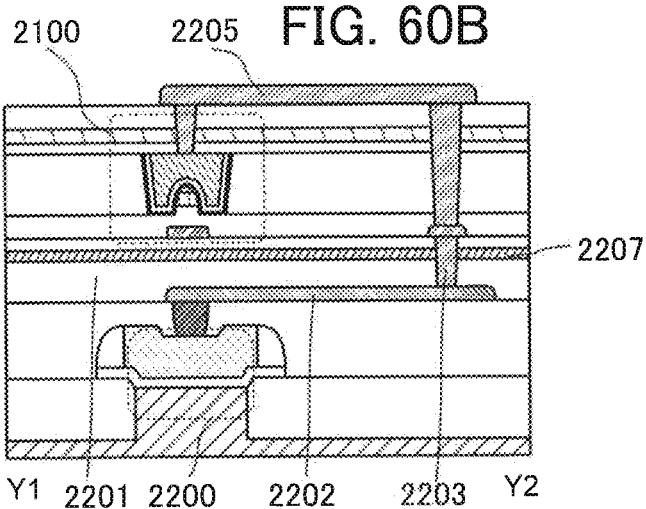

FIGS. 60A and 60B are cross-sectional views of a semiconductor device of one embodiment of the present invention. In FIG. 60A, the X1-X2 direction represents the channel length direction, and in FIG. 60B, the Y1-Y2 direction represents the channel width direction. The semiconductor device illustrated in FIGS. 60A and 60B includes a transistor 2200 containing a first semiconductor material in a lower portion and a transistor 2100 containing a second semiconductor material in an upper portion. In FIGS. 60A and 60B, an example is illustrated in which the transistor illustrated in FIGS. 9A to 9C is used as the transistor 2100 containing the second semiconductor material.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor and described in the above embodiment as an example has excellent subthreshold characteristics and a minute structure. Furthermore, the transistor can operate at a high speed because of its high switching speed and has a low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIGS. 60A and 60B illustrate a structure in which the transistor 2100 is provided over the transistor 2200 with an insulator 2201, an insulator 2207, and an insulator 2208 provided therebetween. A plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100 and a wiring 2205 over the insulator 2204 are provided.

The stack of the two kinds of transistors reduces the area occupied by the circuit, allowing high integration of a plurality of circuits.

Here, in the case where a silicon-based semiconductor material is used for the transistor 2200 provided in a lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulator 2207 having a function of preventing diffusion of hydrogen is provided between the transistors 2100 and 2200. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 also can be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide film is preferably used. With the aluminum oxide film, excess oxygen can be added to the insulator under the aluminum oxide film in the deposition, and the excess oxygen moves to the oxide semiconductor layer of the transistor 2100 by heat treatment, which has an effect of repairing a defect in the oxide semiconductor layer. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented. Note that as the blocking film, the insulator 2204 having a layered structure may be used, or the blocking film may be provided under the insulator 2204.

Note that the transistor 2200 can be a transistor of any of various types without being limited to a planar type transistor. For example, the transistor 2200 can be a fin-type transistor, a tri-gate transistor, or the like. An example of a cross-sectional view in this case is shown in FIGS. 60E and 60F. An insulator 2212 is provided over a semiconductor substrate 2211. The semiconductor substrate 2211 includes a projecting portion with a thin tip (also referred to a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, the semiconductor device of one embodiment of the present invention is not limited thereto. For example, a semiconductor region having a projecting portion may be formed by processing an SOI substrate.

At least part of this embodiment can be implemented in combination with any of the other embodiments described in this specification as appropriate.

Embodiment 7

[CMOS Circuit]

Figure 60C:
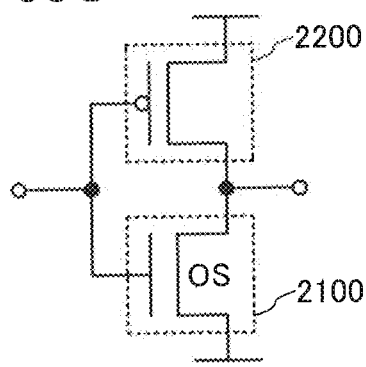

A circuit diagram in FIG. 60C shows a configuration of a so-called CMOS circuit in which a p-channel transistor 2200 and an n-channel transistor 2100 are connected to each other in series and in which gates of them are connected to each other.

[Analog Switch]

Figure 60D:
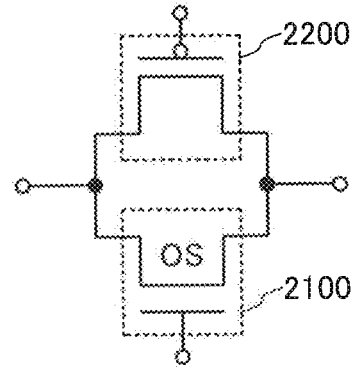
Figure 60E:
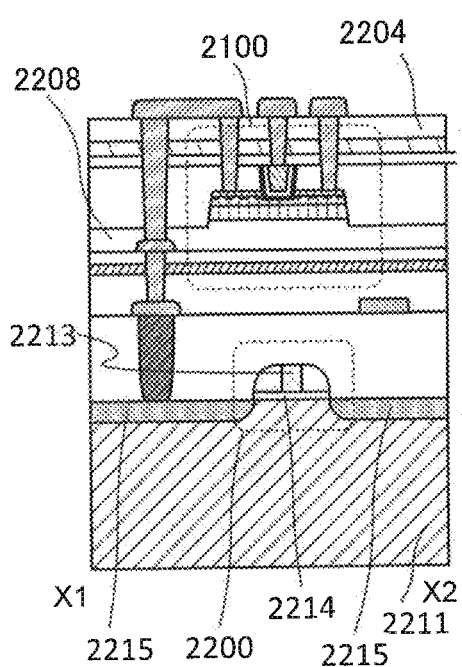
Figure 60F:
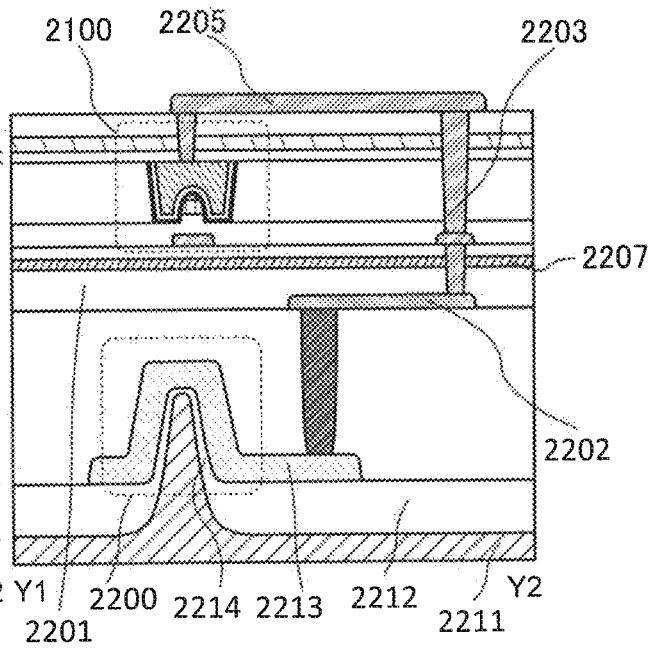

A circuit diagram in FIG. 60D shows a configuration in which sources of the transistors 2100 and 2200 are connected to each other and drains of the transistors 2100 and 2200 are connected to each other. With such a configuration, the transistors can function as a so-called analog switch. At least part of this embodiment can be implemented in combination with any of the embodiments described in this specification as appropriate.

Embodiment 8

<CPU>

A CPU including a semiconductor device such as any of the above-described transistors or the above-described memory devices will be described below.

Figure 61:
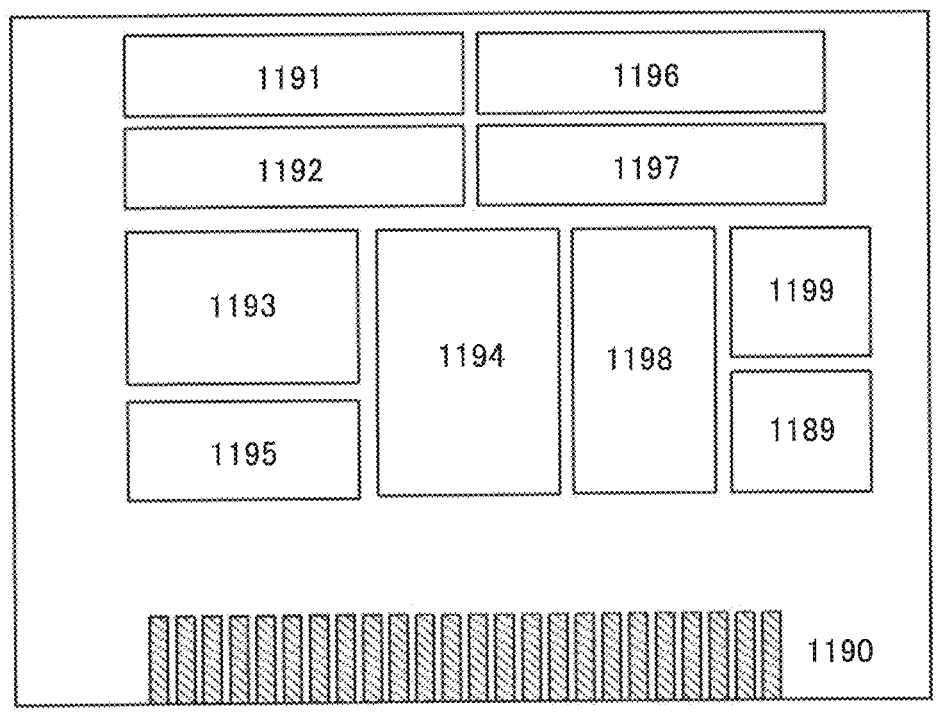
FIG. 61 is a block diagram illustrating a CPU of one embodiment of the present invention.

FIG. 61 is a block diagram illustrating a configuration example of a CPU at least partly including any of the transistors described above as a component.

The CPU illustrated in FIG. 61 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 61 is just an example in which the configuration is simplified, and an actual CPU may have a variety of configurations depending on the application. For example, the CPU may have the following configuration: a structure including the CPU illustrated in FIG. 61 or an arithmetic circuit is considered as one core; a plurality of the cores are included; and the cores operate in parallel. The number of bits that the CPU can process in an internal arithmetic circuit or in a data bus can be 8, 16, 32, or 64, for example An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

In the CPU illustrated in FIG. 61, a memory cell is provided in the register 1196. For the memory cell of the register 1196, any of the transistors and the memory devices described in the above embodiments can be used.

In the CPU illustrated in FIG. 61, the register controller 1197 selects operation of retaining data in the register 1196 in accordance with an instruction from the ALU 1191. That is, the register controller 1197 selects whether data is retained by a flip-flop or whether it is retained by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 62:
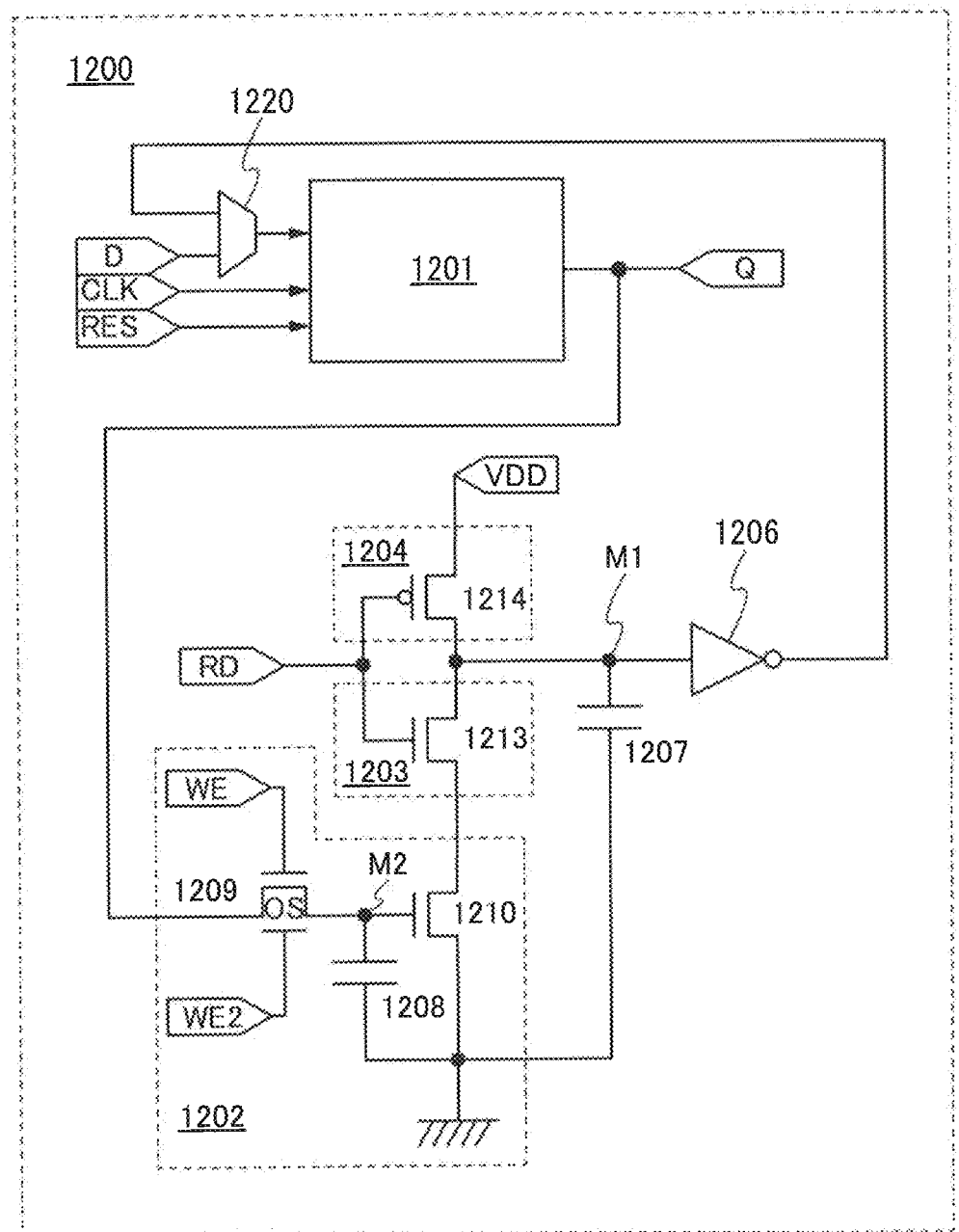
FIG. 62 is a circuit diagram illustrating a memory element of one embodiment of the present invention.

FIG. 62 is an example of a circuit diagram of a memory circuit that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described above can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When one of the switches is in the conduction state between the first terminal and the second terminal, the other of the switches is in the non-conduction state between the first terminal and the second terminal.

A signal corresponding to data retained in the circuit 1201 is input to the other of the source and the drain of the transistor 1209. FIG. 62 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 62, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 62, the transistors included in the memory element 1200 except the transistor 1209 can each be a transistor in which a channel is formed in a layer formed using a semiconductor other than an oxide semiconductor or in the substrate 1190. For example, the transistor can be a transistor whose channel is formed in a silicon film or a silicon substrate. Alternatively, a transistor in which a channel is formed in an oxide semiconductor can be used for all the transistors in the memory element 1200. Still alternatively, in the memory element 1200, a transistor in which a channel is formed in an oxide semiconductor can be included besides the transistor 1209, and a transistor in which a channel is formed in a layer formed using a semiconductor other than an oxide semiconductor or in the substrate 1190 can be used for the rest of the transistors.

As the circuit 1201 in FIG. 62, for example, a flip-flop circuit can be used. As the logic element 1206, for example, an inverter or a clocked inverter can be used.

In a period during which the memory element 1200 is not supplied with a power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which a power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By using the above-described memory element 1200 for a memory device such as a register or a cache memory included in a processor, data in the memory device can be prevented from being lost owing to the stop of the supply of a power supply voltage. Furthermore, shortly after the supply of the power supply voltage is restarted, the memory device can be returned to the same state as that before the power supply is stopped. Therefore, the power supply can be stopped even for a short time in the processor or one or more of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency tag (RF tag).

At least part of this embodiment can be implemented in combination with any of the other embodiments described in this specification as appropriate.

Embodiment 9

<Imaging Device>

Figure 63A:
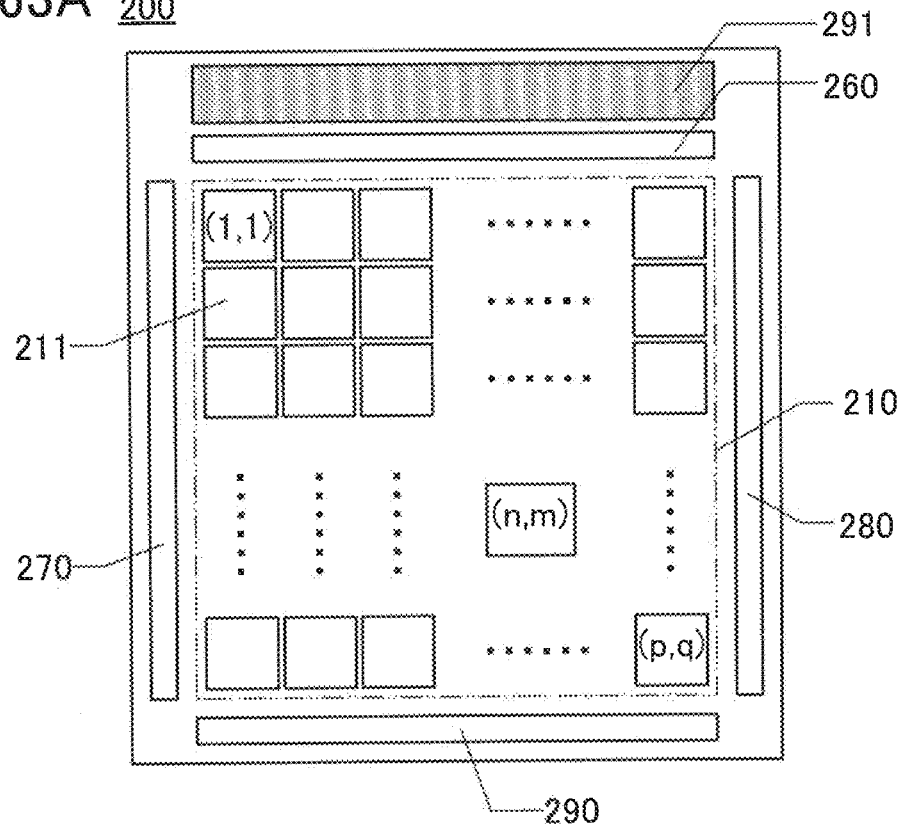
FIGS. 63A and 63B are plan views of imaging devices.

FIG. 63A is a top plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix of p rows and q columns (p and q are each an integer of 2 or more). The peripheral circuit 260, the peripheral circuit 270, the peripheral circuit 280, and the peripheral circuit 290 are each connected to a plurality of pixels 211 and each have a function of supplying a signal for driving the plurality of pixels 211. In this specification and the like, in some cases, "a peripheral circuit" or "a driver circuit" indicate all of the peripheral circuits 260, 270, 280, and 290. For example, the peripheral circuit 260 can be regarded as part of the peripheral circuit.

In addition, the imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC chip. Note that as the peripheral circuit, one or more of the peripheral circuits 260, 270, 280, and 290 may be omitted.

Figure 63B:
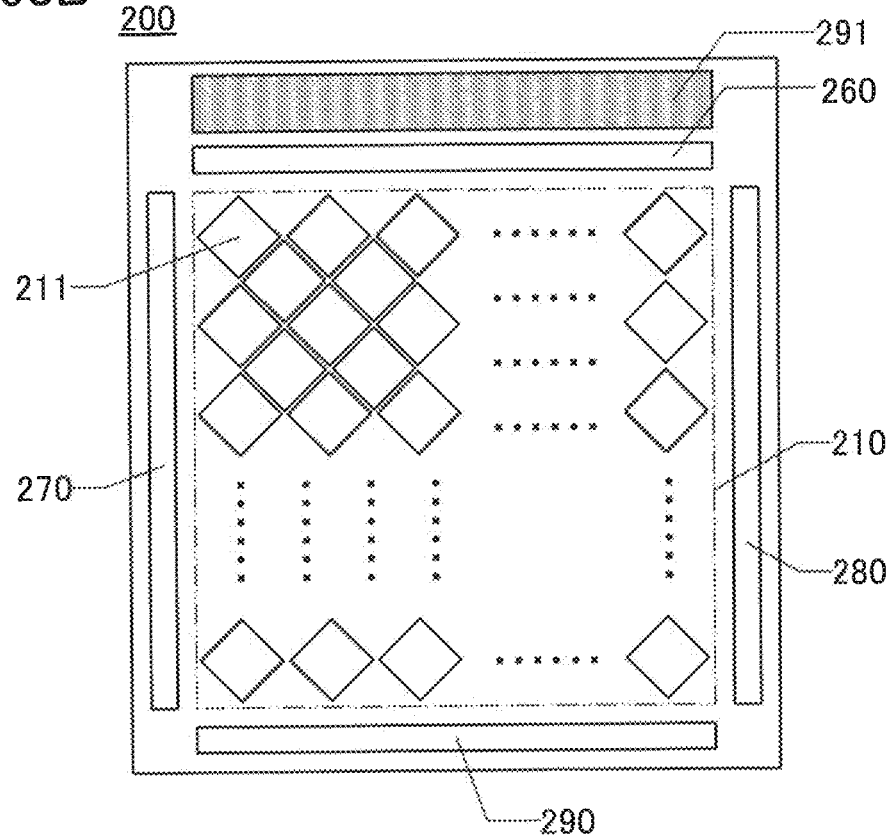

As illustrated in FIG. 63B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

Configuration Example 1 of Pixel

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 64A:
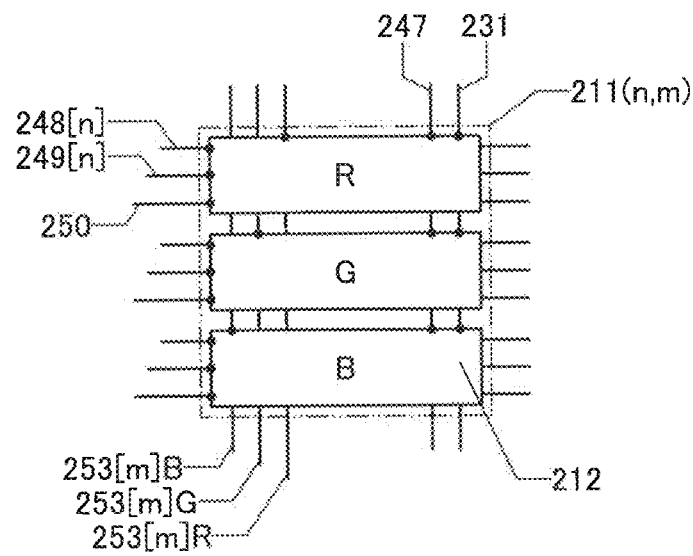
FIGS. 64A and 64B are plan views of pixels of an imaging device.

FIG. 64A is a top plan view showing an example of the pixel 211 with which a color image is obtained. The pixel 211 illustrated in FIG. 64A includes a subpixel 212 provided with a color filter that transmits light with a red (R) wavelength band (also referred to as a subpixel 212R), a subpixel 212 provided with a color filter that transmits light with a green (G) wavelength band (also referred to as a subpixel 212G), and a subpixel 212 provided with a color filter that transmits light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 64A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 64B:
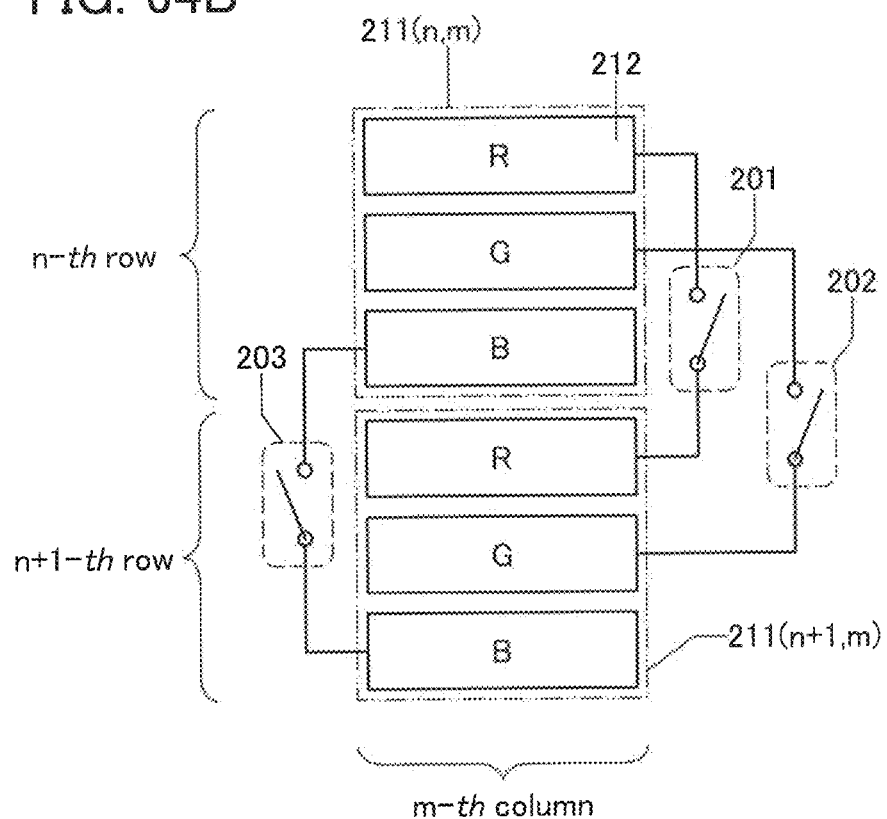

The imaging device 200 has a structure in which the subpixel 212 is electrically connected to the subpixel 212 in an adjacent pixel 211 which is provided with a color filter that transmits light with the same wavelength band as the subpixel 212, via a switch. FIG. 64B shows a connection example of the subpixels 212: the subpixel 212 in the pixel 211 arranged in an n-th (n is an integer greater than or equal to 1 and less than or equal top) row and an m-th (m is an integer greater than or equal to 1 and less than or equal to q) column and the subpixel 212 in the adjacent pixel 211 arranged in an (n+1)-th row and the m-th column In FIG. 64B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter that transmits yellow (Y) light may be provided, in addition to the subpixels 212 provided with the color filters that transmits red (R), green (G), and blue (B) light. The pixel 211 including the subpixel 212 provided with a color filter that transmits blue (B) light may be provided, in addition to the subpixels 212 provided with the color filters that transmits cyan (C), yellow (Y), and magenta (M) light. When the subpixels 212 that sense light with four different wavelength bands are provided in one pixel 211, the reproducibility of colors of an obtained image can be increased.

For example, in FIG. 64A, in regard to the subpixel 212 that senses light in a red wavelength band, the subpixel 212 that senses light in a green wavelength band, and the subpixel 212 that senses light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 that senses light in the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be provided.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 will be described with reference to cross-sectional views in FIGS. 65A and 65B. With the lens 255, the photoelectric conversion element can receive incident light efficiently. Specifically, as illustrated in FIG. 65A, light 256 enters a photoelectric conversion element 220 through the lens 255, the filter 254 (a filter 254R, a filter 254G, and a filter 254B), a pixel circuit 230, and the like which are provided in the pixel 211.

However, part of the light 256 indicated by arrows might be blocked by some wirings 257 as indicated by a region surrounded with dashed-dotted lines. Thus, a preferable structure is that the lens 255 and the filter 254 are provided on the photoelectric conversion element 220 side so that the photoelectric conversion element 220 can efficiently receive the light 256 as illustrated in FIG. 65B. When the light 256 enters the photoelectric conversion element 220 from the photoelectric conversion element 220 side, the imaging device 200 with high sensitivity can be provided.

Figure 65A:
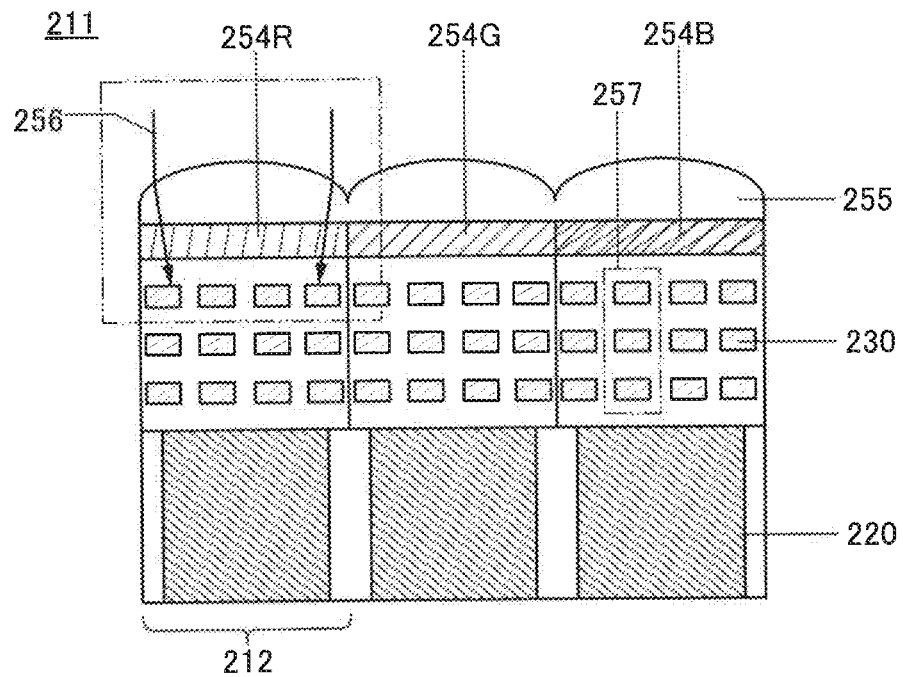
FIGS. 65A and 65B are cross-sectional views of imaging devices.
Figure 65B:
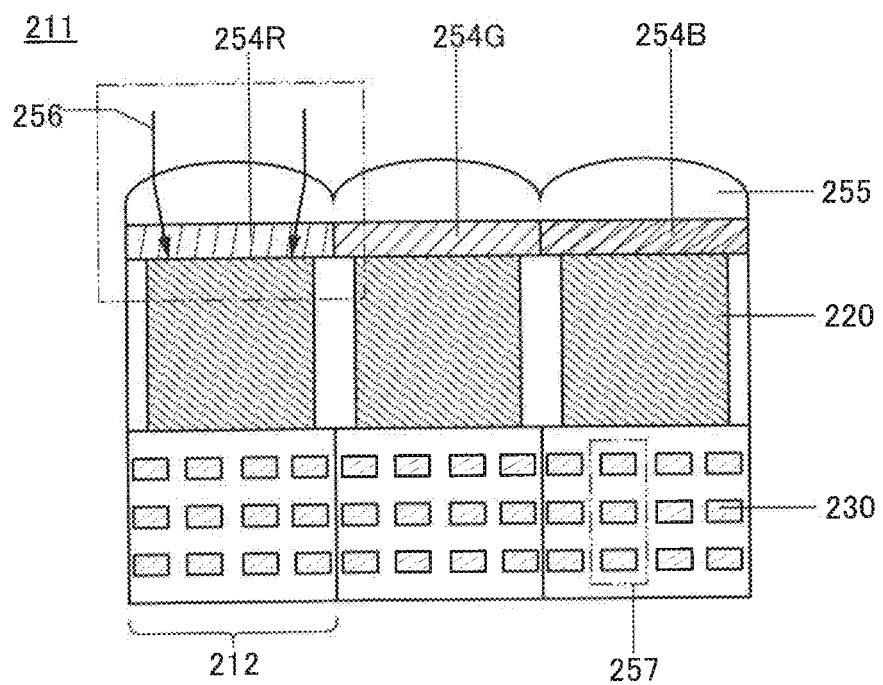

As the photoelectric conversion element 220 illustrated in FIGS. 65A and 65B, a photoelectric conversion element in which a p-n junction or a p-i-n junction is formed may be used.

The photoelectric conversion element 220 may be formed using a substance that has a function of absorbing a radiation and generating electric charge. Examples of the substance that has a function of absorbing a radiation and generating electric charge include selenium, lead iodide, mercury iodide, gallium arsenide, cadmium telluride, and a cadmium-zinc alloy.

For example, when selenium is used for the photoelectric conversion element 220, the photoelectric conversion element 220 can have an absorption coefficient of light in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 65A and 65B.

Configuration Example 2 of Pixel

An example of a pixel including a transistor using silicon and the transistor using an oxide semiconductor of one embodiment of the present invention will be described below.

Figure 66A:
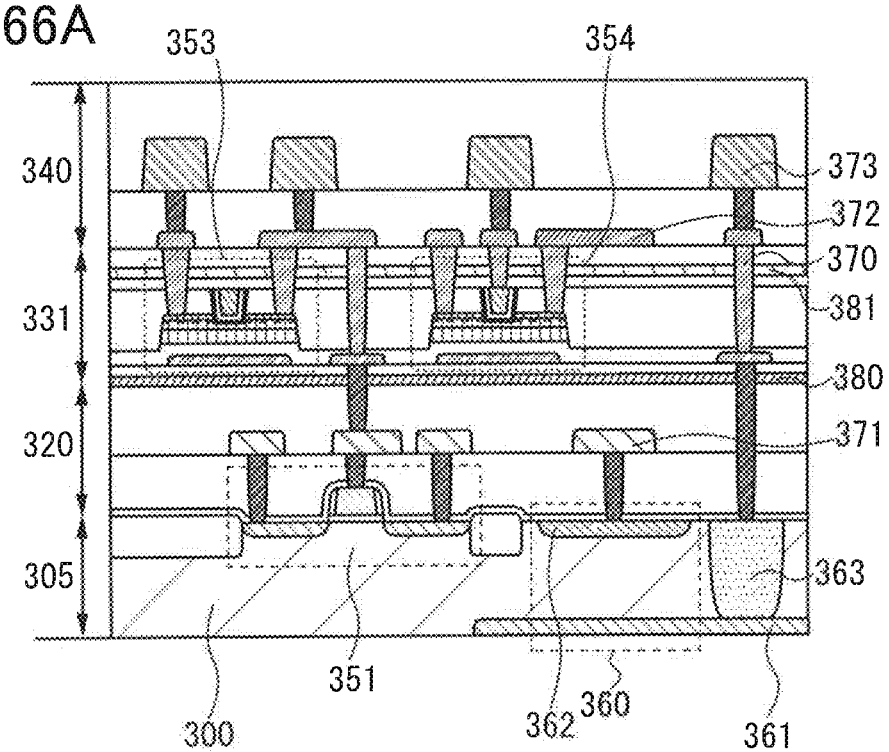
FIGS. 66A and 66B are cross-sectional views of imaging devices.
Figure 66B:
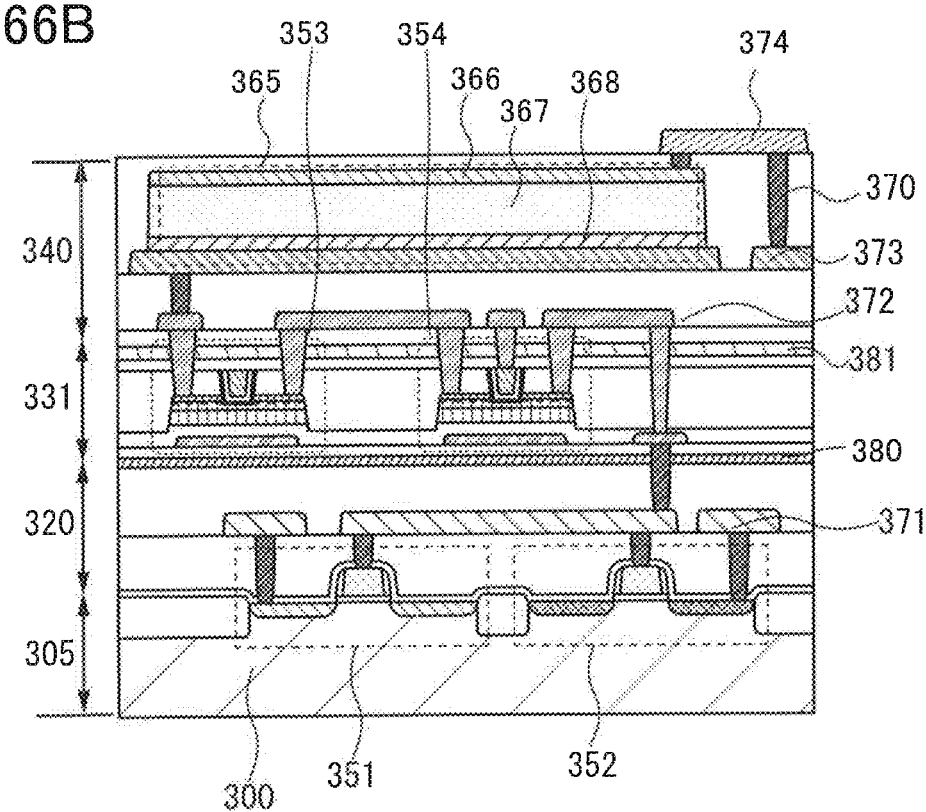

FIGS. 66A and 66B are each a cross-sectional view of an element included in an imaging device.

The imaging device illustrated in FIG. 66A includes a transistor 351 including silicon on a silicon substrate 300, transistors 353 and 354 which include an oxide semiconductor and are stacked over the transistor 351, and a photodiode 360 which includes an anode 361 and a cathode 362 and is provided in a silicon substrate 300. The transistors and the photodiode 360 are electrically connected to various plugs 370 and wirings 371. In addition, the anode 361 of the photodiode 360 is electrically connected to the plug 370 through a low-resistance region 363.

The imaging device includes a layer 305 including the transistor 351 provided on the silicon substrate 300 and the photodiode 360 provided in the silicon substrate 300, a layer 320 which is in contact with the layer 305 and includes the wirings 371, a layer 331 which is in contact with the layer 320 and includes the transistors 353 and 354, and a layer 340 which is in contact with the layer 331 and includes a wiring 372 and a wiring 373.

In the example of cross-sectional view in FIG. 66A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with the use of only transistors including an oxide semiconductor, the layer 305 may include the transistors including an oxide semiconductor. Alternatively, the layer 305 may be omitted, and the pixel may include only transistors including an oxide semiconductor.

In the cross-sectional view in FIG. 66A, the photodiode 360 in the layer 305 and the transistor in the layer 331 can be formed so as to overlap each other. Thus, the degree of integration of pixels can be increased. In other words, the resolution of the imaging device can be increased.

An imaging device shown in FIG. 66B includes a photodiode 365 in the layer 340 and over the transistor. In FIG. 66B, the layer 305 includes the transistor 351 and a transistor 352 using silicon, the layer 320 includes the wiring 371, the layer 331 includes the transistors 353 and 354 using an oxide semiconductor layer, the layer 340 includes the photodiode 365. The photodiode 365 includes a semiconductor layer 366, a semiconductor layer 367, and a semiconductor layer 368, and is electrically connected to the wiring 373, and a wiring 374 through the plug 370.

The element structure shown in FIG. 66B can increase the aperture ratio.

Alternatively, a PIN diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. The p-type semiconductor layer 366 and the n-type semiconductor layer 368 can each be formed using amorphous silicon, microcrystalline silicon, or the like which includes a dopant imparting the corresponding conductivity type. The photodiode 365 in which a photoelectric conversion layer is formed using amorphous silicon has high sensitivity in a visible light wavelength region, and therefore can easily sense weak visible light.

Here, an insulator 380 is provided between the layer 305 including the transistor 351 and the photodiode 360 and the layer 331 including the transistors 353 and 354. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 353, the transistor 354, and the like is one of factors generating a carrier in the oxide semiconductor. Thus, the hydrogen may cause a reduction of the reliability of the transistor 354, the transistor 354, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 353, the transistor 354, and the like can be increased. It is preferable to form the insulator 381 over the transistors 353 and 354 because oxygen diffusion can be prevented in the oxide semiconductor.

At least part of this embodiment can be implemented in combination with any of the other embodiments described in this specification as appropriate.

Embodiment 10

<RF Tag>

In this embodiment, an RF tag that includes the transistor described in the above embodiment or the memory device described in the above embodiment will be described with reference to FIG. 67.

The RF tag of this embodiment includes a memory circuit, stores necessary data in the memory circuit, and transmits and receives data to/from the outside with use of contactless means, for example, wireless communication. The RF tag with these features can be used for an individual authentication system in which an object or the like is recognized by reading the individual information, for example. In order that the RF tag is used for such application, extremely high reliability is needed.

A configuration of the RF tag will be described with reference to FIG. 67. FIG. 67 is a block diagram illustrating a configuration example of an RF tag.

Figure 67:
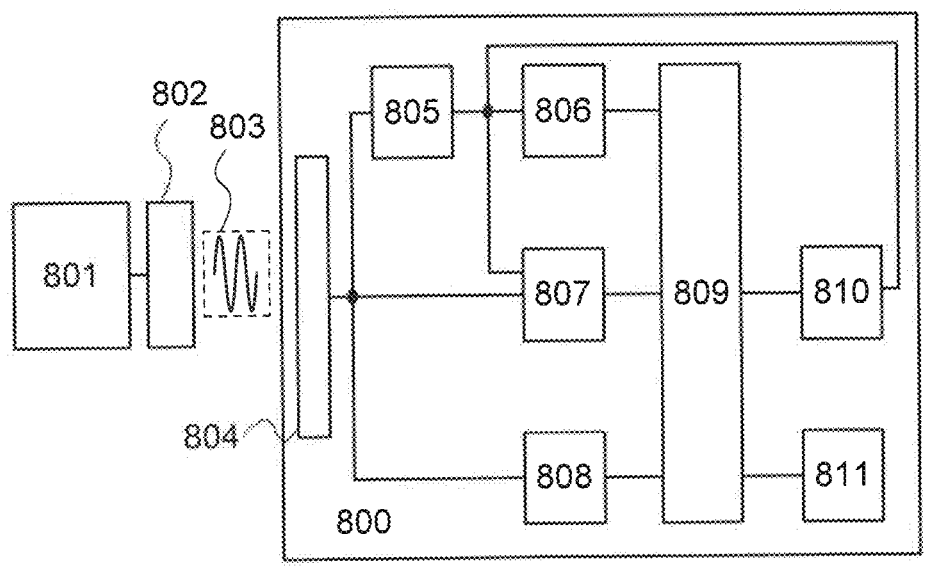
FIG. 67 illustrates a configuration example of an RF tag.

As shown in FIG. 67, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress reduction of a rectifying function due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the configuration of each circuit will be described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that whether each circuit described above is provided can be determined as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, putting identification numbers only to good products to be shipped is possible. Thus, the identification numbers of the shipped products are in series and customer management corresponding to the shipped products is easily performed.

This embodiment can be combined as appropriate with any of the other embodiments and examples in this specification.

Embodiment 11

<Display Device>

A display device of one embodiment of the present invention will be described below with reference to FIGS. 68A to 68C and FIGS. 69A and 69B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) will be described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 68A:
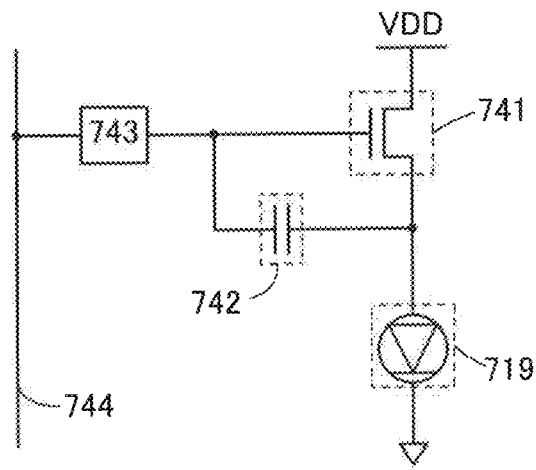
FIGS. 68A to 68C are a circuit diagram, a top view, and a cross-sectional view illustrating a semiconductor device of one embodiment of the present invention.
Figure 68B:
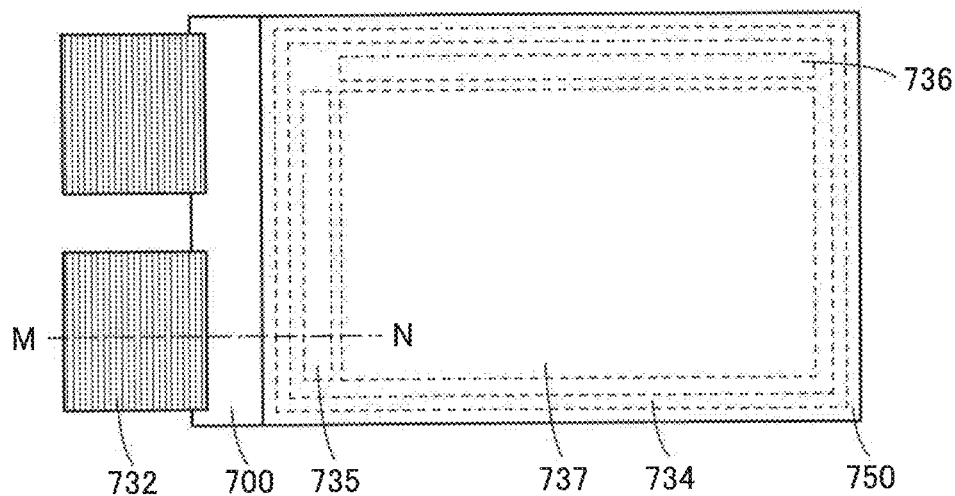
Figure 68C:
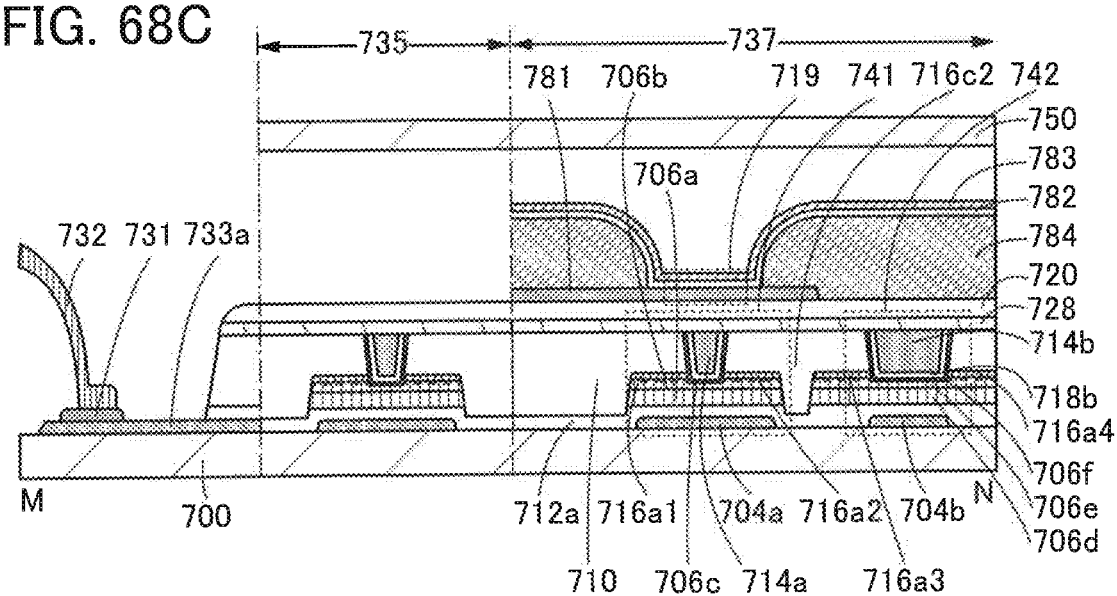

FIGS. 68A to 68C illustrate an example of an EL display device of one embodiment of the present invention. FIG. 68A is a circuit diagram of a pixel in an EL display device. FIG. 68B is a top plan view showing the whole of the EL display device. FIG. 68C is a cross-sectional view taken along part of dashed-dotted line M-N in FIG. 68B.

FIG. 68A illustrates an example of a circuit diagram of a pixel used in an EL display device.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear, and it can be determined that the embodiment is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 68A includes a switching element 743, a transistor 741, a capacitor 742, and a light-emitting element 719.

Note that FIG. 68A and the like each illustrate an example of a circuit configuration; therefore, a transistor can be provided additionally. In contrast, for each node in FIG. 68A and the like, it is possible that an additional transistor, switch, passive element, or the like not be provided.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the transistor illustrated in FIGS. 9A to 9C can be used, for example FIG. 68B is a top plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 68C is a cross-sectional view of the EL display device taken along part of dashed-dotted line M-N in FIG. 68B.

FIG. 68C illustrates a structure of the transistor 741 including an insulator 712 over the substrate 700; a conductor 704a; an insulator 706a that is over the insulator 712a and the conductor 704a and partly overlaps with the conductor 704a; a semiconductor 706b over the insulator 706a; conductors 716a1 and 716a2 in contact with a top surface of the semiconductor 706b; an insulator 710 over the conductors 716a1 and 716a2; an insulator 706c over the semiconductor 706b; an insulator 718b over the insulator 706c; and a conductor 714a that is over the insulator 718b and overlaps with the semiconductor 706b. Note that the structure of the transistor 741 is just an example; the transistor 741 may have a structure different from that illustrated in FIG. 68C.

Thus, in the transistor 741 illustrated in FIG. 68C, the conductor 704a serves as a gate electrode, the insulator 712a serves as a gate insulator, the conductor 716a serves as a source electrode, the conductor 716a2 serves as a drain electrode, the insulator 718b serves as a gate insulator, and the conductor 714a serves as a gate electrode. Note that in some cases, the electrical characteristics of the insulator 706a, the semiconductor 706b, and the insulator 706c change if light enters the insulator 706a, the semiconductor 706b, and the insulator 706c. To prevent this, it is preferable that one or more of the conductor 704a, the conductor 716a1, the conductor 716a2, and the conductor 714a have a light-blocking property.

FIG. 68C illustrates a structure of the capacitor 742 including an insulator 706d that is over a conductor 704b provided over the conductor 704b and partly overlaps with the conductor 704b; a semiconductor 706e over the insulator 706d; conductors 716a3 and 716a4 in contact with a top surface of the semiconductor 706e; the insulator 710 over the conductors 716a3 and 716a4; an insulator 706f over the semiconductor 706e; the insulator 718b over the insulator 706f; and a conductor 714b that is over the insulator 718b and overlaps with the semiconductor 706e.

In the capacitor 742, the conductor 704*b* serves as one electrode, and the conductor 714*b* serves as the other electrode.

The capacitor 742 can be formed using a film of the transistor 741. The conductor 704*a* and the conductor 704*b* are preferably conductors of the same kind, in which case the conductor 704*a* and the conductor 704*b* can be formed through the same step. Furthermore, the conductor 714*a* and the conductor 714*b* are preferably conductors of the same kind, in which case the conductor 714*a* and the conductor 714*b* can be formed through the same step.

The capacitor 742 illustrated in FIG. 68C has a large capacitance per unit area occupied by the capacitor. Therefore, the EL display device illustrated in FIG. 68C has high display quality. Note that the structure of the capacitor 742 is just an example and may be different from that illustrated in FIG. 68C.

An insulator 728 is provided over the transistor 741 and the capacitor 742, and an insulator 720 is provided over the insulator 728. Here, the insulator 728 and the insulator 720 may have an opening reaching the conductor 716*a*1 that serves as the source electrode of the transistor 741. A conductor 781 is provided over the insulator 720. The conductor 781 may be electrically connected to the transistor 741 through the opening in the insulator 728 and the insulator 720.

A partition wall 784 having an opening reaching the conductor 781 is provided over the conductor 781. A light-emitting layer 782 in contact with the conductor 781 through the opening formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device will be described.

Figure 69A:
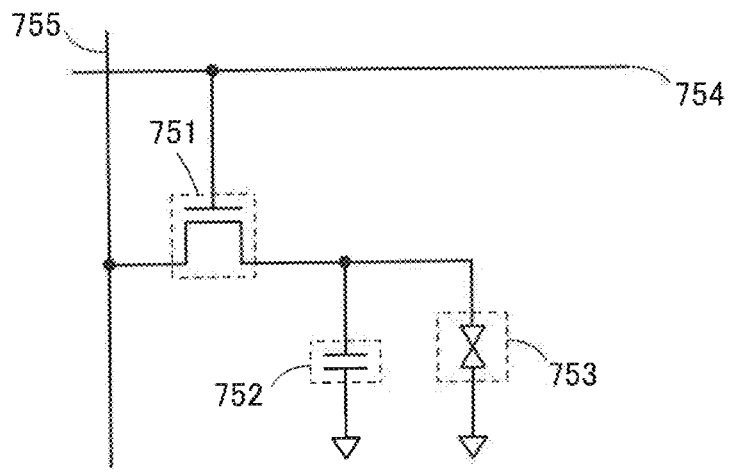
FIGS. 69A and 69B are a circuit diagram and a cross-sectional view illustrating a semiconductor device of one embodiment of the present invention.

FIG. 69A is a circuit diagram illustrating a configuration example of a pixel of a liquid crystal display device. A pixel shown in FIGS. 69A and 69B includes a transistor 751, a capacitor 752, and an element (liquid crystal element) 753 in which a space between a pair of electrodes is filled with liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 69B:
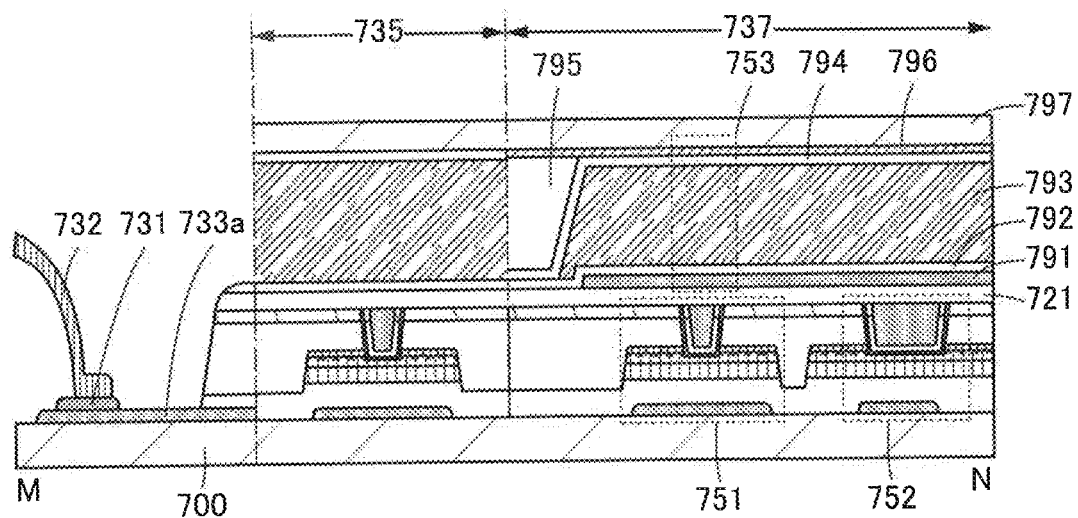

Note that the description of the liquid crystal display device is made on the assumption that the top plan view of the liquid crystal display device is similar to that of the EL display device. FIG. 69B is a cross-sectional view of the liquid crystal display device taken along dashed-dotted line M-N in FIG. 68B. In FIG. 69B, the FPC 732 is connected to the wiring 733*a* via the terminal 731. Note that the wiring 733*a* may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 69B corresponds to, but is not limited to, the structure of the capacitor 742 in FIG. 68C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element (e.g., an EL element including organic and inorganic materials, an organic EL element, or an inorganic EL element), an LED (e.g., an LED for white, red, green, blue, or the like), a transistor (a transistor that emits light depending on a current), an electron emitter, a liquid crystal element, Electronic Liquid Powder (registered trademark) electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an MN layer may be provided between the n-type GaN semiconductor including crystals and graphene or graphite. The GaN semiconductors included in the LED may be formed by MOCVD. Note that when the graphene is provided, the GaN semiconductor included in the LED can also be formed by a sputtering method.

This embodiment can be combined as appropriate with any of the other embodiments and examples in this specification.

Embodiment 12

In this embodiment, a display module using a semiconductor device of one embodiment of the present invention will be described with reference to FIG. 70.

Figure 70:
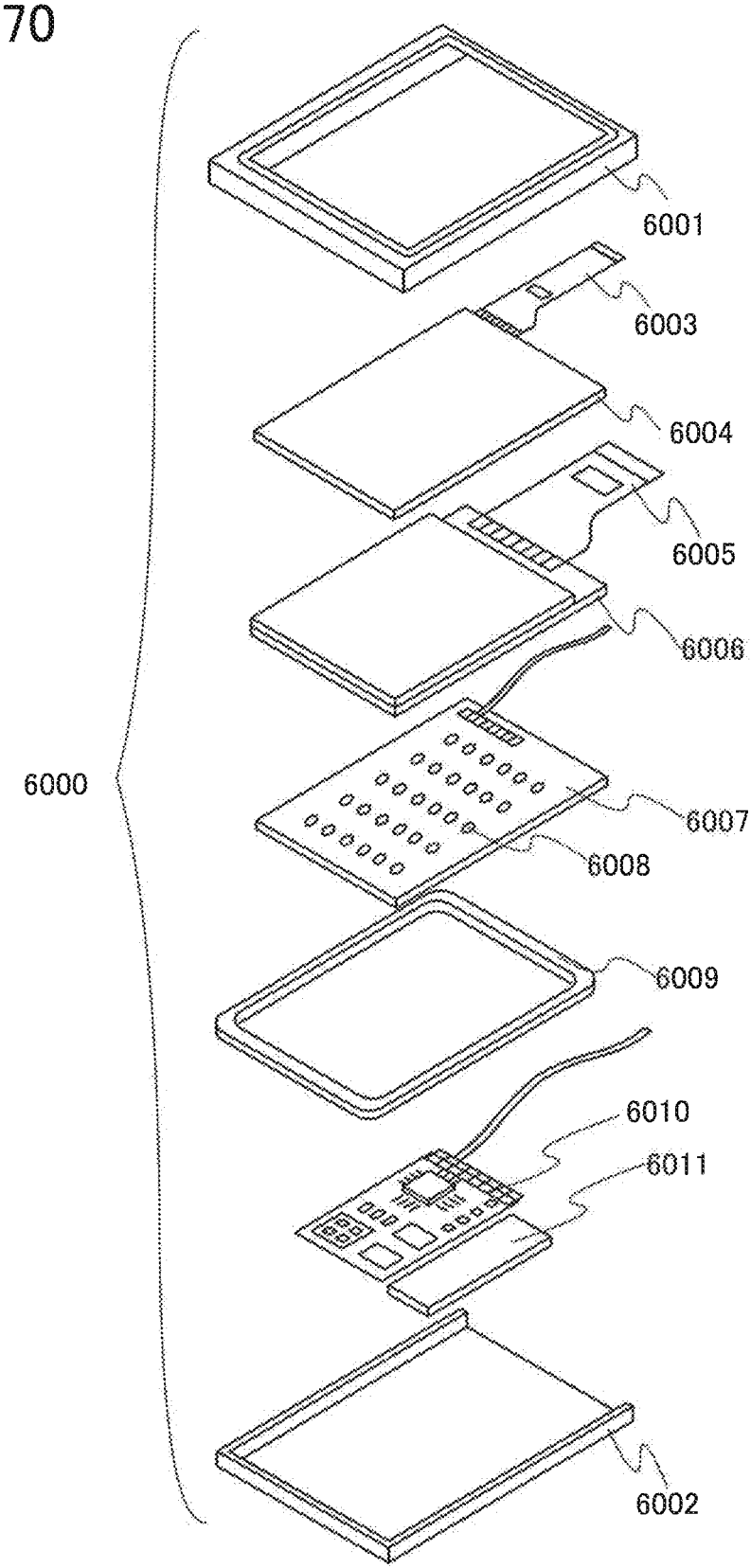
FIG. 70 illustrates a display module.

In a display module 6000 illustrated in FIG. 70, a touch panel 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for, for example, the display panel 6006 and an integrated circuit mounted on a printed circuit board.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed so as to overlap with the display panel 6006. A counter substrate (sealing substrate) of the display panel 6006 can have a touch panel function. A photosensor may be provided in each pixel of the display panel 6006 so that an optical touch panel function is added. An electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and functions as an electromagnetic shield for blocking electromagnetic waves generated from the printed board 6010. The frame 6009 may function as a radiator plate.

The printed board 6010 is provided with a power supply circuit and a signal processing circuit for outputting a video signal and a clock signal. As a power source for supplying power to the power supply circuit, an external commercial power source or a power source using the battery 6011 provided separately may be used. The battery 6011 can be omitted in the case of using a commercial power source.

The display module 6000 may be additionally provided with a member such as a polarizing plate, a retardation plate, or a prism sheet.

Note that this embodiment can be combined as appropriate with any of the other embodiments and examples in this specification.

Embodiment 13

<Package Using a Lead Frame Interposer>

Figure 71A:
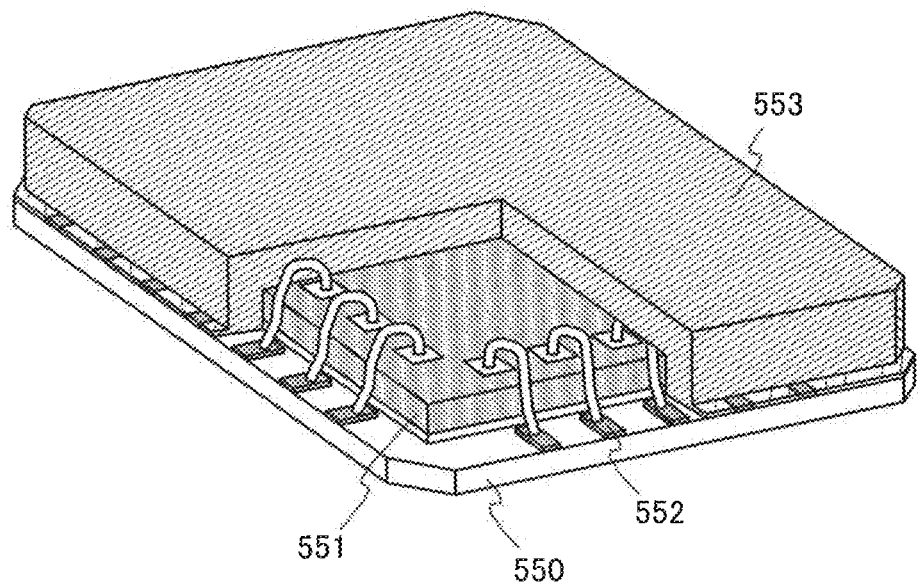
FIG. 71A is a perspective view illustrating a cross-sectional structure of a package using a lead frame interposer.

FIG. 71A is a perspective view illustrating a cross-sectional structure of a package using a lead frame interposer. In the package illustrated in FIG. 71A, a chip 551 corresponding to the semiconductor device of one embodiment of the present invention is connected to a terminal 552 over an interposer 550 by a wire bonding method. The terminal 552 is placed on a surface of the interposer 550 on which the chip 551 is mounted. The chip 551 may be sealed by a mold resin 553, in which case the chip 551 is sealed such that part of each of the terminals 552 is exposed.

Figure 71B:
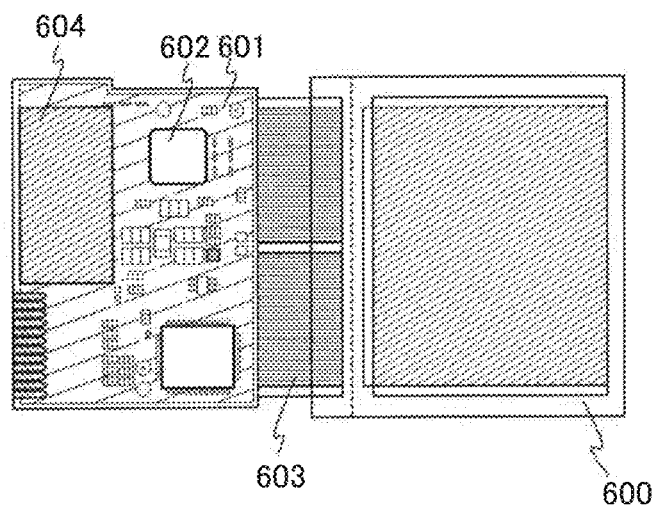
FIG. 71B is a top view illustrating the structure of a module.

FIG. 71B illustrates the structure of a module of an electronic device (mobile phone) in which a package is mounted on a circuit board. In the module of the mobile phone in FIG. 71B, a package 602 and a battery 604 are mounted on a printed wiring board 601. The printed wiring board 601 is mounted on a panel 600 including a display element by an FPC 603.

Note that this embodiment can be combined as appropriate with any of the other embodiments and examples in this specification.

Embodiment 14

In this embodiment, electronic devices and lighting devices of embodiments of the present invention will be described with reference to drawings.
<Electronic Device>

Electronic devices and lighting devices can be fabricated using the semiconductor device of one embodiment of the present invention. In addition, highly reliable electronic devices and lighting devices can be fabricated using the semiconductor device of one embodiment of the present invention. Furthermore, electronic devices and lighting devices including touch sensors with improved detection sensitivity can be fabricated using the semiconductor device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

In the case of having flexibility, the electronic device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

Figure 72A:
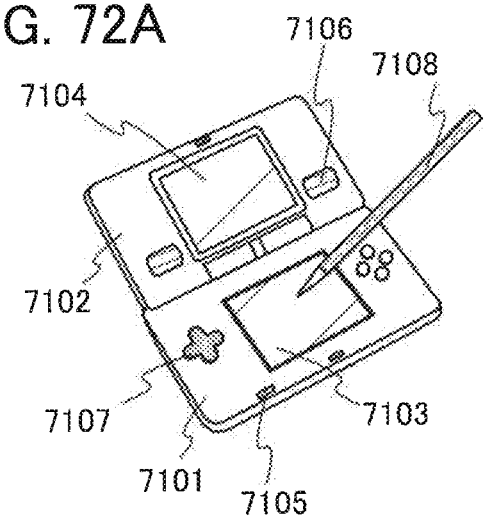
FIGS. 72A to 72E each illustrate an electronic device of one embodiment of the present invention.

FIG. 72A illustrates a portable game machine including a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the light-emitting device of one embodiment of the present invention is used as the display portion 7103 or 7104, it is possible to provide a user-friendly portable game machine with quality that hardly deteriorates. Although the portable game machine illustrated in FIG. 72A includes two display portions, the display portion 7103 and the display portion 7104, the number of display portions included in the portable game machine is not limited to two.

Figure 72B:
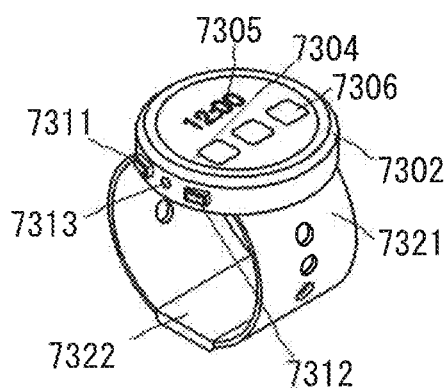

FIG. 72B illustrates a smart watch which includes a housing 7302, a display portion 7304, operation buttons 7311 and 7312, a connection terminal 7313, a band 7321, a clasp 7322, and the like. The semiconductor device of one embodiment of the present invention can be used for a memory, a CPU, or the like incorporated in the display portion 7304 or the housing 7302.

Figure 72C:
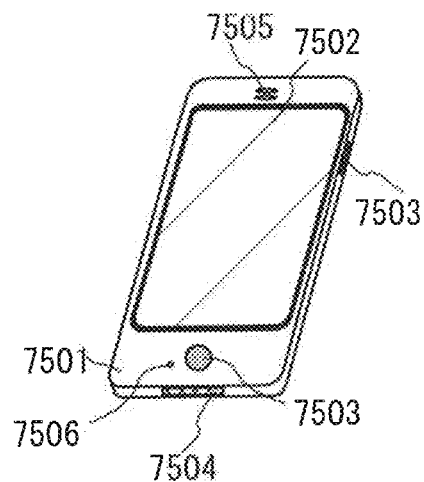

FIG. 72C illustrates a portable information terminal which includes a display portion 7502 incorporated in a housing 7501, operation buttons 7503, an external connection port 7504, a speaker 7505, a microphone 7506, a display portion 7502, and the like. The semiconductor device of one embodiment of the present invention can be used for a mobile memory, a CPU, or the like incorporated in the housing 7501. Note that the display portion 7502 is small- or medium-sized but can perform full high vision, 4 k, or 8 k display because it has greatly high definition; therefore, a significantly clear image can be obtained.

Figure 72D:
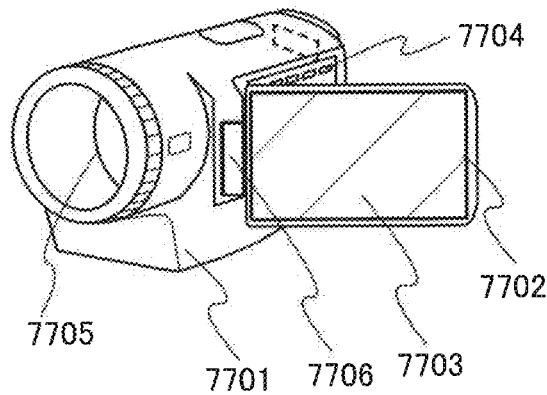

FIG. 72D illustrates a video camera which includes a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device of one embodiment of the present invention can be provided in a focus position of the lens 7705. The semiconductor device of one embodiment of the present invention can be used for an integrated circuit, a CPU, or the like incorporated in the first housing 7701.

Figure 72E:
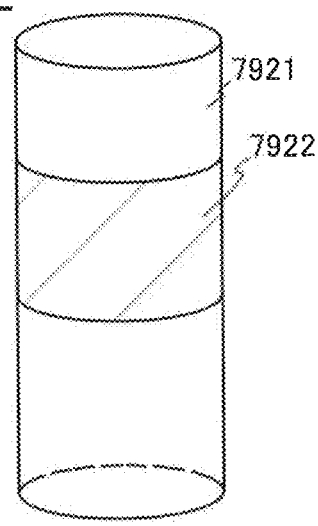

FIG. 72E illustrates a digital signage including a display portion 7922 provided on a utility pole 7921. The display device of one embodiment of the present invention can be used for a control circuit of the display portion 7922.

Figure 73A:
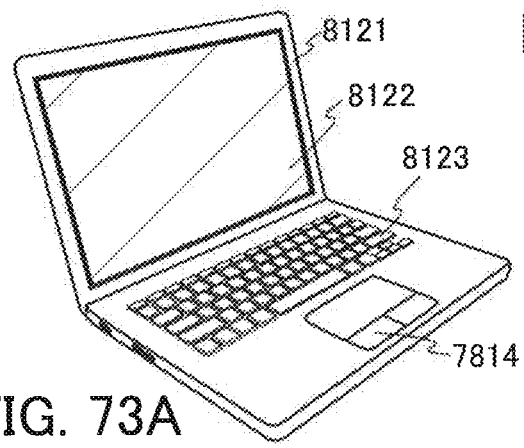
FIGS. 73A to 73D each illustrate an electronic device of one embodiment of the present invention.

FIG. 73A illustrates a notebook personal computer which includes a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform 8$k$ display because it has greatly high definition; therefore, a significantly clear image can be obtained.

Figure 73B:
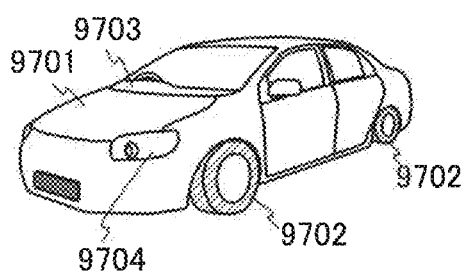
Figure 73C:
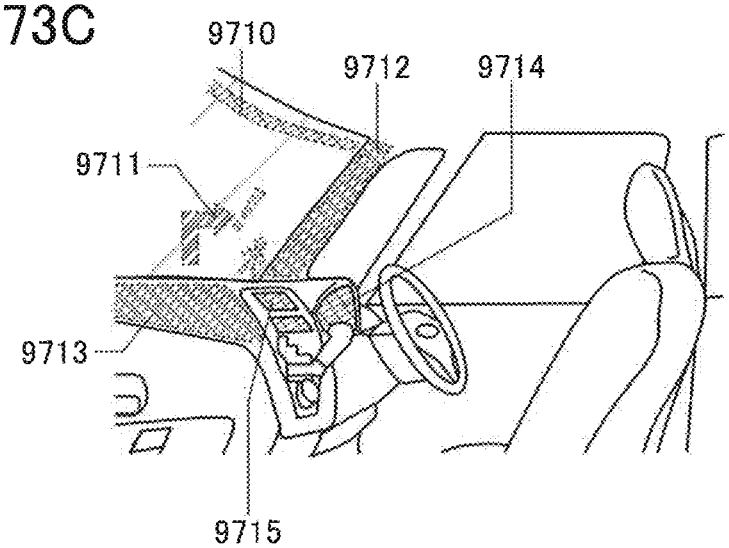

FIG. 73B is an external view of an automobile 9700. FIG. 73C illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the semiconductor device of one embodiment of the present invention can be used in display portions 9710 to 9715 illustrated in FIG. 73C.

The display portion 9710 and the display portion 9711 are display devices or input/output devices provided in an automobile windshield. The use of a light-transmitting conductive material for its electrodes allows the display device or input/output device of one embodiment of the present invention to be a see-through display device or input/output device through which the opposite side can be seen. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see makes it possible for the driver to confirm safety easily and comfortably.

Figure 73D:
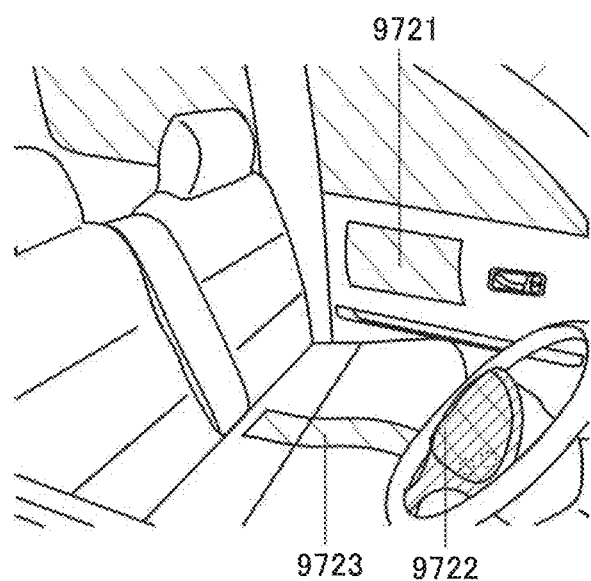

FIG. 73D illustrates the inside of a car in which a bench seat is used as a driver seat and a front passenger seat. A display portion 9721 is a display device or input/output device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generated by the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 74A:
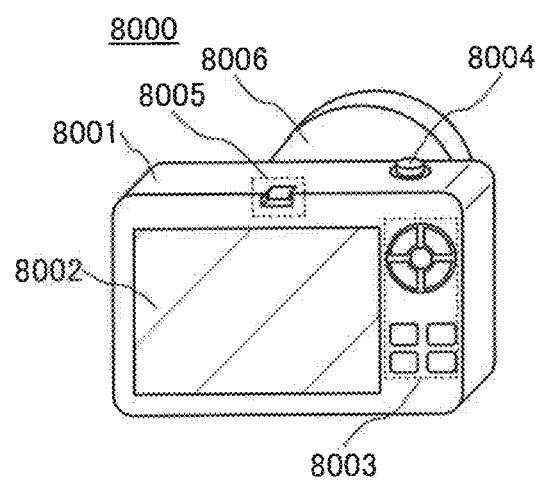
FIGS. 74A to 74C each illustrate an electronic device of one embodiment of the present invention.

FIG. 74A illustrates an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect with a finder 8100, which will be described below, a stroboscope, or the like.

Although the lens 8006 of the camera 8000 here is detachable from the housing 8001 for replacement, the lens 8006 may be included in a housing.

Images can be taken by the touch of the shutter button 8004. In addition, images can be taken by the touch of the display portion 8002 which serves as a touch panel.

The display device or input/output device of one embodiment of the present invention can be used in the display portion 8002.

Figure 74B:
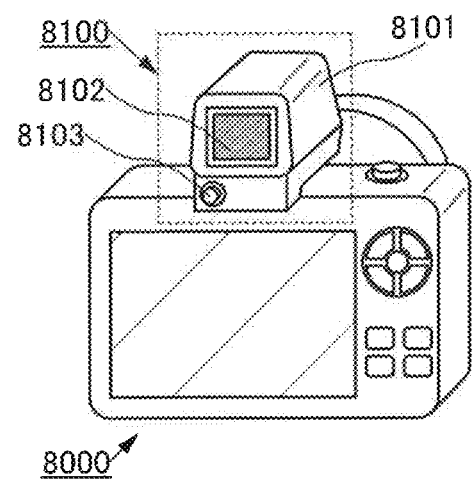

FIG. 74B shows the camera 8000 with the finder 8100 connected.

The finder 8100 includes a housing 8101, a display portion 8102, a button 8103, and the like.

The housing 8101 includes a connection portion for the camera 8000 and the connection portion 8005, and the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off with the button 8103.

The semiconductor device of one embodiment of the present invention can be used for an integrated circuit and an image sensor included in the housing 8101.

Although the camera 8000 and the finder 8100 are separate and detachable electronic devices in FIGS. 74A and 74B, the housing 8001 of the camera 8000 may include a finder having the display device or input/output device of one embodiment of the present invention.

Figure 74C:
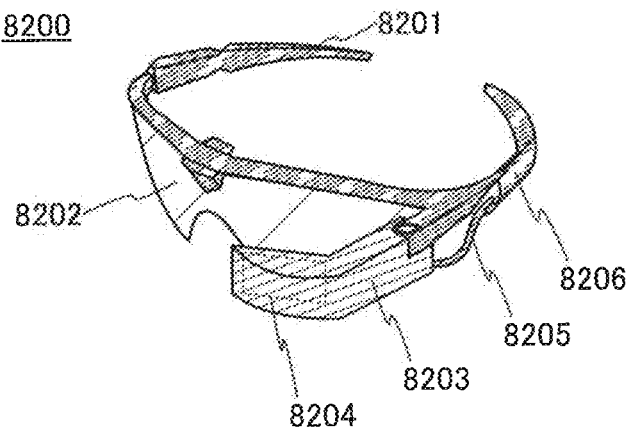

FIG. 74C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data such as image data and display it on the display portion 8204. In addition, the movement of the eyeball and the eyelid of a user can be captured by a camera in the main body 8203 and then coordinates of the points the user looks at can be calculated using the captured data to utilize the eye of the user as an input means.

The mounting portion 8201 may include a plurality of electrodes to be in contact with the user. The main body 8203 may have a function of sensing current flowing through the electrodes with the movement of the user's eyeball to recognize the direction of his or her eyes. The main body 8203 may have a function of sensing current flowing through the electrodes to monitor the user's pulse. The mounting portion 8201 may include sensors such as a temperature sensor, a pressure sensor, or an acceleration sensor so that the user's biological information can be displayed on the display portion 8204. The main body 8203 may have a function of sensing the movement of the user's head or the like to move an image displayed on the display portion 8204 in synchronization with the movement of the user's head or the like.

The semiconductor device of one embodiment of the present invention can be used for an integrated circuit included in the main body 8203.

At least part of this embodiment can be implemented in combination with any of the other embodiments described in this specification as appropriate.

Embodiment 15

In this embodiment, application examples of the RF tag using the semiconductor device of one embodiment of the present invention will be described with reference to FIGS. 75A to 75F.

<Application Examples of RF Tag>

Figure 75A:
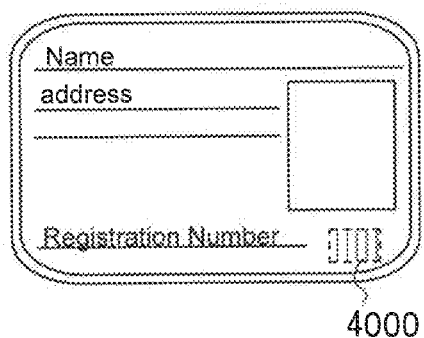
FIGS. 75A to 75F illustrate application examples of an RF tag of one embodiment of the present invention.
Figure 75B:
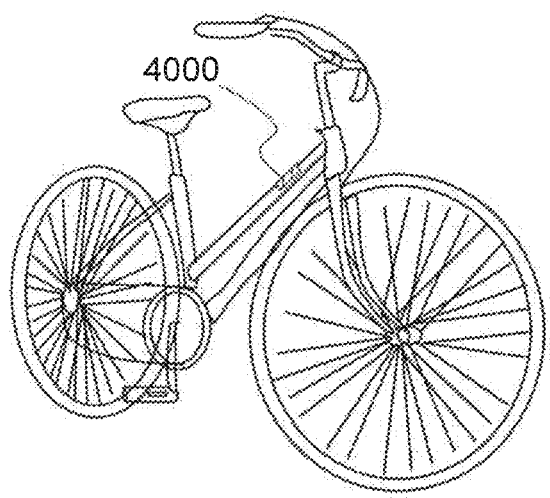
Figure 75C:
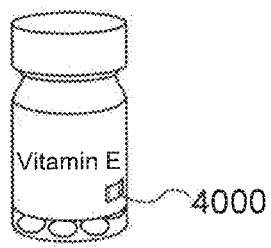
Figure 75D:
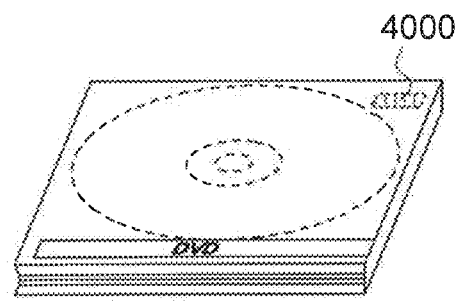
Figure 75E:
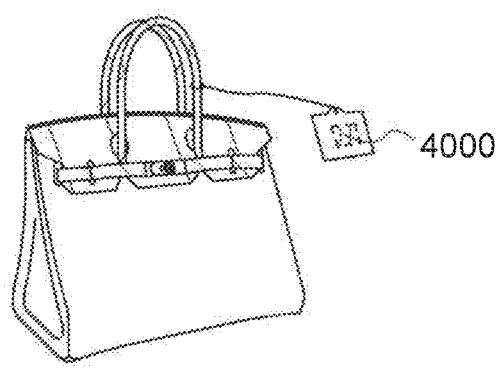
Figure 75F:
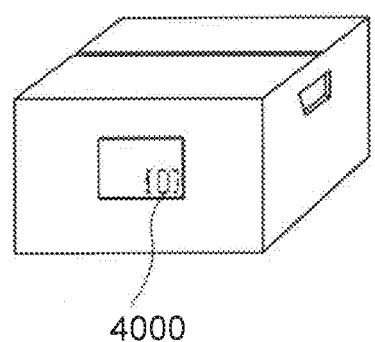

The RF tag is widely used and can be provided for, for example, products such as bills, coins, securities, bearer bonds, documents (e.g., driver's licenses or resident's cards, see FIG. 75A), vehicles (e.g., bicycles, see FIG. 75B), packaging containers (e.g., wrapping paper or bottles, see FIG. 75C), recording media (e.g., DVDs or video tapes, see FIG. 75D), personal belongings (e.g., bags or glasses, see FIG. 75E), foods, plants, clothing, household goods, medical supplies such as medicine and chemicals, and electronic appliances (e.g., liquid crystal display devices, EL display devices, television sets, or cellular phones), animals, human bodies, or tags on products (see FIGS. 75E and 75F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Vehicles can also have a higher level of security against theft or the like by being provided with the RF tag of one embodiment of the present invention.

As described above, by using the RF tag using the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined as appropriate with any of the other embodiments and examples in this specification.

Example 1

In this example, the effect of washing was examined by X-ray photoelectron spectroscopy (XPS).

Samples were formed by depositing tungsten to a thickness of 300 nm on a single crystal silicon wafer by a sputtering method. Sample 1 is a comparison example subjected to no treatment after the deposition of tungsten. Sample 2 was obtained by successively performing the following steps after the deposition of tungsten: etching treatment under the conditions for forming contact openings with the use of a dry etching apparatus and oxygen plasma treatment. Sample 3 was obtained in such a manner that treatment of the surface of tungsten under the conditions for forming contact openings with the use of a dry etching apparatus and oxygen plasma treatment were successively performed after the deposition of tungsten, and then, QDR washing was performed three cycles. That is, Sample 3 was processed as in the method for forming openings that is described in Embodiment 1.

The dry etching apparatus that was used has a structure in which high frequency power sources with different frequencies are connected to respective parallel plate type electrodes. To form openings, the following steps were performed: a first step of applying 1800 W high frequency power to the upper electrode and 2000 W high frequency power to the lower electrode at a pressure of 3.3 Pa for 40 seconds using a mixed gas containing a $C_4F_6$ gas with a flow rate of 22 sccm, an oxygen gas with a flow rate of 30 sccm, and an Ar gas with a flow rate of 800 sccm; and a second step of applying 1000 W high frequency power to the upper electrode and 1200 W high frequency power to the lower electrode at a pressure of 2.6 Pa for 64 seconds using a mixed gas containing a $C_4F_8$ gas with a flow rate of 8 sccm, a hydrogen gas with a flow rate of 16 sccm, and an Ar gas with a flow rate of 475 sccm.

The oxygen plasma treatment was performed in such a manner that 500 W high frequency power and 100 W high frequency power were applied to the upper electrode and the lower electrode, respectively, at a pressure of 2.6 Pa for 10 seconds using an oxygen gas with a flow rate of 200 sccm. For washing, QDR treatment was performed three cycles.

Figure 76:
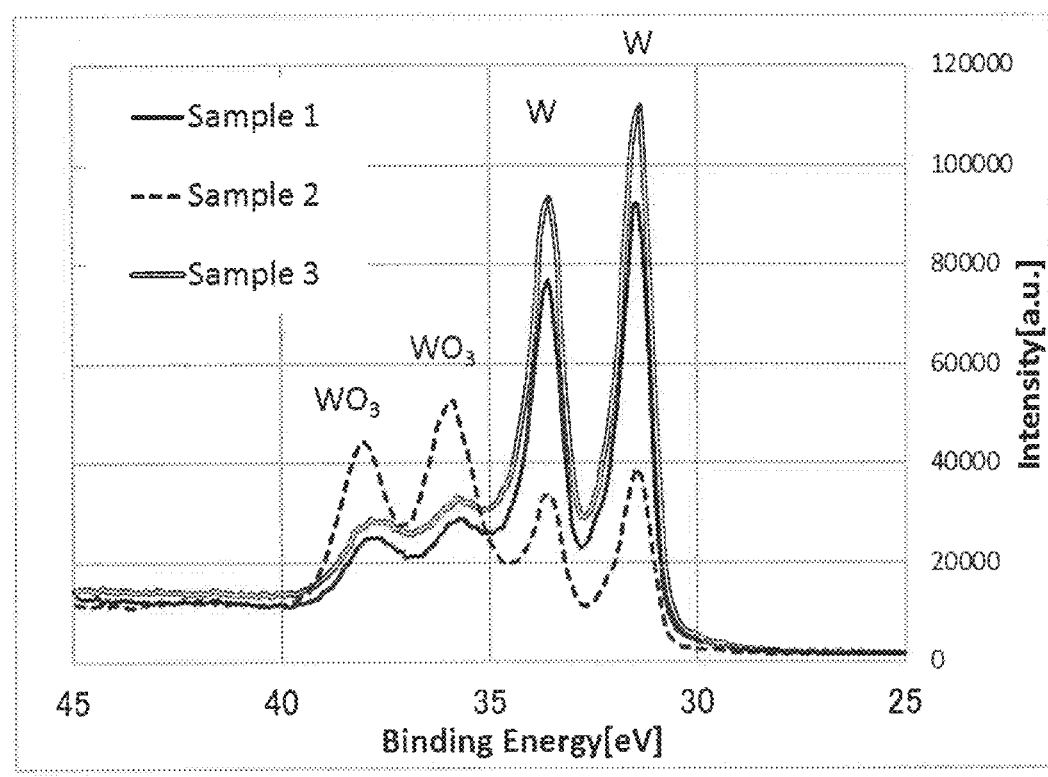
FIG. 76 is a graph showing XPS analysis results in Example 1.

Next, the surfaces of Samples 1 to 3 were analyzed by an XPS analysis method. The analysis results are shown in FIG. 76. FIG. 76 shows spectra as the XPS analysis results. The horizontal axis and the vertical axis in the graph represent binding energy and intensity (the intensity of binding energy), respectively. Peaks of tungsten (W) are seen at a binding energy of around 31 eV to 32 eV and at a binding energy of around 33 eV to 34 eV, and peaks of tungsten oxide ($WO_3$) are seen at a binding energy of around 36 eV and at a binding energy of around 38 eV.

Sample 1 has a high peak intensity of W binding energy and a low peak intensity of $WO_3$. This indicates that substantially the entire surface of Sample 1 is covered with W. Sample 2 has a low peak intensity of W and a high peak intensity of $WO_3$. This indicates that substantially the entire surface of Sample 2 is covered with $WO_3$. Sample 3 has a high peak intensity of W and a low peak intensity of $WO_3$. This state is substantially the same as the surface state of Sample 1. This indicates that substantially the entire surface of Sample 3 is covered with W.

It is found from the above XPS analysis results that when treatment of the surface of W under the conditions for forming openings and oxygen plasma treatment are successively performed in this order, the surface of W is oxidized and $WO_3$ is formed. When QDR washing is further performed, the surface of $WO_3$ is removed to expose the surface of W.

The above suggests that the oxygen plasma treatment successively performed after dry etching for forming openings oxidizes the surface of tungsten in the opening, and metal oxide containing tungsten is formed; however, the metal oxide is removed by QDR washing.

Example 2

In Example 2, a test element group (TEG) for contact resistance measurement was fabricated to examine the effect of QDR washing after formation of openings in one embodiment of the present invention.

A sample was fabricated in such a manner that a silicon oxide film was formed to a thickness of 100 nm on a single crystal silicon wafer by a thermal oxidation method, and then, a 10-nm-thick titanium nitride film and a 30-nm-thick tungsten film were successively formed in this order over the silicon oxide film by a sputtering method.

Next, a 20-nm-thick organic coating film was applied on the tungsten film, and part of the organic coating film, the tungsten film, and the titanium nitride film were etched by a lithography method, so that a first conductive layer including the tungsten film and the titanium nitride film was formed.

Then, a first silicon oxynitride film was formed on the silicon oxide film and the first conductive layer to a thickness of 10 nm by a CVD method, a hafnium oxide film was formed on the first silicon oxynitride film to a thickness of 20 nm by an ALD method, a second silicon oxynitride film was formed on the hafnium oxide film to a thickness of 30 nm by a CVD method, an IGZO film was formed on the second silicon oxynitride film to a thickness of 5 nm by a sputtering method, an aluminum oxide film was formed on the IGZO film to a thickness of 40 nm by a sputtering method, and a third silicon oxynitride film was formed on the aluminum oxide film to a thickness of 390 nm by a CVD method.

Subsequently, CMP treatment was performed on the third silicon oxynitride film to be planarized such that the thickness of a portion of the silicon oxynitride film located on the first conductive layer was 310 nm and the rest of the silicon oxynitride film was 350 nm.

Then, a tungsten film was formed on the planarized third silicon oxynitride film to a thickness of 30 nm by a sputtering method, and a silicon nitride film was formed on the tungsten film to a thickness of 100 nm by a CVD method.

After that, an organic coating film was applied to the silicon nitride film, and a resist mask was formed by a lithography method. Then, the organic coating film, the silicon nitride film, and the tungsten film were successively etched using the resist mask as a mask.

As a dry etching apparatus, a one similar to that used in Example 1 was used. For the etching of the organic coating film, first processing was performed in which 500 W high frequency power and 100 W high frequency power were applied to the upper electrode and the lower electrode, respectively, at a pressure of 3 Pa for 13 seconds using a $CF_4$ gas with a flow rate of 80 sccm. For the etching of the silicon nitride film, second processing was performed in which 550 W high frequency power and 350 W high frequency power were applied to the upper electrode and the lower electrode, respectively, at a pressure of 5.3 Pa for 30 seconds using a mixed gas containing an oxygen gas with a flow rate of 13 sccm and a $CHF_3$ gas with a flow rate of 67 sccm. For the etching of the tungsten film, third processing was performed in which 1000 W high frequency power and 100 W high frequency power were applied to the upper electrode and the lower electrode, respectively, at a pressure of 1.3 Pa for 13 seconds using a mixed gas containing a chlorine gas with a flow rate of 11 sccm, a $CF_4$ gas with a flow rate of 22 sccm, and an oxygen gas with a flow rate of 22 sccm. At that time, the resist mask was eliminated.

Then, the third silicon oxynitride film, the aluminum oxide film, the IGZO film, the second silicon oxynitride film, the hafnium oxide film, and the first silicon oxynitride film were successively processed using the silicon nitride film and the tungsten film formed in the above steps as masks, so that an opening that reaches the first conductive layer was formed.

For the etching of the third silicon oxynitride film, fourth processing was performed in which 1800 W high frequency power and 2000 W high frequency power were applied to the upper electrode and the lower electrode, respectively, at a pressure of 3.3 Pa for 40 seconds using a mixed gas containing a $C_4F_6$ gas with a flow rate of 22 sccm, an oxygen gas with a flow rate of 30 sccm, and an argon gas with a flow rate of 800 sccm.

For etching of the aluminum oxide film, the IGZO film, the second silicon oxynitride film, the hafnium oxide film, and the first silicon oxynitride film, fifth processing was performed in which 1000 W high frequency power and 1200 W high frequency power were applied to the upper electrode and the lower electrode, respectively, at a pressure of 2.6 Pa for 64 seconds using a mixed gas containing a $C_4F_8$ gas with a flow rate of 8 sccm, a hydrogen gas with a flow rate of 16 sccm, and an argon gas with a flow rate of 475 sccm.

By the first processing to the fifth processing, a product was deposited on a sidewall of the opening. To remove the product, oxygen plasma treatment was performed in such a manner that 500 W high frequency power and 100 W high frequency power were applied to the upper electrode and the lower electrode, respectively, at a pressure of 2.6 Pa for 10 seconds using an oxygen gas with a flow rate of 200 sccm.

Note that the first to fifth processings and the oxygen plasma treatment were successively performed with the same dry etching apparatus.

The oxygen plasma treatment oxidized the tungsten on the first conductive layer in the opening, so that tungsten oxide was formed.

Here, to examine effects depending on the conditions for washing for removing tungsten oxide of one embodiment of the present invention, different washing conditions were used for different samples.

Sample A is a comparative example subjected to no washing treatment. Sample B is a sample subjected to QDR washing one cycle. Sample C is a sample subjected to QDR washing three cycles. Sample D is a sample subjected to QDR washing five cycles. Sample E was subjected to spin washing treatment including the following steps with the use of a single wafer washing apparatus: a first step of performing pure water rinsing treatment for 15 seconds in which pure water is supplied from a nozzle to a surface of the sample that is rotated; a second step of performing treatment for 30 seconds in which pressurized pure water is supplied from the nozzle to the surface of the sample that is rotated; and a third step of performing pure water rinsing treatment for 15 seconds in which pure water is supplied from the nozzle to the surface of the sample that is rotated.

Then, a 10-nm-thick titanium nitride film and a 150-nm-thick tungsten film were formed by a CVD method. Then, the titanium nitride film and the tungsten film were subjected to CMP treatment until the third silicon oxynitride film was reached, so that a second conductive layer including the titanium nitride film and the tungsten film was embedded in the opening.

Next, a titanium film, an aluminum film, and a titanium film were formed in this order by a sputtering method to thicknesses of 50 nm, 200 nm, and 50 nm, respectively. Then, the titanium film, the aluminum film, and the titanium film were processed by a lithography method to form a third conductive layer including the titanium film, the aluminum film, and the titanium film. Through the above process, the samples were fabricated.

Next, electronic measurements were performed on the samples. In the electronic measurement, the value of contact resistance between the first conductive layer and the third conductive layer with the second conductive layer therebetween was measured with the use of two TEGs. One of the TEGs is a Kelvin resistance TEG for measuring contact resistance by a four-terminal method, and the other TEG is a contact chain resistance TEG of a circuit in which 3000 contact holes are connected in series in the form of a chain.

Figure 77A:
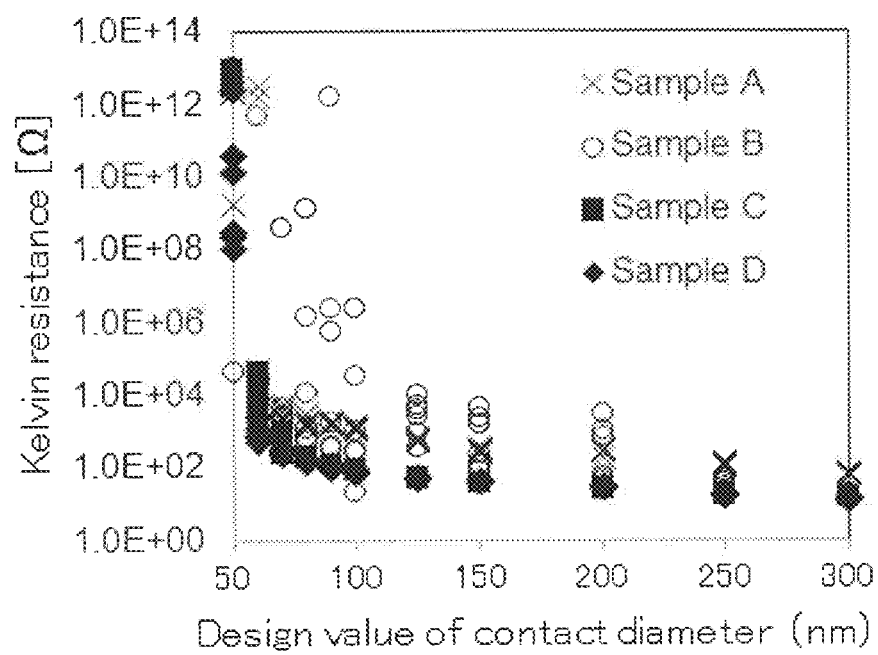
FIGS. 77A and 77B are graphs showing contact resistances in Example 2.
Figure 77B:
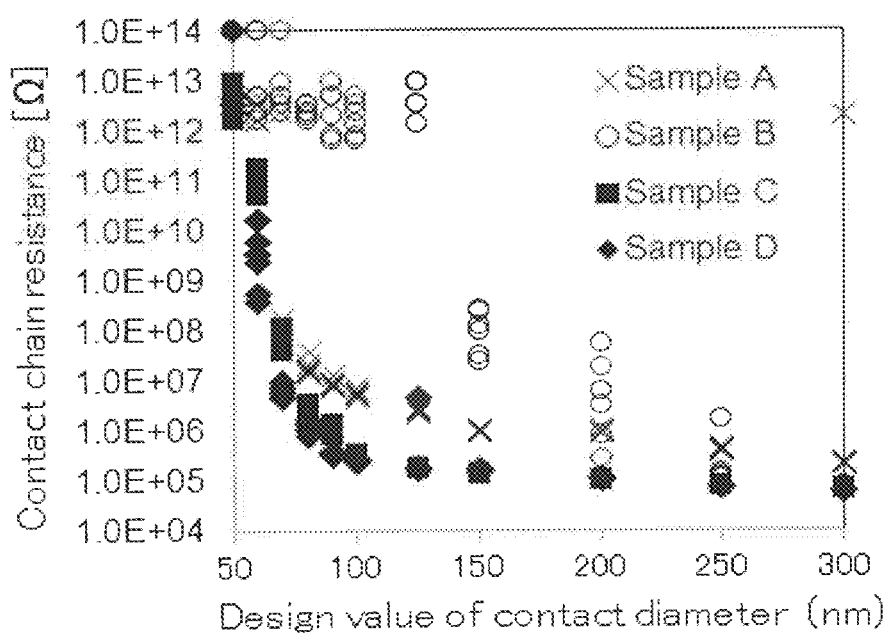

FIG. 77A is a graph showing contact diameter design value dependence of Kelvin resistance of Sample A subjected to no washing treatment, Sample B subjected to one cycle of QDR washing treatment, Sample C subjected to three cycles of QDR washing treatment, and Sample D subjected to five cycles of QDR washing treatment. FIG. 77B is a graph showing contact diameter design value dependence of contact chain resistance of Sample A subjected to no washing treatment, Sample B subjected to one cycle of QDR washing treatment, Sample C subjected to three cycles of QDR washing treatment, and Sample D subjected to five cycles of QDR washing treatment. In the case of any of the above treatments, there is a tendency that Kelvin resistance, contact chain resistance, and a variation in resistance increase as the contact diameter design value decreases; however, the Kelvin resistance and the contact chain resistance of Sample C subjected to three cycles of QDR washing treatment and Sample D subjected to five cycles of QDR washing treatment did not increase and variations in Kelvin resistance and contact chain resistance were small in the cases where the contact diameter design value is larger than or equal to 80 nm.

Figure 78A:
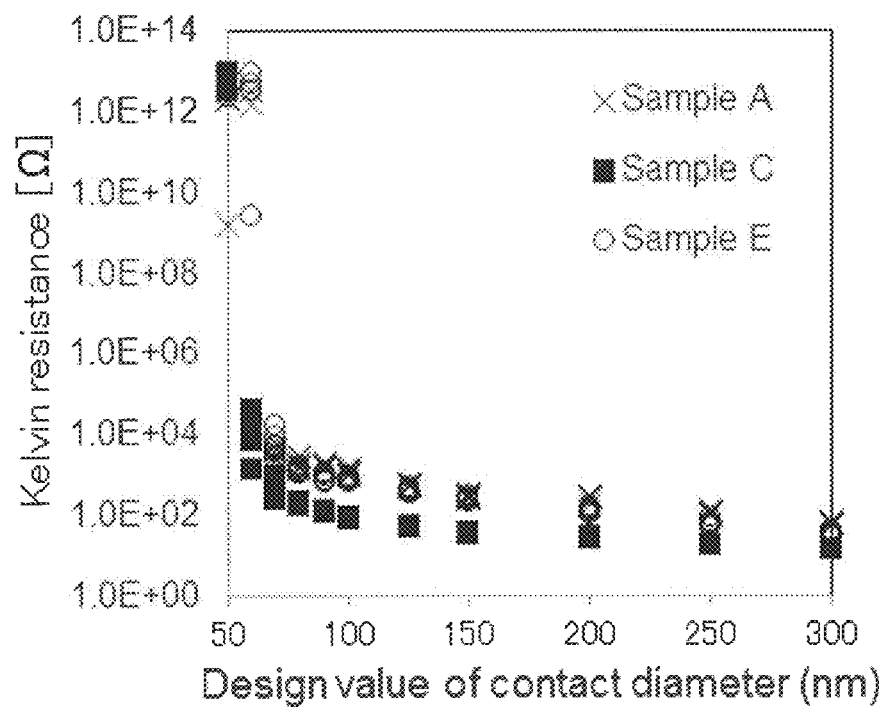
FIGS. 78A and 78B are graphs showing contact resistances in Example 2.
Figure 78B:
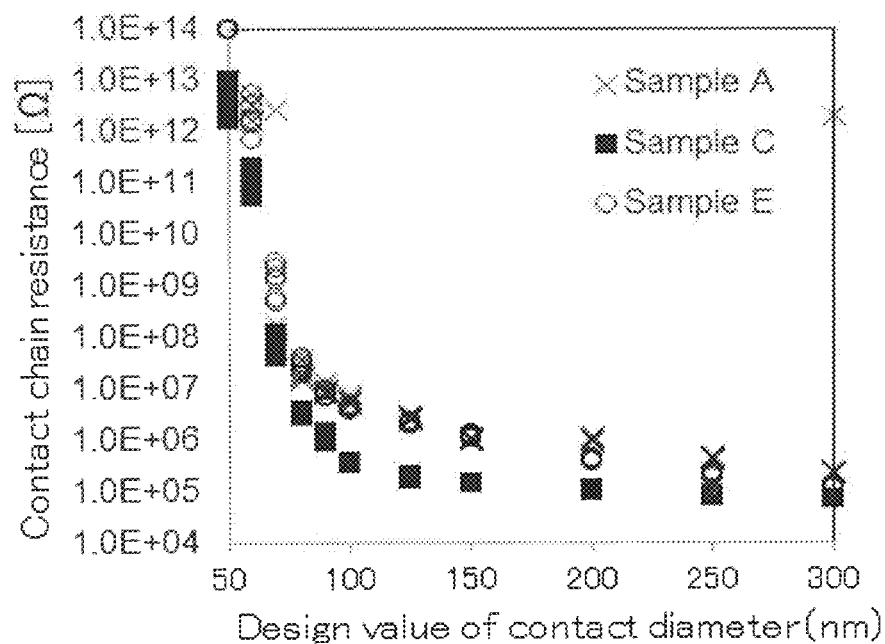

FIG. 78A is a graph showing contact diameter design value dependence of Kelvin resistance of Sample A subjected to no washing treatment, Sample C subjected to three cycles of QDR washing treatment, and Sample E subjected to spin washing treatment. FIG. 78B is a graph showing contact diameter design value dependence of contact chain resistance of Sample A subjected to no washing treatment, Sample C subjected to three cycles of QDR washing treatment, and Sample E subjected to spin washing treatment. Note that data of Sample A and Sample C in FIGS. 78A and 78B are the same as those in FIGS. 77A and 77B.

It is found from the above results that the Kelvin resistance and the contact chain resistance of Sample E subjected to spin washing treatment are lower than those of Sample A subjected to no treatment but spin washing treatment has a poorer effect than three cycles of QDR washing treatment.

Thus, QDR washing treatment has an effect of lowering Kelvin resistance and contact chain resistance or reducing variations in Kelvin resistance and contact chain resistance, and is preferably performed three or more cycles, more preferably five or more cycles.

Example 3

In Example 3, cross-sectional shapes of the openings of one embodiment of the present invention were observed with a scanning transmission electron microscope (STEM).

Figure 79A:
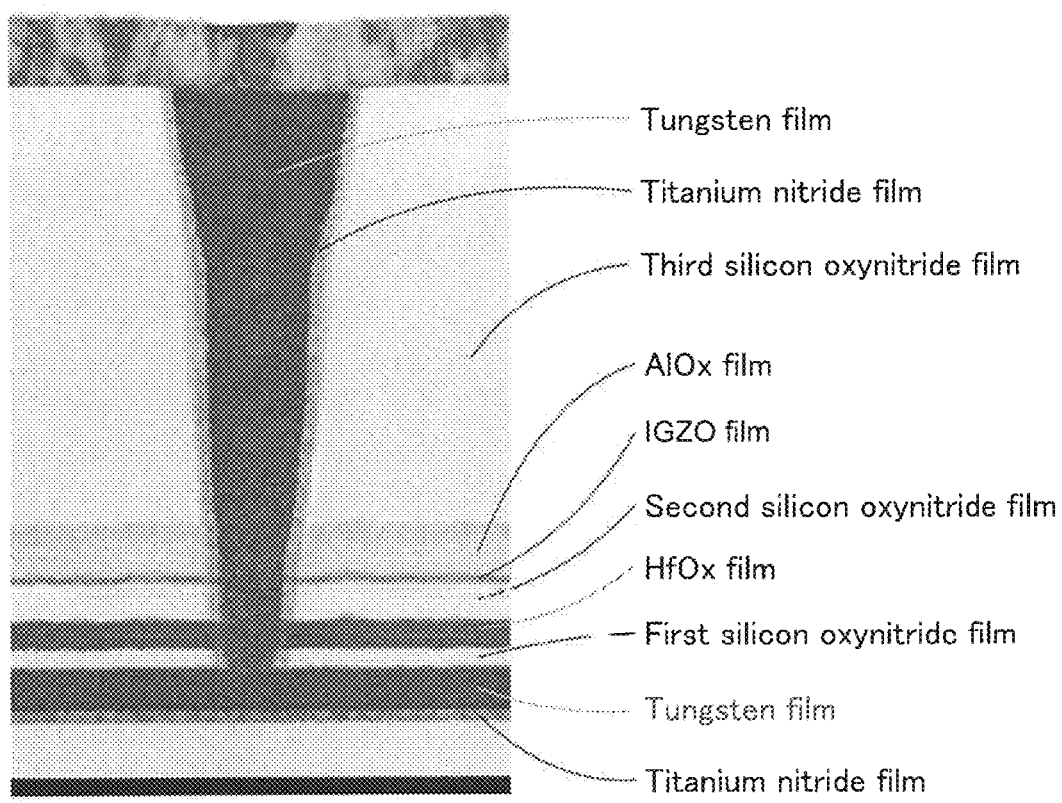
FIGS. 79A and 79B are cross-sectional STEM images in Example 3.
Figure 79B:
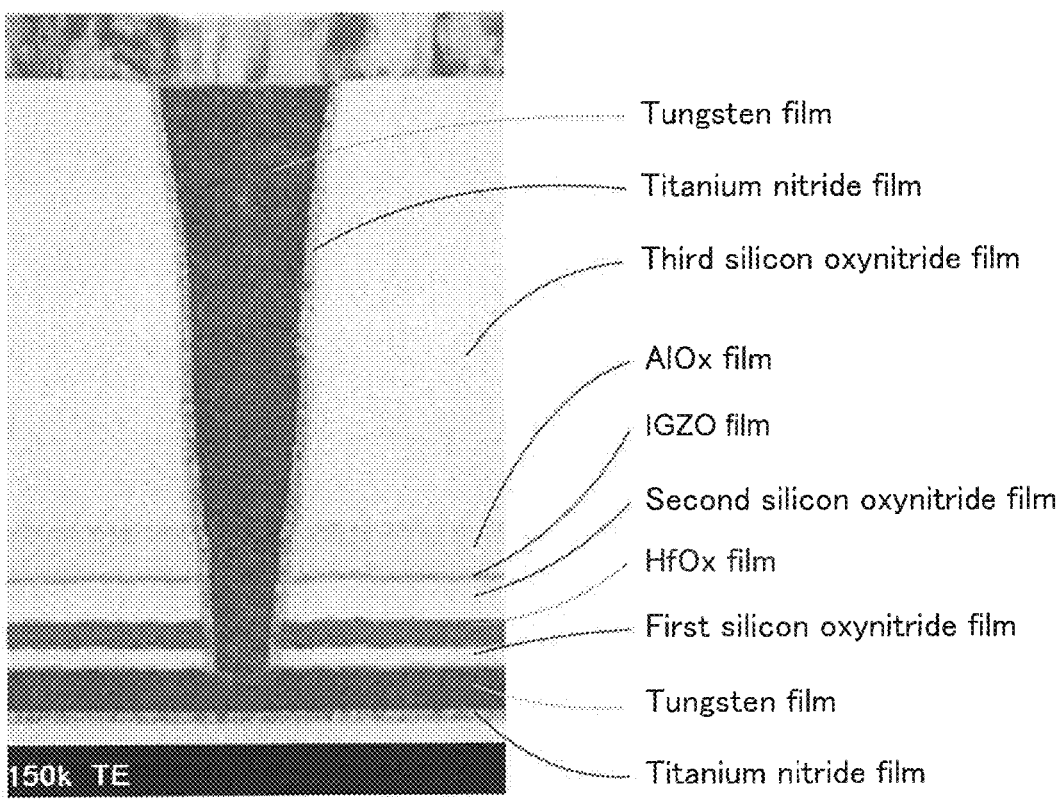

As samples, those fabricated in Example 2 were used. FIGS. 79A and 79B are photographs each showing a cross section when the design value of the opening diameter is 100 nm. FIG. 79A is a photograph showing a cross section of Sample A not subjected to QDR washing after formation of the opening, and FIG. 79B is a photograph showing a cross section of Sample C subjected to three cycles of QDR washing after formation of the opening. There is no difference in cross-sectional shape regardless of whether QDR washing was performed.

FIGS. 80A and 80B are photographs each showing a cross section when the design value of the opening diameter is 300 nm. FIG. 80A is a photograph showing a cross section of Sample A not subjected to QDR washing after formation of the opening, and FIG. 80B is a photograph showing a cross section of Sample C subjected to three cycles of QDR washing after formation of the opening. There is no difference in cross-sectional shape regardless of whether QDR washing was performed. The above results imply that even when QDR washing is performed, a cross-sectional shape is not adversely affected and a favorable shape can be obtained regardless of the design value of an opening diameter.

This application is based on Japanese Patent Application serial no. 2015-083537 filed with Japan Patent Office on Apr. 15, 2015, the entire contents of which are hereby incorporated by reference.

What is claimed is:

1. A method for fabricating a semiconductor device, comprising:
   forming a first insulator over a substrate;
   forming a first conductor comprising a metal element and a second conductor over the first insulator, wherein the first conductor and the second conductor are formed from a same film;
   forming a second insulator over the first conductor and the second conductor;
   forming a semiconductor over the second insulator;
   forming a third conductor over the semiconductor as a source or drain electrode;
   forming a third insulator over the third conductor;
   forming a fourth conductor as a first gate electrode over the third insulator;
   forming a fourth insulator over the fourth conductor;
   forming a mask layer over the fourth insulator;
   forming a first opening that reaches a top surface of the first conductor in the second insulator, the third insulator, and the fourth insulator to expose the top surface of the first conductor, wherein the first opening is formed by etching the second insulator, the third insulator, and the fourth insulator using plasma and the mask layer as a mask;
   performing plasma treatment on at least the first opening so as to form an oxide comprising the metal element from the first conductor, wherein the plasma treatment is performed in an atmosphere containing oxygen;
   removing the oxide; and
   forming a fifth conductor in the first opening,
   wherein the second conductor comprises a second gate electrode.

2. The method for fabricating the semiconductor device, according to claim 1,
   wherein the oxide is removed by washing treatment using a liquid in the removing step.

3. The method for fabricating the semiconductor device, according to claim 2,
   wherein the washing treatment comprises three or more cycles of first to fourth steps,
   wherein the first step is to supply water so that a washing bath overflows while bubbling the water in the washing bath with the use of a nitrogen gas,
   wherein the second step is to drain the water from the washing bath while supplying water from a shower to the washing bath,
   wherein the third step is to supply water in the washing bath, and
   wherein the fourth step is to supply water so that the washing bath overflows while bubbling the water in the washing bath with the use of a nitrogen gas.

4. The method for fabricating the semiconductor device, according to claim 1,
   wherein the first conductor is a conductive layer containing tungsten.

5. The method for fabricating the semiconductor device, according to claim 1,
   wherein the second conductor and the fourth conductor overlap with each other.

6. The method for fabricating the semiconductor device, according to claim 1,
   wherein the semiconductor does not overlap with the first conductor.

7. The method for fabricating the semiconductor device, according to claim 1,
   wherein a second opening is formed in the same step as the step of forming the first opening, and
   wherein the second opening is formed in the third insulator and the fourth insulator to expose a top surface of the source or drain electrode.

8. The method for fabricating the semiconductor device, according to claim 1,
   wherein the source or drain electrode is not overlapped with the first conductor.

9. The method for fabricating the semiconductor device, according to claim 1, further comprising a step of forming a fifth insulator over the fourth insulator,
   wherein the first opening is formed in the fifth insulator.

10. The method for fabricating the semiconductor device, according to claim 9, further comprising a step of forming a sixth conductor over the fifth insulator,
    wherein the sixth conductor is electrically connected to the first conductor through the fifth conductor.

* * * * *